United States Patent
Tsuchimura et al.

(10) Patent No.: US 8,637,220 B2
(45) Date of Patent: Jan. 28, 2014

(54) ACTINIC RAY-SENSITIVE OR RADIATION-SENSITIVE RESIN COMPOSITION, AND RESIST FILM AND PATTERN FORMING METHOD USING THE COMPOSITION

(75) Inventors: Tomotaka Tsuchimura, Shizuoka (JP); Hideaki Tsubaki, Shizuoka (JP); Toshiya Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 11 days.

(21) Appl. No.: 13/172,025

(22) Filed: Jun. 29, 2011

(65) Prior Publication Data

US 2012/0003583 A1 Jan. 5, 2012

(30) Foreign Application Priority Data

Jun. 29, 2010 (JP) ................. 2010-148386

(51) Int. Cl.
*G03F 7/004* (2006.01)
*G03F 7/039* (2006.01)

(52) U.S. Cl.
CPC ............ *G03F 7/0045* (2013.01); *G03F 7/0397* (2013.01); *Y10S 430/106* (2013.01); *Y10S 430/111* (2013.01)

USPC ........ 430/270.1; 430/302; 430/325; 430/326; 430/905; 430/910

(58) Field of Classification Search
CPC ........ G03F 7/0397; G03F 7/0045; G03F 7/30
USPC ........................ 430/270.1, 326, 905, 302, 325
See application file for complete search history.

(56) References Cited

U.S. PATENT DOCUMENTS

| | | | | |
|---|---|---|---|---|
| 5,821,345 A | * | 10/1998 | Sandford et al. | ............... 534/557 |
| 5,919,601 A | * | 7/1999 | Nguyen et al. | ............. 430/278.1 |
| 5,945,516 A | * | 8/1999 | Sandford et al. | ............... 534/557 |
| 6,051,361 A | * | 4/2000 | Hattori et al. | ............... 430/270.1 |
| 7,108,951 B2 | * | 9/2006 | Sasaki et al. | ............... 430/270.1 |

FOREIGN PATENT DOCUMENTS

| | | |
|---|---|---|
| JP | 11-102065 A | 4/1999 |
| JP | 2002-23372 A | 1/2002 |
| JP | 2003-149800 A | 5/2003 |
| JP | 3444844 B2 | 6/2003 |

* cited by examiner

*Primary Examiner* — John Chu
(74) *Attorney, Agent, or Firm* — Sughrue Mion, PLLC

(57) ABSTRACT

An actinic ray-sensitive or radiation-sensitive resin composition comprising (A) a guanidine compound having a logP value of 1.2 or more, and (B) a compound capable of generating an acid upon irradiation with an actinic ray or radiation.

14 Claims, No Drawings

ACTINIC RAY-SENSITIVE OR RADIATION-SENSITIVE RESIN COMPOSITION, AND RESIST FILM AND PATTERN FORMING METHOD USING THE COMPOSITION

BACKGROUND OF THE INVENTION

1. Field of the Invention

The present invention relates to an actinic ray-sensitive or radiation-sensitive resin composition capable of undergoing a reaction upon irradiation with an actinic ray or radiation to change in the property, and a resist film and a pattern forming method each using the composition. More specifically, the present invention relates to an actinic ray-sensitive or radiation-sensitive resin composition for use in the production process of a semiconductor such as IC, in the production of a liquid crystal device or a circuit board such as thermal heads, in the fabrication of a nanoimprint mold structure, in other photofabrication processes, or in a lithographic printing plate or an acid-curable composition, and a resist film and a pattern forming method each using the composition.

2. Description of the Related Art

A chemical amplification resist composition is a pattern forming material of forming a pattern on a substrate by producing an acid in the exposed area upon irradiation with radiation such as far ultraviolet light and through a reaction using the acid as a catalyst, changing the developer solubility of the area irradiated with an actinic ray or radiation and that of the non-irradiated area.

In the case of using a KrF excimer laser as the exposure light source, a resin having small absorption in the wavelength region of 248 nm and having a basic framework of poly(hydroxystyrene) is predominantly used as the main component, and this is an excellent system capable of forming a good pattern with high sensitivity and high resolution, compared with the conventional naphthoquinone-diazide/novolak resin system.

On the other hand, in the case where a light source of emitting light at a shorter wavelength, for example, an ArF excimer laser (193 nm), is used as the exposure light source, a satisfactory pattern cannot be formed even by the above-described chemical amplification system, because the compound having an aromatic group substantially has large absorption in the region of 193 nm.

In order to solve this problem, a resist composition for ArF excimer laser, containing a resin having an alicyclic hydrocarbon structure, has been developed.

Furthermore, a resist composition for forming a fine pattern of several tens of nm by using an X-ray, an electron beam or EUV (lithography) has been also developed.

The resist composition generally contains a basic compound so that the acid generated from an acid generator upon irradiation with an actinic ray or radiation can be prevented from diffusing into the unexposed area. As such a basic compound, DBU (1,8-diazabicyclo[5.4.0]-7-undecene) and a guanidine compound are known (see, for example, JP-A-11-102065 (the term "JP-A" as used herein means an "unexamined published Japanese patent application"), JP-A-2002-23372, Japanese Patent No. 3444844, JP-A-2003-149800).

However, these basic compounds still have many insufficient points and it is demanded to improve the basic compound and thereby develop a photosensitive composition enhanced in terms of scum reduction, pattern profile, sensitivity, line edge roughness (LER) and the like.

In particular, the weight of scum reduction is increased as the pattern profile is reduced. For example, in the lithography with X-ray, electron beam or EUV, the target is formation of a fine pattern in the order of several tens of nm and therefore, an excellent scum reduction performance is particularly required.

Furthermore, the formation of a fine pattern involves a problem that the line width varies depending on the temperature at heating after irradiation with radiation (post exposure bake, PEB). Accordingly, improvement of the PEB temperature dependency is also needed.

SUMMARY OF THE INVENTION

An object of the present invention is to provide an actinic ray-sensitive or radiation-sensitive resin composition containing a specific guanidine compound and thereby ensuring excellent scum reduction, high resolution enabling formation of a pattern with a good profile, superior performance in terms of sensitivity and line edge roughness (LER), and suppressed PEB temperature dependency, a resist film formed using the composition, and a pattern forming method using the composition.

The present invention is, for example, as follows.

<1> An actinic ray-sensitive or radiation-sensitive resin composition comprising:

(A) a guanidine compound having a logP value of 1.2 or more, and (B) a compound capable of generating an acid upon irradiation with an actinic ray or radiation.

<2> The actinic ray-sensitive or radiation-sensitive resin composition as described in <1> above, wherein the guanidine compound (A) is a compound represented by the following formula (A1):

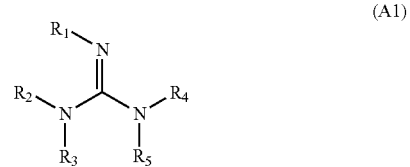

(A1)

wherein each of $R_1$ to $R_5$ represents a hydrogen atom or an organic group, $R_2$ and $R_3$ are not hydrogen at the same time, $R_4$ and $R_5$ are not hydrogen at the same time, and respective members of $R_1$ to $R_5$ may combine with each other to form a non-aromatic ring, and any of $R_1$ to $R_5$ of a structure represented by formula (A1) may be bonded with any of $R_1$ to $R_5$ of another structure represented by formula (A1) to form a structure having a plurality of structures represented by formula (A1).

<3> The actinic ray-sensitive or radiation-sensitive resin composition as described in <2> above, wherein each of $R_1$ to $R_5$ in formula (A1) is a hydrogen atom, an alkyl group, a cycloalkyl group or an aryl group.

<4> The actinic ray-sensitive or radiation-sensitive resin composition as described in any one of <1> to <3> above, wherein the compound (B) capable of generating an acid is a compound capable of generating an acid having a size of 130 Å$^3$ or more in volume or a resin containing a repeating unit capable of decomposing upon irradiation with an actinic ray or radiation to generate an acid.

<5> The actinic ray-sensitive or radiation-sensitive resin composition as described in any one of <1> to <4> above, which is a positive resist composition containing an acid-decomposable resin.

<6> The actinic ray-sensitive or radiation-sensitive resin composition as described in <5> above, wherein the acid-decomposable resin contains a repeating unit represented by the following formula (VI):

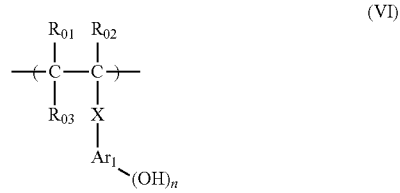

wherein each of $R_{01}$, $R_{02}$ and $R_{03}$ independently represents a hydrogen atom, an alkyl group, a cycloalkyl group, a halogen atom, a cyano group or an alkoxycarbonyl group, $R_{03}$ may represent an alkylene group and combine with $Ar_1$ to form a 5- or 6-membered ring, $Ar_1$ represents an aromatic ring group, n represents an integer of 1 to 4, and X represents a single bond or a divalent linking group.

<7> The actinic ray-sensitive or radiation-sensitive resin composition as described in any one of <1> to <4> above, which is a negative resist composition containing an acid crosslinking agent.

<8> The actinic ray-sensitive or radiation-sensitive resin composition as described in any one of <1> to <7> above, which is exposed to electron beam, X-ray or EUV light.

<9> A resist film formed using the actinic ray-sensitive or radiation-sensitive resin composition described in any one of <1> to <8>.

<10> A pattern forming method comprising a step of exposing the resist film described in <9> above and a step of developing the exposed film.

The present invention preferably further includes the following configurations.

<11> The actinic ray-sensitive or radiation-sensitive resin composition as described in any one of <1> to <7> above, wherein the logP value of the guanidine compound (A) is from 2 to 10.

<12> The actinic ray-sensitive or radiation-sensitive resin composition as described in any one of <1> to <7> and <11> above, wherein at least one of $R_1$ to $R_5$ in formula (A1) has a cycloalkyl group or an aryl group.

<13> The actinic ray-sensitive or radiation-sensitive resin composition as described in any one of <1> to <7>, <11> and <12> above, wherein two or more of $R_1$ to $R_5$ in formula (A1) has a cycloalkyl group or an aryl group.

According to the present invention, an actinic ray-sensitive or radiation-sensitive resin composition containing a specific guanidine compound and thereby ensuring excellent scum reduction, high resolution enabling formation of an ultrafine pattern with a good profile, superior performance in terms of sensitivity and LER, and suppressed PEB temperature dependency, a resist film formed using the composition, and a pattern forming method using the composition, can be provided.

A guanidine-type strong base having a higher basicity than normal bases is combined with a compound capable of generating a low-diffusible acid or a resin containing a repeating unit capable of decomposing upon irradiation with an actinic ray or the like to generate an acid, whereby diffusion of an acid generated upon exposure is significantly restricted and this makes it possible to provide a resist with good resolution (pattern profile) and form an ultrafine pattern. Furthermore, although detailed reasons are unknown, a guanidine compound having high hydrophobicity has an effect of improving scum and PEB temperature dependency.

DETAILED DESCRIPTION OF THE INVENTION

The mode for carrying out the present invention is described below.

In the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation.

In the description of the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

The actinic ray-sensitive or radiation-sensitive resin composition of the present invention (hereinafter, sometimes referred to as "the composition of the present invention) contains (A) a guanidine compound having a logP value of 1.2 or more and (B) a compound capable of generating an acid upon irradiation with an actinic ray or radiation.

[1] (A) Guanidine Compound Having a logP Value of 1.2 or More (Hereinafter, Sometimes Simply Referred to as a "Compound (A)")

In the present invention, the guanidine compound indicates a compound having a structure represented by the following formula:

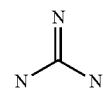

The guanidine compound exhibits strong basicity because dispersion of positive electric charges of a conjugate acid is stabilized by three nitrogens.

As for the basicity of the guanidine compound (A) for use in the present invention, the pKa of the conjugate acid is preferably 6.0 or more, more preferably from 7.0 to 20.0 in view of high neutralization reactivity with an acid and excellent roughness characteristics, and still more preferably from 8.0 to 16.0.

Thanks to such strong basicity, the compound can suppress the diffusion of an acid and contribute to the formation of an excellent pattern profile.

The "pKa" as used herein is pKa in an aqueous solution and described, for example, in *Kagaku Binran* (*Chemical Handbook*) (*II*), 4th ed., compiled by CSJ, Maruzen (1993), and a lower value indicates higher acid strength. Specifically, the pKa in an aqueous solution can be measured in practice by using an infinite-dilution aqueous solution and measuring the acid dissociation constant at 25° C., or a value based on the Hammett substituent constants and the data base of known publications can be determined by computation using the following software package 1. All values of pKa cited in the description of the present invention are a value determined by computation using this software package.

Software Package 1:

Advanced Chemistry Development (ACD/Labs) Software V8.14 for Solaris (1994-2007 ACD/Labs)

In the present invention, the logP is a logarithmic value of the n-octanol/water partition coefficient (P) and is an effective parameter capable of characterizing the hydrophilicity/hydrophobicity for compounds over a wide range. The partition coefficient is generally determined by computation but not from experiments and in the present invention, a value computed using CS ChemDraw Ultra Ver. 8.0 software package (Crippen's fragmentation method) is employed.

The guanidine compound (A) for use in the present invention is not limited as long as the logP is 1.2 or more. With a value in this range, scum can be improved and excellent resolution can be imparted. Such a value can also contribute to excellent performance in terms of PEB temperature dependency.

The logP of the guanidine compound (A) is preferably 10 or less. When the value is in this range, the compound can be uniformly contained in the resist film.

The logP of the guanidine compound (A) for use in the present invention is preferably from 2 to 10, more preferably from 3 to 8, still more preferably 4 to 8.

The guanidine compound (A) for use in the present invention preferably contains no nitrogen atom except for in the guanidine structure.

In the present invention, the guanidine compound (A) is preferably represented by the following formula (A1):

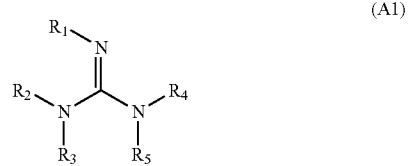

(A1)

In the formula, each of $R_1$ to $R_5$ represents a hydrogen atom or an organic group, $R_2$ and $R_3$ are not hydrogen at the same time, and $R_4$ and $R_5$ are not hydrogen at the same time.

Respective members of $R_1$ to $R_5$ may combine with each other to form a non-aromatic ring.

The non-aromatic ring formed by combining $R_1$ to $R_5$ with each other is preferably a 5- to 10-membered aromatic ring formed together with two nitrogen atoms and a carbon atom in the guanidine structure in formula (A1), more preferably a 5- or 6-membered non-aromatic ring.

$R_2$ and $R_3$ (or $R_4$ and $R_5$) bonded to the same nitrogen atom in formula (A1) may combine to form a 5- or 6-membered aromatic ring. In this case, the ring may contain a heteroatom such as oxygen atom.

Such a non-aromatic ring structure suppresses the reduction in basicity and is preferred from the standpoint of improving the LER performance and enhancing the pattern profile.

The compound (A) may have a structure having a plurality of structures represented by formula (A1), specifically, may be a compound where any of $R_1$ to $R_5$ in a structure represented by formula (A1) is bonded to any of $R_1$ to $R_5$ in another structure represented by formula (A1). Examples of the structure where any of $R_1$ to $R_5$ in a structure represented by formula (A1) is bonded to any of $R_1$ to $R_5$ in another structure represented by formula (A1) include a divalent alkylene group (e.g., nonamethylene group), a cycloalkylene group (e.g., 1,8-decahydronaphthalene group), and an arylene group (e.g., 1,8-naphthalene group). From the standpoint of suppressing the reduction in basicity, a divalent alkylene group and a cycloalkylene group are preferred.

However, in the case of forming a ring structure having a plurality of structures represented by formula (A1) by combining any of $R_1$ to $R_5$ in a structure represented by formula (A1) with any of $R_1$ to $R_5$ in another structure represented by formula (A1), when a ring using, as a constituent atom, the nitrogen atom of the guanidine structure in formula (A1) is formed, the ring structure is preferably a non-aromatic ring structure in view of suppressing the reduction in basicity.

It is preferred that $R_2$ and $R_3$ do not form an imino group and at the same time, $R_4$ and $R_5$ do not form an imino group.

The organic group of $R_1$ to $R_5$ is preferably an organic group having a carbon number of 1 to 50, and examples thereof include an alkyl group, a cycloalkyl group, an aryl group, an alkenyl group, an alkanoyl group, an alkoxycarbonyl group, an aryloxycarbonyl group, an alkylsulfonyl group, an arylsulfonyl group, an alkylaminocarbonyl group and an arylaminocarbonyl group. Each of these groups may have a substituent. The organic group of $R_1$ to $R_5$ preferably has no nitrogen atom.

The alkyl group of $R_1$ to $R_5$ may have a substituent and is preferably an alkyl group having a carbon number of 1 to 20, and examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The cycloalkyl group of $R_1$ to $R_5$ may have a substituent and is preferably a cycloalkyl group having a carbon number of 3 to 30 (more preferably a carbon number of 6 to 30). The cycloalkyl group may be monocyclic or polycyclic and examples thereof include a cyclopentyl group, a cyclohexyl group, an adamantyl group and a norbornyl group.

The aryl group of $R_1$ to $R_5$ may have a substituent and is preferably an aryl group having a carbon number of 6 to 30, and examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-, m- or p-tolyl group, a xylyl group, an o-, m- or p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group and an ovalenyl group.

The alkenyl group of $R_1$ to $R_5$ may have a substituent and is preferably an alkenyl group having a carbon number of 2 to 10, and examples thereof include a vinyl group, an allyl group, and a styryl group.

The alkanoyl group of $R_1$ to $R_5$ may have a substituent and is preferably an alkanoyl group having a carbon number of 2 to 20, and examples thereof include an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group of $R_1$ to $R_5$ may have a substituent and is preferably an alkoxycarbonyl group having a carbon number of 2 to 20, and examples thereof include a methoxycarbonyl group, an ethoxycarbonyl group, an n- or iso-propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

The aryloxycarbonyl group of $R_1$ to $R_5$ may have a substituent, and examples of the alkoxycarbonyl group include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The alkylsulfonyl group of $R_1$ to $R_5$ may have a substituent and is preferably an alkylsulfonyl group having a carbon number of 1 to 20, and examples thereof include a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanoylsulfonyl group, a dodecanoylsulfonyl group, an octadecanoylsulfonyl group, a cyanomethylsulfonyl group, a methoxymethylsulfonyl group, and a perfluoroalkylsulfonyl group (e.g., trifluoromethylsulfonyl group, n-nonafluorobutylsulfonyl group).

The arylsulfonyl group of $R_1$ to $R_5$ may have a substituent and is preferably an arylsulfonyl group having a carbon number of 6 to 30, and examples thereof include a phenylsulfonyl group, a 1-naphthylsulfonyl group, a 2-naphthylsulfonyl group, a 2-chlorophenylsulfonyl group, a 2-methylphenylsulfonyl group, a 4-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, and a 4-dimethylaminophenylsulfonyl group.

The alkylaminocarbonyl group of $R_1$ to $R_5$ may have a substituent, and examples of the alkylaminocarbonyl group include a dimethylaminocarbonyl group, a diethylaminocarbonyl group, a dipropylaminocarbonyl group, a dibutylaminocarbonyl group, a methylaminocarbonyl group, an ethylaminocarbonyl group, an n- or iso-propylaminocarbonyl group, and a butylaminocarbonyl group.

The arylaminocarbonyl group of $R_1$ to $R_5$ may have a substituent, and examples of the arylaminocarbonyl group include a phenylaminocarbonyl group, a 1-naphthylaminocarbonyl group, a 2-naphthylaminocarbonyl group, a 4-methylsulfanylphenylaminocarbonyl group, a 4-phenylsulfanylphenylaminocarbonyl group, 4-dimethylaminophenylaminocarbonyl group, a 4-diethylaminophenylaminocarbonyl group, a 2-chlorophenylaminocarbonyl group, a 2-methylphenylaminocarbonyl group, a 2-methoxyphenylaminocarbonyl group, a 2-butoxyphenylaminocarbonyl group, a 3-chlorophenylaminocarbonyl group, a 3-trifluoromethylphenylaminocarbonyl group, a 3-cyanophenylaminocarbonyl group, a 3-nitrophenylaminocarbonyl group, a 4-fluorophenylaminocarbonyl group, a 4-cyanophenylaminocarbonyl group, and a 4-methoxyphenylaminocarbonyl group.

Each of these groups may further have a substituent, and examples of the substituent include a halogen group such as fluorine atom, chlorine atom, bromine atom and iodine atom, an alkoxy group such as methoxy group, ethoxy group and tert-butoxy group, an aryloxy group such as phenoxy group and p-tolyloxy group, an alkoxycarbonyl group such as methoxycarbonyl group and butoxycarbonyl group, an aryloxycarbonyl group such as phenoxycarbonyl group and p-tolyloxycarbonyl group, an acyloxy group such as acetoxy group, propionyloxy group and benzoyloxy group, an acyl group such as acetyl group, benzoyl group, isobutyryl group, acryloyl group, methacryloyl group and methoxalyl group, an alkylsulfanyl group such as methylsulfanyl group and tert-butylsulfanyl group, an arylsulfanyl group such as phenylsulfanyl group and p-tolylsulfanyl group, an alkyl- or cyaloalkyl-amino group such as methylamino group and cyclohexylamino group, a dialkylamino group such as dimethylamino group, diethylamino group, morpholino group and piperidino group, an arylamino group such as phenylamino group and p-tolylamino group, an alkyl group such as methyl group, ethyl group, tert-butyl group and dodecyl group, a cycloalkyl group such as cyclohexyl group, an aryl group such as phenyl group, p-tolyl group, xylyl group, cumenyl group, naphthyl group, anthryl group and phenanthryl group, a hydroxy group, a carboxy group, a formyl group, a mercapto group, a sulfo group, a mesyl group, a p-toluenesulfonyl group, an amino group, a nitro group, a cyano group, a trifluoromethyl group, a 2,2,2-trifluoro-1-hydroxy-1-trifluoromethyl-ethyl group, a trichloromethyl group, a trimethylsilyl group, a phosphinico group, and a phosphono group. The substituent which each of the groups for $R_1$ to $R_5$ may have preferably has no nitrogen atom.

Each of $R_1$ to $R_5$ is preferably a hydrogen atom, an alkyl group which may have a substituent, a cycloalkyl group which may have a substituent, or an aryl group which may have a substituent. More preferably, at least one of $R_1$ to $R_5$ has a cycloalkyl group or an aryl group in view of improving the scum performance; still more preferably, two or more of $R_1$ to $R_5$ have a cycloalkyl group or an aryl group; and most preferably three or more of $R_1$ to $R_5$ have a cycloalkyl group or an aryl group.

The guanidine compound (A) having a logP value of 1.2 or more for use in the present invention includes, in its scope, tautomers of the guanidine compound represented by formula (A1). Formula (A1) is shown in the form of a canonical structure out of several kinds of tautomers which are acceptable as a chemical structure, but the compound may be a tautomer of a structure other than that shown or may be a mixture containing a plurality of tautomers. For example, the guanidine compound represented by formula (A1) is considered to be a tautomer of the guanidine compounds represented by the following formulae (A1') and (A1").

The guanidine compounds represented by the following formulae (A1') and (A1") which are tautomers of the guanidine compound represented by formula (A1) are also included in the scope of the present invention.

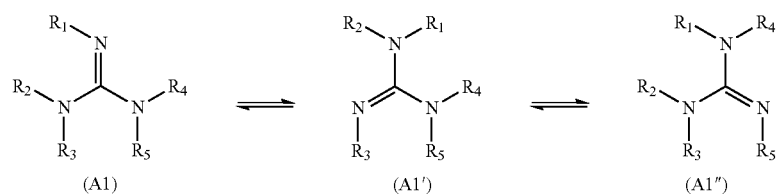

In formulae (A1') and (A1"), $R_1$ to $R_5$ have the same meanings as $R_1$ to $R_5$ in formula (A1).

However, in formula (A1'), $R_1$ and $R_2$ are not hydrogen at the same time, and $R_4$ and $R_5$ are not hydrogen at the same time. Also, in formula (A1"), $R_2$ and $R_3$ are not hydrogen at the same time, and $R_1$ and $R_4$ are not hydrogen at the same time.

Specific examples of the guanidine compound having a logP value of 1.2 or more are illustrated below. As described above, tautomers conceivable from the following specific examples are also included in specific examples.

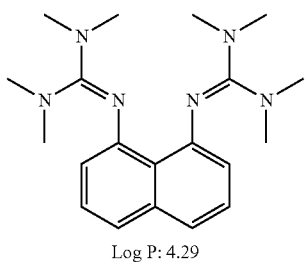

Log P: 4.29

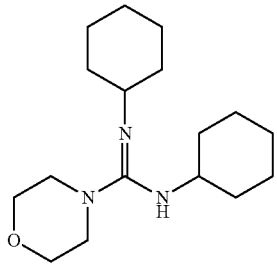

Log P: 3.32

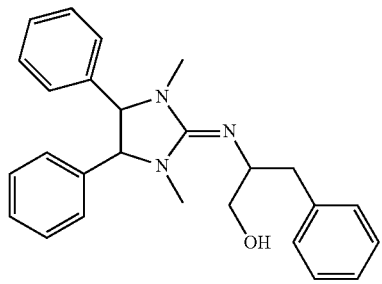

Log P: 5.66

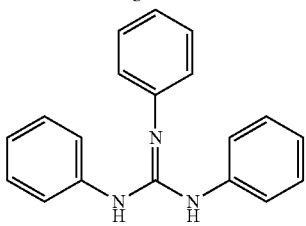

Log P: 5.24

-continued

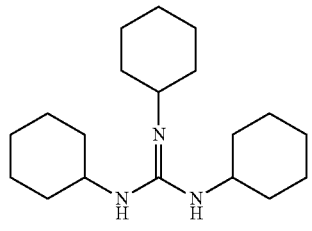

Log P: 4.89

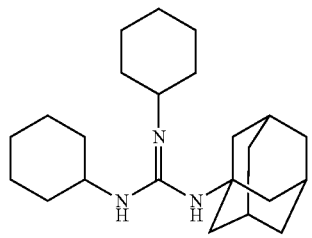

Log P: 5.17

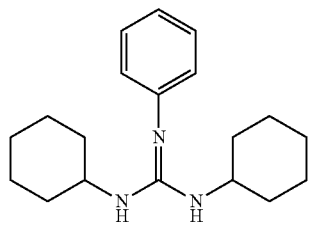

Log P: 5

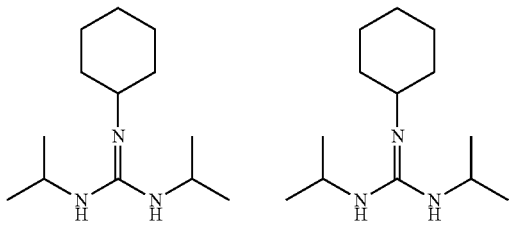

Log P: 3.1          Log P: 3.1

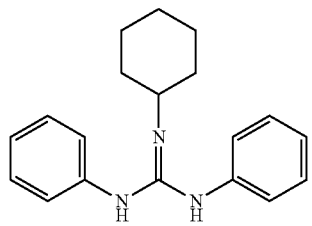

Log P: 5.12

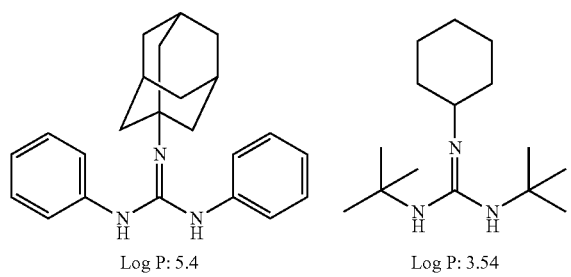
Log P: 5.4
Log P: 3.54
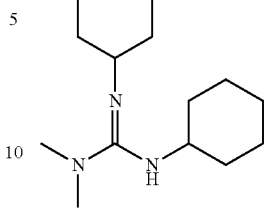
Log P: 3.72
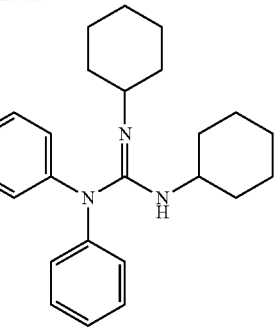
Log P: 7.21
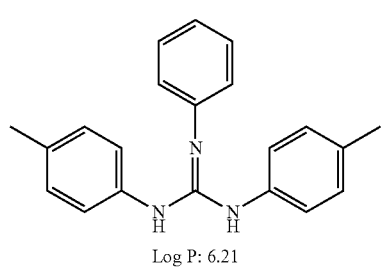
Log P: 6.21
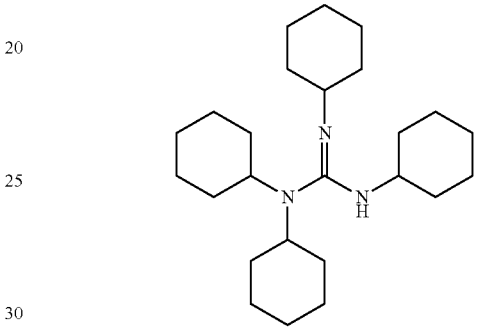
Log P: 6.81
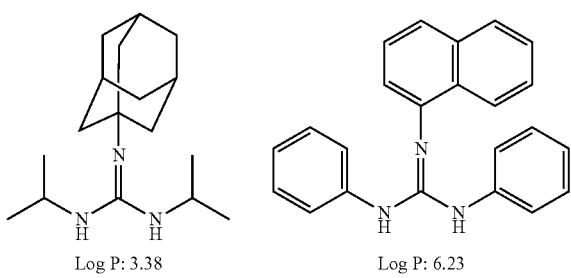
Log P: 3.38
Log P: 6.23
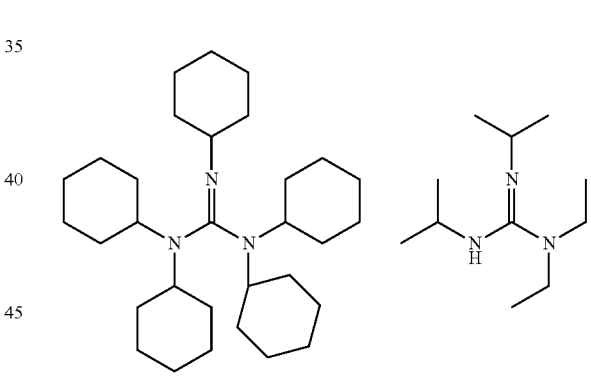
Log P: 8.74
Log P: 2.61
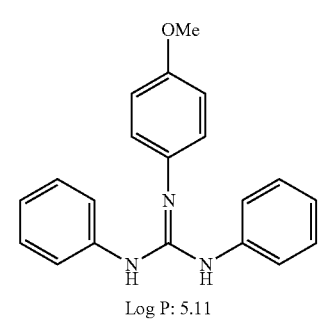
Log P: 5.11
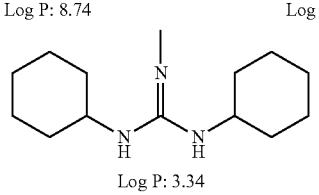
Log P: 3.34
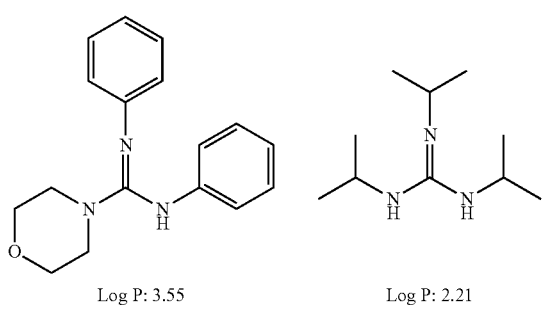
Log P: 3.55
Log P: 2.21
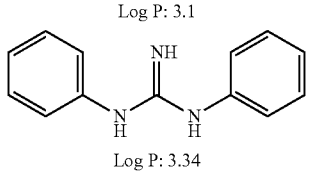
Log P: 3.1
Log P: 3.34

-continued
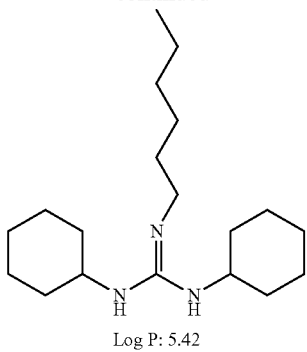
Log P: 5.42
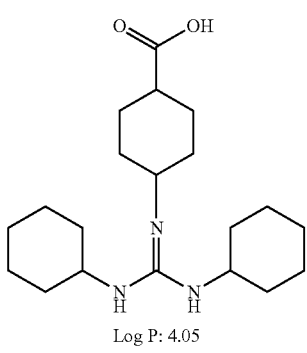
Log P: 4.05
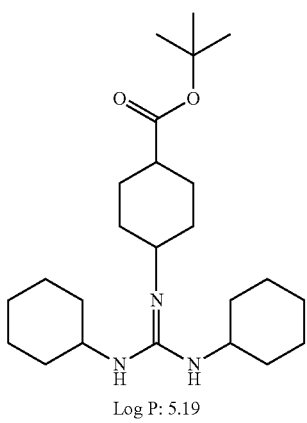
Log P: 5.19
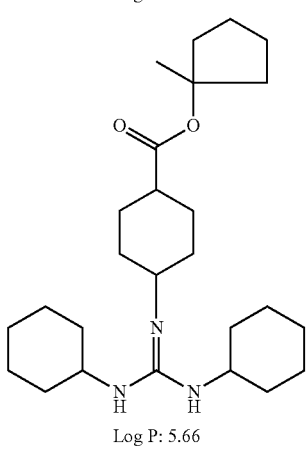
Log P: 5.66
-continued
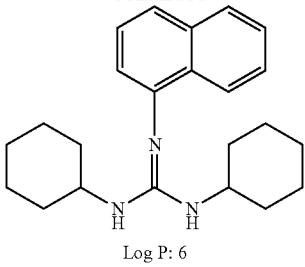
Log P: 6
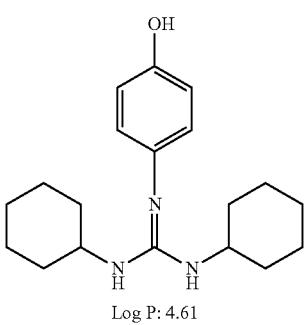
Log P: 4.61
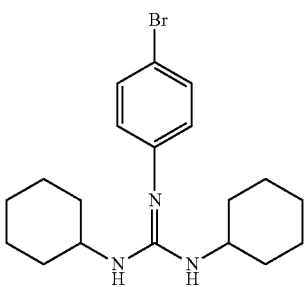
Log P: 5.83
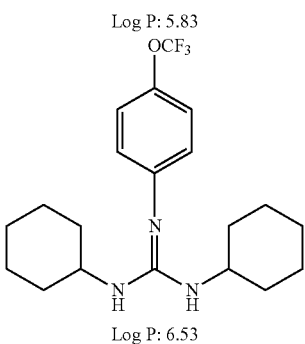
Log P: 6.53
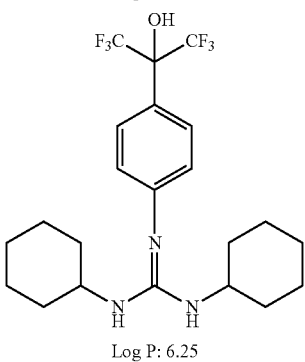
Log P: 6.25

-continued
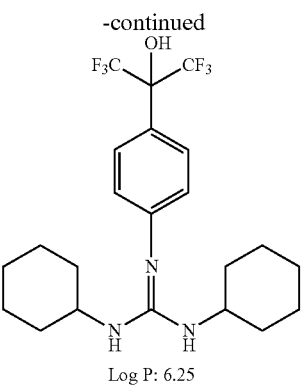
Log P: 6.25
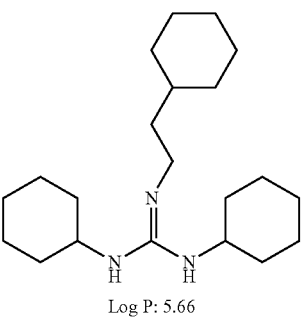
Log P: 5.66
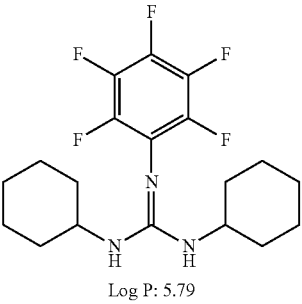
Log P: 5.79
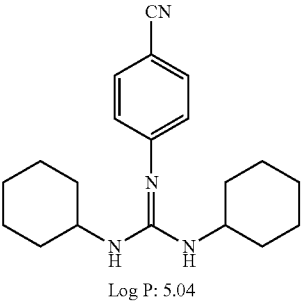
Log P: 5.04
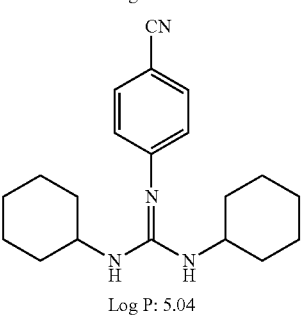
Log P: 5.04
-continued
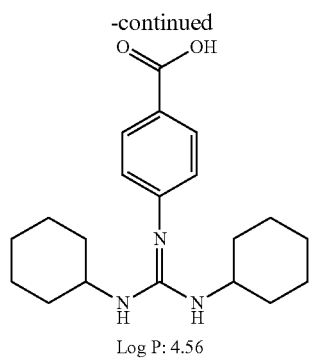
Log P: 4.56
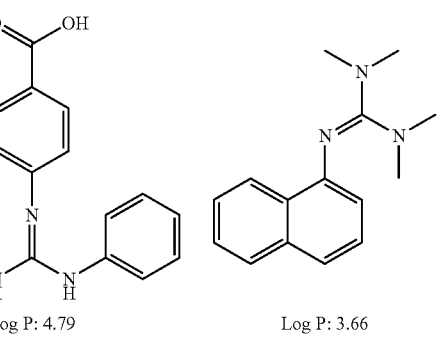
Log P: 4.79    Log P: 3.66
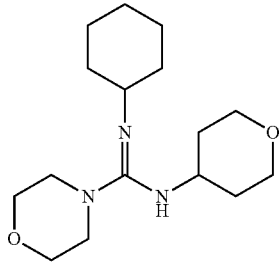
Log P: 1.56
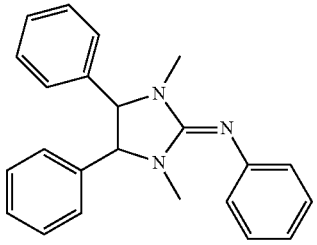
Log P: 5.84
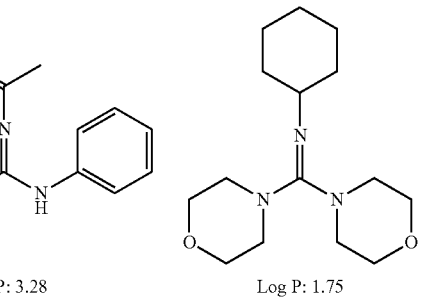
Log P: 3.28    Log P: 1.75

17
-continued
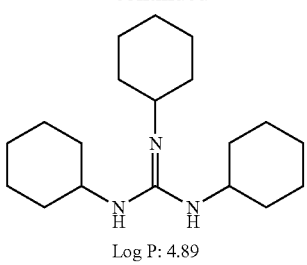
Log P: 4.89
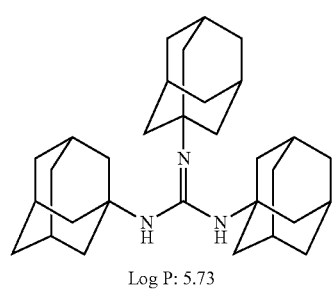
Log P: 5.73
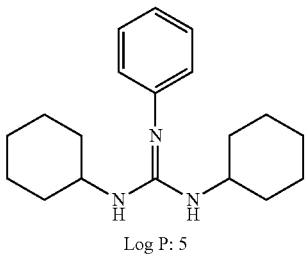
Log P: 5
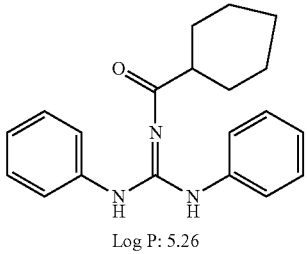
Log P: 5.26
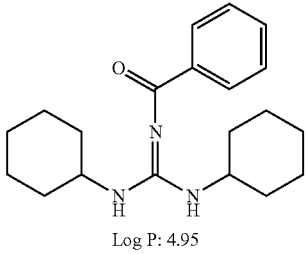
Log P: 4.95
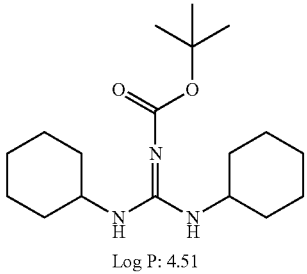
Log P: 4.51
18
-continued
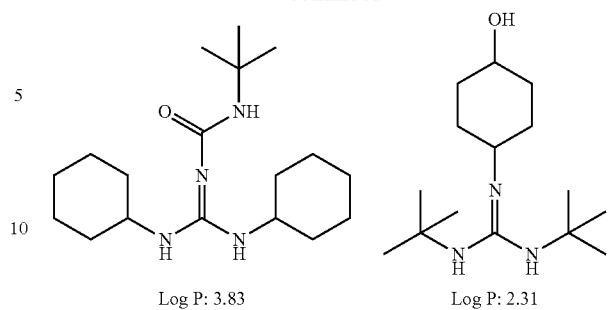
Log P: 3.83   Log P: 2.31
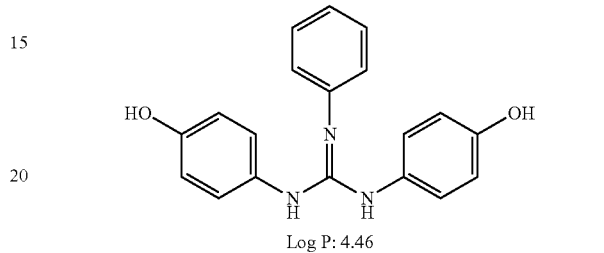
Log P: 4.46
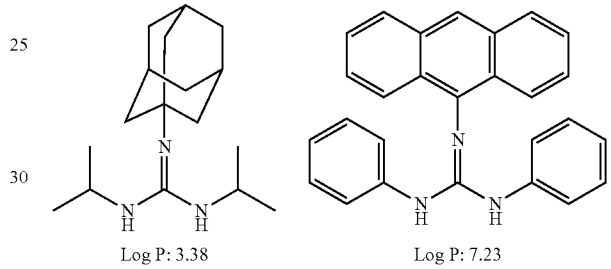
Log P: 3.38   Log P: 7.23
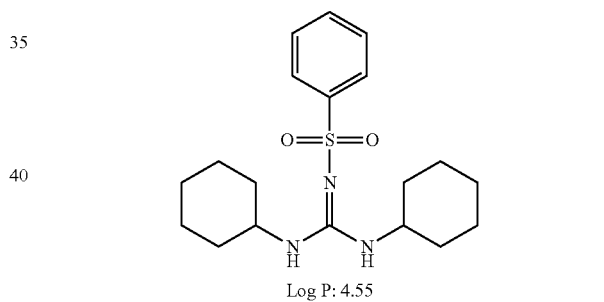
Log P: 4.55
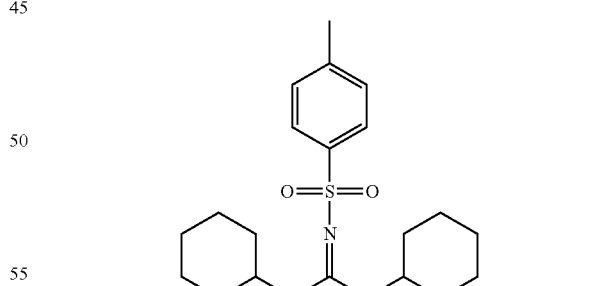
Log P: 5.04
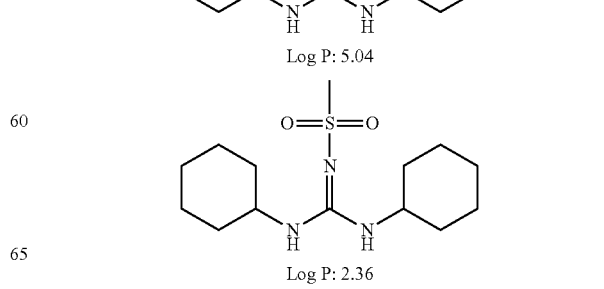
Log P: 2.36

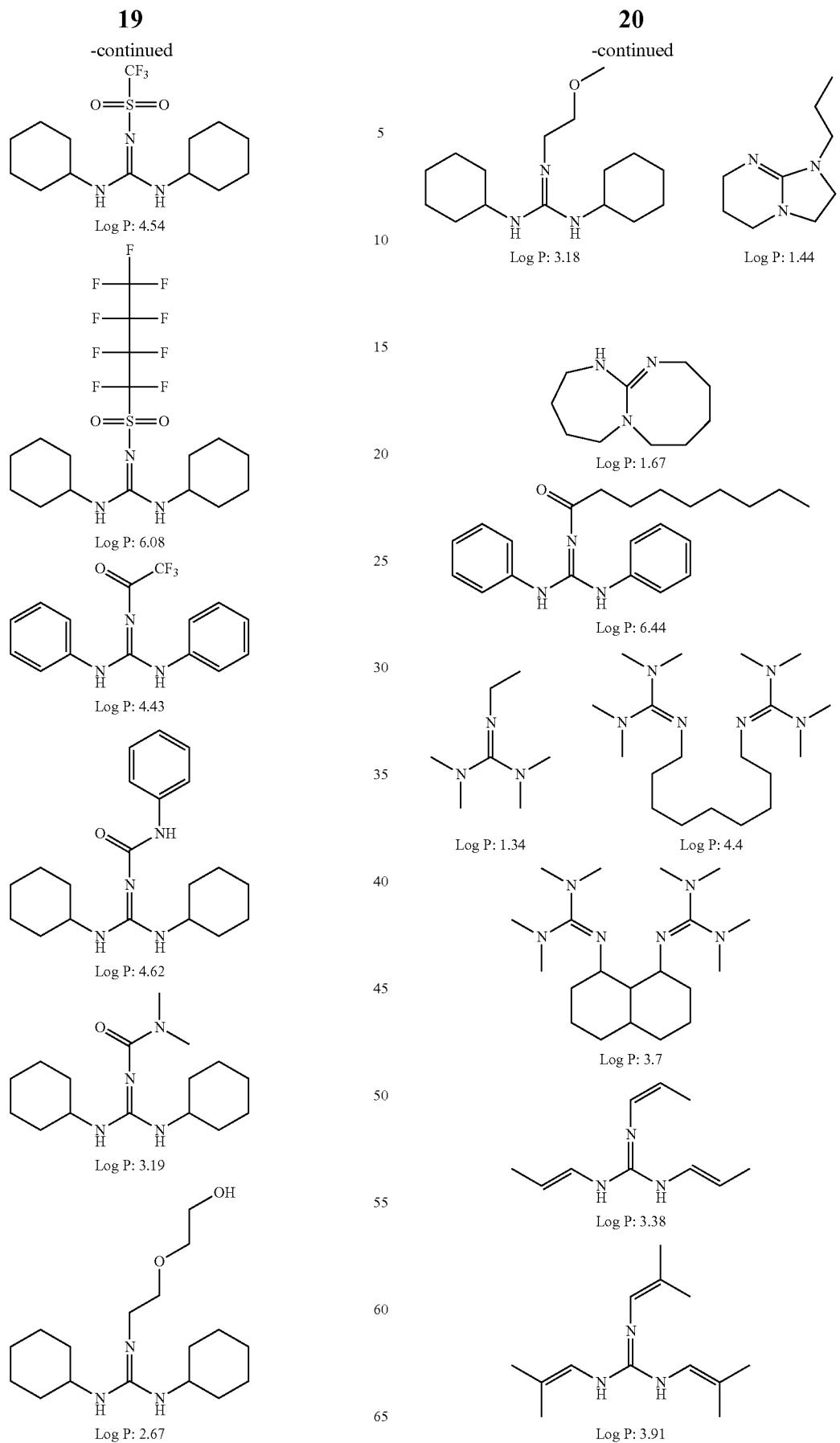

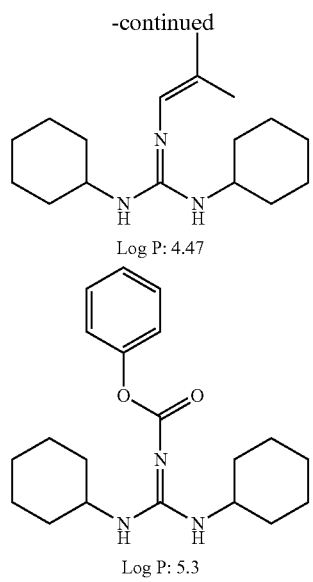

Log P: 4.47

Log P: 5.3

As for the guanidine compound (A), one compound may be used alone, or a plurality of compounds may be used in combination.

The content of the guanidine compound (A) is preferably from 0.01 to 40 mass %, more preferably from 0.1 to 30 mass %, still more preferably from 0.2 to 20 mass %, based on the entire solid content of the composition of the present invention.

The guanidine compound (A) is prepared by the method described, for example, in *European Journal of Organic Chemistry*, 2009, #23, pp. 3940-3952, *Journal fuer Praktische Chemie (Leipzig)*, 1983, Vol. 325, 5, pp. 787-802, and *Tetrahedron Letters*, 2002, Vol. 43, #1, pp. 49-52, and generally, the compound may be produced by reacting carbodiimide and amine.

[2] Photoacid Generator (B)

The photoacid generator is a compound capable of generating an acid upon irradiation with an actinic ray or radiation.

The photoacid generator which can be used may be appropriately selected, for example, from a photoinitiator for cationic photopolymerization, a photoinitiator for radical photopolymerization, a photo-decoloring agent for dyes, a photo-discoloring agent, a known compound capable of generating an acid upon irradiation with an actinic ray or radiation, which is used for microresist or the like, and a mixture thereof. Examples thereof include an onium salt such as sulfonium salt and iodonium salt, and a diazodisulfone compound such as a bis(alkylsulfonyldiazomethane).

Preferred examples of the photoacid generator include the compounds represented by the following formulae (ZX), (ZXI) and (ZXII):

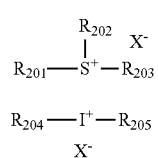

(ZX)

(ZXI)

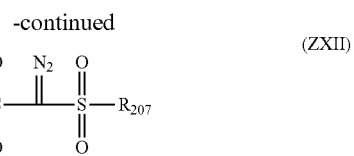

(ZXII)

In formula (ZX), each of $R_{201}$, $R_{202}$ and $R_{203}$ independently represents an organic group. The carbon number of the organic group as $R_{201}$, $R_{202}$ and $R_{203}$ is, for example, from 1 to 30, preferably from 1 to 20.

Two members out of $R_{201}$ to $R_{203}$ may combine to form a ring structure (including a condensed ring), and the ring may further contain an oxygen atom, a sulfur atom, an ester bond, an amide bond or a carbonyl group, in addition to the sulfur atom. Examples of the group formed by combining two members out of $R_{201}$ to $R_{203}$ include an alkylene group (e.g., butylenes group, pentylene group).

Examples of the organic group as $R_{201}$, $R_{202}$ and $R_{203}$ include the corresponding groups in the groups represented by (ZA-1-1), (ZA-1-2) and (ZA-1-3) described below. Above all, the groups represented by (ZA-1-1) and (ZA-1-3) are preferred.

The group (ZA-1-1) is described below.

The group (ZA-1-1) is a group having arylsulfonium as the cation, where at least one of $R_{201}$ to $R_{203}$ in formula (ZX) is an aryl group.

All of $R_{201}$ to $R_{203}$ may be an aryl group or a part of $R_{201}$ to $R_{203}$ may be an aryl group with the remaining being an alkyl group or a cycloalkyl group.

Examples of the group include groups corresponding to a triarylsulfonium, a diarylalkylsulfonium, an aryldialkylsulfonium, a diarylcycloalkylsulfonium and an aryldicycloalkylsulfonium.

The aryl group in the arylsulfonium is preferably a phenyl group or a naphthyl group. The aryl group may be an aryl group having a heterocyclic structure containing an oxygen atom, a nitrogen atom, a sulfur atom or the like. Examples of the heterocyclic structure include pyrrole, furan, thiophene, indole, benzofuran and benzothiophene structures.

In the case where the arylsulfonium has two or more aryl groups, these two or more aryl groups may be the same or different.

The alkyl group or cycloalkyl group which is present, if desired, in the arylsulfonium is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

Preferred groups represented by (ZA-1-1) include a triarylsulfonium and the structures represented by the following formulae (ZA-1-1A) and (ZA-1-1B):

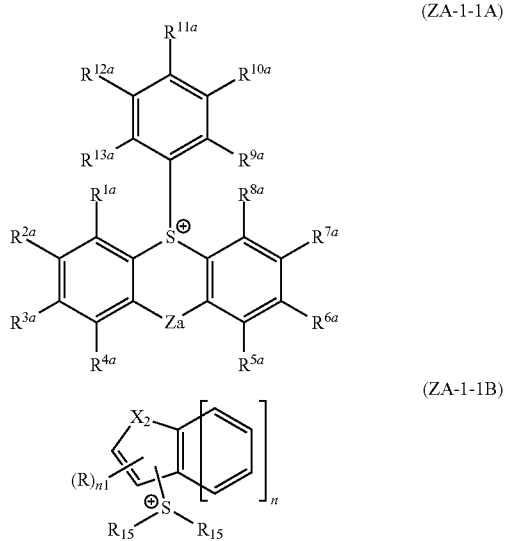

(ZA-1-1A)

(ZA-1-1B)

In formula (ZA-1-1A), each of $R^{1a}$ to $R^{13a}$ independently represents a hydrogen atom or a substituent, and at least one of $R^{1a}$ to $R^{13a}$ is preferably a substituent containing an alcoholic hydroxyl group.

Za represents a single bond or a divalent linking group.

The "alcoholic hydroxyl group" as used in the present invention indicates a hydroxyl group bonded to a carbon atom of a chain or cyclic alkyl group.

In the case where $R^{1a}$ to $R^{13a}$ are a substituent containing an alcoholic hydroxyl group, each of $R^{1a}$ to $R^{13a}$ is represented by —W—Y, wherein Y is a chain or cyclic alkyl group substituted with a hydroxyl group and W is a single bond or a divalent linking group.

Examples of the chain or cyclic alkyl group of Y include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, a cyclopropyl group, a cyclopentyl group, a cyclohexyl group, an adamantyl group, a norbornyl group and a boronyl group. Among these, an ethyl group, a propyl group, an isopropyl group, an n-butyl group, an isobutyl group and a sec-butyl group are preferred, and an ethyl group, a propyl group and an isopropyl group are more preferred. In particular, Y preferably contains a structure represented by —CH$_2$CH$_2$OH.

W is preferably a single bond or a divalent group formed by substituting a single bond for an arbitrary hydrogen atom in an alkoxy group, an acyloxy group, an acylamino group, an alkyl- or aryl-sulfonylamino group, an alkylthio group, an alkylsulfonyl group, an acyl group, an alkoxycarbonyl group or a carbamoyl group, more preferably a single bond or a divalent group formed by substituting a single bond for an arbitrary hydrogen atom in an acyloxy group, an alkylsulfonyl group, an acyl group or an alkoxycarbonyl group.

In the case where $R^{1a}$ to $R^{13a}$ are a substituent containing an alcoholic hydroxyl group, the number of carbons contained is preferably from 2 to 10, more preferably from 2 to 6, still more preferably from 2 to 4.

The alcoholic hydroxyl group-containing substituent as $R^{1a}$ to $R^{13a}$ may have two or more alcoholic hydroxyl groups. The number of alcoholic hydroxyl groups in the alcoholic hydroxyl group-containing substituent as $R^{1a}$ to $R^{13a}$ is from 1 to 6, preferably from 1 to 3, more preferably 1.

The number of alcoholic hydroxyl groups contained in the compound represented by formula (ZI-1A) is, in total of all of $R^{1a}$ to $R^{13a}$, preferably from 1 to 10, more preferably from 1 to 6, still more preferably from 1 to 3.

Each of $R^{1a}$ to $R^{13a}$ is preferably a hydrogen atom, a halogen atom, an alkyl group, a cycloalkyl group, a cyano group, an alkoxy group, an acyloxy group, an acylamino group, an aminocarbonylamino group, an alkoxycarbonylamino group, an alkyl- or aryl-sulfonylamino group, an alkylthio group, a sulfamoyl group, an alkyl- or aryl-sulfonyl group, an alkoxycarbonyl group or a carbamoyl group.

In the case where $R^{1a}$ to $R^{13a}$ contain no alcoholic hydroxyl group, each of $R^{1a}$ to $R^{13a}$ is more preferably a hydrogen atom, an alkyl group, a cycloalkyl group, a halogen atom or an alkoxy group.

Two adjacent members out of $R^{1a}$ to $R^{13a}$ may form a ring structure in cooperation (an aromatic or non-aromatic hydrocarbon ring or an heterocyclic ring; these rings may further combine to form a polycondensed ring; examples of the ring structure include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring and a phenazine ring).

In formula (ZA-1-1A), at least one of $R^{1a}$ to $R^{13a}$ contains an alcoholic hydroxyl group, and preferably, at least one of $R^{9a}$ to $R^{13a}$ contains an alcoholic hydroxyl group.

Za represents a single bond or a divalent linking group. Examples of the divalent linking group include an alkylene group, an arylene group, a carbonyl group, a sulfonyl group, a carbonyloxy group, a carbonylamino group, a sulfonylamido group, an ether bond, a thioether bond, an amino group, a disulfide group, an acyl group, an alkylsulfonyl group, —CH=CH—, —C≡C—, an aminocarbonylamino group and an aminosulfonylamino group, and these groups may have a substituent. Examples of the substituent are the same as those of the substituent described for $R^{1a}$ to $R^{13a}$. Za is preferably a single bond or a substituent having no electron-withdrawing group, such as alkylene group, arylene group, ether group, thioether group, amino group, —CH=CH—, —C≡C—, aminocarbonylamino group and aminosulfonyl group, more preferably a single bond, an ether group or a thioether group, still more preferably a single bond.

Formula (ZA-1-1B) is described below.

In formula (ZA-1-1B), each $R_{15}$ independently represents an alkyl group, a cycloalkyl group or a naphthyl group. Two $R_{15}$'s may combine with each other to form a ring.

$X_2$ represents any of —CR$_{21}$=CR$_{22}$—, —NR$_{23}$—, —S— and —O—, wherein each of $R_{21}$ and $R_{22}$ independently represents a hydrogen atom, an alkyl group, a cycloalkyl group or an aryl group, and $R_{23}$ represents a hydrogen atom, an alkyl group, a cycloalkyl group, an aryl group or an acyl group.

R represents, when a plurality of R's are present, each independently represents, a substituent. Examples of the substituent of R include corresponding groups in formulae (ZI-1) to (ZI-3) described below as preferred embodiments of formula (ZA-1-1B).

n represents an integer of 0 to 3.

n1 represents an integer of 0 to 11.

The alkyl group in $R_{15}$ and $R_{21}$ to $R_{23}$ may have a substituent and is preferably a linear or branched alkyl group having a carbon number of 1 to 20, and the alkyl chain may contain an oxygen atom, a sulfur atom or a nitrogen atom.

The alkyl group having a substituent includes particularly a group where a cycloalkyl group is substituted on a linear or branched alkyl group (for example, an adamantylmethyl group, an adamantylethyl group, a cyclohexylethyl group and a camphor residue group).

The cycloalkyl group in $R_{15}$ and $R_{21}$ to $R_{23}$, which may have a substituent, is preferably a cycloalkyl group having a carbon number of 3 to 20 and may contain an oxygen atom in the ring.

The aryl group in $R_{15}$ and $R_{21}$ to $R_{23}$ may have a substituent and is preferably an aryl group having a carbon number of 6 to 14.

Examples of the substituent which each of the above-described groups may have include a halogen atom, a hydroxyl group, a nitro group, a cyano group, a carboxy group, a carbonyl group, an alkyl group (preferably having a carbon number of 1 to 10), a cycloalkyl group (preferably having a carbon number of 3 to 10), an aryl group (preferably having a carbon number of 6 to 14), an alkoxy group (preferably having a carbon number of 1 to 10), an aryloxy group (preferably having a carbon number of 6 to 14), an acyl group (preferably having a carbon number of 2 to 20), an acyloxy group (preferably having a carbon number of 2 to 10), an alkoxycarbonyl group (preferably having a carbon number of 2 to 20), an aminoacyl group (preferably having a carbon number of 2 to 20), an alkylthio group (preferably having a carbon number of 1 to 10), and an arylthio group (preferably having a carbon number of 6 to 14). The cyclic structure in the aryl group, cycloalkyl group and the like and the aminoacyl group may further have, as a substituent, an alkyl group (preferably having a carbon number of 1 to 20).

The ring which may be formed by combining two $R_{15}$s with each other is a ring structure formed together with —S$^+$ in formula (ZA-1-1B) and is preferably a 5-membered ring containing one sulfur atom or a condensed ring containing the ring. The condensed ring is preferably a ring containing one sulfur atom and 18 or less carbon atom, more preferably a ring structure represented by the following formulae (IV-1) to (IV-3).

In the formulae, * represents a bond. R represents an arbitrary substituent, and examples thereof are the same as those of the substituent which may be substituted on each of the groups in $R_{15}$ and $R_{21}$ to $R_{23}$. n represents an integer of 0 to 4, and n2 represents an integer of 0 to 3.

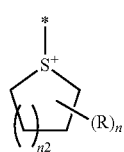

(IV-1)

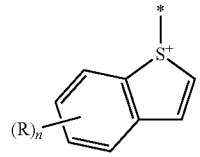

(IV-2)

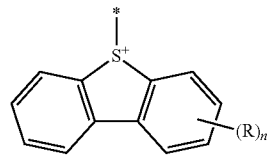

(IV-3)

Out of compounds represented by formula (ZA-1-1B), preferred cation structures include the following cation structures (ZI-1) to (ZI-3).

The cation structure (ZI-1) is a structure represented by the following formula (ZI-1);

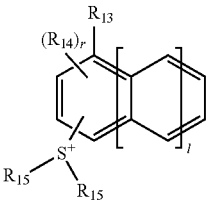

(ZI-1)

In formula (ZI-1), $R_{13}$ represents a hydrogen atom, a fluorine atom, a hydroxyl group, an alkyl group, a cycloalkyl group, an alkoxy group, an alkoxycarbonyl group, or a group having a monocyclic or polycyclic cycloalkyl framework.

$R_{14}$ represents, when a plurality of $R_{14}$s are present, each independently represents, an alkyl group, a cycloalkyl group, an alkoxy group, an alkylsulfonyl group, a cycloalkylsulfonyl group, a hydroxyl group, or a group having a monocyclic or polycyclic cycloalkyl framework.

Each $R_{15}$ independently represents an alkyl group, a cycloalkyl group or a naphthyl group. Two $R_{15}$'s may combine with each other to form a ring.

l represents an integer of 0 to 2.

r represents an integer of 0 to 8.

In formula (ZI-1), the alkyl group of $R_{13}$, $R_{14}$ and $R_{15}$ is preferably a methyl group, an ethyl group, an n-butyl group or a tert-butyl group.

The cycloalkyl group of $R_{13}$, $R_{14}$ and $R_{15}$ may be monocyclic or polycyclic and is preferably a cycloalkyl group having a carbon number of 3 to 12, and examples thereof include cyclopropyl, cyclobutyl, cyclopentyl, cyclohexyl, cycloheptyl, cyclooctyl, cyclododecanyl, cyclopentenyl, cyclohexenyl, cyclooctadienyl, bicycloheptyl (norbornyl), and adamantyl. Among these, cyclopropyl, cyclopentyl, cyclohexyl, cycloheptyl and cyclooctyl are preferred.

The alkoxy group of $R_{13}$ and $R_{14}$ is preferably a linear or branched alkoxy group having a carbon number of 1 to 10, and among these alkoxy group, a methoxy group, an ethoxy group, an n-propoxy group, an n-butoxy group, and the like are preferred.

The alkoxycarbonyl group of $R_{13}$ is preferably a linear or branched alkoxycarbonyl group having a carbon number of 2 to 11, and among these alkoxycarbonyl groups, a methoxycarbonyl group, an ethoxycarbonyl group, an n-butoxycarbonyl group, and the like are preferred.

Examples of the group having a monocyclic or polycyclic cycloalkyl framework of $R_{13}$ and $R_{14}$ include a monocyclic or polycyclic cycloalkyloxy group, and an alkoxy group having a monocyclic or polycyclic cycloalkyl group. These groups may further have a substituent.

The monocyclic or polycyclic cycloalkyloxy group of $R_{13}$ and $R_{14}$ preferably has a total carbon number of 7 or more, more preferably a total carbon number of 7 to 15, and preferably has a monocyclic cycloalkyl framework. The monocyclic cycloalkyloxy group having a total carbon number of 7 or more indicates a monocyclic cycloalkyloxy group where a cycloalkyloxy group such as cyclopropyloxy group, cyclobutyloxy group, cyclopentyloxy group, cyclohexyloxy group, cycloheptyloxy group, cyclooctyloxy group and cyclododecanyloxy group arbitrarily has a substituent such as alkyl group (e.g., methyl group, ethyl group, propyl group, butyl group, pentyl group, hexyl group, heptyl group, octyl group, dodecyl group, 2-ethylhexyl group, isopropyl group, sec-butyl group, tert-butyl group, isoamyl group), hydroxyl group, halogen atom (e.g., fluorine, chlorine, bromine, iodine), nitro group, cyano group, amido group, sulfonamido group, alkoxy group (e.g., methoxy group, ethoxy group, hydroxyethoxy group, propoxy group, hydroxypropoxy group, butoxy group), alkoxycarbonyl group (e.g., methoxycarbonyl group, ethoxycarbonyl group), acyl group (e.g., formyl group, acetyl group, benzoyl group), acyloxy group (e.g., acetoxy group, butyryloxy group) and carboxy group and where the total carbon number inclusive of the carbon number of an arbitrary substituent on the cycloalkyl group is 7 or more.

Examples of the polycyclic cycloalkyloxy group having a total carbon number of 7 or more include a norbornyloxy group, a tricyclodecanyloxy group, a tetracyclodecanyloxy group and an adamantyloxy group.

The alkoxy group having a monocyclic or polycyclic cycloalkyl framework of $R_{13}$ and $R_{14}$ preferably has a total carbon number of 7 or more, more preferably a total carbon number of 7 to 15, and is preferably alkoxy group having a monocyclic cycloalkyl framework. Examples thereof include a cyclohexylmethoxy group, a cyclopentylethoxy group and a cyclohexylethoxy group, with a cyclohexylmethoxy group being preferred.

Preferred examples of the alkoxy group having a total carbon number of 7 or more and having a polycyclic cycloalkyl framework include a norbornylmethoxy group and a norbornylethoxy group.

The alkylsulfonyl group or cycloalkylsulfonyl group of $R_{14}$ is preferably a linear, branched or cyclic alkylsulfonyl group having a carbon number of 1 to 10. Among these alkylsulfonyl groups and cycloalkylsulfonyl groups, a methanesulfonyl group, an ethanesulfonyl group, an n-propanesulfonyl group, an n-butanesulfonyl group, a cyclopentanesulfonyl group and a cyclohexanesulfonyl group are preferred.

l is preferably 0 or 1, more preferably 1.

r is preferably an integer of 0 to 2.

The ring structure which may be formed by combining two $R_{15}$'s with each other includes a 5- or 6-membered ring which a divalent group formed by combining two $R_{15}$s forms together with the sulfur atom in formula (ZI-1), and is preferably a 5-membered ring (that is, a tetrahydrothiophene ring). This ring may be condensed with an aryl group or a cycloalkyl group. The divalent group above may have a substituent, and examples of the substituent include an alkyl group, a cycloalkyl group, a hydroxyl group, a carboxyl group, a cyano group, a nitro group, an alkoxy group, an alkoxyalkyl group, an alkoxycarbonyl group and an alkoxycarbonyloxy group.

In formula (ZI-1), $R_{15}$ is preferably, for example, a methyl group, an ethyl group, a naphthyl group, or a divalent group which forms a tetrahydrothiophene ring structure together with the sulfur atom when two $R_{15}$'s are combined.

The alkyl group, cycloalkyl group, alkoxy group and alkoxycarbonyl group of $R_{13}$ and the alkyl group, cycloalkyl group, alkoxy group, alkylsulfonyl group and cycloalkylsulfonyl group of $R_{14}$ may be substituted as described above, and the substituent is preferably a hydroxyl group, an alkoxy group, an alkoxycarbonyl group or a halogen atom (particularly fluorine atom).

Specific preferred examples of the cation structure represented by formula (ZI-1) are illustrated below.

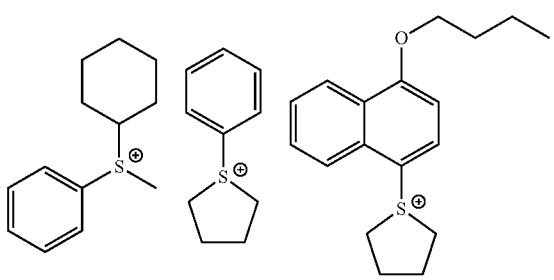

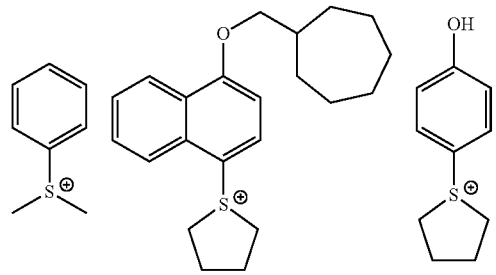

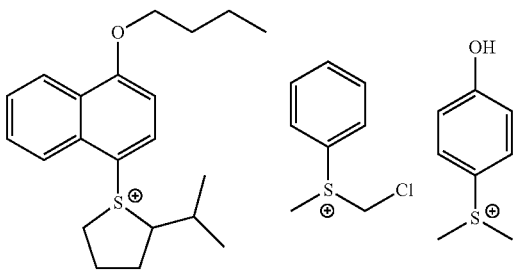

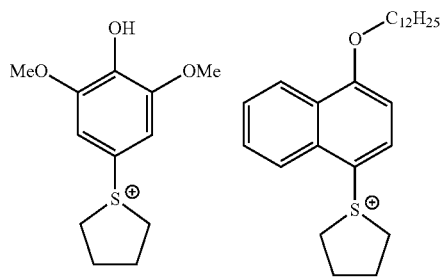

-continued

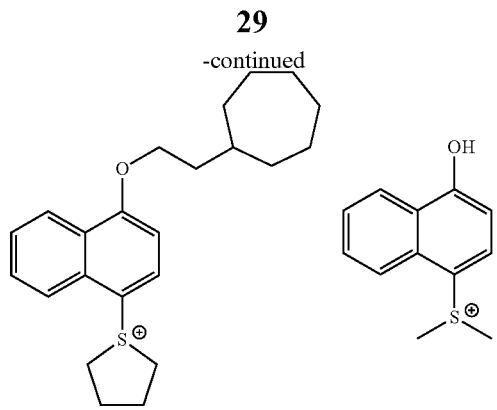

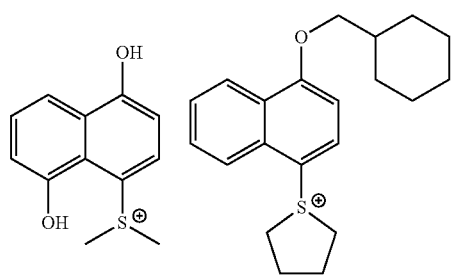

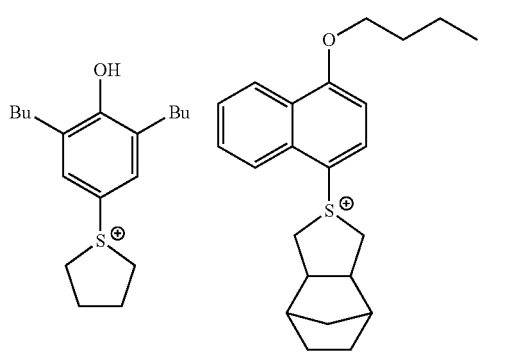

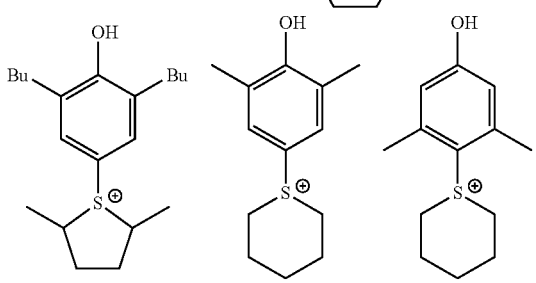

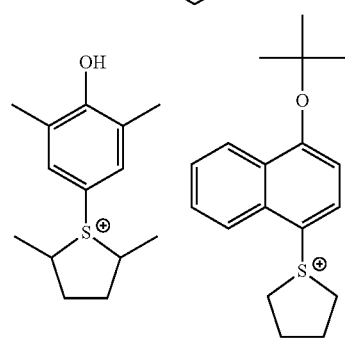

-continued

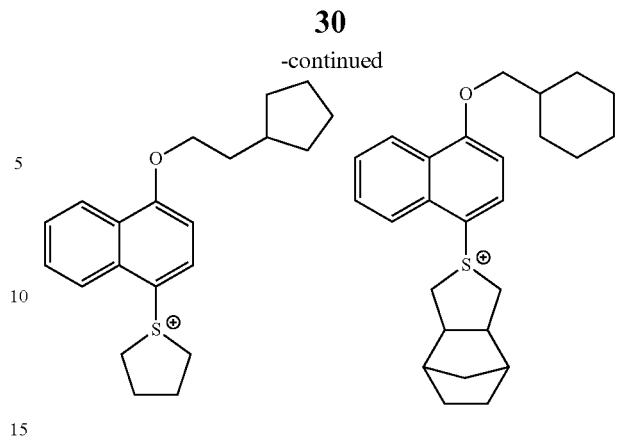

The cation structure (ZI-2) is a structure represented by the following formula (ZI-2):

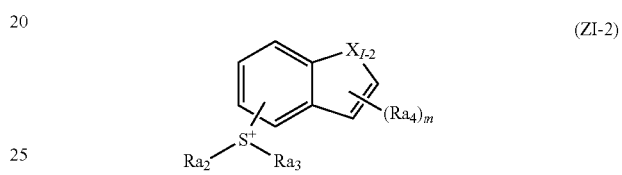

(ZI-2)

In formula (ZI-2), $X_{I-2}$ represents an oxygen atom, a sulfur atom or an —$NRa_1$— group, wherein $Ra_1$ represents a hydrogen atom, an alkyl group, a cycloalkyl group, an aryl group or an acyl group.

Each of $Ra_2$ and $Ra_3$ independently represents an alkyl group, a cycloalkyl group, an alkenyl group or a naphthyl group. $Ra_2$ and $Ra_3$ may combine with each other to form a ring.

$Ra_4$ represents, when a plurality of $Ra_4$'s are present, each independently represents, a monovalent group.

m represents an integer of 0 to 3.

Each of the group represented by —$S^+(Ra_2)(Ra_3)$ and m $Ra_4$'s may be substituted on an arbitrary position of carbon atoms constituting the 5- or 6-membered ring containing $X_{I-2}$ in formula (ZI-2).

The alkyl group of $Ra_1$ to $Ra_3$ is preferably a linear or branched alkyl group having a carbon number of 1 to 20, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group and an eicosyl group.

The cycloalkyl group of $Ra_1$ to $Ra_3$ is preferably a cycloalkyl group having a carbon number of 3 to 20, and examples thereof include a cyclopropyl group, a cyclobutyl group, a cyclopentyl group, a cyclohexyl group, a cyclooctyl group, an adamantyl group, a norbornyl group, an isoboronyl group, a camphanyl group, a dicyclopentyl group, an α-pinel group, a tricyclodecanyl group, a tetracyclododecyl group, and an androstanyl group.

The aryl group of $Ra_1$ to $Ra_3$ is preferably an aryl group having a carbon number of 6 to 10, and examples thereof include a phenyl group and a naphthyl group.

The acyl group of $Ra_1$ is preferably an acyl group having a carbon number of 2 to 20, and examples thereof include a formyl group, an acetyl group, a propanoyl group, a butanoyl group, a pivaloyl group, and a benzoyl group.

The alkenyl group of $Ra_2$ and $Ra_3$ is preferably an alkenyl group having a carbon number of 2 to 15, and examples thereof include a vinyl group, an allyl group, a butenyl group and a cyclohexenyl group.

As for the ring structure which may be formed by combining $Ra_2$ and $Ra_3$ with each other, the groups preferably form a 5- or 6-membered ring together with the sulfur atom in formula (ZI-2), more preferably a 5-membered ring (for example, a tetrahydrothiophene ring). The ring may contain an oxygen atom. Specific examples of the ring structure are the same as those of the ring which may be formed by combining $R_{15}$'s with each other in formula (ZI-1).

Examples of the monovalent group of $Ra_4$ include an alkyl group (preferably having a carbon number of 1 to 20), a cycloalkyl group (preferably having a carbon number of 3 to 20), an aryl group (preferably having a carbon number of 6 to 10), an alkoxy group (preferably having a carbon number of 1 to 20), an acyl group (preferably having a carbon number of 2 to 20), an acyloxy group (preferably having a carbon number of 2 to 20), a fluorine atom, a chlorine atom, a bromine atom, an iodine atom, a hydroxyl group, a carboxyl group, a nitro group, a cyano group, an alkoxycarbonyl group, an alkylsulfonyl group, an arylsulfonyl group, an arylcarbonyl group, an alkylcarbonyl group, and an alkenylcarbonyl group.

$Ra_1$ is preferably an alkyl group, more preferably an alkyl group having a carbon number of 1 to 4.

$Ra_2$ and $Ra_3$ preferably combine with each other to form a 5- or 6-membered ring.

Each of the groups in $Ra_1$ to $Ra_4$ may further substituent, and examples of the substituent which may or may not be substituted on are the same as those of the further substituent which each of the groups of $R_{13}$ to $R_{15}$ in formula (ZI-1) may have.

Specific preferred examples of the cation in the compound represented by formula (ZI-2) are illustrated below.

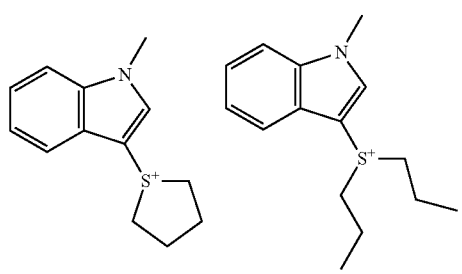

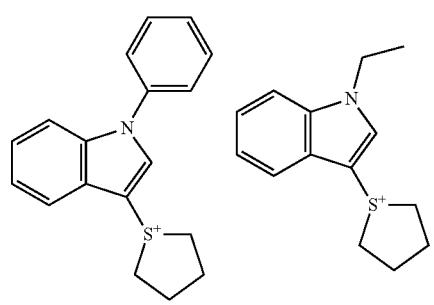

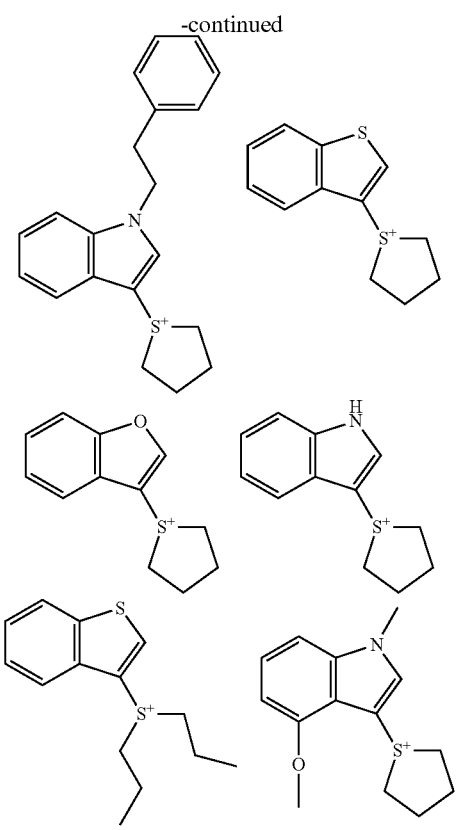

The cation structure (ZI-3) is a structure represented by the following formula (ZI-3):

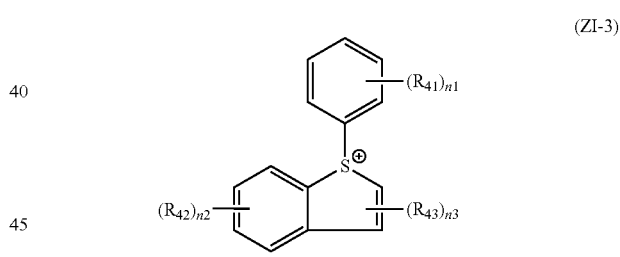

(ZI-3)

In formula (ZI-3), each of $R_{41}$ to $R_{43}$ independently represents an alkyl group, an acetyl group, an alkoxy group, a carboxy group, a halogen atom, a hydroxyl group or a hydroxyalkyl group.

Examples of the alkyl group and alkoxy group as $R_{41}$ to $R_{43}$ are the same as those for $R_{13}$ to $R_{15}$ in formula (ZI-1).

The hydroxyalkyl group is preferably a group formed by substituting a hydroxy group for one or a plurality of hydrogen atoms of the alkyl group above, and examples thereof include a hydroxymethyl group, a hydroxyethyl group and a hydroxypropyl group.

n1 is an integer of 0 to 3, preferably 1 or 2, more preferably 1.

n2 is an integer of 0 to 3, preferably 0 or 1, more preferably 0.

n3 is an integer of 0 to 2, preferably 0 or 1, more preferably 1.

Each of the groups in $R_{41}$ to $R_{43}$ may further have a substituent, and examples of the substituent which may be substituted on are the same as those of the further substituent which each of the groups of $R_{13}$ to $R_{15}$ in formula (ZI-1) may have.

Specific preferred examples of the cation in the compound represented by formula (ZI-3) are illustrated below.

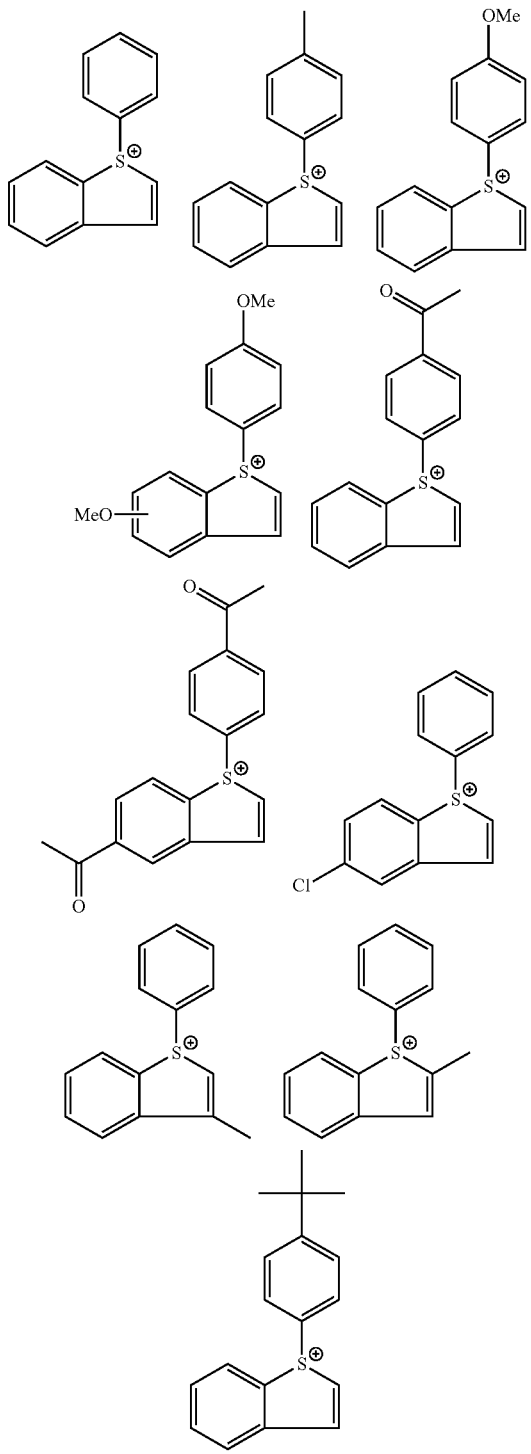

Among cation structures represented by formulae (ZI-1) to (ZI-3), the structures (ZI-1) and (ZI-2) are preferred, and (ZI-1) is more preferred.

The group (ZA-1-2) is described below.

The group (ZA-1-2) is a group where each of $R_{201}$ to $R_{203}$ in formula (ZX) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxocycloalkyl group.

The alkyl group and cycloalkyl group of $R_{201}$ to $R_{203}$ are preferably a linear or branched alkyl group having a carbon number of 1 to 10 (e.g., methyl group, ethyl group, propyl group, butyl group, pentyl group) and a cycloalkyl group having a carbon number of 3 to 10 (e.g., cyclopentyl group, cyclohexyl group, norbornyl group). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy group, ethoxy group, propoxy group, butoxy group, pentoxy group).

$R_{201}$ to $R_{203}$ may be further substituted with a halogen atom, an alkoxy group (for example, having a carbon number of 1 to 5), a hydroxyl group, a cyano group or a nitro group.

The group (ZA-1-3) is described below.

The group (ZA-1-3) is a group represented by the following formula, and this is a group having a phenacylsulfonium salt structure.

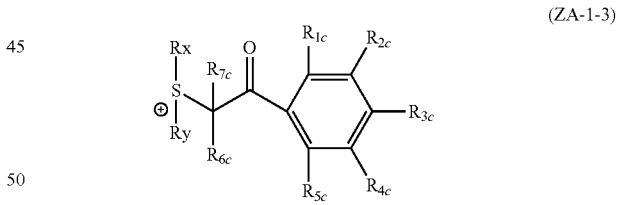

(ZA-1-3)

In formula (ZA-1-3), each of $R_{1c}$ to $R_{5c}$ independently represents a hydrogen atom, an alkyl group, a cycloalkyl group, an alkoxy group, a phenylthio group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more members out of $R_{1c}$ to $R_{5c}$, a pair of $R_{6c}$ and $R_{7c}$, or a pair of $R_x$ and $R_y$ may combine together to form a ring structure. This ring structure may contain an oxygen atom, a sulfur atom, an ester bond or an amide bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl group, ethyl group, linear or branched propyl group, linear or branched butyl group, linear or branched pentyl group).

The cycloalkyl group as $R_{1c}$ to $R_{7c}$ may either monocyclic or polycyclic and is, for example, a cycloalkyl group having a carbon number of 3 to 8 (e.g., cyclopentyl group, cyclohexyl group).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy group, ethoxy group, linear or branched propoxy group, linear or branched butoxy group, linear or branched pentoxy group) or a cyclic alkoxy group having a carbon number of 3 to 8 (e.g., cyclopentyloxy group, cyclohexyloxy group).

An embodiment where any one of $R_{1c}$ to $R_{5c}$ is a linear or branched alkyl group, a cycloalkyl group or a linear, branched or cyclic alkoxy group is preferred, and an embodiment where the sum of carbon numbers of $R_{1c}$ to $R_{5c}$ is from 2 to 15 is more preferred. Thanks to such a configuration, the solvent solubility is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{7c}$. Among these, a 2-oxoalkyl group, a 2-oxocycloalkyl group and an alkoxycarbonylmethyl group are preferred.

The 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group in $R_{1c}$ to $R_{5c}$.

Each of $R_x$ and $R_y$ is preferably an alkyl or cycloalkyl group having a carbon number of 4 or more, more preferably 6 or more, still more preferably 8 or more.

The ring structure which may be formed by combining $R_x$ and $R_y$ with each other includes a 5- or 6-membered ring formed by divalent $R_x$ and $R_y$ (for example, a methylene group, an ethylene group or a propylene group) together with the sulfur atom in formula (ZA-1-3), and a 5-membered ring (that is, a tetrahydrothiophene ring) is particularly preferred.

In formula (ZX), $X^-$ represents a non-nucleophilic anion. Examples of $X^-$ include a sulfonate anion, a bis(alkylsulfonyl)amide anion, a tris(alkylsulfonyl)methide anion, $BF_4^-$, $PF_6^-$ and $SbF_6^-$. $X^-$ is preferably an organic anion containing a carbon atom. Preferred organic anions include organic anions represented by the following formulae AN1 to AN3:

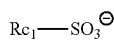

AN1

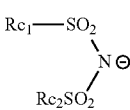

AN2

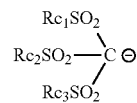

AN3

In formulae AN1 to AN3, each of $Rc_1$ to $Rc_3$ independently represents a single bond or an organic group. The organic group includes, for example, an organic group having a carbon number of 1 to 30 and is preferably an alkyl group, an aryl group, or a group formed by connecting a plurality of these groups through a linking group. Examples of the linking group include —O—, —CO$_2$—, —S—, —SO$_3$— and —SO$_2$N(Rd$_1$)-, wherein $Rd_1$ represents a hydrogen atom or an alkyl group and may form a ring structure together with the alkyl group or aryl group to which $Rd_1$ is bonded.

The organic group of $Rc_1$ to $Rc_3$ may be an alkyl group substituted with a fluorine atom or a fluoroalkyl group at the 1-position, or a phenyl group substituted with a fluorine atom or a fluoroalkyl group. By virtue of containing a fluorine atom or a fluoroalkyl group, the acidity of the acid generated upon irradiation with light can be increased and in turn, the sensitivity of the actinic ray-sensitive or radiation-sensitive resin composition can be enhanced. Incidentally, each of $Rc_1$ to $Rc_3$ may combine with another alkyl group, aryl group or the like to form a ring structure.

Preferred $X^-$ includes a sulfonate anion represented by the following formula (SA1) or (SA2)

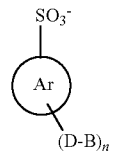

(SA1)

In the formula (SA1), Ar represents an aryl group and may further have a substituent other than the -(D-B) group.

n represents an integer of 1 or more. n is preferably 1 to 4, more preferably 2 or 3, and most preferably 3.

D represents a single bond or a divalent linking group. The divalent linking group is an ether group, a thioether group, a carbonyl group, a sulfoxide group, a sulfone group, a sulfonic acid ester group or an ester group.

B represents a hydrocarbon group.

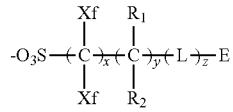

(SA-2)

In formula (SA2), each Xf independently represents a fluorine atom or an alkyl group with at least one hydrogen atom being substituted for by a fluorine atom.

Each of $R_1$ and $R_2$ independently represents a group selected from a hydrogen atom, a fluorine atom, an alkyl group and an alkyl group with at least one hydrogen atom being substituted for by a fluorine atom, and when a plurality of $R_1$'s or $R_2$'s are present, each $R_1$ or $R_2$ may be the same as or different from every other $R_1$ or $R_2$.

L represents a single bond or a divalent linking group and when a plurality of L's are present, each L may be the same as or different from every other L.

E represents a group having a cyclic structure.

x represents an integer of 1 to 20, y represents an integer of 0 to 10, and z represents an integer of 0 to 10.

The sulfonate anion represented by formula (SA1) is described in detail below.

In formula (SA1), from the standpoint of improving the roughness performance and enhancing the pattern profile at resolving, Ar is preferably a benzene ring, a naphthalene ring or an anthracene ring, more preferably a benzene ring.

In the case where Ar further has a substituent other than the -(D-B) group, from the standpoint of improving roughness, the substituent is preferably a linear alkyl group or a branched alkyl group.

In formula (SA1), D is preferably a single bond, an ether group or an ester group. D is more preferably a single bond.

In formula (SA1), B is, for example, an alkyl group, an alkenyl group, an alkynyl group, an aryl group or a cycloalkyl group. B is preferably an alkyl group or a cycloalkyl group. The alkyl group, alkenyl group, alkynyl group, aryl group and cycloalkyl group as B may have a substituent.

The alkyl group as B is preferably a branched alkyl group. Examples of the branched alkyl group include an isopropyl group, a tert-butyl group, a tert-pentyl group, a neopentyl group, a sec-butyl group, an isobutyl group, an isohexyl group, a 3,3-dimethylpentyl group and a 2-ethylhexyl group.

The cycloalkyl group as B may be a monocyclic cycloalkyl group or a polycyclic cycloalkyl group. Examples of the monocyclic cycloalkyl group include a cyclopropyl group, a cyclobutyl group, a cyclopentyl group, a cyclohexyl group, a cycloheptyl group and a cyclooctyl group. Examples of the polycyclic cycloalkyl group include an adamantyl group, a norbornyl group, a bornyl group, a campheryl group, a decahydronaphthyl group, a tricyclodecanyl group, a tetracyclodecanyl group, a camphoroyl group, a dicyclohexyl group, and a pinenyl group.

In the case where the alkyl group, alkenyl group, alkynyl group, aryl group and cycloalkyl group as B have a substituent, from the standpoint of satisfying both improved roughness and elevated sensitivity, the substituent is preferably a linear alkyl group or a branched alkyl group.

The sulfonate anion represented by formula (SA2) is described in detail below.

In formula (SA2), Xf is a fluorine atom or an alkyl group with at least one hydrogen atom being substituted for by a fluorine atom. The alkyl group is preferably an alkyl group having a carbon number of 1 to 10, more preferably an alkyl group having a carbon number of 1 to 4. The alkyl group substituted with a fluorine atom is preferably a perfluoroalkyl group.

Xf is preferably a fluorine atom or a perfluoroalkyl group having a carbon number of 1 to 4. Specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$, more preferably a fluorine atom or $CF_3$, and most preferably a fluorine atom.

In formula (SA2), each of $R_1$ and $R_2$ is a group selected from a hydrogen atom, a fluorine atom, an alkyl group and an alkyl group with at least one hydrogen atom being substituted for by a fluorine atom. The alkyl group which may be substituted with a fluorine atom is preferably an alkyl group having a carbon number of 1 to 4. Also, the alkyl group substituted with a fluorine atom is preferably a perfluoroalkyl group having a carbon number of 1 to 4. Specific examples thereof include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

In formula (SA2), x is preferably from 1 to 8, more preferably from 1 to 4, y is preferably from 0 to 4, more preferably 0, and z is preferably from 0 to 8, more preferably from 0 to 4.

In formula (SA2), L represents a single bond or a divalent linking group. Examples of the divalent linking group include —COO—, —OCO—, —CO—, —O—, —S—, —SO—, —SO$_2$—, an alkylene group, a cycloalkylene group, and an alkenylene group. Among these, —COO—, —OCO—, —CO—, —O—, —S—, —SO— and —SO$_2$— are preferred, and —COO—, —OCO— and —SO$_2$— are more preferred.

In formula (SA2), E represents a group having a cyclic structure. Examples of the group having a cyclic structure include a cyclic aliphatic group, an aryl group and a group having a heterocyclic structure.

The cyclic aliphatic group as E may have a monocyclic structure or a polycyclic structure. The cyclic aliphatic group having a monocyclic structure is preferably a monocyclic cycloalkyl group such as cyclopentyl group, cyclohexyl group and cyclooctyl group. The cyclic aliphatic group having a polycyclic structure is preferably a polycyclic cycloalkyl group such as norbornyl group, tricyclodecanyl group, tetracyclodecanyl group, tetracyclododecanyl group and adamantyl group. Above all, when a cyclic aliphatic group having a bulky structure of 6-membered or higher membered ring is employed, diffusion in the film in the PEB (post-exposure baking) step can be suppressed, and resolution and EL (exposure latitude) can be more enhanced.

The aryl group as E is, for example, a phenyl group, a naphthyl group, a phenanthryl group or an anthryl group.

The group having a heterocyclic structure as E may or may not have aromaticity. The heteroatom contained in this group is preferably a nitrogen atom or an oxygen atom. Above all, a furan ring, a thiophene ring, a pyridine ring, a piperidine ring and a morpholine ring are preferred.

As the photoacid generator, a compound having a plurality of structures represented by formula (ZX) may be used. For example, the photoacid generator may be a compound having a structure where at least one of $R_{201}$ to $R_{203}$ in a compound represented by formula (ZX) is bonded to at least one of $R_{201}$ to $R_{203}$ in another compound represented by formula (ZX).

Formulae (ZXI) and (ZXII) are described below.

In formulae (ZXI) and (ZXII), each of $R_{204}$ to $R_{207}$ independently represents an aryl group, an alkyl group or a cycloalkyl group. These aryl group, alkyl group and cycloalkyl group may have a substituent.

Preferred examples of the aryl group as $R_{204}$ to $R_{207}$ include the same groups as those enumerated for $R_{201}$ to $R_{203}$ in the compound (ZI-1).

Preferred examples of the alkyl group and cycloalkyl group as $R_{204}$ to $R_{207}$ include linear or branched alkyl groups and cycloalkyl groups enumerated for $R_{201}$ to $R_{203}$ in the compound (ZI-2).

$X^-$ in formula (ZXI) has the same meaning as $X^-$ in formula (ZX).

Other examples of the photoacid generator include compounds represented by the following formulae (ZIV), (ZV) and (ZVI):

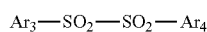

ZIV

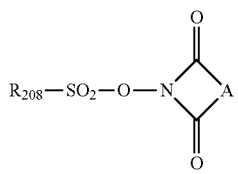

ZV

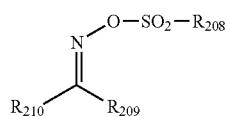

ZVI

In formulae (ZIV) to (ZVI), each of $Ar_3$ and $Ar_4$ independently represents a substituted or unsubstituted aryl group.

In formulae (ZV) and (ZVI), each $R_{208}$ independently represents an alkyl group, a cycloalkyl group or an aryl group. These alkyl group, cycloalkyl group and aryl group may be substituted or may not be substituted.

Each of these groups is preferably substituted with a fluorine atom. In this case, the strength of an acid generated from the photoacid generator can be increased.

Each of $R_{209}$ and $R_{210}$ independently represents an alkyl group, a cycloalkyl group, an aryl group or an electron-withdrawing group. These alkyl group, cycloalkyl group, aryl group and electron-withdrawing group may be substituted or may not be substituted.

$R_{209}$ is preferably a substituted or unsubstituted aryl group.

$R_{210}$ is preferably an electron-withdrawing group. Preferred electron-withdrawing groups include a cyano group and a fluoroalkyl group.

A represents an alkylene group, an alkenylene group or an arylene group. These alkylene group, alkenylene group and arylene group may have a substituent.

As the photoacid generator, a compound having a plurality of structures represented by formula (ZVI) is also preferred. Such a compound includes, for example, a compound where $R_{209}$ or $R_{210}$ in a compound represented by formula (ZVI) is bonded to $R_{209}$ or $R_{210}$ in another compound represented by formula (ZVI).

The photoacid generator is more preferably a compound represented by formulae (ZX) to (ZXII), still more preferably a compound represented by formula (ZX), yet still more preferably a compound where the cation structure of a compound represented by formula (ZX) is represented by formulae (ZI-1) to (ZI-3).

In the present invention, from the standpoint of improving the resolution or pattern profile by preventing an acid generated upon exposure from diffusing into the unexposed area, the compound (B) capable of generating an acid is preferably a compound capable of generating an acid having a size of 130 $Å^3$ or more in volume (more preferably a sulfonic acid), more preferably a compound capable of generating a sulfonic acid having a size of 270 $Å^3$ or more.

In view of sensitivity and/or solubility for a coating solvent, the volume above is preferably 2,000 $Å^3$ or less, more preferably 1,500 $Å^3$ or less.

This volume can be determined as follows by using "Win-MOPAC" produced by Fujitsu Limited. That is, the chemical structure of an acid according to each example is input. Using this structure as an initial structure, the most stable steric configuration of each acid is determined by molecular force field calculation using an MM3 method. Thereafter, molecular orbital calculation using a PM3 method is performed with respect to the most stable steric conformation, whereby the "accessible volume" of each acid can be computed.

Preferred examples of the anion moiety are illustrated below, but the present invention is not limited thereto. In these examples, the calculated value of volume (unit: $Å^3$) is shown together. The calculated value determined here is a volume value of an acid where a proton is bonded to the anion moiety.

| Anion | Volume* |
|---|---|
| (2,4,6-triisopropylphenyl-SO₃⁻) | 303 |
| (fluorinated ester with adamantyl) | 271 |
| (cyclic bis-sulfonimide with fluorines) | 136 |
| (fluorinated disulfonyl piperidide) | 244 |
| (camphorsulfonate) | 216 |
| (pentafluorophenyl-SO₃⁻) | 127 |
| (tris(trifluoromethylsulfonyl)methide) | 189 |

| Anion | Volume* |
|---|---|
| 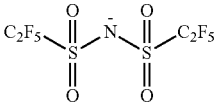 | 173 |
|  | 280 |
| 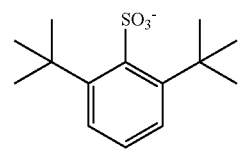 | 244 |
| 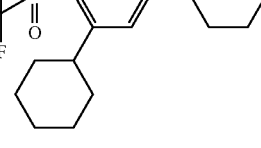 | 281 |
| 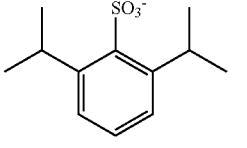 | 525 |
| 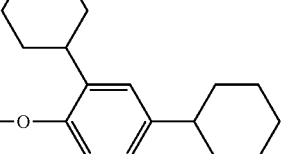 | 395 |
| 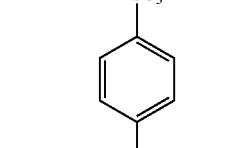 | 266 |
| Anion | Volume* |
|---|---|
|  | 582 |
| 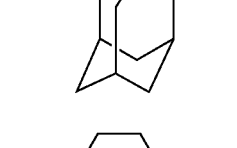 | 535 |
| 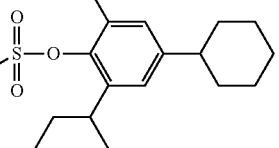 | 591 |
| 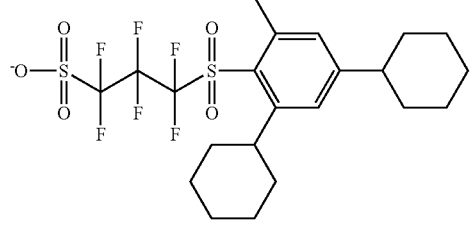 | 221 |
| 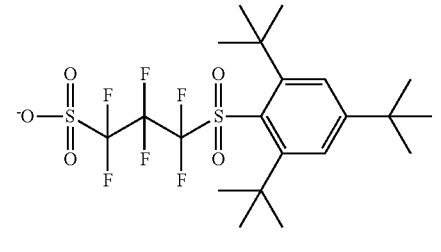 | 187 |
| 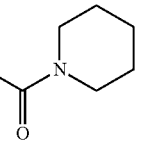 | 380 |
| 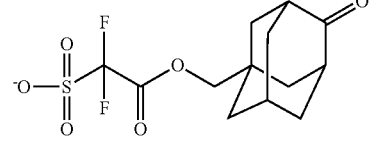 | 250 |

-continued

| Anion | Volume* |
|---|---|
| perfluorooctanesulfonate | 220 |
| perfluoro(2-(2,2,2-trifluoroethoxy)ethane)sulfonate | 141 |
| hexyl difluoro(sulfonato)acetate | 216 |
| propyl difluoro(sulfonato)acetate | 154 |
| 2,2-difluoro-N-propyl-2-sulfonatoacetamide | 161 |
| methyl difluoro(sulfonato)acetate | 113 |
| C₄F₉SO₃⁻ | 113 |
| 2,4,6-tricyclohexylbenzenesulfonate | 437 |
| 1,1,2,2,3,3-hexafluoro-3-(decahydroisoquinolin-2-ylsulfonyl)propane-1-sulfonate | 311 |
| N-(adamantylmethyl)-2,2-difluoro-2-sulfonatoacetamide | 277 |

-continued

| Anion | Volume* |
|---|---|
| 2,3,5,6-tetracyclohexylbenzenesulfonate | 529 |
| 2,5-dicyclohexylbenzenesulfonate | 338 |
| 2,4,6-tri-tert-butylbenzenesulfonate | 357 |
| 4-(adamantylmethoxy)benzenesulfonate | 310 |
| 2,6-diisopropylphenyl 3-(sulfonato)-1,1,2,2,3,3-hexafluoropropane-1-sulfonamide | 339 |
| 2,6-diisopropylphenyl 3-(sulfonato)-1,1,2,2,3,3-hexafluoropropane-1-sulfonate | 347 |
| adamantyl difluoro(sulfonato)acetate | 271 |

Specific examples of the photoacid generator are illustrated below. In some of these examples, the calculated value of volume is shown together. The calculated value determined here is a volume value of an acid where a proton is bonded to the anion moiety.
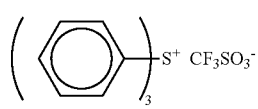
(z1)
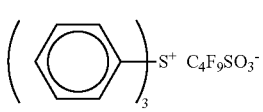
(z2)
113Å³

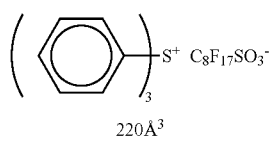
(z3)
220Å³
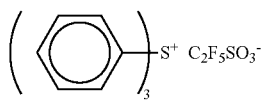
(z4)
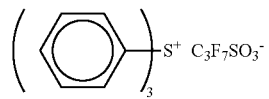
(z5)
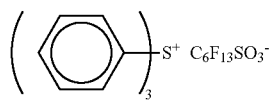
(z6)
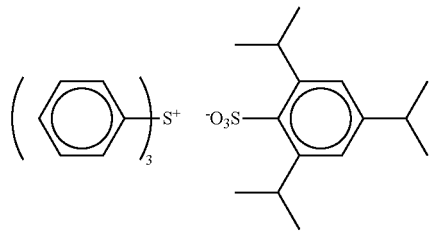
(z7)
303Å³
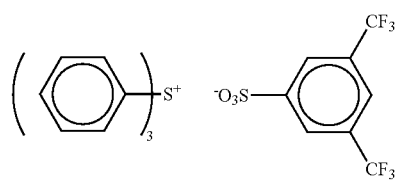
(z8)
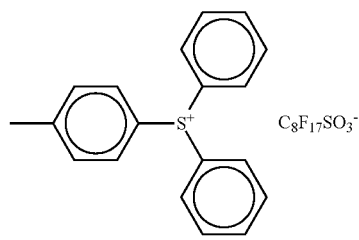
(z9)
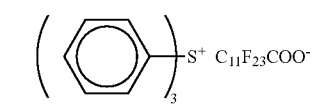
(z10)
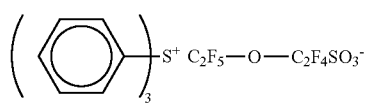
(z11)
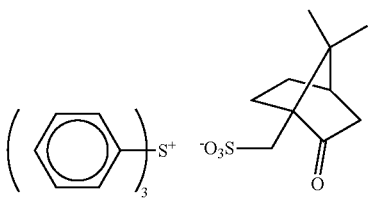
(z12)
216Å³
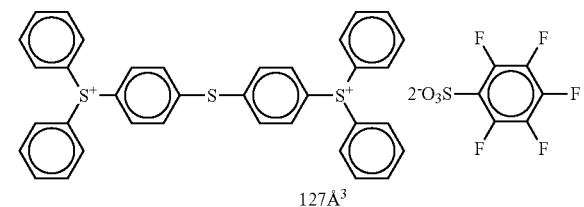
(z13)
127Å³
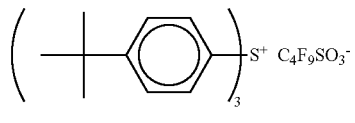
(z14)
127Å³
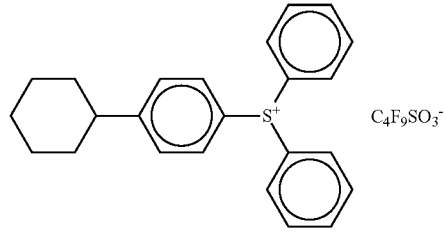
(z15)
113Å³
(z16)
113Å³
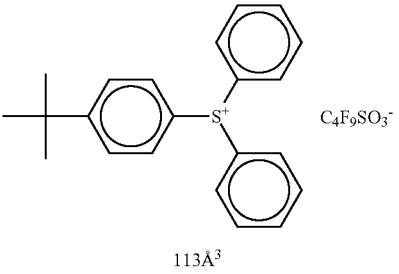
(z17)
113Å³

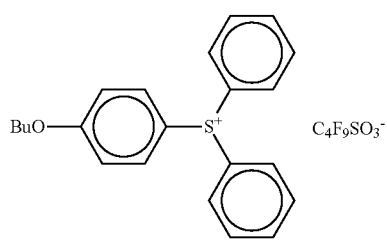 (z18)
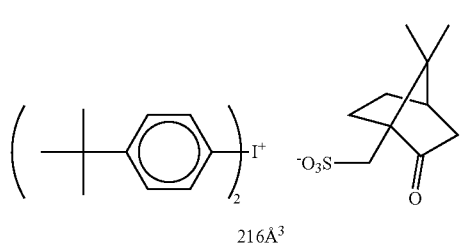 (z19)
216Å³
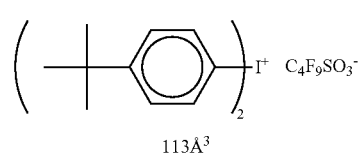 (z20)
113Å³
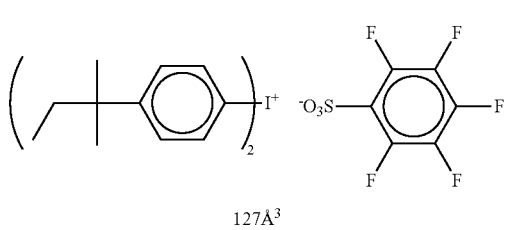 (z21)
127Å³
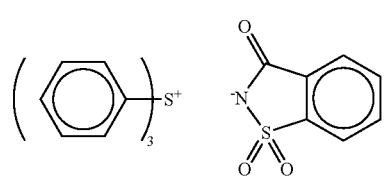 (z22)
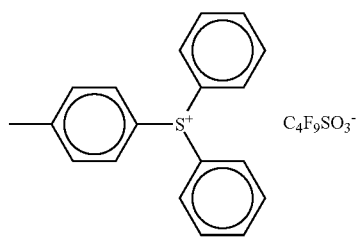 (z23)
113Å³
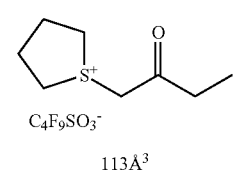 (z24)
C₄F₉SO₃⁻
113Å³
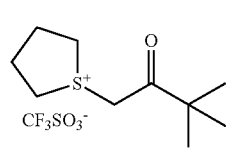 (z25)
113Å³
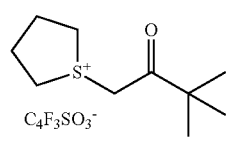 (z26)
113Å³
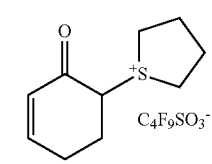 (z27)
113Å³
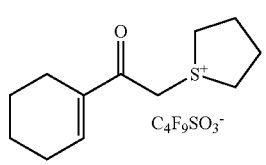 (z28)
113Å³
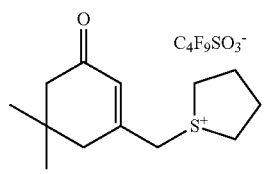 (z29)
113Å³
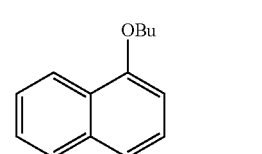 (z30)
113Å³
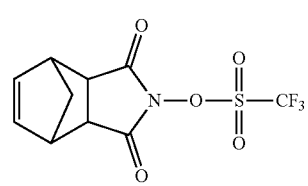 (z31)

(z32) 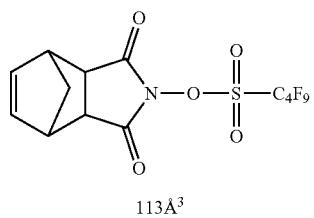
113Å³
(z33) 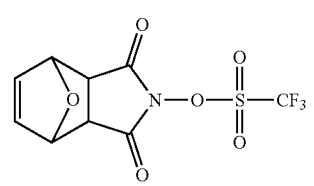
(z34) 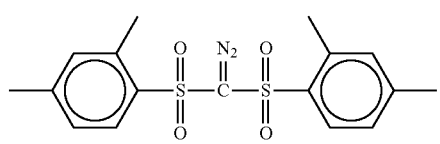
(z35) 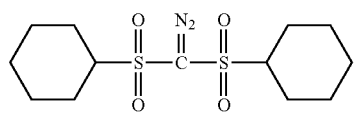
(z36) 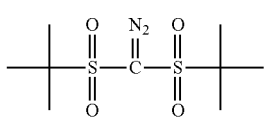
(z37) 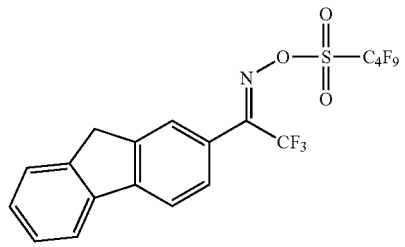
113Å³
(z38) 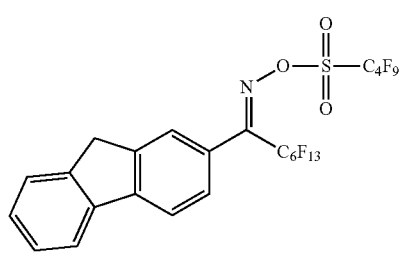
113Å³
(z39) 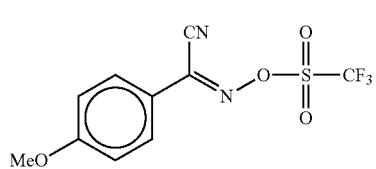
(z40) 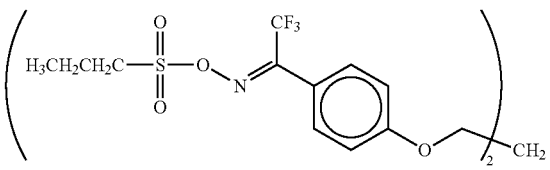
(z41) 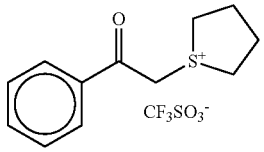
(z42) 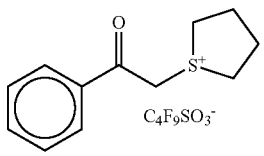
113Å³
(z43) 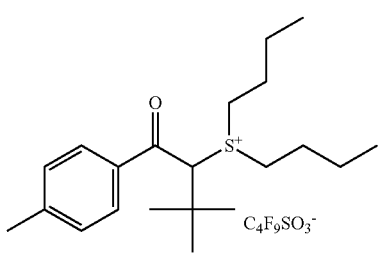
113Å³
(z44) 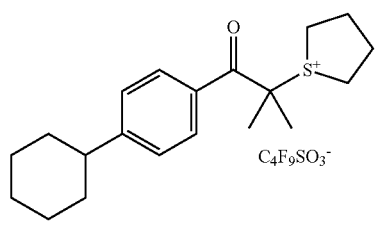
113Å³
(z45) 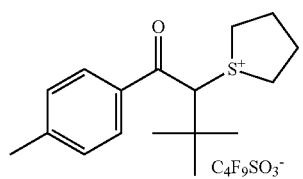
113Å³
(z46) 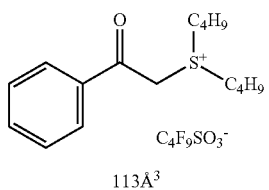
113Å³

(z47)
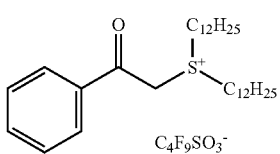
113Å³
(z48)
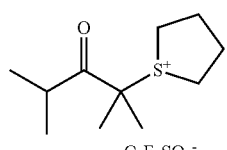
113Å³
(z49)
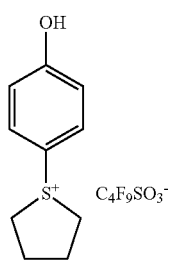
113Å³
(z50)
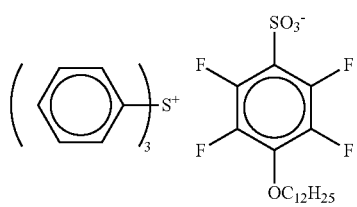
(z51)
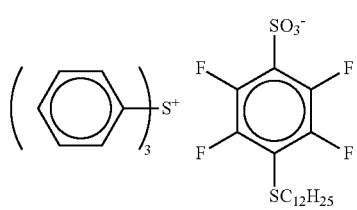
393Å³
(z52)
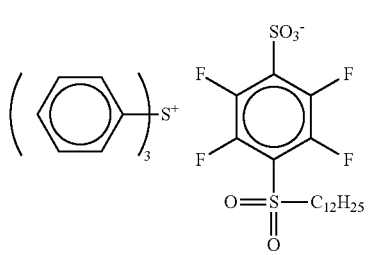
(z53)
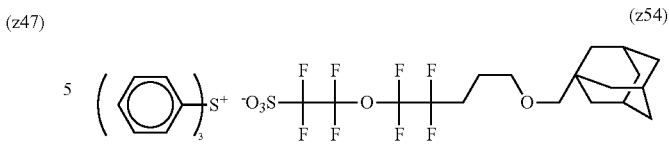
(z54)
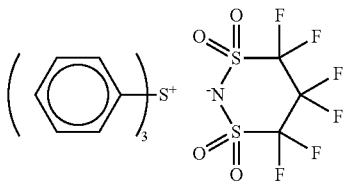
(z55)
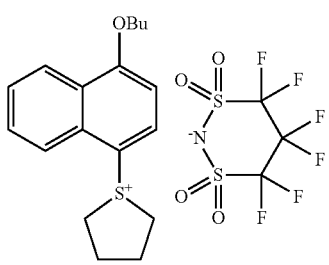
136Å³
(z57)
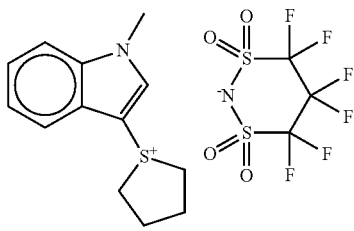
136Å³
(z58)
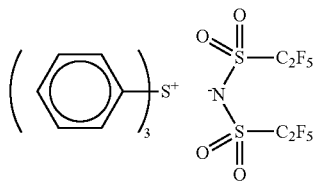
136Å³
(z59)
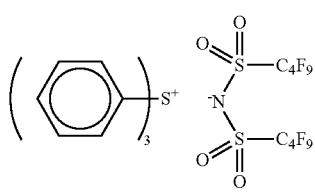
173Å³
(z60)

-continued
(z61)
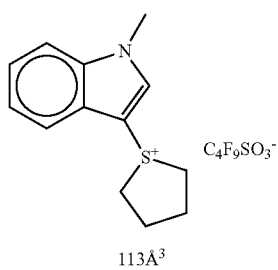
113Å³
(z62)
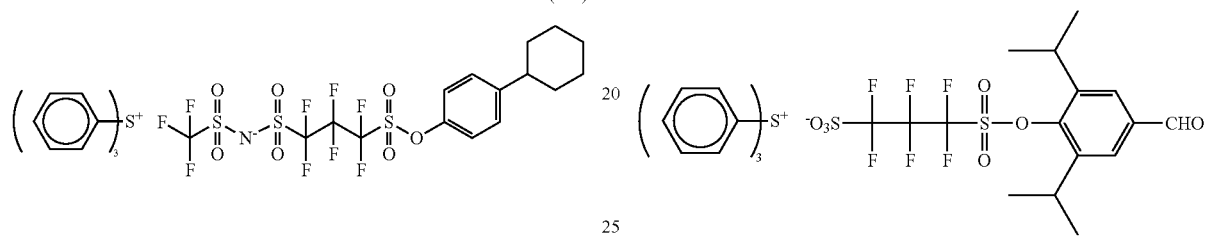
(z63)
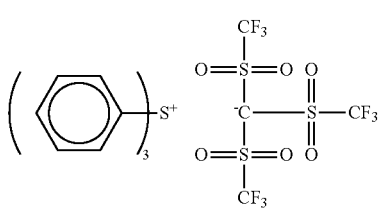
244Å³
(z64)
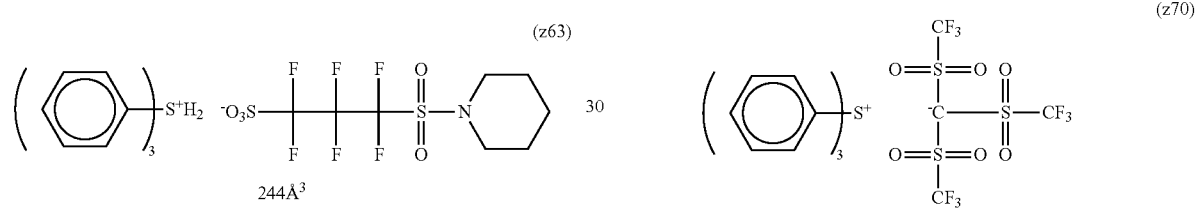
(z65)
(z66)
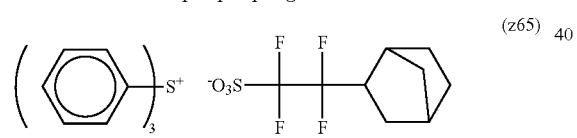
(z67)
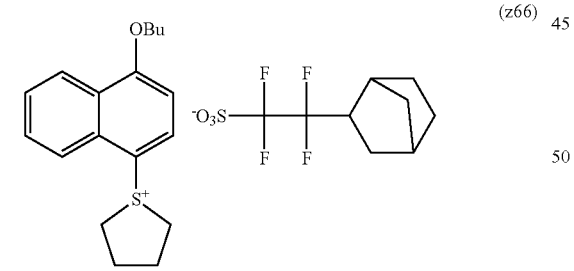
113Å³
-continued
(z68)
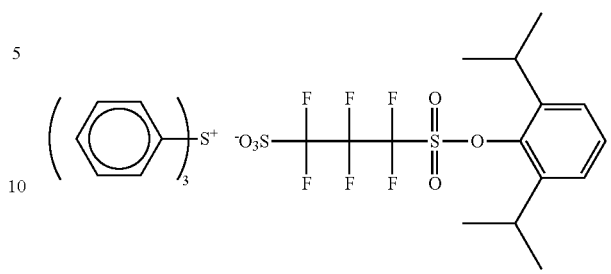
347Å³
(z69)
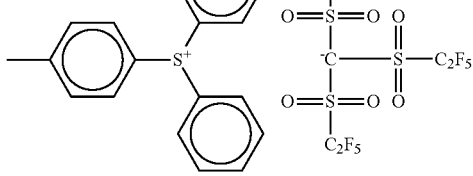
(z70)
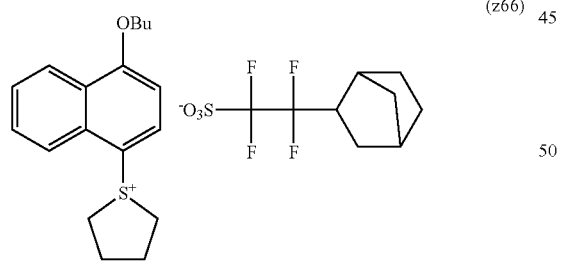
189Å³
(z71)
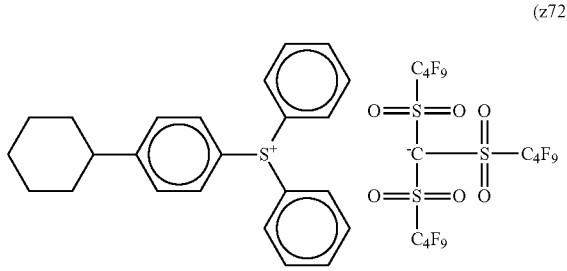
(z72)
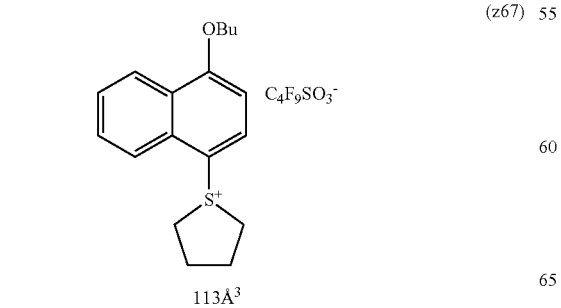
(z73)
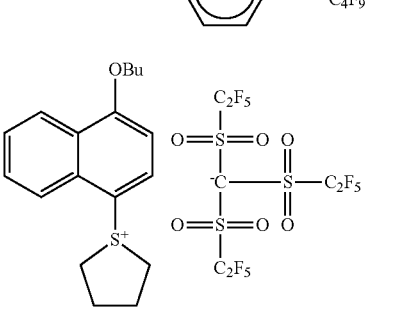

(z74)
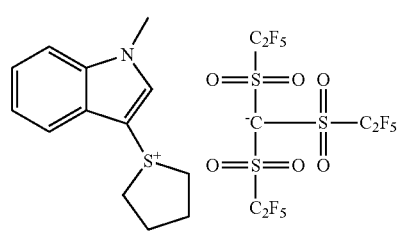
(z75)
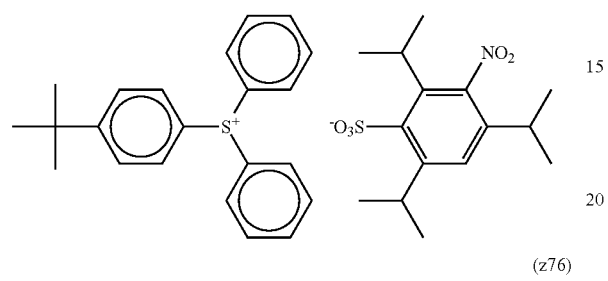
(z76)
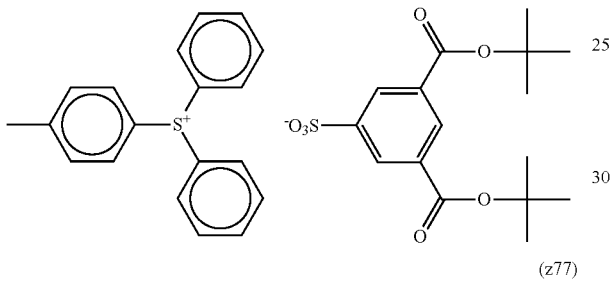
(z77)
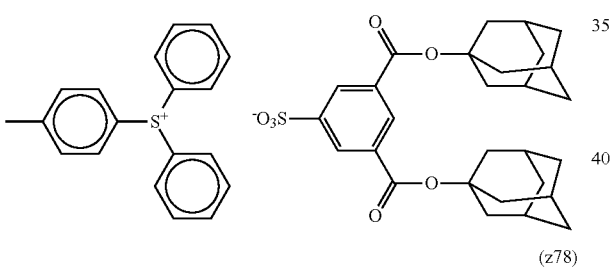
(z78)
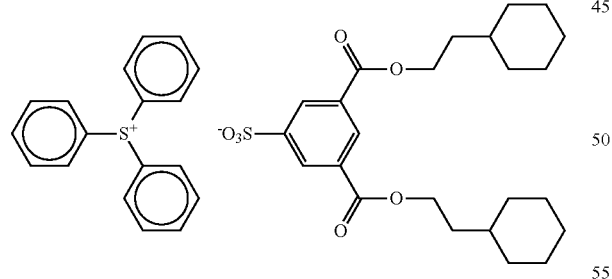
(z79)
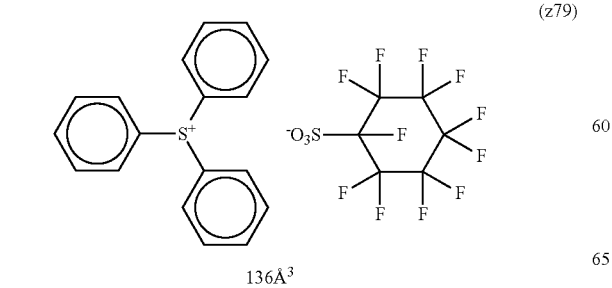
136Å$^3$
(z80)
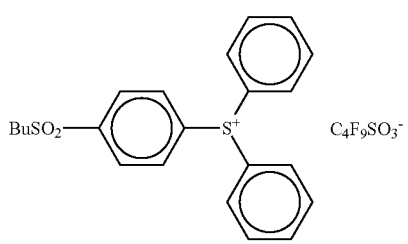
113Å$^3$
(z81)
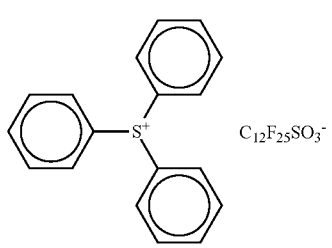
(z82)
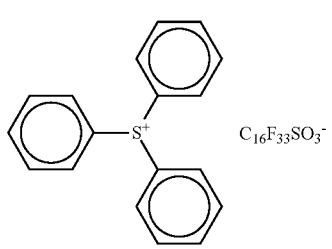
(z83)
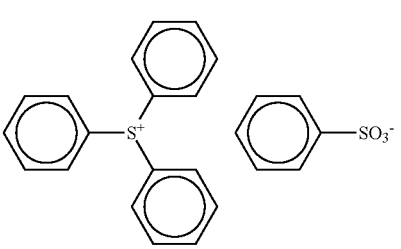
(z84)
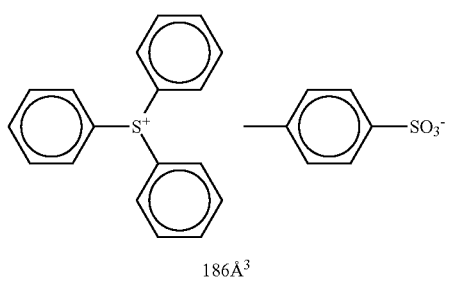
186Å$^3$
(z85)
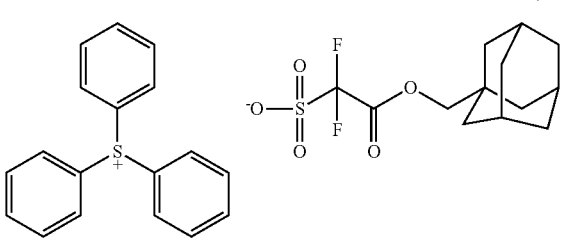
271Å$^3$ (z86)
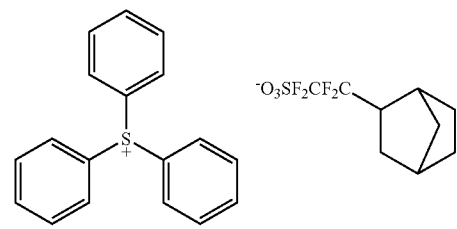
(z87)
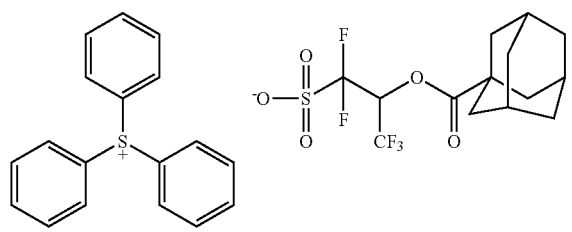
291Å³
(z88)
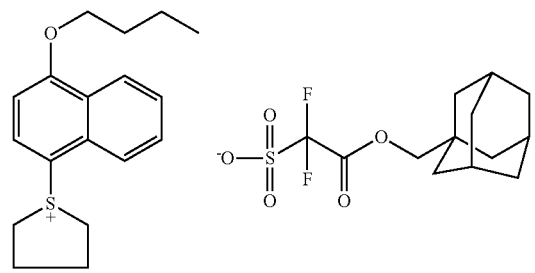
271Å³
(z89)
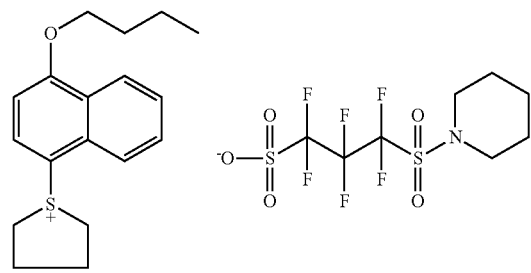
244Å³
(z90)
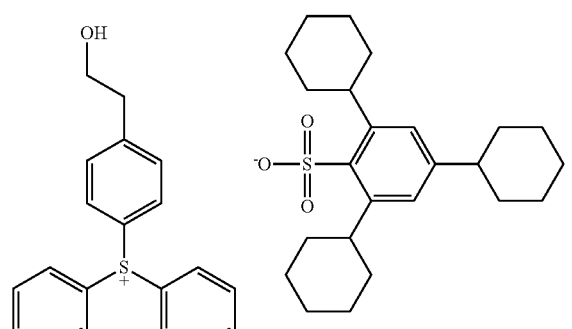
437Å³
(z91)
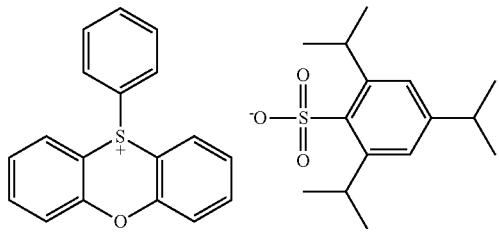
303Å³
(z92)
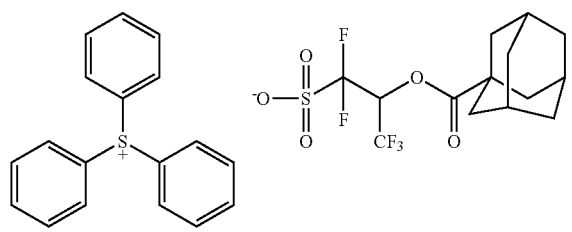
303Å³
(z93)
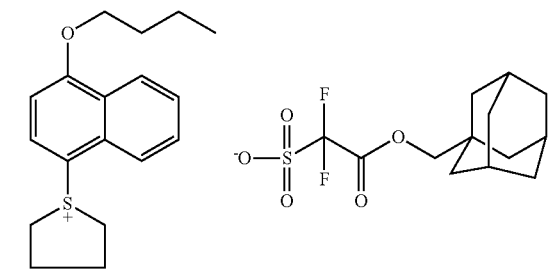
437Å³
(z94)
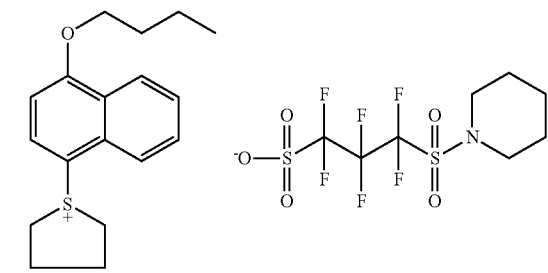
271Å³

-continued

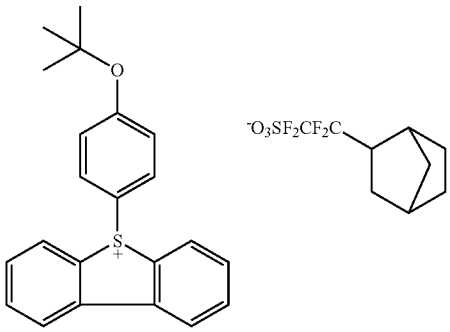
(z95)

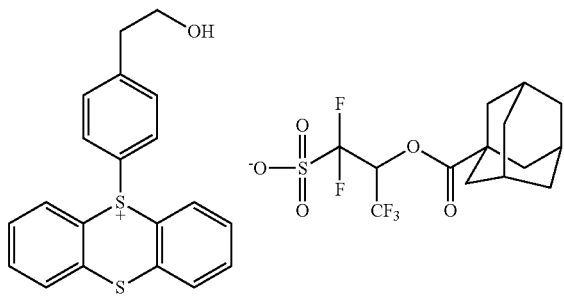
(z96)

291Å³

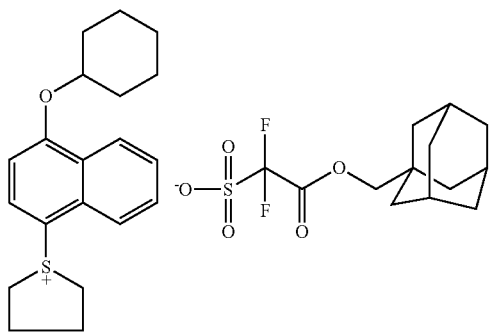
(z97)

271Å³

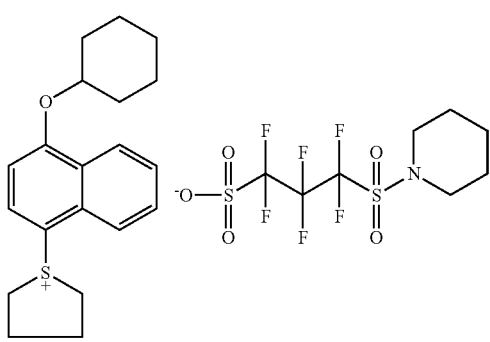
(z98)

244Å³

As for the photoacid generator, one kind of a compound may be used alone, or two or more kinds of compounds may be used in combination. In the case of using two or more kinds of compounds in combination, compounds capable of generating two kinds of organic acids differing in the number of all atoms excluding hydrogen atom by 2 or more are preferably combined.

The content of the photoacid generator is preferably from 0.1 to 40 mass %, more preferably from 0.5 to 30 mass %, still more preferably from 1 to 20 mass %, based on the entire solid content of the composition.

The composition of the present invention may be used as a positive resist composition or may be used as a negative resist composition.

In the former case, the composition of the present invention typically further contains [3] a resin capable of decomposing by the action of an acid to increase the solubility for an alkali developer (hereinafter, sometimes referred to as an "acid-decomposable resin"). Also, this composition may further contain [6] a compound having a molecular weight of 3,000 or less and being capable of decomposing by the action of an acid to increase the solubility for an alkali developer (hereinafter, sometimes referred to as a "dissolution inhibiting compound").

In the latter case, the composition of the present invention typically further contains [4] a resin soluble in an alkali developer (hereinafter, sometimes referred to as an "alkali-soluble resin) and [5] an acid crosslinking agent capable of crosslinking with the alkali-soluble resin by the action of an acid.

[3] Acid-Decomposable Resin

The acid-decomposable resin typically has a group capable of decomposing by the action of an acid to produce an alkali-soluble group (hereinafter sometimes referred to as an "acid-decomposable group"). The resin may have an acid-decomposable group in ether one or both of the main chain and the side chain of the resin. The resin preferably has an acid-decomposable group in the side chain.

The acid-decomposable group is preferably a group formed by replacing the hydrogen atom of an alkali-soluble group such as —COOH group and —OH group by a group capable of leaving by the action of an acid. The group capable of leaving by the action of an acid is preferably an acetal group or a tertiary ester group.

In the case where the acid-decomposable group is bonded as a side chain, the mother resin includes, for example, an alkali-soluble resin having an —OH or —COOH group in the side chain. Examples of such an alkali-soluble resin include those described later.

The alkali dissolution rate of the alkali-soluble resin is preferably 17 nm/sec or more, more preferably 33 nm/sec or more, as measured (at 23° C.) in an aqueous 2.38 mass % tetramethylammonium hydroxide (TMAH) solution.

From such a standpoint, the alkali-soluble resin is preferably a resin containing a hydroxystyrene structural unit, such as o-, m- or p-poly(hydroxystyrene) or a copolymer thereof, hydrogenated poly(hydroxystyrene), halogen- or alkyl-substituted poly(hydroxystyrene), partially O-alkylated or O-acylated poly(hydroxystyrene), styrene-hydroxystyrene copolymer, α-methylstyrene-hydroxystyrene copolymer and hydrogenated novolak resin; or a resin containing a repeating unit having a carboxyl group, such as (meth)acrylic acid and norbornene carboxylic acid.

Preferred examples of the repeating unit having an acid-decomposable group include tert-butoxycarbonyloxystyrene, 1-alkoxyethoxystyrene and tertiary alkyl (meth)acrylate. Among these repeating units, 2-alkyl-2-adamantyl (meth)acrylate and dialkyl(1-adamantyl)methyl (meth)acrylate are more preferred.

The resin capable of decomposing by the action of an acid to increase the solubility in an alkali developer can be obtained, for example, by reacting a resin with a precursor of a group capable of leaving by the action of an acid or by copolymerizing various monomers with an alkali-soluble resin monomer having bonded thereto a group capable of leaving by the action of an acid, and this is disclosed, for example, in European Patent 254853, JP-A-2-25850, JP-A-3-223860 and JP-A-4-251259.

In the case of irradiating the composition of the present invention with KrF excimer laser light, electron beam, X-ray or high-energy light at a wavelength of 50 nm or less (e.g., EUV), the resin above preferably has a hydroxystyrene repeating unit, and the resin is more preferably a copolymer of hydroxystyrene and hydroxystyrene protected by a group capable of leaving by the action of an acid, or a copolymer of hydroxystyrene and tertiary alkyl (meth)acrylate.

Such a resin specifically includes a resin having a repeating unit represented by the following formula (AO):

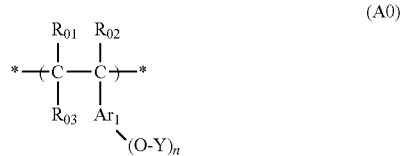

(AO)

In the formula, each of $R_{01}$, $R_{02}$ and $R_{03}$ independently represents, for example, a hydrogen atom, an alkyl group, a cycloalkyl group, a halogen atom, a cyano group or an alkoxycarbonyl group. $Ar_1$ represents an aromatic ring group. Also, $R_{03}$ may be an alkylene group and combine with $Ar_1$ as an aromatic ring group to form a ring together with the —C—C— chain, or $R_{03}$ and $Ar_1$ may be an alkylene group and combine with each other to form a ring, for example, a 5- or 6-membered ring, together with the —C—C— chain.

Each of n Y's independently represents a hydrogen atom or a group capable of leaving by the action of an acid. However, at least one Y represents a group capable of leaving by the action of an acid.

n represents an integer of 1 to 4 and is preferably 1 or 2, more preferably 1.

The alkyl group as $R_{01}$ to $R_{03}$ is, for example, an alkyl group having a carbon number of 20 or less and is preferably a methyl group, an ethyl group, a propyl group, an isopropyl group, an n-butyl group, a sec-butyl group, a hexyl group, a 2-ethylhexyl group, an octyl group or a dodecyl group. The alkyl group is more preferably an alkyl group having a carbon number of 8 or less. These alkyl groups may have a substituent.

As the alkyl group contained in the alkoxycarbonyl group, the same alkyl group as in $R_{01}$ to $R_{03}$ is preferred.

The cycloalkyl group may be either a monocyclic cycloalkyl group or a polycyclic cycloalkyl group. The cycloalkyl group is preferably a monocyclic cycloalkyl group having a carbon number of 3 to 8, such as cyclopropyl group, cyclopentyl group and cyclohexyl group. These cycloalkyl groups may have a substituent.

The halogen atom includes a fluorine atom, a chlorine atom, a bromine atom and an iodine atom, with a fluorine atom being preferred.

In the case where $R_{03}$ represents an alkylene group, the alkylene group is preferably an alkylene group having a carbon number of 1 to 8, such as methylene group, ethylene group, propylene group, butylene group, hexylene group and octylene group.

The aromatic ring group as $Ar_1$ is preferably an aromatic ring group having a carbon number of 6 to 14, and examples thereof include a benzene ring, a toluene ring and a naphthalene ring. These aromatic rings may have a substituent.

Examples of the group Y capable of leaving by the action of an acid include groups represented by —C($R_{36}$)($R_{37}$)($R_{38}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)($R_{38}$) and —CH($R_{36}$)(Ar).

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring structure.

Each of $R_{01}$ and $R_{02}$ independently represents a hydrogen atom, an alkyl group, a cycloalkyl group, an aryl group, an aralkyl group or an alkenyl group.

Ar represents an aryl group.

The alkyl group as $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group as $R_{36}$ to $R_{39}$, $R_{01}$ and $R_{02}$ may be a monocyclic cycloalkyl group or a polycyclic cycloalkyl group. The monocyclic cycloalkyl group is preferably a cycloalkyl group having a carbon number of 3 to 8, and examples thereof include a cyclopropyl group, a cyclobutyl group, a cyclopentyl group, a cyclohexyl group and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group. Incidentally, a part of carbon atoms in the cycloalkyl group may be substituted with a heteroatom such as oxygen atom.

The aryl group as $R_{36}$ to $R_{39}$, $R_{01}$, $R_{02}$ and Ar is preferably an aryl group having a carbon number of 6 to 10, and examples thereof include a phenyl group, a naphthyl group and an anthryl group.

The aralkyl group as $R_{36}$ to $R_{39}$, $R_{01}$ and $R_{02}$ is preferably an aralkyl group having a carbon number of 7 to 12, and preferred examples thereof include a benzyl group, a phenethyl group and a naphthylmethyl group.

The alkenyl group as $R_{36}$ to $R_{39}$, $R_{01}$ and $R_{02}$ is preferably an alkenyl group having a carbon number of 2 to 8, and examples thereof include a vinyl group, an allyl group, a butenyl group and a cyclohexenyl group.

The ring formed by combining $R_{36}$ and $R_{37}$ with each other may be either monocyclic or polycyclic. The monocyclic ring is preferably a cycloalkane structure having a carbon number of 3 to 8, and examples thereof include a cyclopropane structure, a cyclobutane structure, a cyclopentane structure, a cyclohexane structure, a cycloheptane structure and a cyclooctane structure. The polycyclic ring is preferably a cycloalkane structure having a carbon number of 6 to 20, and examples thereof include an adamantane structure, a norbornane structure, a dicyclopentane structure, a tricyclodecane structure and a tetracyclododecane structure. Incidentally, a part of carbon atoms in the ring structure may be substituted with a heteroatom such as oxygen atom.

Each of the groups above may have a substituent, and examples of the substituent include an alkyl group, a cycloalkyl group, an aryl group, an amino group, an amido group, a ureido group, a urethane group, a hydroxyl group, a carboxy group, a halogen atom, an alkoxy group, a thioether group, an acyl group, an acyloxy group, an alkoxycarbonyl group, a cyano group and a nitro group. The carbon number of the substituent is preferably 8 or less.

The structure may be a structure where a plurality of repeating units represented by formula (AO) are combined with each other at the portion of group Y capable of leaving by the action of an acid.

The group Y capable of leaving by the action of an acid is more preferably a structure represented by the following formula (B):

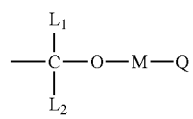

(B)

In the formula, each of $L_1$ and $L_2$ independently represents a hydrogen atom, an alkyl group, a cycloalkyl group, an aryl group or an aralkyl group.

M represents a single bond or a divalent linking group.

Q represents an alkyl group, a cycloalkyl group, a cyclic aliphatic group, an aromatic ring group, an amino group, an ammonium group, a mercapto group, a cyano group or an aldehyde group. The cyclic aliphatic group and the aromatic ring group may contain a heteroatom.

At least two members of Q, M and $L_1$ may combine with each other to form a 5- or 6-membered ring.

The alkyl group as $L_1$ and $L_2$ is, for example, an alkyl group having a carbon number of 1 to 8, and specific examples thereof include a methyl group, an ethyl group, a propyl group, an n-butyl group, a sec-butyl group, a hexyl group and an octyl group.

The cycloalkyl group as $L_1$ and $L_2$ is, for example, a cycloalkyl group having a carbon number of 3 to 15, and specific examples thereof include a cyclopentyl group, a cyclohexyl group, a norbornyl group and an adamantyl group.

The aryl group as $L_1$ and $L_2$ is, for example, an aryl group having a carbon number of 6 to 15, and specific examples thereof include a phenyl group, a tolyl group, a naphthyl group and an anthryl group.

The aralkyl group as $L_1$ and $L_2$ is, for example, an aralkyl group having a carbon number of 6 to 20, and specific examples thereof include a benzyl group and a phenethyl group.

Examples of the divalent linking group as M include an alkylene group (e.g., methylene group, ethylene group, propylene group, butylene group, hexylene group, octylene group), a cycloalkylene group (e.g., cyclopentylene group, cyclohexylene group), an alkenylene group (e.g., ethenylene, propenylene, butenylene), an arylene group (e.g., phenylene, tolylene, naphthylene), —S—, —O—, —CO—, —SO$_2$—, —N(R$_0$)—, and a combination of two or more thereof. Here, R$_0$ is a hydrogen atom or an alkyl group. The alkyl group as R$_0$ is, for example, an alkyl group having a carbon number of 1 to 8, and specific examples thereof include a methyl group, an ethyl group, a propyl group, an n-butyl group, a sec-butyl group, a hexyl group and an octyl group.

Examples of the alkyl group as Q are the same as those of respective groups as $L_1$ and $L_2$.

Examples of the cyclic aliphatic group and aromatic ring group represented by Q include the above-described cycloalkyl group and aryl group as $L_1$ and $L_2$. The cycloalkyl group and aryl group are preferably a group having a carbon number of 3 to 15.

Examples of the heteroatom-containing cyclic aliphatic group or aromatic ring group represented by Q include a group having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the ring is not limited thereto as long as it is a ring composed of carbon and a heteroatom or a ring composed of only a heteroatom.

Examples of the ring structure which may be formed by combining at least two members out of Q, M and $L_1$ with each other include a 5- or 6-membered ring structure where a propylene group or a butylene group is formed by the members above. The 5- or 6-membered ring structure contains an oxygen atom.

In formula (B), each of the groups represented by $L_1$, $L_2$, M and Q may have a substituent, and examples of the substituent include an alkyl group, a cycloalkyl group, an aryl group, an amino group, an amido group, a ureido group, a urethane group, a hydroxyl group, a carboxy group, a halogen atom, an alkoxy group, a thioether group, an acyl group, an acyloxy group, an alkoxycarbonyl group, a cyano group and a nitro group. The carbon number of the substituent is preferably 8 or less.

The group represented by -(M-Q) is preferably a group having a carbon number of 1 to 30, more preferably a group having a carbon number of 5 to 20. Particularly, from the standpoint of suppressing outgas, a group having a carbon number of 6 or more is preferred.

The content of the repeating unit represented by formula (AO) in the acid-decomposable resin is preferably from 10 to 90 mol %, more preferably from 10 to 70 mol %, still more preferably from 20 to 60 mol %, based on all repeating units.

Other preferred resins include a resin containing a repeating unit represented by the following formula (X):

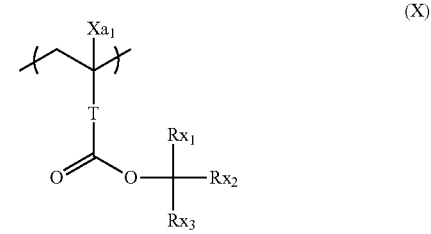

(X)

In formula (X), $Xa_1$ represents a hydrogen atom, a methyl group, a trifluoromethyl group or a hydroxymethyl group.

T represents a single bond or a divalent linking group.

Each of $Rx_1$ to $Rx_3$ independently represents a linear or branched alkyl group or a monocyclic or polycyclic cycloalkyl group. At least two members out of $Rx_1$ to $Rx_3$ may combine with each other to form a monocyclic or polycyclic cycloalkyl group.

Examples of the divalent linking group as T include an alkylene group, a —COO-Rt- group and a —O-Rt- group, wherein Rt represents an alkylene group or a cycloalkylene group.

T is preferably a single bond or a —(COO-Rt)- group. Rt is preferably an alkylene group having a carbon number of 1 to 5, more preferably a —CH$_2$— group, —(CH$_2$)$_2$— group or a —(CH$_2$)$_3$— group.

The alkyl group as $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group as $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group which may be formed by combining two members of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 to 6.

An embodiment where $Rx_1$ is a methyl group or an ethyl group and $Rx_2$ and $Rx_3$ are combined to form the above-described cycloalkyl group is preferred.

Each of the groups above may have a substituent, and examples of the substituent include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). The carbon number is preferably 8 or less.

Specific examples of the repeating unit represented by formula (X) are illustrated below, but the present invention is not limited thereto.

(In the formulae, Rx represents H, $CH_3$, $CF_3$ or $CH_2OH$, and each of Rxa and Rxb represents an alkyl group having a carbon number of 1 to 4.)

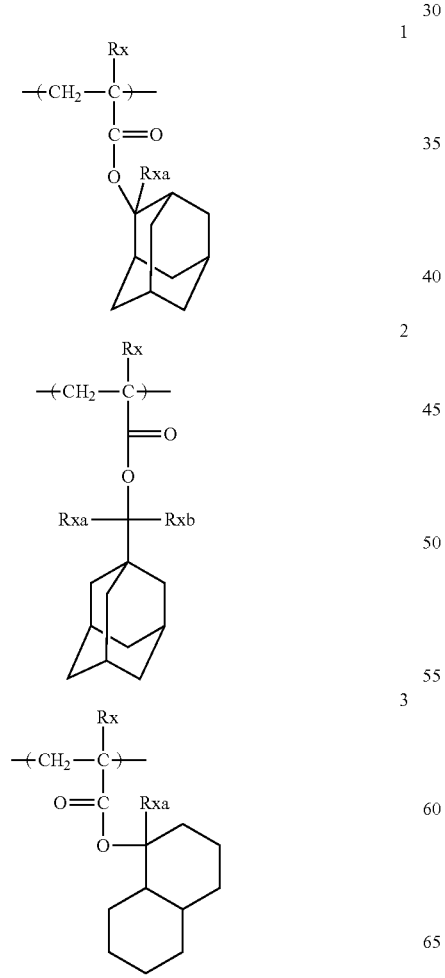

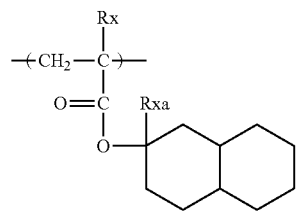

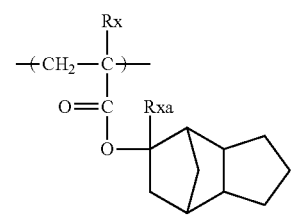

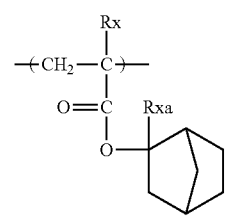

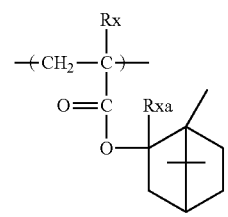

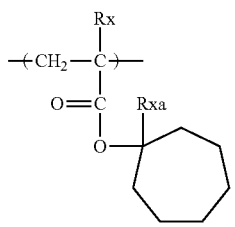

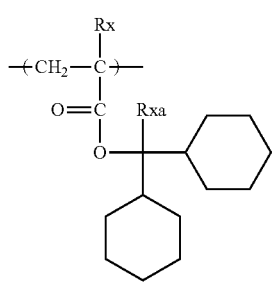

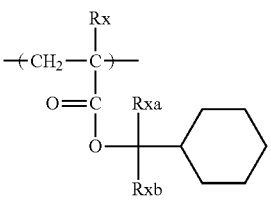

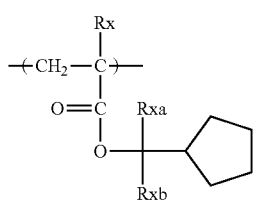

11

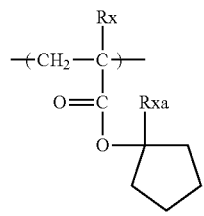

12

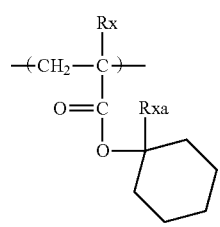

13

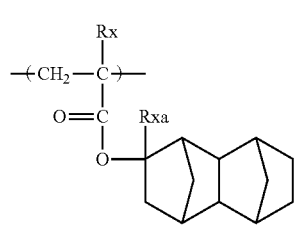

14

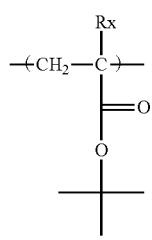

15

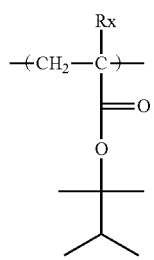

16

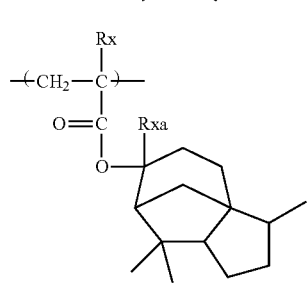

17

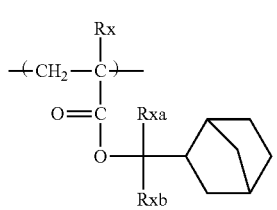

18

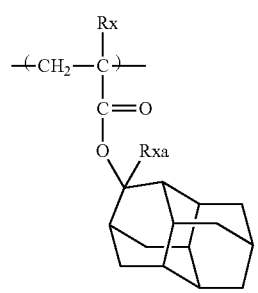

19

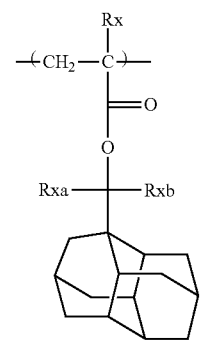

20

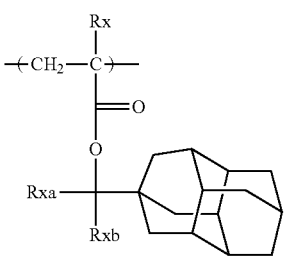

21

The content of the repeating unit represented by formula (X) in the acid-decomposable resin is preferably from 10 to 90 mol %, more preferably from 10 to 80 mol %, still more preferably from 15 to 70 mol %, based on all repeating units In the case where the composition of the present invention is irradiated with KrF excimer laser light, electron beam, X-ray or high-energy beam at a wavelength of 50 nm or less (e.g., EUV), the resin preferably contains a repeating unit of formula (VI). The repeating unit of formula (VI) contains an alkali-soluble group and can assist in alkali solubility of the resin. Also, the repeating unit can enhance the pattern strength and further can impart a function of controlling Tg of the film formed using the composition of the present invention.

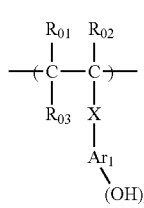

(VI)

In the formula, each of $R_{01}$, $R_{02}$ and $R_{03}$ independently represents a hydrogen atom, an alkyl group, a cycloalkyl group, a halogen atom, a cyano group or an alkoxycarbonyl group.

Also, $R_{03}$ may represent an alkylene group and combine with X or $Ar_1$ to form a 5- or 6-membered ring together with the —C—C— chain.

$Ar_1$ represents an aromatic ring group.

n represents an integer of 1 to 4. n is preferably 1 or 2, more preferably 1.

X represents a divalent linking group or a single bond.

The divalent linking group of X includes any one selected from an alkylene group, a cycloalkylene group, an arylene group, —COO—, —OCO—, —CO—, —O—, —S—, —S(=O)—, —S(=O)$_2$—, —OS(=O)$_2$— and —NH—, and a group formed by combining two or more thereof.

The alkylene group of X is preferably a linear or branched alkylene group having a carbon number of 1 to 20, more preferably a carbon number of 1 to 10, and examples thereof include a methylene group, an ethylene group and a propylene group.

The cycloalkylene group of X is preferably a cycloalkylene group having a carbon number of 3 to 20, more preferably a carbon number of 3 to 10, and examples thereof include a 1,4-cyclohexylene group.

In the alkylene group and cycloalkylene group of X, a part or all of hydrogen atoms bonded to carbon may be substituted for by a substituent.

The arylene group of X is preferably an arylene group having a carbon number of 6 to 20, more preferably a carbon number of 6 to 10 (e.g., phenylene, naphthylene), and a part or all of hydrogen atom bonded to carbon may be substituted for by a substituent.

Examples of the substituent which may be substituted on the alkylene group, cycloalkylene group and arylene group of X include a halogen atom such as fluorine atom, chlorine atom, bromine atom and iodine atom; an alkoxy group such as methoxy group, ethoxy group and tert-butoxy group; an aryloxy group such as phenoxy group and p-tolyloxy group; an alkoxycarbonyl group such as methoxycarbonyl group and butoxycarbonyl group; an aryloxycarbonyl group such as phenoxycarbonyl group and p-tolyloxycarbonyl group; an acyloxy group such as acetoxy group, propionyloxy group and benzoyloxy group; an acyl group such as acetyl group, benzoyl group, isobutyryl group, acryloyl group, methacryloyl group and methoxalyl group; an alkylsulfanyl group such as methylsulfanyl group and tert-butylsulfanyl group; an arylsulfanyl group such as phenylsulfanyl group and p-tolylsulfanyl group; an alkyl- or cycloalkyl-amino group such as methylamino group and cyclohexylamino group; a dialkylamino group such as dimethylamino group, diethylamino group, morpholino group and piperidino group; an arylamino group such as phenylamino group and p-tolylamino group; an alkyl group such as methyl group, ethyl group, tert-butyl group and dodecyl group; an aryl group such as phenyl group, p-tolyl group, xylyl group, cumenyl group, naphthyl group, anthryl group and phenanthryl group; a hydroxy group; a carboxy group; a formyl group; a mercapto group; a sulfo group; a mesyl group; a p-toluenesulfonyl group; an amino group; a nitro group; a cyano group; a perfluoroalkyl group; and a trialkylsilyl group.

The alkyl group as $R_{01}$ to $R_{03}$ is, for example, an alkyl group having a carbon number of 20 or less and is preferably a methyl group, an ethyl group, a propyl group, an isopropyl group, an n-butyl group, a sec-butyl group, a hexyl group, a 2-ethylhexyl group, an octyl group or a dodecyl group. The alkyl group is more preferably an alkyl group having a carbon number of 8 or less. These alkyl groups may have a substituent.

As the alkyl group contained in the alkoxycarbonyl group, the same alkyl group as in $R_{01}$ to $R_{03}$ is preferred.

The cycloalkyl group may be either a monocyclic cycloalkyl group or a polycyclic cycloalkyl group. The cycloalkyl group is preferably a monocyclic cycloalkyl group having a carbon number of 3 to 8, such as cyclopropyl group, cyclopentyl group and cyclohexyl group. These cycloalkyl groups may have a substituent.

The halogen atom includes a fluorine atom, a chlorine atom, a bromine atom and an iodine atom, with a fluorine atom being preferred.

In the case where $R_{03}$ represents an alkylene group, the alkylene group is preferably an alkylene group having a carbon number of 1 to 8, such as methylene group, ethylene group, propylene group, butylene group, hexylene group and octylene group.

The aromatic ring group as $Ar_1$ is preferably an aromatic ring group having a carbon number of 6 to 14, and examples thereof include a benzene ring, a toluene ring and a naphthalene ring. These aromatic rings may have a substituent.

Specific examples of the repeating unit represented by formula (VI) are illustrated below, but the present invention is not limited thereto.

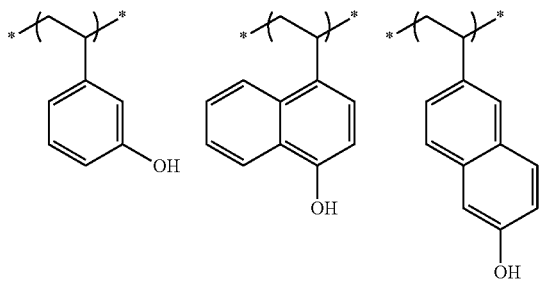

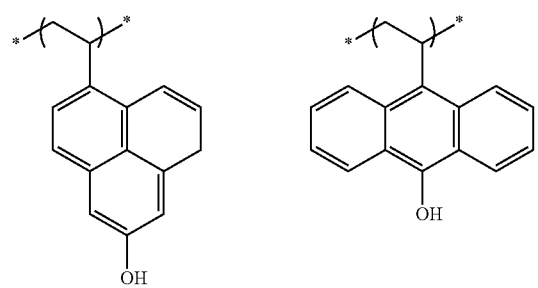

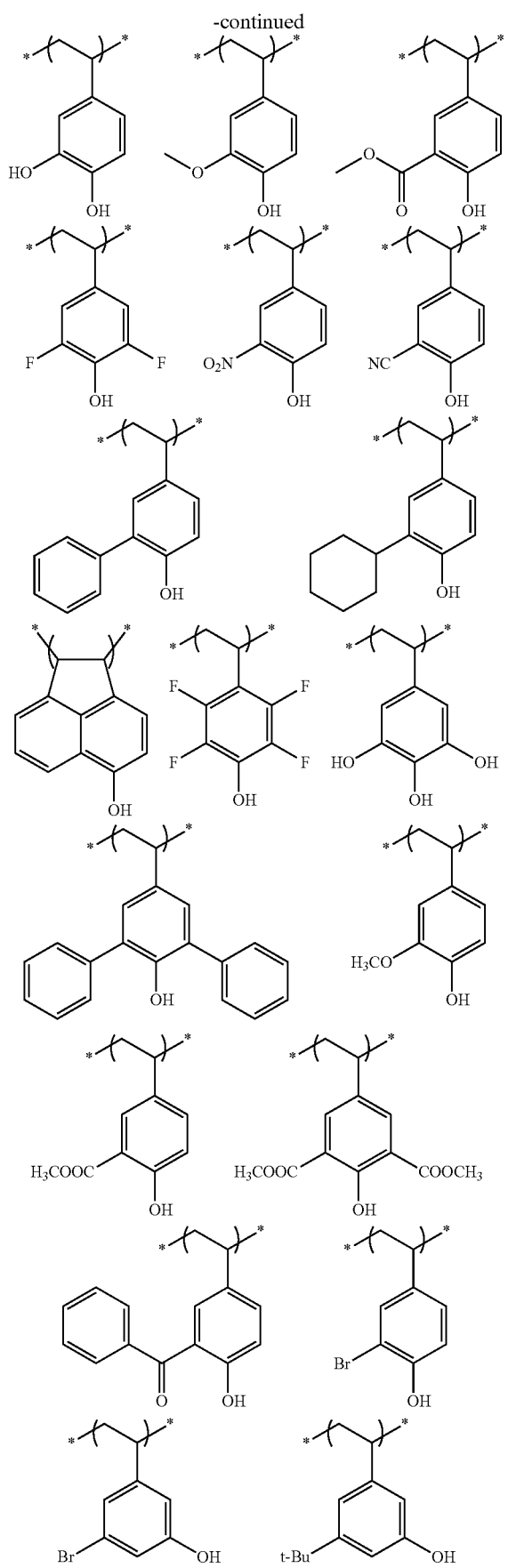
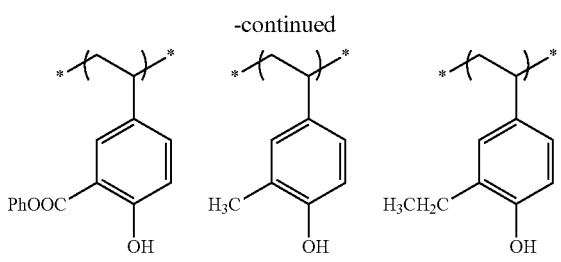
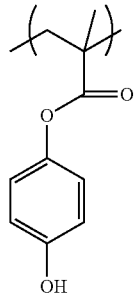
(a01-1)
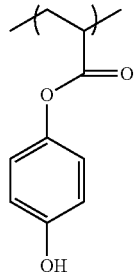
(a01-2)
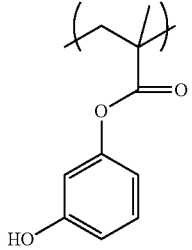
(a01-3)
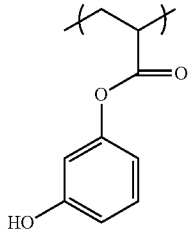
(a01-4)

(a01-5)
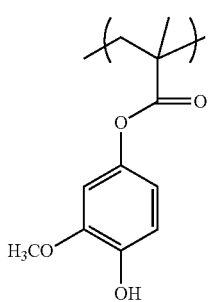
(a01-6)
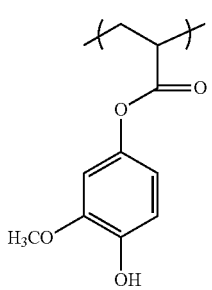
(a01-7)
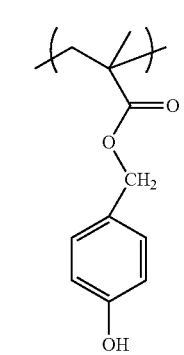
(a01-8)
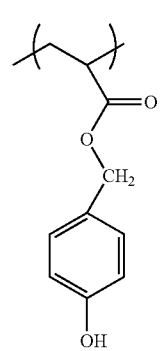
(a01-9)
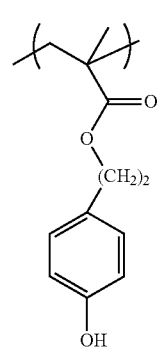
(a01-10)
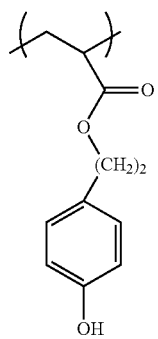
(a01-11)
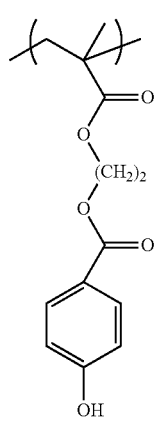
(a01-12)
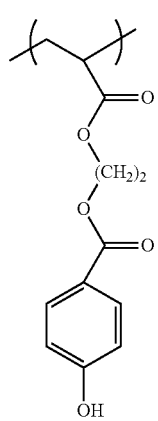
(a01-13)
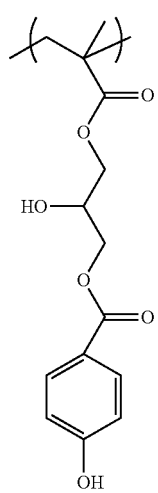

(a01-14)
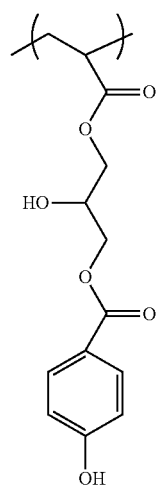
(a01-15)
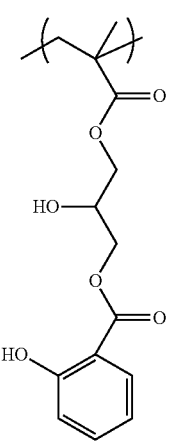
(a01-16)
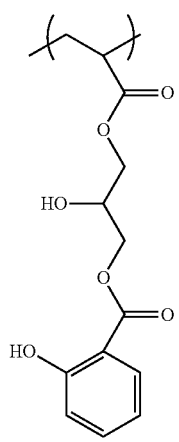
(a02-1)
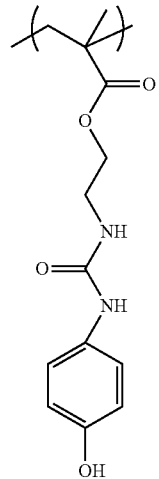
(a02-2)
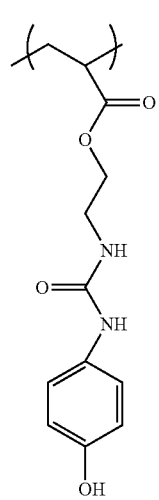
(a02-3)
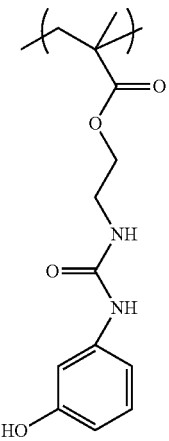

(a02-4)
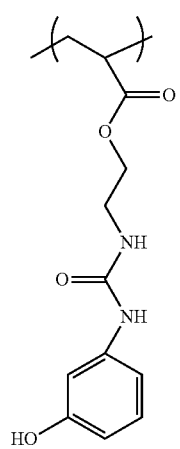
(a03-1)
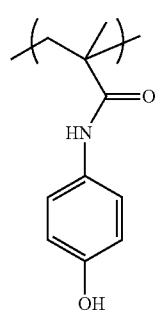
(a03-2)
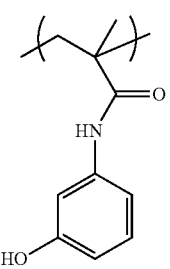
(a03-3)
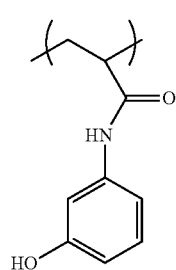
(a03-4)
(a03-5)
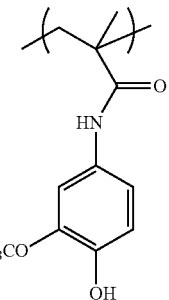
(a03-6)
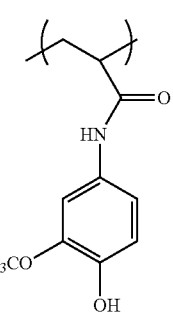
(a04-1)
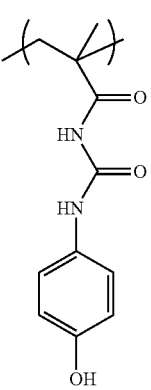
(a04-2)
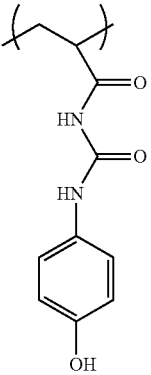
The content of the repeating unit represented by formula (VI) in the acid-decomposable resin is preferably from 20 to 90 mol %, more preferably from 30 to 80 mol %, based on all repeating units.
Specific examples of the resin described above are illustrated below, but the present invention is not limited thereto.

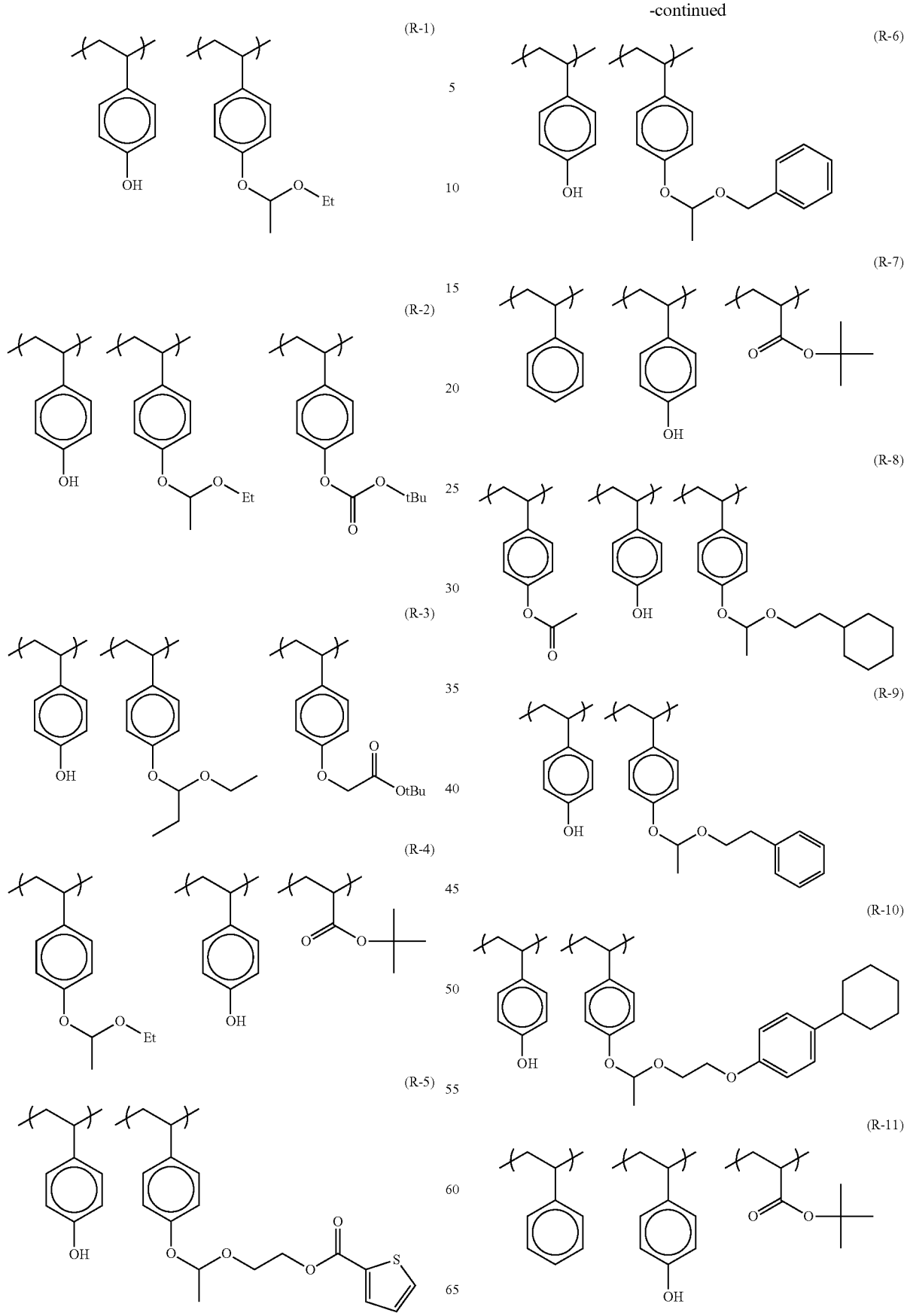

(R-12) 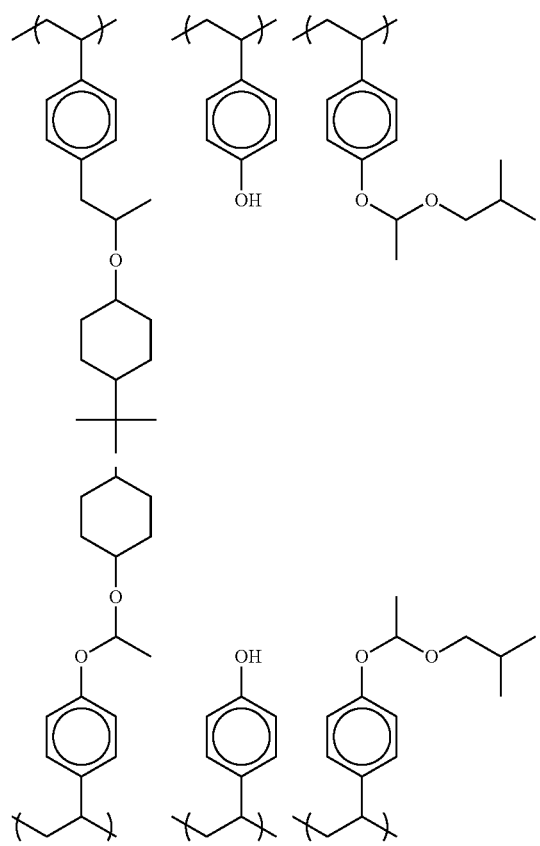
(R-13) 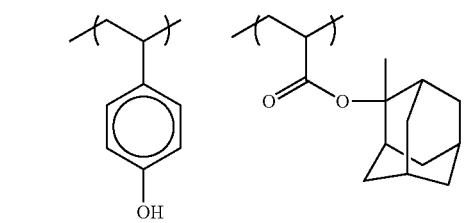
(R-14) 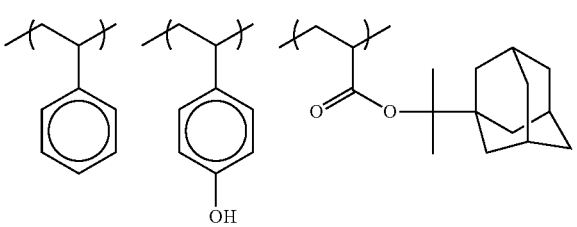
(R-15) 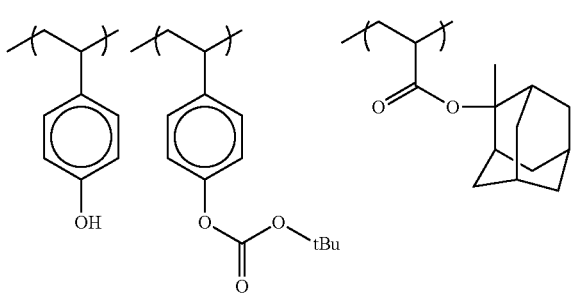
(R-16) 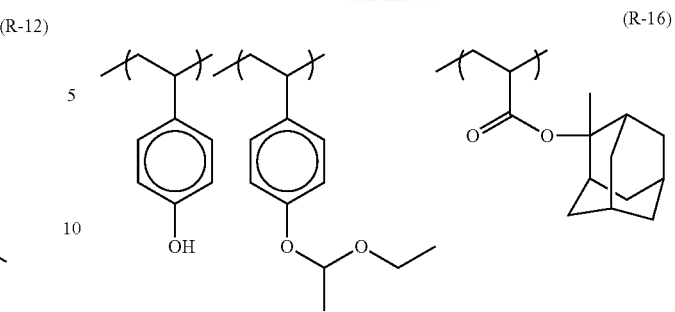
(R-17) 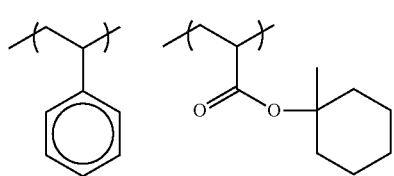
(R-18) 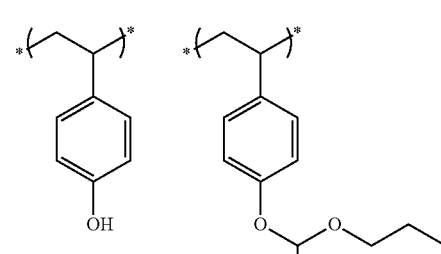
(R-19) 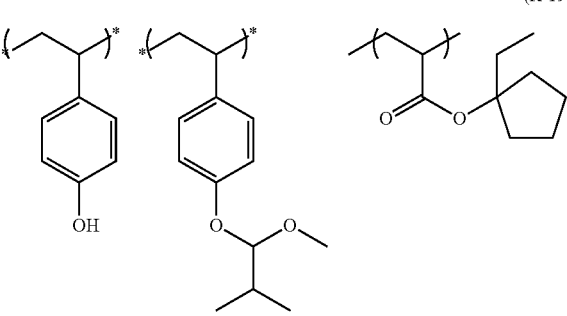
(R-20) 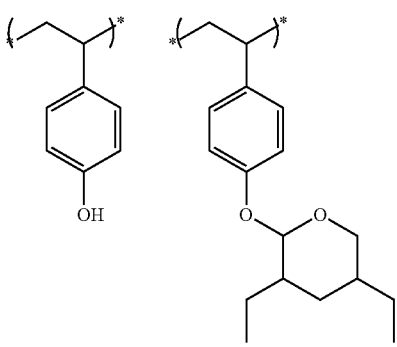

(R-21) 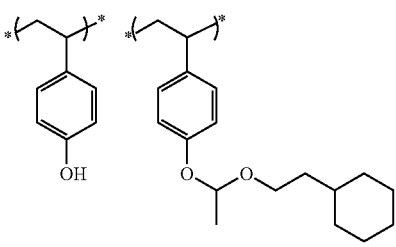

(R-22) 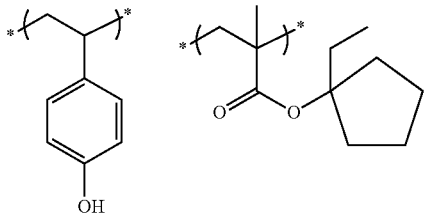

(R-23)

(R-24) 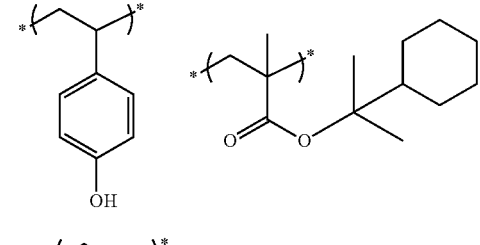

(R-25)

(R-26)

(R-27) 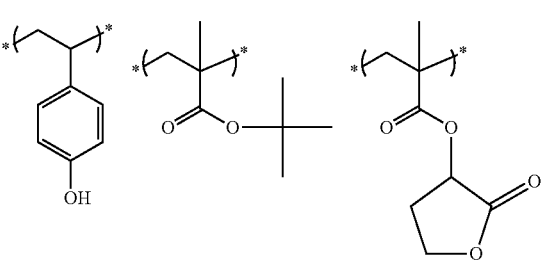

(R-28) 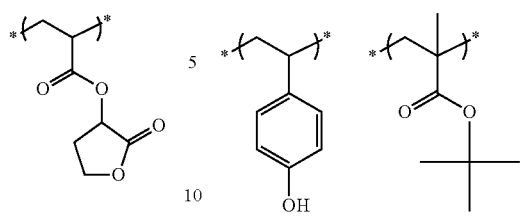

(R-29)

(R-30)

(R-31)

In these specific examples, "tBu" indicates a tert-butyl group.

The content of the group capable of decomposing by the action of an acid is calculated by B/(B+S) using the number (B) of groups capable of decomposing by the action of an acid in the resin and the number (S) of alkali-soluble groups not protected by a group capable of leaving by the action of an acid. The content is preferably from 0.01 to 0.7, more preferably from 0.05 to 0.50, still more preferably from 0.05 to 0.40.

In the case of irradiating the composition of the present invention with ArF excimer laser light, the resin preferably has a monocyclic or polycyclic alicyclic hydrocarbon structure. Hereinafter, this resin is referred to as "alicyclic hydrocarbon-based acid-decomposable resin".

The alicyclic hydrocarbon-based acid-decomposable resin is preferably a resin containing at least one repeating unit selected from the group consisting of a repeating unit having an alicyclic hydrocarbon-containing partial structure represented by the following formulae (pI) to (pV), and a repeating unit represented by the following formula (II-AB):

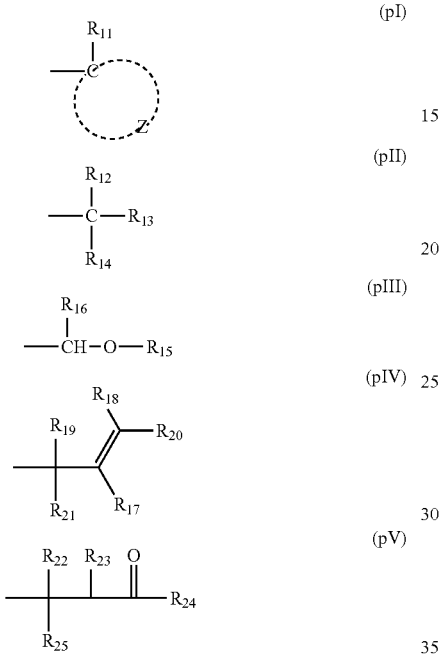

In formulae (pI) to (pV), $R_{11}$ represents a methyl group, an ethyl group, an n-propyl group, an isopropyl group, an n-butyl group, an isobutyl group or a sec-butyl group. Z represents an atomic group necessary for forming a cycloalkyl group together with the carbon atom.

Each of $R_{12}$ to $R_{16}$ independently represents a linear or branched alkyl group having a carbon number of 1 to 4 or a cycloalkyl group, provided that at least one of $R_{12}$ to $R_{14}$ represents a cycloalkyl group and that either $R_{15}$ or $R_{16}$ represents a cycloalkyl group Each of $R_{17}$ to $R_{21}$ independently represents a hydrogen atom, a linear or branched alkyl group having a carbon number of 1 to 4, or a cycloalkyl group, provided that at least one of $R_{17}$ to $R_{21}$ represents a cycloalkyl group and that either $R_{19}$ or $R_{21}$ represents a linear or branched alkyl group having a carbon number of 1 to 4 or a cycloalkyl group.

Each of $R_{22}$ to $R_{25}$ independently represents a hydrogen atom, a linear or branched alkyl group having a carbon number of 1 to 4, or a cycloalkyl group, provided that at least one of $R_{22}$ to $R_{25}$ represents a cycloalkyl group. $R_{23}$ and $R_{24}$ may combine with each other to form a ring structure.

In formula (II-AB), each of $R_{11}'$ and $R_{12}'$ independently represents a hydrogen atom, a cyano group, a halogen atom or an alkyl group.

Z' represents an atomic group necessary for forming an alicyclic structure together with two carbon atoms (C—C) to which bonded.

Formula (II-AB) is preferably the following formula (II-AB1) or (II-AB2):

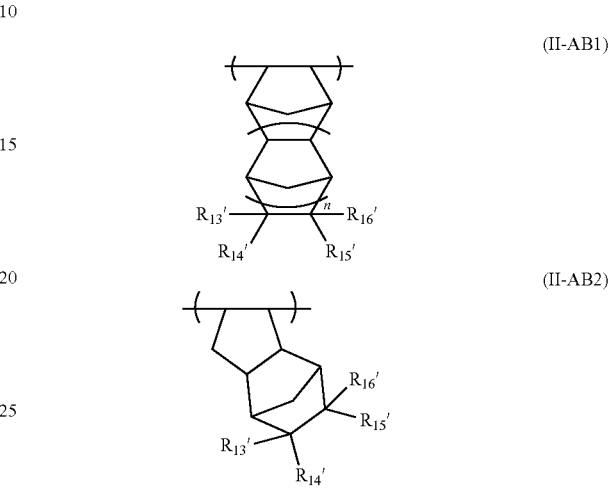

In formulae (II-AB1) and (II-AB2), each of $R_{13}'$ to $R_{16}'$ independently represents a hydrogen atom, a halogen atom, a cyano group, a hydroxy group, —COOH, —COOR$_5$, a group capable of decomposing by the action of an acid, —C(=O)—X-A'-R$_{17}$', an alkyl group or a cycloalkyl group. Here, $R_5$ represents an alkyl group, a cycloalkyl group or a group having a lactone structure. X represents an oxygen atom, a sulfur atom, —NH—, —NHSO$_2$— or —NHSO$_2$NH—. A' represents a sing bond or a divalent linking group. $R_{17}'$ represents —COOH, —COOR$_5$, —CN, a hydroxy group, an alkoxy group, —CO—NH—R$_6$, —CO—NH—SO$_2$—R$_6$ or a group having a lactone structure, wherein $R_6$ represents an alkyl group or a cycloalkyl group. At least two members out of $R_{13}'$ to $R_{16}'$ may combine with each other to form a ring structure.

n represents 0 or 1.

In formulae (pI) to (pV), the alkyl group of $R_{12}$ to $R_{25}$ is preferably a linear or branched alkyl group having from a carbon number of 1 to 4, and examples thereof include a methyl group, an ethyl group, a propyl group, an n-butyl group, a sec-butyl group and a tert-butyl group.

The cycloalkyl group of $R_{12}$ to $R_{25}$ and the cycloalkyl group formed by Z together with the carbon atom may be a monocyclic cycloalkyl group or a polycyclic cycloalkyl group. Specific examples thereof include a group having a monocyclo, bicyclo, tricyclo or tetracyclo structure with a carbon number of 5 or more. The carbon number thereof is preferably from 6 to 30, more preferably from 7 to 25.

Preferred examples of the cycloalkyl group include an adamantyl group, a noradamantyl group, a decalin residue group, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, an adamantyl group, a norbornyl group, a cyclohexyl group, a cyclopentyl group, a tetracyclododecanyl group and a tricyclodecanyl group are more preferred.

These alkyl group and cycloalkyl group may have a substituent. Examples of the substituent include an alkyl group (having a carbon number of 1 to 4), a halogen atom, a hydroxy group, an alkoxy group (having a carbon number of 1 to 4), a carboxy group and an alkoxycarbonyl group (having a carbon number of 2 to 6). These substituents may have a further substituent. Examples of the further substituent include a hydroxy group, a halogen atom and an alkoxy group.

The structures represented by formulae (pI) to (pV) may be used for the protection of an alkali-soluble group. The alkali-soluble group includes various groups known in this technical field.

Specific examples thereof include structures where the hydrogen atom of a carboxylic acid group, sulfonic acid group, phenol group or thiol group is substituted for by a structure represented by formulae (pI) to (pV). Among these, structures where the hydrogen atom of a carboxylic acid group or sulfonic acid group is substituted for by a structure represented by formulae (pI) to (pV) are preferred.

The repeating unit having an alkali-soluble group protected by a structure represented by formulae (pI) to (pV) is preferably a repeating unit represented by the following formula (pA):

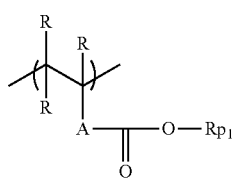

(pA)

In formula (pA), R represents a hydrogen atom, a halogen atom or a linear or branched alkyl group having from a carbon number of 1 to 4, and each R may be the same as or different from every other R.

A is selected from the group consisting of a single bond, an alkylene group, an ether group, a thioether group, a carbonyl group, an ester group, an amido group, a sulfonamido group, a urethane group, a urea group and a combination of two or more thereof, and is preferably a single bond.

$Rp_1$ is a group represented by any group of formulae (pI) to (pV).

The repeating unit represented by formula (pA) is most preferably a repeating unit composed of a 2-alkyl-2-adamantyl (meth)acrylate or a dialkyl(1-adamantyl)methyl (meth)acrylate.

Specific examples of the repeating unit represented by formula (pA) are the same as those described above as the repeating unit represented by formula (X), and other specific examples of the repeating unit represented by formula (pA) are illustrated below.

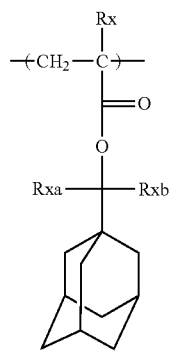

1

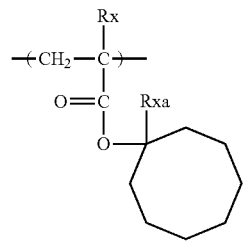

2

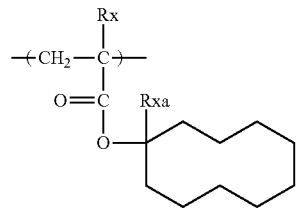

3

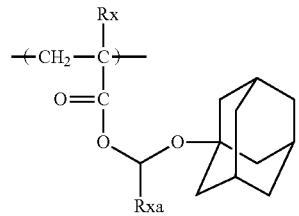

4

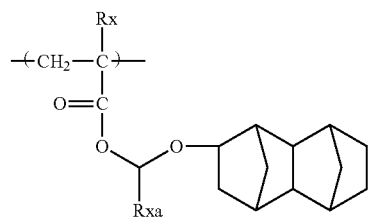

5

In the structural formulae above, Rx represents H, $CH_3$, $CF_3$ or $CH_2OH$, and each of Rxa and Rxb independently represents an alkyl group having a carbon number of 1 to 4.

Examples of the halogen atom as $R_{11}'$ and $R_{12}'$ in formula (II-AB) include a chlorine atom, a bromine atom, a fluorine atom and an iodine atom.

The alkyl group as $R_{11}'$ and $R_{12}'$ is preferably a linear or branched alkyl group having a carbon number of 1 to 10, and examples thereof include a methyl group, an ethyl group, an n-propyl group, an isopropyl group and a linear or branched butyl, pentyl, hexyl or heptyl group.

The atomic group represented by Z' is an atomic group that forms, in the resin, an alicyclic hydrocarbon repeating unit which may have a substituent. The atomic group is preferably an atomic group that forms a crosslinked alicyclic hydrocarbon repeating unit.

Examples of the framework of the alicyclic hydrocarbon formed are the same as those of the cycloalkyl group of $R_{12}$ to $R_{25}$ in formulae (pI) to (pVI).

The framework of the alicyclic hydrocarbon may have a substituent, and the substituent include, for example, $R_{13}'$ to $R_{16}'$ in formulae (II-AB1) and (II-AB2).

In the alicyclic hydrocarbon-based acid-decomposable resin, the group capable of decomposing by the action of an acid may be contained in at least one repeating unit out of a repeating unit having an alicyclic hydrocarbon-containing partial structure represented by formulae (pI) to (pV), a repeating unit represented by formula (II-AB), and a repeating unit composed of the later-described copolymerization component.

Each of the substituents $R_{13}'$ to $R_{16}'$ in formulae (II-AB1) and (II-AB2) may work out to a substituent of the atomic group Z' for forming an alicyclic structure or a crosslinked alicyclic structure in formula (II-AB).

Specific examples of the repeating units represented by formulae (II-AB1) and (II-AB2) are illustrated below, but the present invention is not limited to these examples.

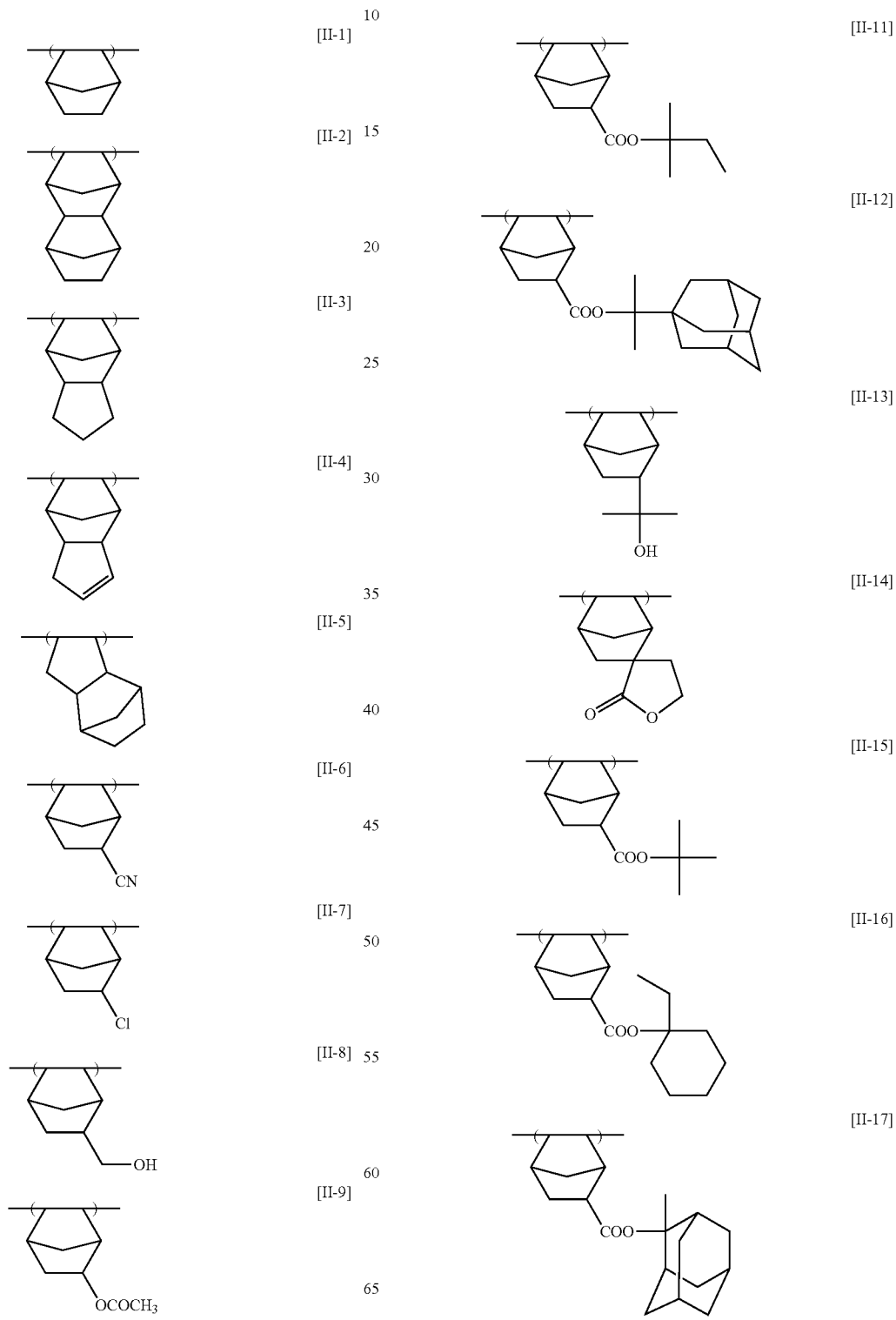

-continued

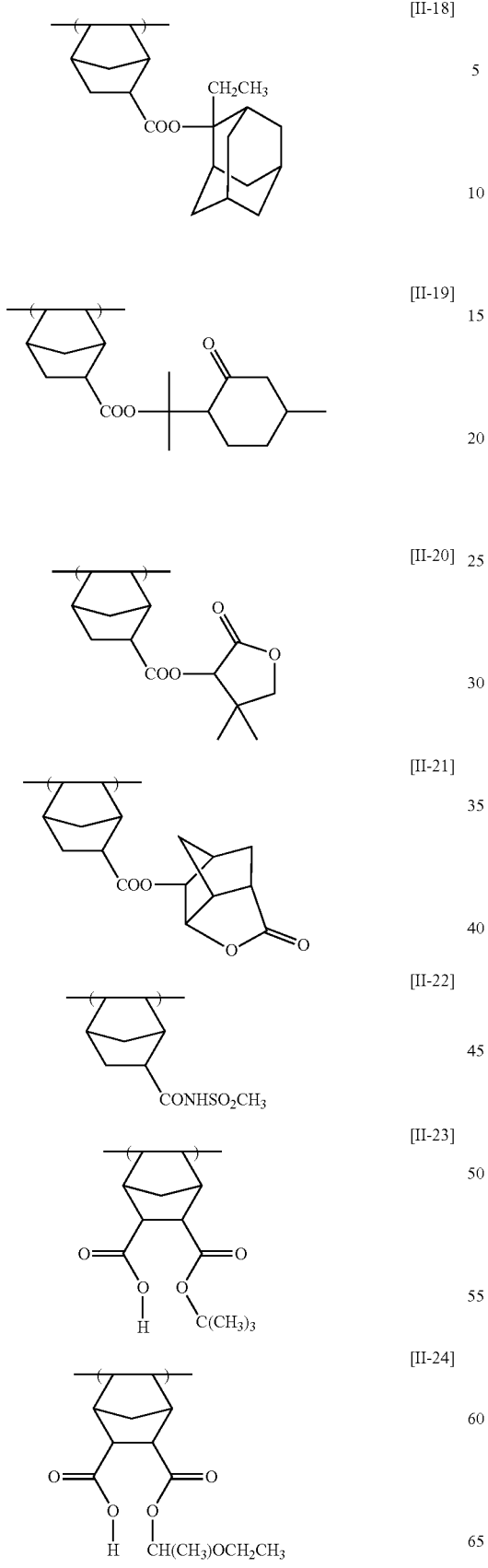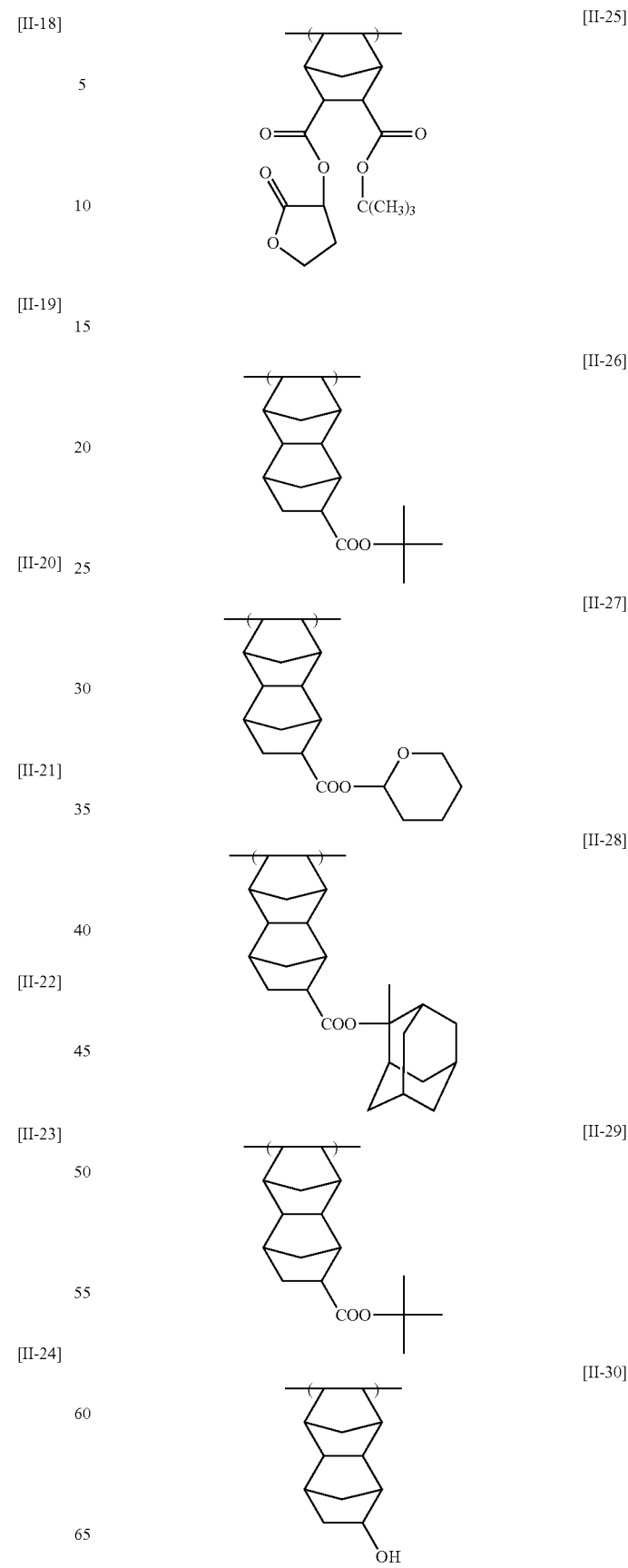

[II-31]

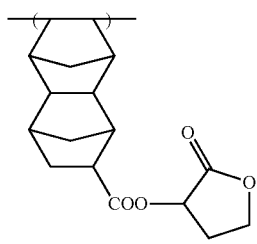

[II-32]

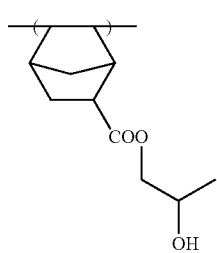

The alicyclic hydrocarbon-based acid-decomposable resin preferably contains a repeating unit having a lactone group. The lactone group is preferably a group having a 5- to 7-membered ring lactone structure, more preferably a 5- to 7-membered ring lactone structure to which another ring structure is fused in the form of forming a bicyclo or spiro structure.

The alicyclic hydrocarbon-based acid-decomposable resin more preferably contains a repeating unit having a group containing a lactone structure represented by any of the following formulae (LC1-1) to (LC1-17). The group having a lactone structure may be bonded directly to the main chain. Among these lactone structures, (LC1-1), (LC1-4), (LC1-5), (LC1-6), (LC1-13), (LC1-14) and (LC1-17) are preferred. By virtue of using a specific lactone structure, the line edge roughness and development defect can be more reduced.

LC1-1

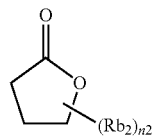

LC1-2

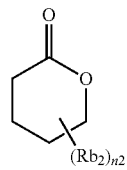

LC1-3

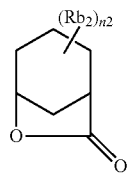

LC1-4

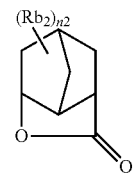

LC1-5

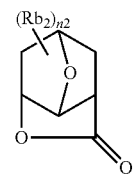

LC1-6

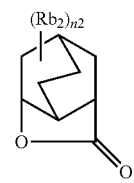

LC1-7

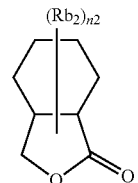

LC1-8

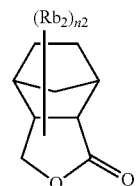

LC1-9

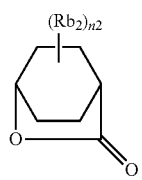

LC1-10

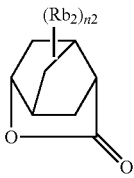

LC1-11

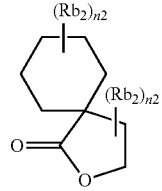

LC1-12

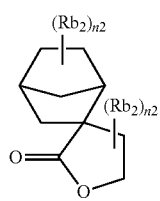

LC1-13

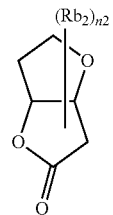

LC1-14

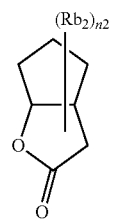

LC1-15

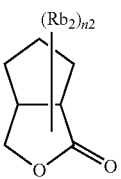

LC1-16

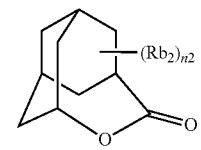

LC1-17

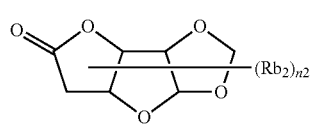

The lactone structure moiety may or may not have a substituent ($Rb_2$). Preferred examples of the substituent ($Rb_2$) include an alkyl group having a carbon number of 1 to 8, a cycloalkyl group having a carbon number of 3 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group.

$n_2$ represents an integer of 0 to 4. When $n_2$ is an integer of 2 or more, each $Rb_2$ may be the same as or different from every other $Rb_2$. Also, in this case, the plurality of $Rb_2$s may combine with each other to form a ring structure.

Examples of the repeating unit having a group containing a lactone structure represented by any of formulae (LC1-1) to (LC1-17) include a repeating unit where at least one of $R_{13}'$ to $R_{16}'$ in formula (II-AB1) or (II-AB2) has a group represented by formulae (LC1-1) to (LC1-17), and a repeating unit represented by the following formula (AI). Examples of the former include a structure where $R_5$ of —$COOR_5$ is a group represented by formulae (LC1-1) to (LC1-17).

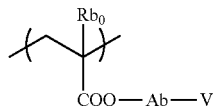

(AI)

In formula (AI), $Rb_0$ represents a hydrogen atom, a halogen atom or an alkyl group having a carbon number of 1 to 4.

Examples of the alkyl group of $Rb_0$ include a methyl group, an ethyl group, a propyl group, an n-butyl group, a sec-butyl group and a tert-butyl group. The alkyl group may have a substituent. Examples of the substituent include a hydroxy group and a halogen atom.

The halogen atom of $Rb_0$ includes a fluorine atom, a chlorine atom, a bromine atom and an iodine atom.

$Rb_0$ is preferably a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxy group, or a group formed by comprising two or more thereof. Ab is preferably a single bond or a linking group represented by -$Ab_1$-$CO_2$—.

$Ab_1$ is a linear or branched alkylene group or a monocyclic or polycyclic cycloalkylene group, preferably a methylene group, an ethylene group, a cyclohexylene group, an adamantylene group or a norbornylene group.

V represents a group represented by any of formulae (LC1-1) to (LC1-17).

The repeating unit having a lactone structure usually has an optical isomer, but any optical isomer may be used. One optical isomer may be used alone or a mixture of a plurality of optical isomers may be used. In the case of mainly using one optical isomer, the optical purity thereof is preferably 90% ee or more, more preferably 95% ee or more.

The content of the repeating unit having lactone is, in the case of containing a plurality of kinds of lactone-containing repeating units, the total content thereof is, preferably from 5 to 60 mol %, more preferably from 10 to 55 mol %, based on all repeating units in the resin.

Particularly preferred repeating units having a lactone group include the following repeating units. By selecting an optimal lactone group, the pattern profile and the iso/dense bias are improved. In the formulae, each of Rx and R represents H, $CH_3$, $CH_2OH$ or $CF_3$.

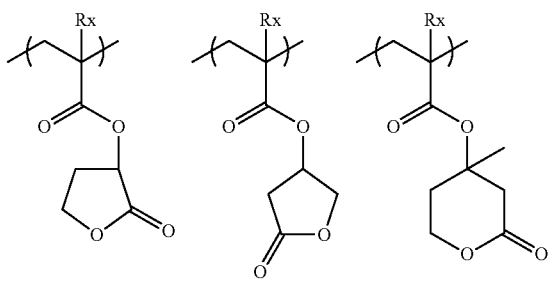

-continued
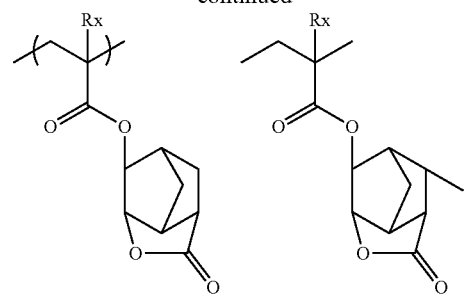
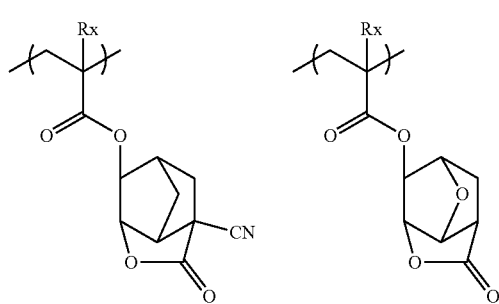
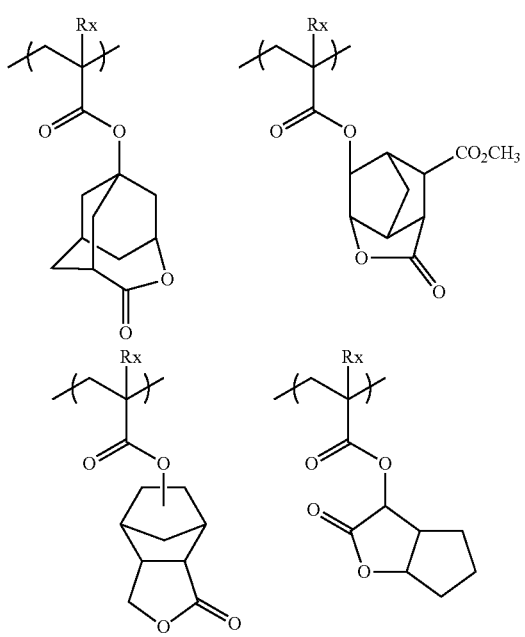
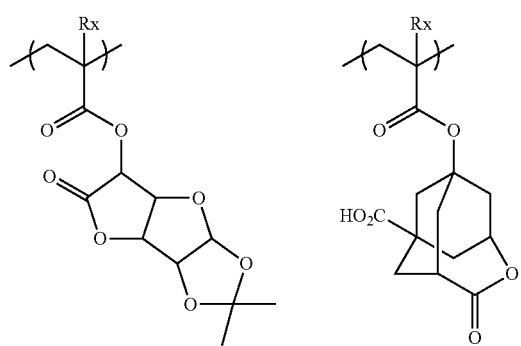
-continued
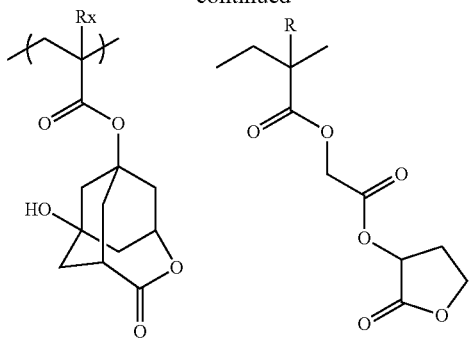
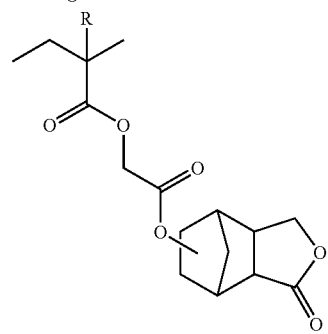
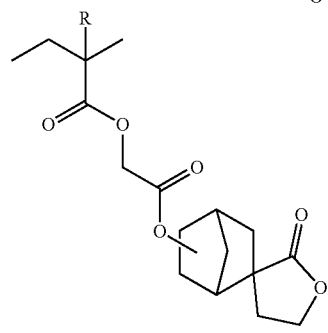
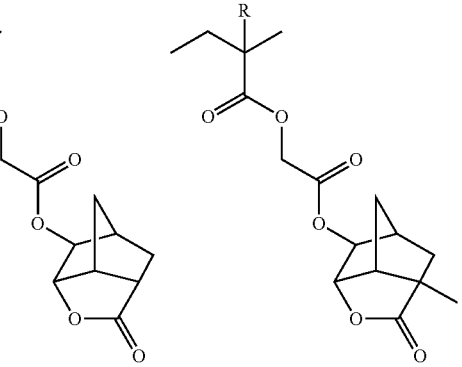
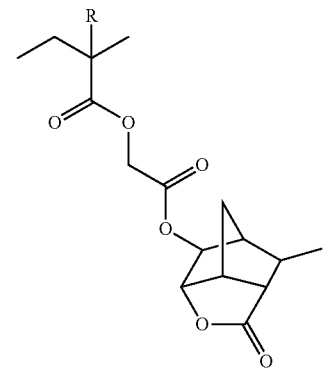

101
-continued
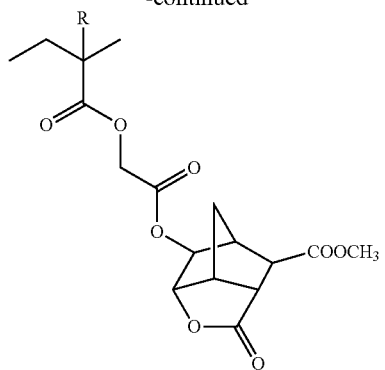
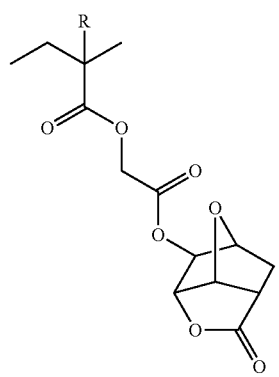
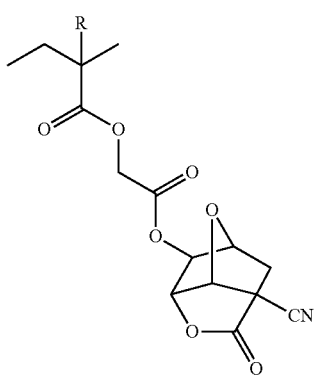
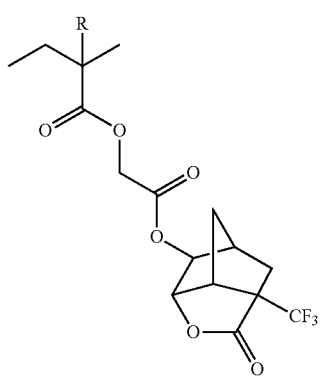
102
-continued
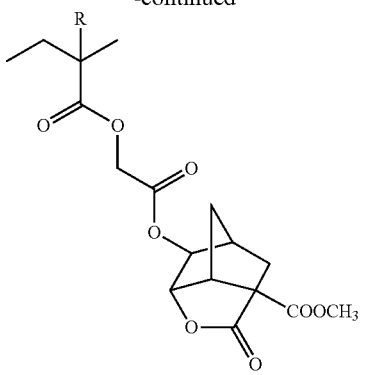
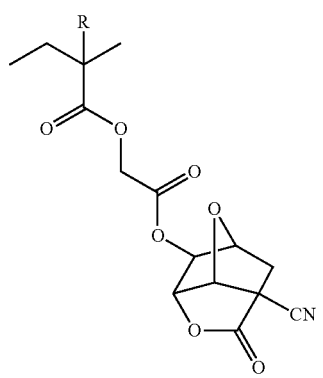
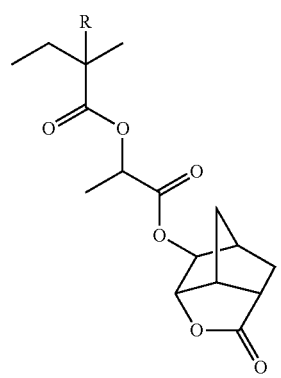
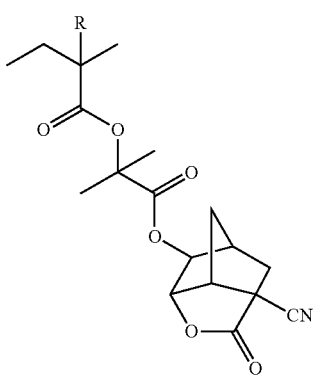

103
-continued
104
-continued
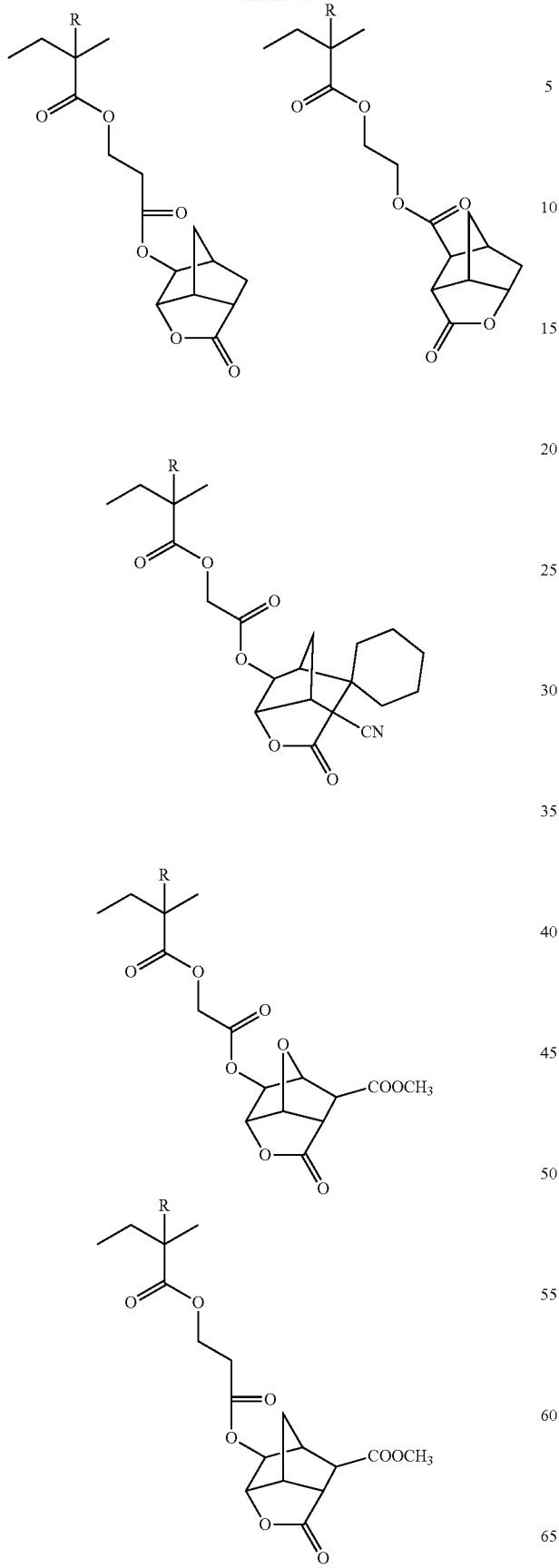
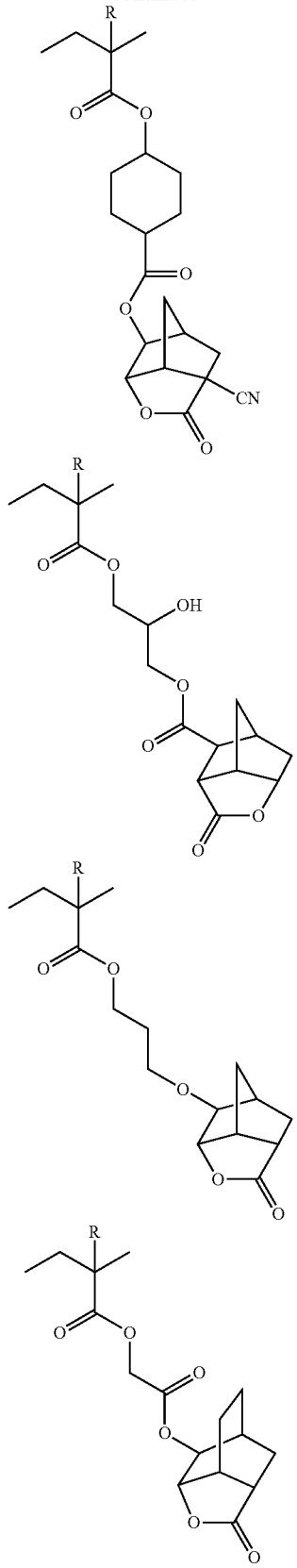
The alicyclic hydrocarbon-based acid-decomposable resin preferably contains a repeating unit containing an alicyclic hydrocarbon structure substituted with a polar group. Thanks to this repeating unit, the adhesion to substrate and the affinity for developer are enhanced. The polar group is preferably a hydroxy group or a cyano group. Incidentally, the hydroxy group as the polar group forms an alcoholic hydroxy group.

The alicyclic hydrocarbon structure substituted with a polar group includes, for example, a structure represented by the following formula (VIIa) or (VIIb):

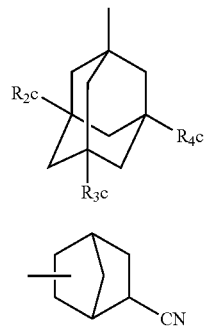

In formula (VIIa), each of $R_{2c}$ to $R_{4c}$ independently represents a hydrogen atom, a hydroxy group or a cyano group, provided that at least one of $R_{2c}$ to $R_{4c}$ represents a hydroxyl group or a cyano group. Preferably, one or two members out of $R_{2c}$ to $R_{4c}$ are a hydroxyl group with the remaining being a hydrogen atom; and more preferably, two members out of $R_2$ to $R_{4c}$ are a hydroxyl group and the remaining one member is a hydrogen atom.

The group represented by formula (VIIa) is preferably a dihydroxy form or a monohydroxy form, more preferably a dihydroxy form.

The repeating unit having a group represented by formula (VIIa) or (VIIb) include a repeating unit where at least one of $R_{13}'$ to $R_{16}'$ in formula (II-AB1) or (II-AB2) has a group represented by formula (VIIa) or (VIIb), and a repeating unit represented by the following formula (AIIa) or (AIIb). Examples of the former include a structure where $R_5$ of —COOR$_5$ is a group represented by formula (VIIa) or (VIIb).

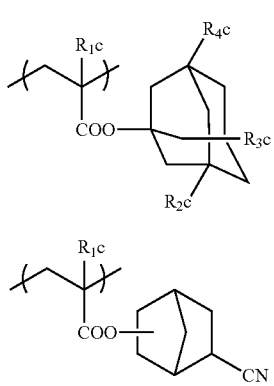

In formulae (AIIa) and (AIIb), $R_{1c}$ represents a hydrogen atom, a methyl group, a trifluoromethyl group or a hydroxymethyl group.

$R_{2c}$ to $R_{4c}$ have the same meanings as $R_{2c}$ to $R_{4c}$ in formula (VIIa).

The content of the repeating unit represented by formula (AIIa) or (AIIb) is preferably from 5 to 40 mol %, more preferably from 5 to 30 mol %, still more preferably from 10 to 25 mol %, based on all repeating units in the resin (B1).

Specific examples of the repeating unit represented by formula (AIIa) or (AIIb) are illustrated below, but the present invention is not limited thereto.

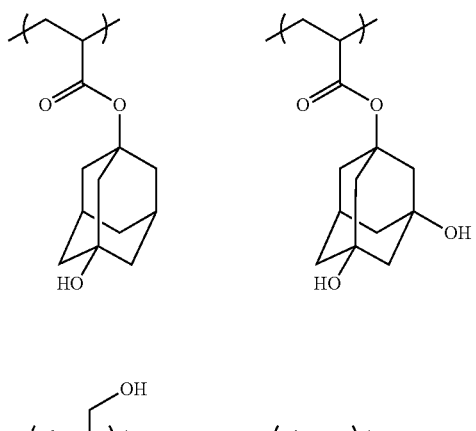

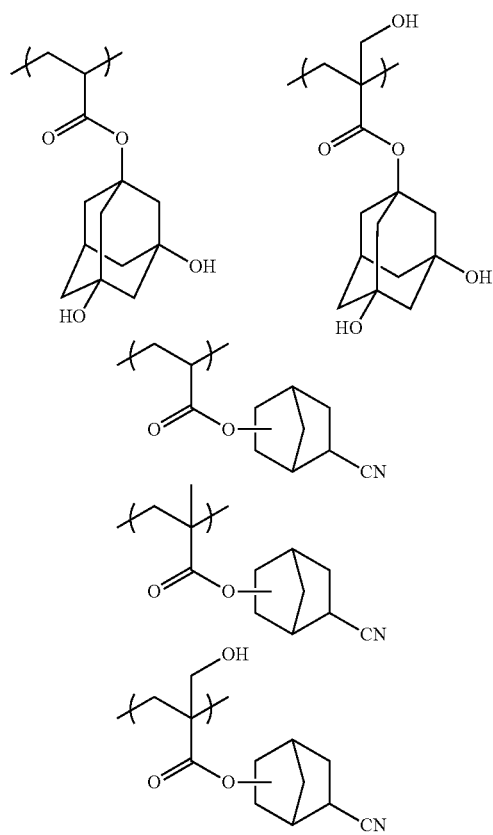

The alicyclic hydrocarbon-based acid-decomposable resin may contain a repeating unit represented by the following formula (VIII):

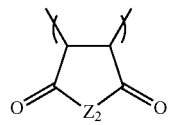

(VIII)

In formula (VIII), $Z_2$ represents —O— or —N($R_{41}$)—. $R_{41}$ represents a hydrogen atom, a hydroxy group, an alkyl group or —OSO$_2$—$R_{42}$. $R_{42}$ represents an alkyl group, a cycloalkyl group or a camphor residue group. The alkyl group of $R_{41}$ and $R_{42}$ may be substituted with a halogen atom or the like. In this case, the halogen atom is preferably a fluorine atom.

Specific examples of the repeating unit represented by formula (VIII) are illustrated below, but the present invention is not limited thereto.

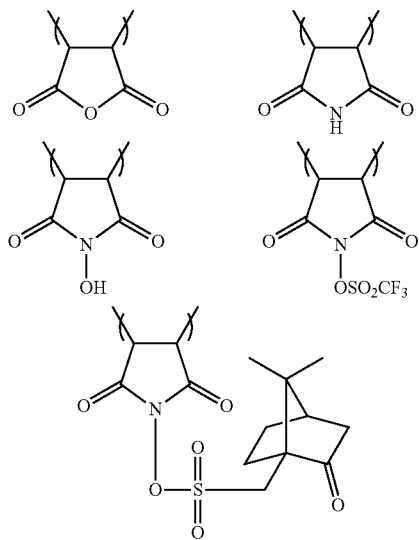

The alicyclic hydrocarbon-based acid-decomposable resin preferably contains a repeating unit having an alkali-soluble group, more preferably a repeating unit having a carboxy group. Thanks to such a repeating unit, the resolution increases in usage of forming contact holes.

As for the repeating unit having a carboxy group, both a repeating unit where a carboxy group is directly bonded to the main chain of the resin, and a repeating unit where a carboxy group is bonded to the main chain of the resin through a linking group, are preferred.

Examples of the former include a repeating unit by an acrylic acid or a methacrylic acid. Also, the linking group in the latter may have a monocyclic or polycyclic hydrocarbon structure.

The repeating unit having a carboxy group is most preferably a repeating unit by an acrylic acid or a methacrylic acid.

The acid-decomposable resin may further contain a repeating unit having a polar group-free alicyclic hydrocarbon structure and not exhibiting acid decomposability. Such a repeating unit includes, for example, a repeating unit represented by the following formula (IV):

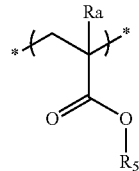

(IV)

In formula (IV), $R_5$ represents a hydrocarbon group having at least one cyclic structure and not having a polar group (e.g., hydroxy group, cyano group).

Ra represents a hydrogen atom, an alkyl group, or a group represented by —CH$_2$—O—Ra2, wherein Ra2 represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes, for example, a monocyclic hydrocarbon group and a polycyclic hydrocarbon group.

Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7. Examples of the monocyclic hydrocarbon group include a cyclopentyl group and a cyclohexyl group.

The polycyclic hydrocarbon group includes a ring assembly hydrocarbon group and a crosslinked cyclic hydrocarbon group.

Examples of the ring assembly hydrocarbon group include a bicyclohexyl group and a perhydronaphthalenyl group.

Examples of the crosslinked cyclic hydrocarbon group include a bicyclic hydrocarbon group such as pinane ring, bornane ring, norpinane ring, norbornane ring and bicyclooctane ring (e.g., bicyclo[2.2.2]octane ring, bicyclo[3.2.1]octane ring), a tricyclic hydrocarbon group such as homobledane ring, adamantane ring, tricyclo[5.2.1.0$^{2,6}$]decane ring and tricyclo[4.3.1.1$^{2,5}$]undecane ring, and a tetracyclic hydrocarbon group such as tetracyclo[4.4.0.1$^{2,5}$.1$^{7,10}$]dodecane ring and perhydro-1,4-methano-5,8-methanonaphthalene ring.

The crosslinked cyclic hydrocarbon group also includes a condensed cyclic hydrocarbon group. Examples of the condensed cyclic hydrocarbon group include a group formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon group include a norbornyl group, an adamantyl group, a bicyclooctanyl group and a tricycle[5,2,1,0$^{2,6}$]decanyl group. Of these crosslinked cyclic hydrocarbon groups, a norbornyl group and an adamantyl group are more preferred.

The alicyclic hydrocarbon group may further have a substituent, and preferred substituents include a halogen atom, an alkyl group, a hydroxy group protected by a protective group, and an amino group protected by a protective group.

The halogen atom is preferably a bromine atom, a chlorine atom or a fluorine atom.

The alkyl group is preferably a methyl group, an ethyl group, a butyl group or a tert-butyl group. This alkyl group may further have a substituent, and the substituent includes a halogen atom, an alkyl group, a hydroxy group protected by a protective group, and an amino group protected by a protective group.

Examples of the protective group include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group is preferably an alkoxycarbonyl group having a carbon number of 1 to 4.

The content of the repeating unit having a polar group-free alicyclic hydrocarbon structure and not exhibiting acid decomposability is preferably from 0 to 40 mol %, more preferably from 0 to 20 mol %, based on all repeating units in the resin (B1).

Specific examples of the repeating unit having a polar group-free alicyclic hydrocarbon structure and not exhibiting acid decomposability are illustrated below. In specific examples, Ra represents H, $CH_3$, $CH_2OH$ or $CF_3$.

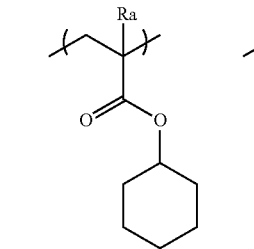
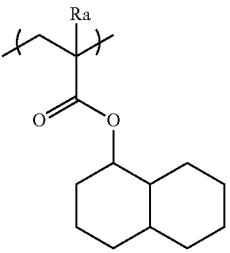
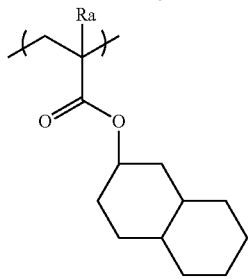
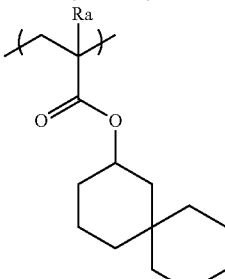
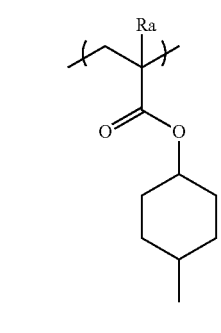
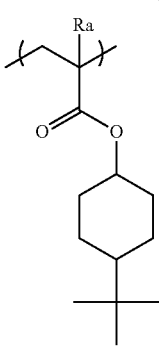

-continued

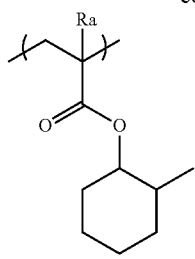
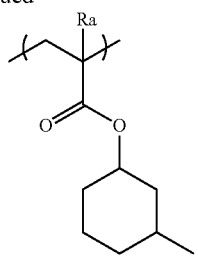
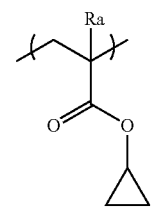
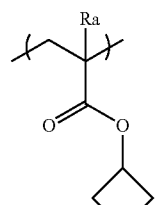
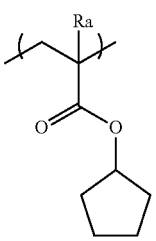
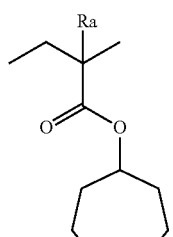
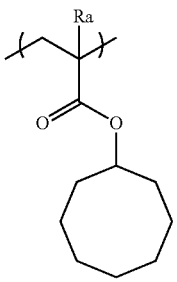
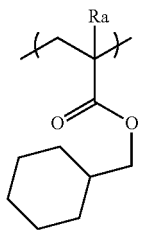
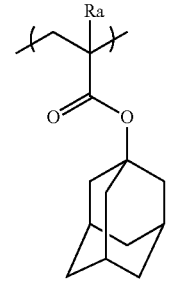
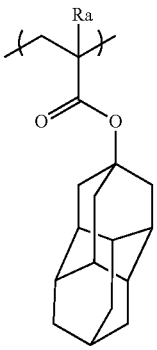
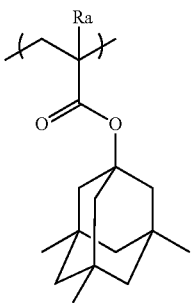

-continued

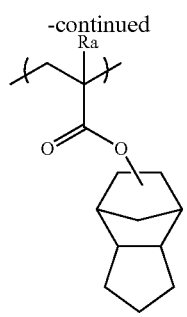

The content of the repeating unit having a polar group-free alicyclic hydrocarbon structure and not exhibiting acid decomposability is preferably from 0 to 40 mol %, more preferably from 5 to 20 mol %, based on all repeating units in the resin. ((B2) Repeating unit capable of decomposing upon irradiation with an actinic ray or radiation to generate an acid)

From the standpoint of improving the resolution or pattern profile by preventing an acid generated upon exposure from diffusing into the unexposed area, the acid-decomposable resin contained in the actinic ray-sensitive or radiation-sensitive resin composition of the present invention preferably contains (B2) a repeating unit capable of decomposing upon irradiation with an actinic ray or radiation to generate an acid.

The repeating unit (B2) is a repeating unit capable of decomposing upon irradiation with an actinic ray or radiation to generate an acid anion in the side chain of the resin and, in one embodiment, is preferably at least a repeating unit containing an aromatic ring in the side chain excluding the counter anion of the acid anion.

More specifically, the repeating unit (B2) is preferably a repeating unit represented by the following formula (I) or (II):

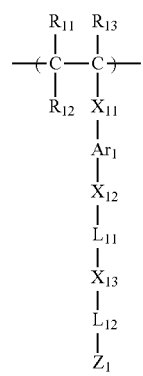

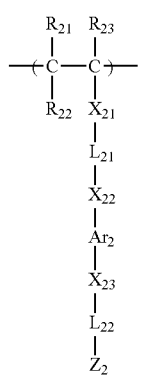

In formula (I), each of $R_{11}$, $R_{12}$ and $R_{13}$ independently represents a hydrogen atom, an alkyl group, a cycloalkyl group, a halogen atom, a cyano group or an alkoxycarbonyl group.

The alkyl group is a linear or branched alkyl group which may have a substituent, preferably an alkyl group having a carbon number of 20 or less, which may have a substituent, such as methyl group, ethyl group, propyl group, isopropyl group, n-butyl group, sec-butyl group, hexyl group, 2-ethylhexyl group, octyl group and dodecyl group, more preferably an alkyl group having a carbon number of 8 or less, still more preferably an alkyl group having a carbon number of 3 or less.

As the alkyl group contained in the alkoxycarbonyl group, the same alkyl group as in $R_{11}$, $R_{12}$ and $R_{13}$ is preferred.

The cycloalkyl group includes a monocyclic or polycyclic cycloalkyl group which may have a substituent. The cycloalkyl group is preferably a monocyclic cycloalkyl group having a carbon number of 3 to 8, which may have a substituent, such as cyclopropyl group, cyclopentyl group and cyclohexyl group.

The halogen atom includes a fluorine atom, a chlorine atom, a bromine atom and an iodine atom, with a fluorine atom being preferred.

Preferred examples of the substituent substituted on each of the groups above include a hydroxyl group, a halogen atom (e.g., fluorine, chlorine, bromine, iodine), a nitro group, a cyano group, an amido group, a sulfonamido group, the alkyl group described above for $R_{11}$ to $R_{13}$, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group, with a hydroxyl group and a halogen atom being more preferred.

In formula (I), each of $R_{11}$, $R_{12}$ and $R_{13}$ is preferably a hydrogen atom, an alkyl group or a halogen atom, more preferably a hydrogen atom, a methyl group, an ethyl group, a trifluoromethyl group (—CF$_3$), a hydroxymethyl group (—CH$_2$—OH), a chloromethyl group (—CH$_2$—Cl) or a fluorine atom (—F).

Each of $X_{11}$, $X_{12}$ and $X_{13}$ independently represents a single bond, —O—, —S—, —CO—, —SO$_2$—, —NR— (R is a hydrogen atom or an alkyl group), a divalent nitrogen-containing non-aromatic heterocyclic group, or a group formed by combining two or more thereof.

The alkyl group represented by R in —NR— is a linear or branched alkyl group which may have a substituent, and specific examples thereof are the same as those of the alkyl group in $R_{11}$, $R_{12}$ and $R_{13}$. In particular, R is preferably a hydrogen atom, a methyl group or an ethyl group. The divalent nitrogen-containing non-aromatic heterocyclic group means preferably a 3- to 8-membered non-aromatic heterocyclic group having at least one nitrogen atom. Specific examples thereof include divalent linking groups of the following structures.

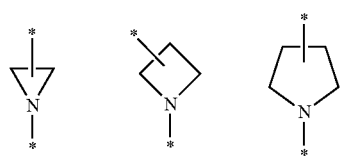

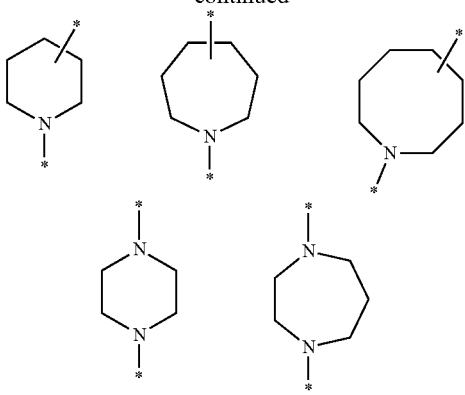

In the case where $X_{11}$ is a single bond, $R_{12}$ and $Ar_1$ may form a ring. In this case, $R_{12}$ represents an alkylene group. $X_{11}$ is preferably a single bond, —COO—, —CONR— (R is a hydrogen atom or an alkyl group), more preferably a single bond or —COO—.

$X_{12}$ is preferably a single bond, —O—, —CO—, —SO$_2$—, —NR— (R is a hydrogen atom or an alkyl group) or a group formed by combining two or more thereof, more preferably a single bond, —OCO— or —OSO$_2$—.

$X_{13}$ is preferably a single bond, —O—, —CO—, —SO$_2$—, —NR— (R is a hydrogen atom or an alkyl group) or a group formed by combining two or more thereof, more preferably a single bond, —OCO— or —OSO$_2$—.

$L_{11}$ represents a single bond, an alkylene group, an alkenylene group, a cycloalkylene group, a divalent aromatic ring group, or a group formed by combining two or more thereof. In the group formed by combination, two or more groups combined may be the same as or different from each other. Also, these groups may be connected through, as the linking group, —O—, —S—, —CO—, —SO$_2$—, —NR— (R is a hydrogen atom or an alkyl group), a divalent nitrogen-containing non-aromatic heterocyclic group, or a group formed by combining two or more thereof.

The alkylene group of $L_{11}$ may be linear or branched. The alkylene group is, for example, preferably an alkylene having a carbon number of 1 to 8, such as methylene group, ethylene group, propylene group, butylene group, hexylene group and octylene group, more preferably an alkylene group having a carbon number of 1 to 6, still more preferably an alkylene group having a carbon number of 1 to 4.

The alkenylene group includes a group having a double bond at an arbitrary position of the alkylene group described above for $L_{11}$.

The cycloalkylene group may be either monocyclic or polycyclic, and preferred examples thereof include a cycloalkylene group having a carbon number of 3 to 17, such as cyclobutylene group, cyclopentylene group, cyclohexylene group, norbornanylene group, adamantylene group and diamantanylene group. A cycloalkylene group having a carbon number of 5 to 12 is more preferred, and a cycloalkylene group having a carbon number of 6 to 10 is still more preferred.

Examples of the divalent aromatic ring group include an arylene group having a carbon number of 6 to 14, which may have a substituent, such as phenylene group, tolylene group and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

Specific examples of —NR— and divalent nitrogen-containing non-aromatic heterocyclic group are the same as those of respective groups in $X_{11}$ above, and preferred examples are also the same.

$L_{11}$ is preferably a single bond, an alkylene group or a cycloalkylene group, more preferably a single bond or an alkylene group.

$L_{12}$ represents a single bond, an alkylene group, an alkenylene group, a cycloalkylene group, a divalent aromatic ring group, or a group formed by combining two or more thereof, and in these groups, a part or all of hydrogen atoms are preferably substituted for by a substituent selected from a fluorine atom, an alkyl fluoride group, a nitro group and a cyano group. In the group formed by combination, two or more groups combined may be the same as or different from each other. Also, these groups may be connected through, as a linking group, —O—, —S—, —CO—, —SO$_2$—, —NR— (R is a hydrogen atom or an alkyl group), a divalent nitrogen-containing non-aromatic heterocyclic group, or a group formed by combining two or more thereof.

$L_{12}$ is preferably an alkylene group, a divalent aromatic ring group, or a group formed by combining two or more thereof, where a part or all of hydrogen atoms are substituted for by a fluorine atom or an alkyl fluoride group (more preferably a perfluoroalkyl group), more preferably an alkylene group where a part or all of hydrogen atoms are substituted for by a fluorine atom. $L_{12}$ is most preferably an alkylene group where from 30 to 100% by number of hydrogen atoms are substituted for by a fluorine atom.

The alkylene group in $L_{12}$ may be linear or branched, and preferred examples thereof include an alkylene group having a carbon number of 1 to 8, such as methylene group, ethylene group, propylene group, butylene group, hexylene group and octylene group. An alkylene group having a carbon number of 1 to 6 is more preferred, and an alkylene group having a carbon number of 1 to 4 is still more preferred.

The alkenylene group includes a group having a double bond at an arbitrary position of the above-described alkylene group.

The cycloalkylene group may be either monocyclic or polycyclic, and preferred examples thereof include a cycloalkylene group having a carbon number of 3 to 17, such as cyclobutylene group, cyclopentylene group, cyclohexylene group, norbornanylene group, adamantylene group and diamantanylene group.

Specific examples of the divalent aromatic ring group are the same as specific examples of the divalent aromatic ring group described above as the linking group of $L_{11}$.

Specific examples of —NR— and divalent nitrogen-containing non-aromatic heterocyclic group, as a linking group in $L_{12}$, are the same as those of respective groups in $X_{11}$ above, and preferred examples are also the same. Specific preferred examples of $L_{12}$ are illustrated below, but the present invention is not limited thereto.

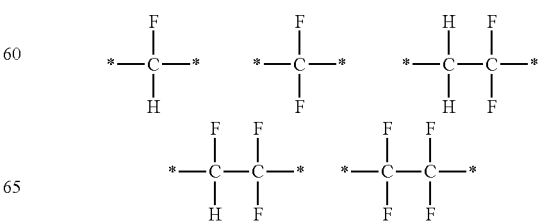

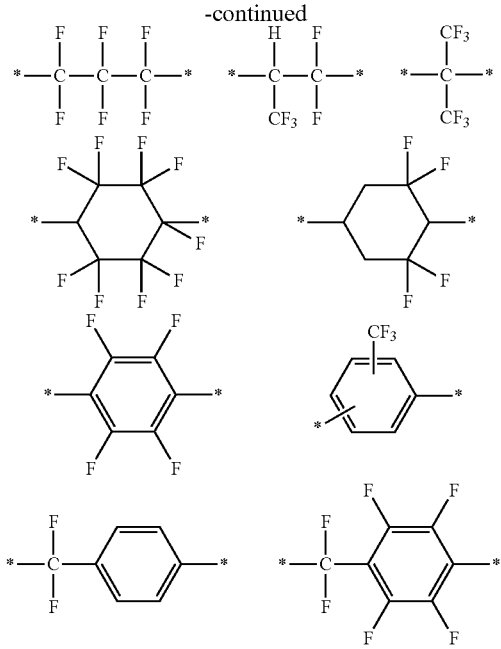

Ar₁ represents a divalent aromatic ring group or a group formed by combining a divalent aromatic ring group and an alkylene group.

The divalent aromatic ring group may have a substituent. Preferred examples of the divalent aromatic ring group include an arylene group having a carbon number of 6 to 18, such as phenylene group, tolylene group and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

Preferred substituents on each of the groups above include the alkyl group described for $R_{11}$ to $R_{13}$, an alkoxy group such as methoxy group, ethoxy group, hydroxyethoxy group, propoxy group, hydroxypropoxy group and butoxy group, and an aryl group such as phenyl group.

Preferred examples of the group formed by combining a divalent aromatic ring group and an alkylene group include an aralkylene group formed by combining the above-described divalent aromatic ring group and an alkylene group (which may be linear or branched) having a carbon number of 1 to 8, such as methylene group, ethylene group, propylene group, butylene group, hexylene group and octylene group.

Ar₁ is preferably an arylene group having a carbon number of 6 to 18, which may have a substituent, more preferably a phenylene group, a naphthylene group, a biphenylene group, or a phenylene group substituted with a phenyl group.

$Z_1$ represents a moiety capable of becoming a sulfonic acid group, an imide acid group or a methide acid group upon irradiation with an actinic ray or radiation. The moiety represented by $Z_1$ is preferably an onium salt, and the onium salt is preferably a sulfonium salt or an iodonium salt, more preferably a structure represented by the following formulae (ZI) to (ZIII):

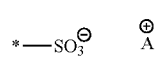

(ZI)

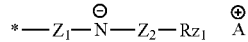

(ZII)

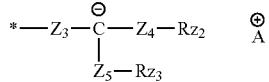

(ZIII)

In formulae (ZII) and (ZIII), each of $Z_1$, $Z_2$, $Z_3$, $Z_4$ and $Z_5$ independently represents —CO— or —SO₂—, preferably —SO₂—.

Each of $Rz_1$, $Rz_2$ and $Rz_3$ independently represents an alkyl group, a cycloalkyl group, an aryl group or an aralkyl group. Such a groups is preferably in an embodiment where a part or all of hydrogen atoms are substituted for by a fluorine atom or a fluoroalkyl group (more preferably a perfluoroalkyl group), more preferably an embodiment where from 30 to 100% by number of hydrogen atoms are substituted for by a fluorine atom.

The alkyl group may be linear or branched, and preferred examples thereof include an alkyl group having a carbon number of 1 to 8, such as methyl group, ethyl group, propyl group, butyl group, hexyl group and octyl group. An alkyl group having a carbon number of 1 to 6 is more preferred, and an alkyl group having a carbon number of 1 to 4 is still more preferred.

The cycloalkyl group is, for example, preferably a cycloalkyl group having a carbon number of 3 to 10, such as cyclobutyl group, cyclopentyl group and cyclohexyl group, more preferably a cycloalkyl group having a carbon number of 3 to 6.

The aryl group is preferably an aryl group having a carbon number of 6 to 18, more preferably an aryl group having a carbon number of 6 to 10, still more preferably a phenyl group.

The aralkyl group is preferably, for example, an aralkyl group formed by combining an alkylene group having a carbon number of 1 to 8 and the above-described aryl group. An aralkyl group formed by combining an alkylene group having a carbon number of 1 to 6 and the above-described aryl group is more preferred, and an aralkyl group formed by combining an alkylene group having a carbon number of 1 to 4 and the above-described aryl group is still more preferred.

Each of $Rz_1$, $Rz_2$ and $Rz_3$ is preferably an alkyl group with a part or all of hydrogen atoms being substituted for by a fluorine atom or a fluoroalkyl group (more preferably a perfluoroalkyl group), more preferably an alkyl group where from 30 to 100% by number of hydrogen atoms are substituted for by a fluorine atom.

In formulae (ZI) to (ZIII), A⁺ represents a sulfonium cation or an iodonium cation and is preferably a sulfonium cation in formula (ZX) or an iodonium cation in formula (ZXI).

Specific examples of the structure for the cation constituting an onium salt preferred as $Z_1$ in formula (I) are illustrated later.

With respect to the polymerizable monomer unit corresponding to the repeating unit of formula (I), examples of the sulfonic acid, imide acid or methide acid unit produced resulting from leaving of the cation upon irradiation with an actinic ray or irradiation are illustrated below.

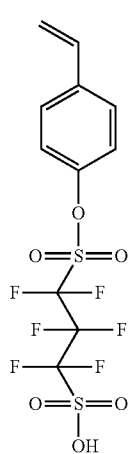 (I-1)
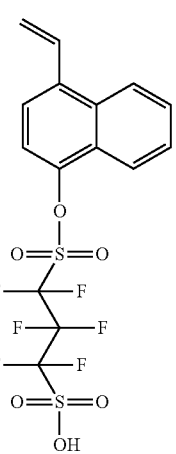 (I-4)
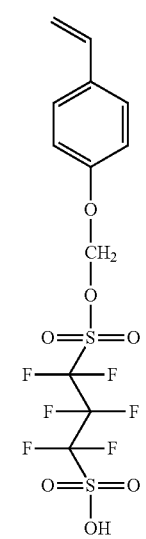 (I-5)
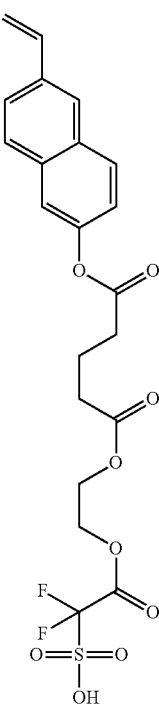 (I-6)

(I-7)
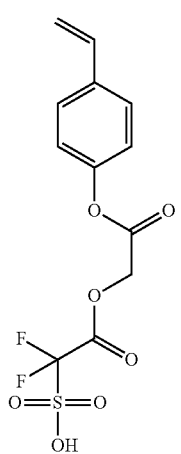
(I-8)
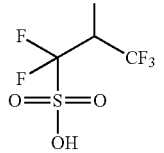
(I-9)
(I-10)
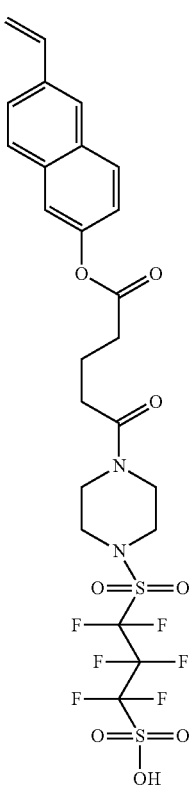
(I-11)
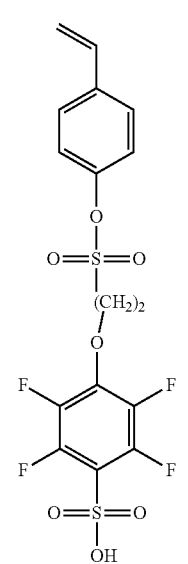

(I-12)
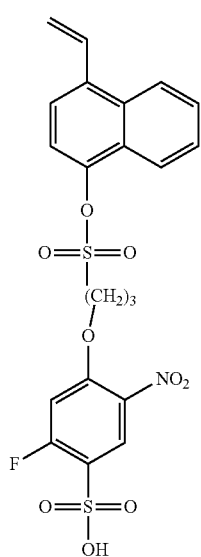
(I-14)
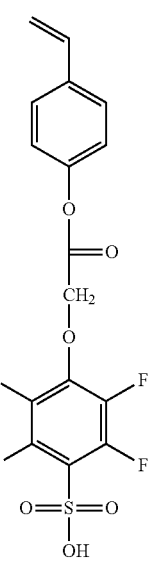
(I-13)
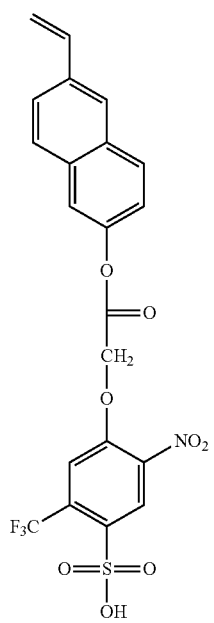
(I-15)
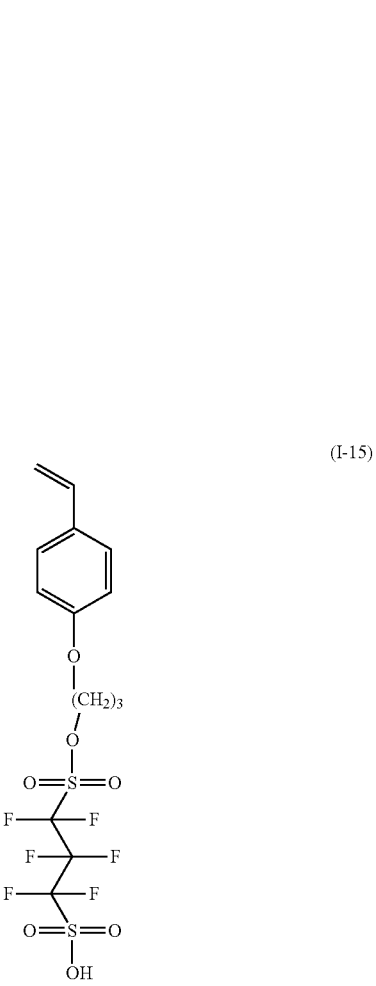

(I-16)
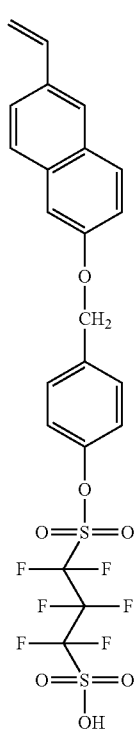
(I-17)
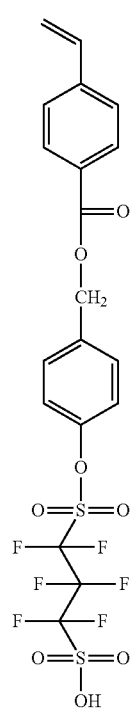
(I-18)
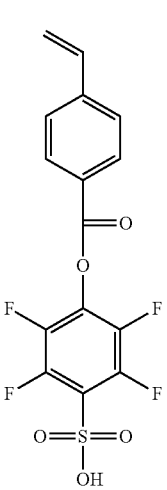
(I-19)
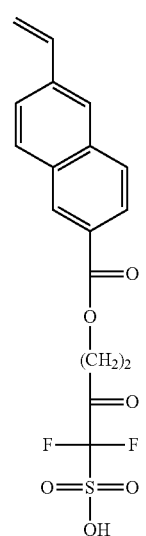
(I-20)
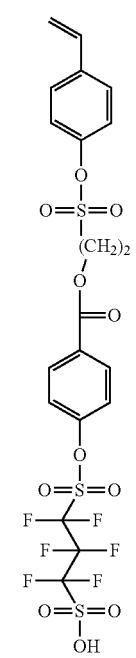

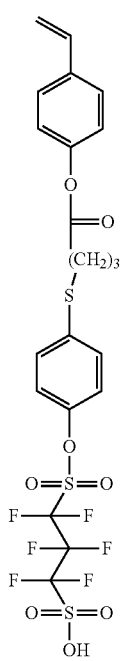
(I-21)
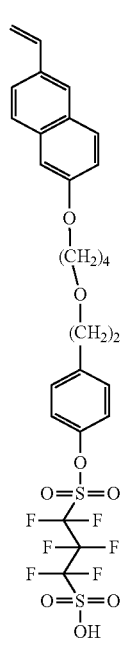
(I-22)
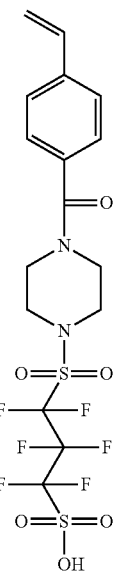
(I-23)
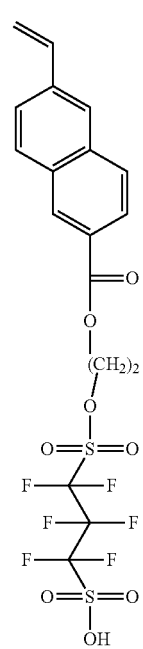
(I-24)
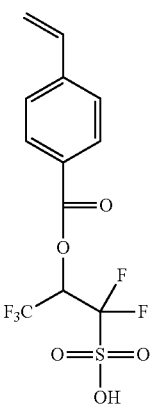
(I-25)

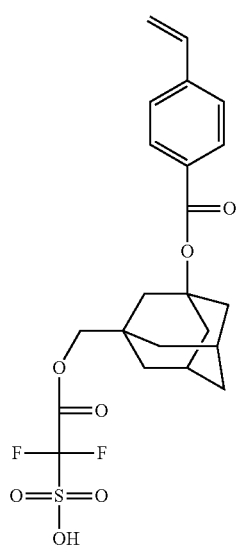 (I-26)
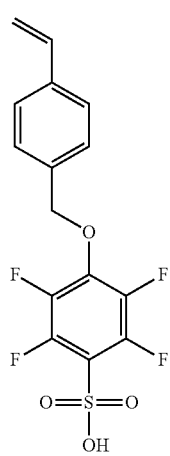 (I-30)
(I-27)
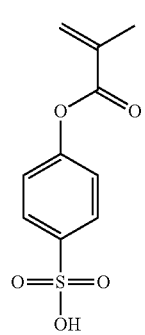 (I-31)
(I-28)
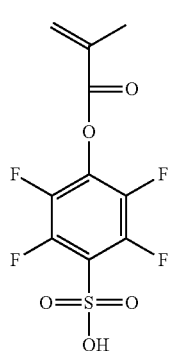 (I-32)
(I-29)
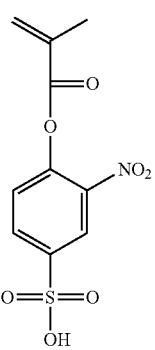 (I-33)

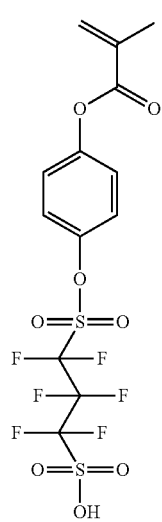 (I-34)
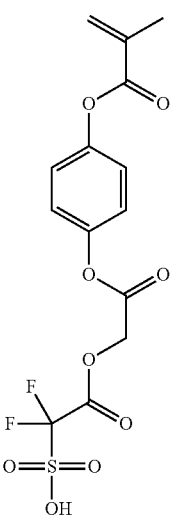 (I-35)
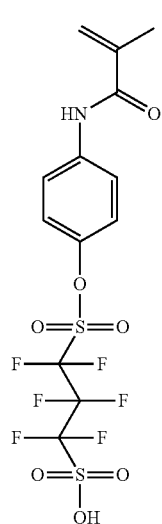 (I-36)
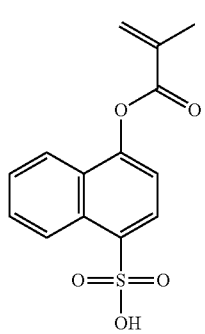 (I-37)
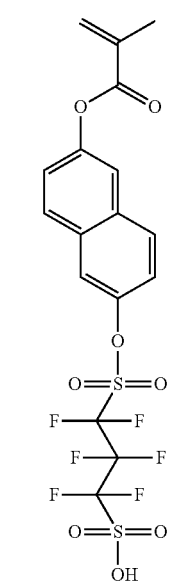 (I-38)
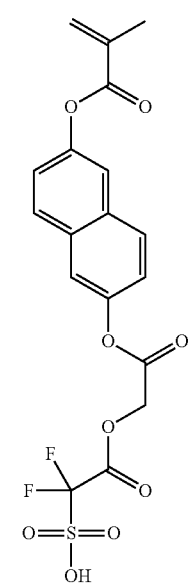 (I-39)

(I-40)
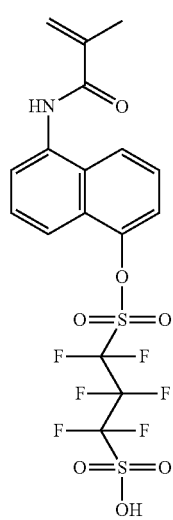
(I-41)
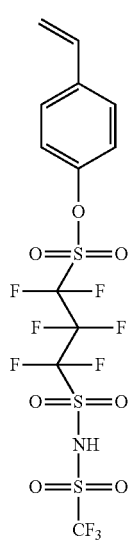
(I-42)
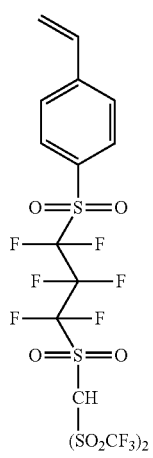
(I-43)
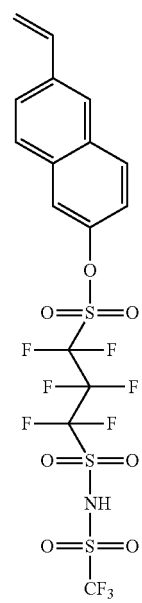
(I-44)
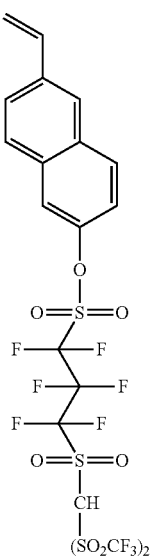
(I-45)
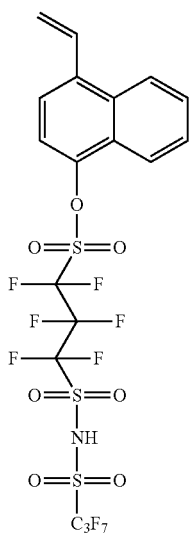

(I-46)
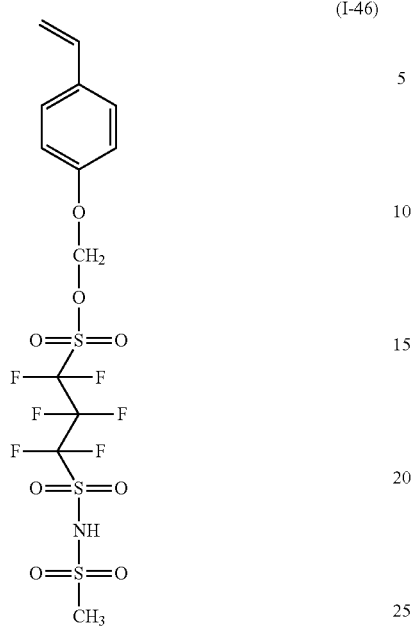
(I-48)
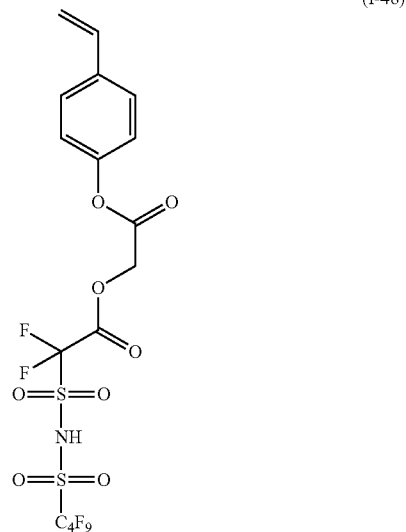
(I-47)
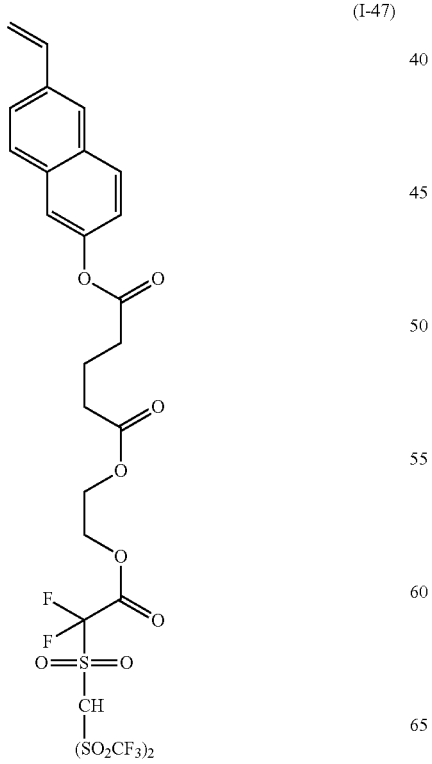
(I-49)
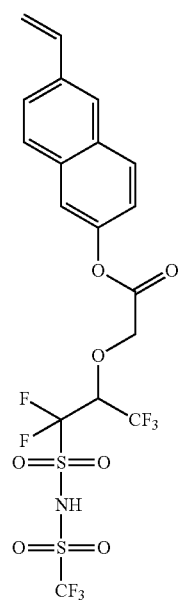

(I-50)
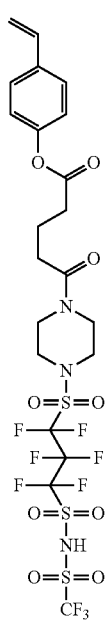
(I-51)
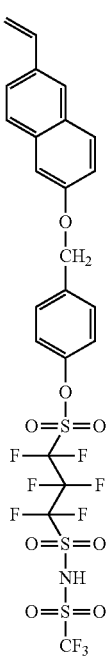
(I-52)
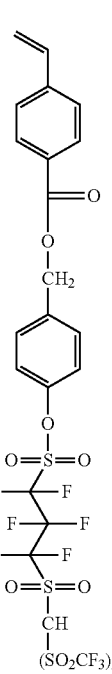
(I-53)
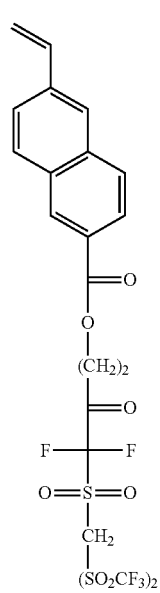
(I-54)
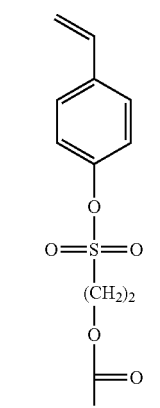

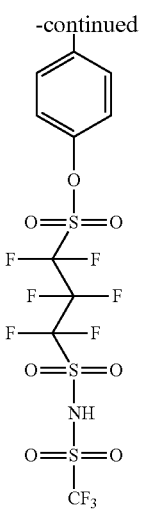
(I-55)
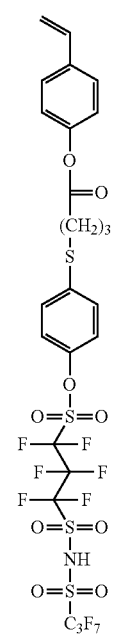
(I-56)
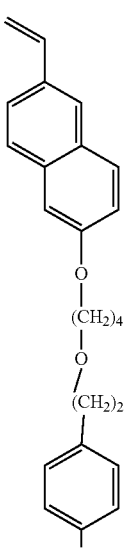
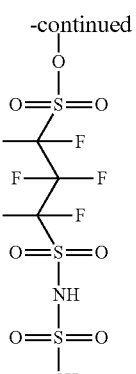
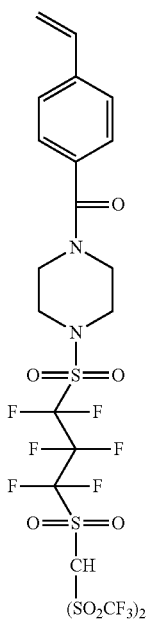
(I-57)
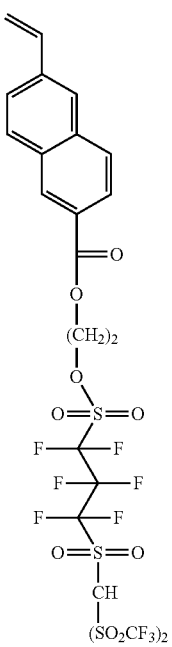
(I-58)

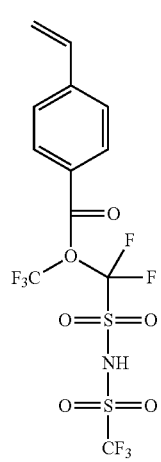
(I-59)
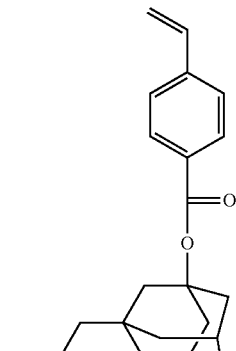
(I-60)
(I-61)
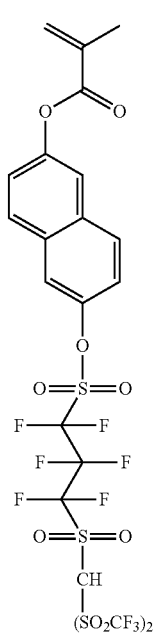
(I-62)
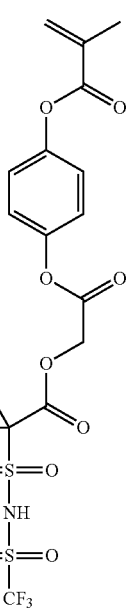
(I-63)

-continued (I-64)

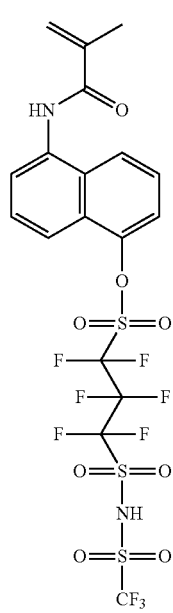

(I-65)

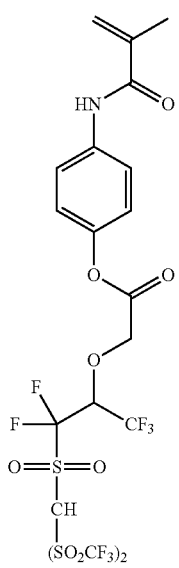

Formula (II) is described below.

In formula (II), $R_{21}$, $R_{22}$ and $R_{23}$ have the same meanings as $R_{11}$, $R_{12}$ and $R_{13}$ in formula (I), and specific examples and preferred examples of each group are the same as those of the group described above for $R_{11}$, $R_{12}$ and $R_{13}$.

$X_{21}$ represents —O—, —S—, —CO—, —SO$_2$—, —NR— (R is a hydrogen atom or an alkyl group), a divalent nitrogen-containing non-aromatic heterocyclic group, or a group formed by combining two or more thereof.

The alkyl group represented by R in —NR— is a linear or branched alkyl group which may have a substituent, and specific examples thereof are the same as those of the alkyl group in $R_{21}$, $R_{22}$ and $R_{23}$. In particular, R is preferably a hydrogen atom, a methyl group or an ethyl group.

The divalent nitrogen-containing non-aromatic heterocyclic group means preferably a 3- to 8-membered non-aromatic heterocyclic group having at least one nitrogen atom. Specific examples thereof include structures illustrated for $X_{11}$ to $X_{13}$ in formula (I).

$X_{21}$ is preferably —O—, —CO—, —NR— (R is a hydrogen atom or an alkyl group), or a group formed by combining two or more thereof, more preferably —COO— or —CONR— (R is a hydrogen atom or an alkyl group).

$L_{21}$ represents an alkylene group, an alkenylene group, a cycloalkylene group, or a group formed by combining two or more thereof. In the group formed by combination, two or more groups combined may be the same as or different from each other. Also, these groups may be connected through, as a linking group, —O—, —S—, —CO—, —SO$_2$—, —NR— (R is a hydrogen atom or an alkyl group), a divalent nitrogen-containing non-aromatic heterocyclic group, a divalent aromatic ring group, or a group formed by combining two or more thereof.

The alkylene group of $L_{21}$ may be linear or branched, and preferred examples thereof include an alkylene group having a carbon number of 1 to 8, such as methylene group, ethylene group, propylene group, butylene group, hexylene group and octylene group. An alkylene group having a carbon number of 1 to 6 is more preferred, and an alkylene group having a carbon number of 1 to 4 is still more preferred.

The alkenylene group includes a group having a double bond at an arbitrary position of the alkylene group described above for $L_{21}$.

The cycloalkylene group may be either monocyclic or polycyclic, and preferred examples thereof include a cycloalkylene group having a carbon number of 3 to 17, such as cyclobutylene group, cyclopentylene group, cyclohexylene group, norbornanylene group, adamantylene group and diamantanylene group. A cycloalkylene group having a carbon number of 5 to 12 is more preferred, and a cycloalkylene group having a carbon number of 6 to 10 is still more preferred.

Examples of the divalent aromatic ring group as the linking group include an arylene group having a carbon number of 6 to 14, which may have a substituent, such as phenylene group, tolylene group and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

Specific examples of —NR— and divalent nitrogen-containing non-aromatic heterocyclic group are the same as those of respective groups in $X_{21}$ above, and preferred examples are also the same.

$L_{21}$ is preferably an alkylene group, a cycloalkylene group, or a group formed by combining an alkylene group and a cycloalkylene group through —OCO—, —O— or —CONH— (for example, -alkylene group-O-alkylene group-, -alkylene group-OCO-alkylene group-, -cycloalkylene group-O-alkylene group-, or -alkylene group-CONH-alkylene group-).

Each of $X_{22}$ and $X_{23}$ independently represents a single bond, —O—, —S—, —CO—, —SO$_2$—, —NR— (R is a hydrogen atom or an alkyl group), a divalent nitrogen-containing non-aromatic heterocyclic group, or a group formed by combining two or more thereof.

Specific examples of —NR— and divalent nitrogen-containing non-aromatic heterocyclic group in $X_{22}$ and $X_{23}$ are the same as those of respective groups in $X_{21}$ above, and preferred examples are also the same.

$X_{22}$ is preferably a single bond, —S—, —O—, —CO—, —SO$_2$— or a group formed by combining two or more thereof, more preferably a single bond, —S—, —OCO— or —OSO$_2$—.

$X_{23}$ is preferably —O—, —CO—, —SO$_2$— or a group formed by combining two or more thereof, more preferably —OSO$_2$—.

Ar$_2$ represents a divalent aromatic ring group or a group formed by combining a divalent aromatic group and an alkylene group.

This divalent aromatic ring group may have a substituent. Preferred examples of the divalent aromatic ring group include an arylene group having a carbon number of 6 to 18, such as phenylene group, tolylene group and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

Preferred substituents on each of the groups above include the alkyl group described for R$_{21}$ to R$_{23}$, an alkoxy group such as methoxy group, ethoxy group, hydroxyethoxy group, propoxy group, hydroxypropoxy group and butoxy group, and an aryl group such as phenyl group.

Preferred examples of the group formed by combining a divalent aromatic ring group and an alkylene group include an aralkylene group formed by combining the above-described divalent aromatic ring group and an alkylene group (which may be linear or branched) having a carbon number of 1 to 8, such as methylene group, ethylene group, propylene group, butylene group, hexylene group and octylene group.

Ar$_2$ is preferably an arylene group having a carbon number of 6 to 18, which may have a substituent, more preferably an aralkylene group formed by combining an arylene group having a carbon number of 6 to 18 and an alkylene group having a carbon number of 1 to 4, still more preferably a phenylene group, a naphthylene group, a biphenylene group, or a phenylene group substituted with a phenyl group.

L$_{22}$ represents an alkylene group, an alkenylene group, a cycloalkylene group, a divalent aromatic ring group, or a group formed by combining two or more thereof, and in these groups, a part or all of hydrogen atoms are substituted for by a substituent selected from a fluorine atom, an alkyl fluoride group, a nitro group and a cyano group. In the group formed by combination, two or more groups combined may be the same as or different from each other. Also, these groups may be connected through, as a linking group, —O—, —S—, —CO—, —SO$_2$—, —NR— (R is a hydrogen atom or an alkyl group), a divalent nitrogen-containing non-aromatic heterocyclic group, or a group formed by combining two or more thereof.

L$_{22}$ is preferably an alkylene group, a divalent aromatic ring group, or a group formed by combining two or more thereof, where a part or all of hydrogen atoms are substituted for by a fluorine atom or an alkyl fluoride group (more preferably a perfluoroalkyl group), more preferably an alkylene group or a divalent aromatic ring group, where a part or all of hydrogen atoms are substituted for by a fluorine atom. L$_{22}$ is most preferably an alkylene group or a divalent aromatic ring group, where from 30 to 100% by number of hydrogen atoms are substituted for by a fluorine atom.

The alkylene group in L$_{22}$ may be linear or branched, and preferred examples thereof include an alkylene group having a carbon number of 1 to 8, such as methylene group, ethylene group, propylene group, butylene group, hexylene group and octylene group. An alkylene group having a carbon number of 1 to 6 is more preferred, and an alkylene group having a carbon number of 1 to 4 is still more preferred.

The alkenylene group includes a group having a double bond at an arbitrary position of the above-described alkylene group.

The cycloalkylene group may be either monocyclic or polycyclic, and preferred examples thereof include a cycloalkylene group having a carbon number of 3 to 17, such as cyclobutylene group, cyclopentylene group, cyclohexylene group, norbornanylene group, adamantylene group and diamantanylene group.

Specific examples of the divalent aromatic ring group are the same as specific examples of the divalent aromatic ring group described above as the linking group of L$_{21}$.

Specific examples of —NR— and the divalent nitrogen-containing non-aromatic heterocyclic group, as a linking group in L$_{22}$, are the same as those of respective groups in X$_{21}$ above, and preferred examples are also the same.

Specific preferred examples of L$_{22}$ include the structures illustrated above for L$_{12}$ in formula (I).

Z$_2$ represents a moiety capable of becoming a sulfonic acid group, an imide acid group or a methide acid group upon irradiation with an actinic ray or radiation. Z$_2$ has the same meaning as Z$_1$ in formula (I), and the description about Z$_1$ also applies to Z$_2$.

Specific examples of the structure for the cation constituting an onium salt preferred as Z$_2$ in formula (II) are illustrated later.

With respect to the polymerizable monomer unit corresponding to the repeating unit of formula (II), examples of the sulfonic acid, imide acid or methide acid unit produced resulting from leaving of the cation upon irradiation with an actinic ray or irradiation are illustrated below.

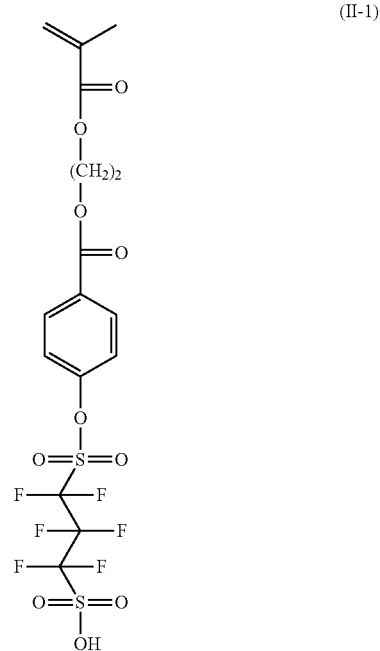

(II-1)

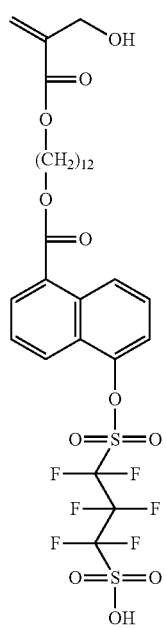
(II-2)
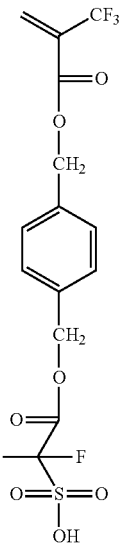
(II-4)
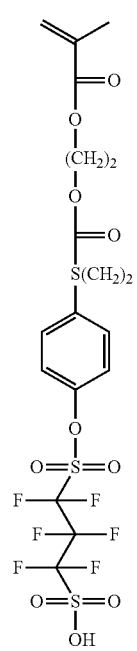
(II-3)
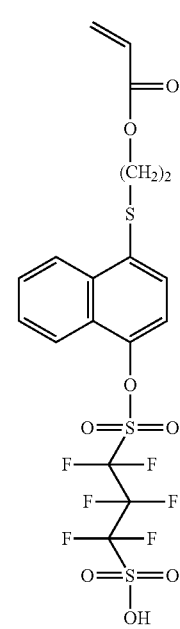
(II-5)

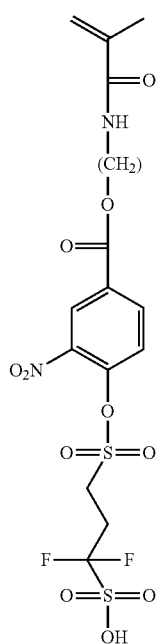
(II-6)
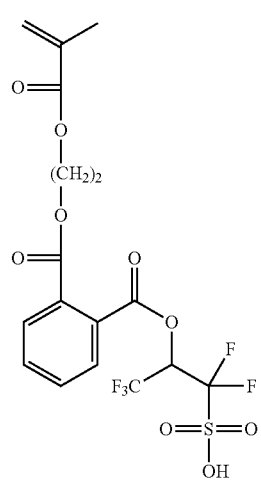
(II-7)
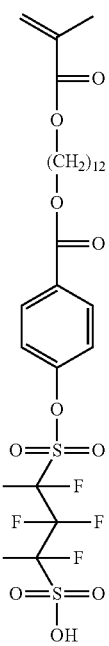
(II-8)
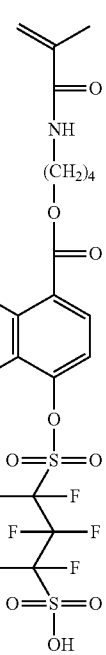
(II-9)

(II-10)
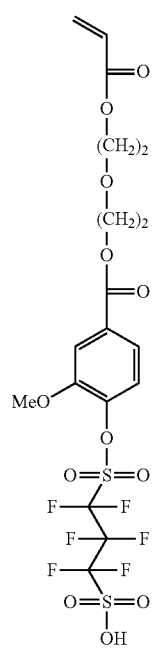
(II-12)
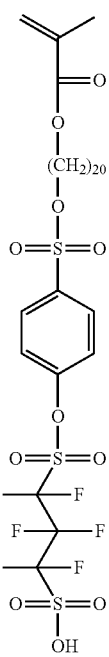
(II-11)
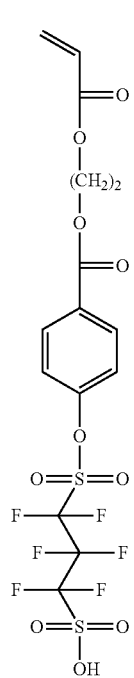
(II-13)
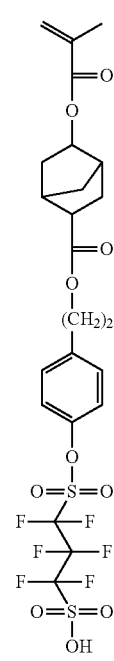

(II-14)
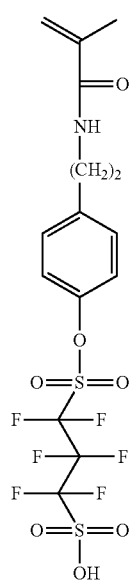
(II-15)
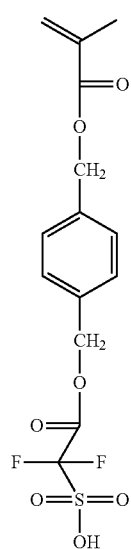
(II-16)
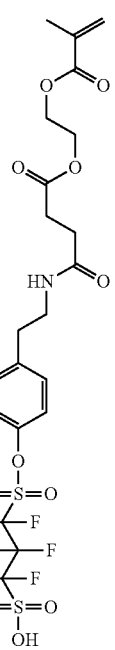
(II-17)
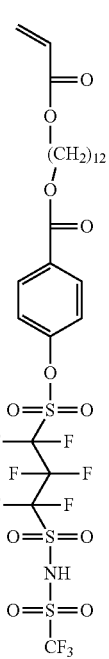

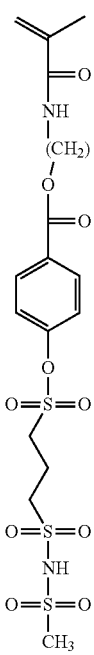 (II-18)
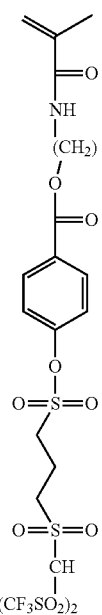 (II-19)
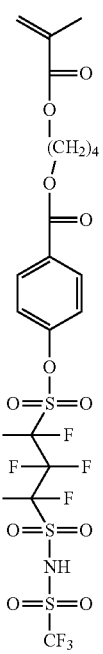 (II-20)
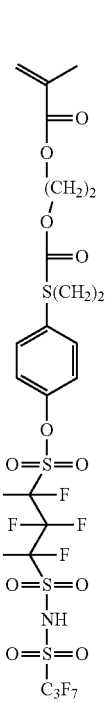 (II-21)

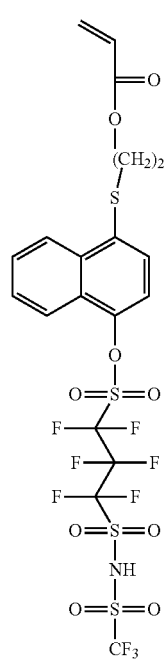
(II-22)
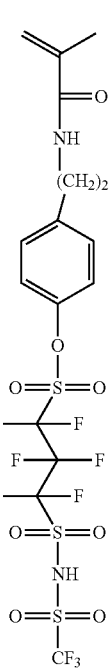
(II-24)
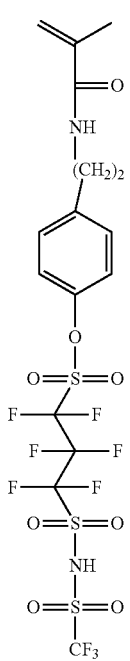
(II-23)
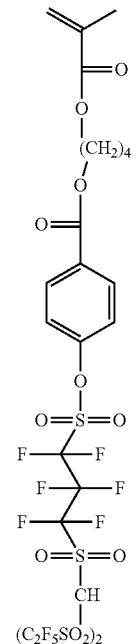
(II-25)

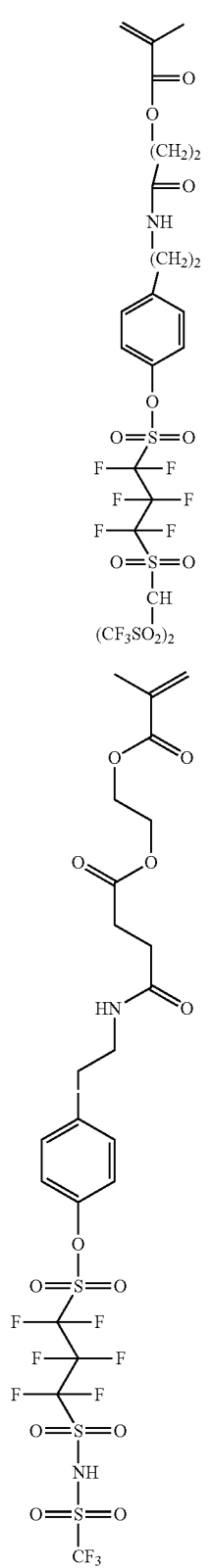

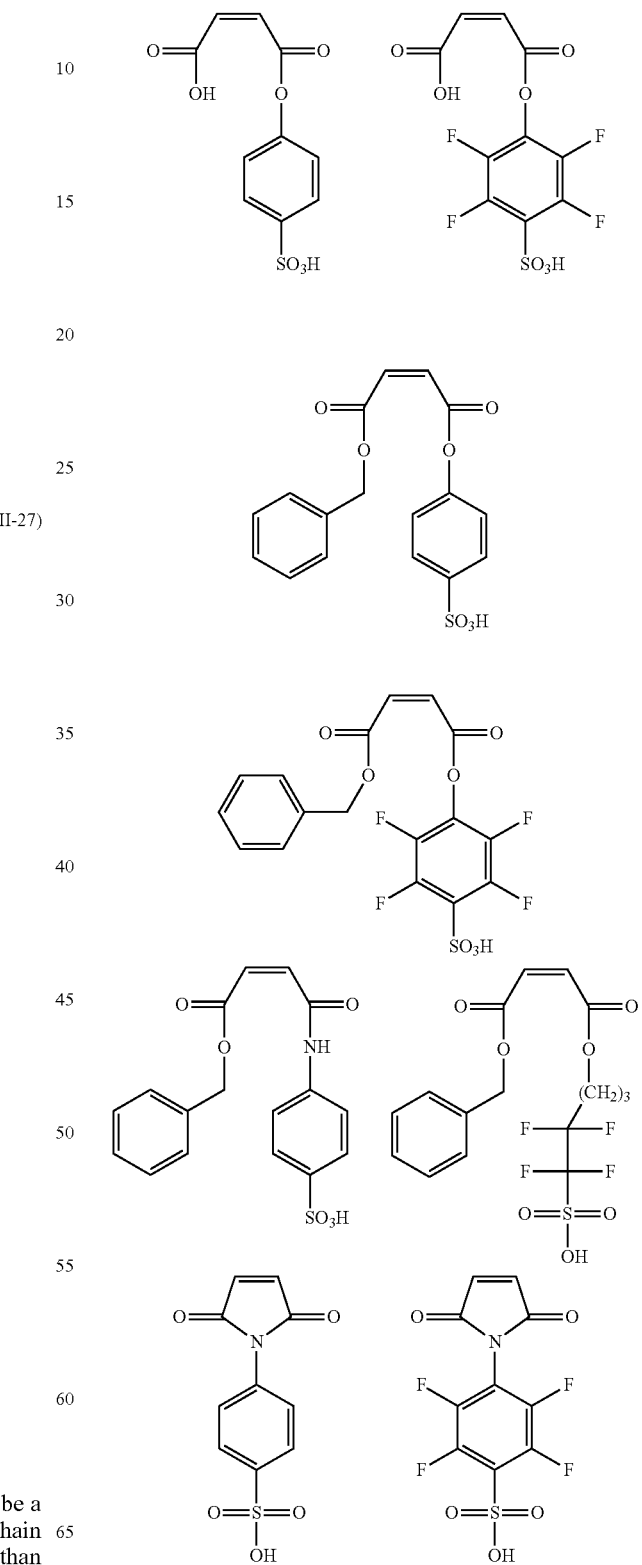

With respect to the polymerizable monomer unit corresponding to such a repeating unit (B2), examples of the sulfonic acid, imide acid or methide acid unit produced resulting from leaving of the cation upon irradiation with an actinic ray or irradiation are illustrated below.

In another embodiment, the repeating unit (B2) may be a repeating unit containing an aromatic ring in the side chain excluding the counter cation for the acid anion, other than those represented by formulae (I) and (II).

-continued

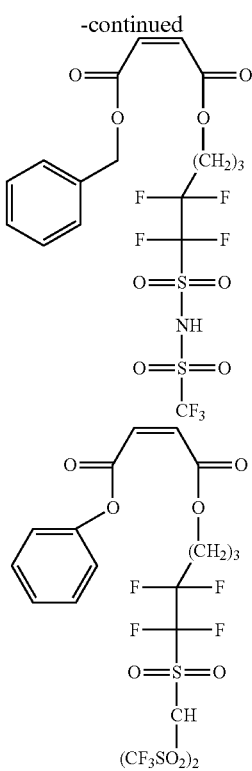

It is also preferred that the repeating unit (B2) is represented by formula (III):

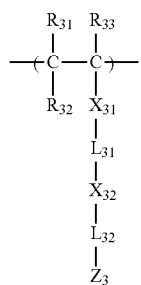

In formula (III), $R_{31}$, $R_{32}$ and $R_{33}$ have the same meanings as $R_{11}$, $R_{12}$ and $R_{13}$ in formula (I), and specific examples and preferred examples of each group are the same as those of the group described above for $R_{11}$, $R_{12}$ and $R_{13}$.

The alkyl group is a linear or branched alkyl group which may have a substituent, and is preferably an alkyl group having a carbon number of 20 to less, such as methyl group, ethyl group, propyl group, isopropyl group, n-butyl group, sec-butyl group, hexyl group, 2-ethylhexyl group, octyl group and dodecyl group, more preferably an alkyl group having a carbon number of 8 or less, still more preferably an alkyl group having a carbon number of 3 or less.

As the alkyl group contained in the alkoxycarbonyl group, the same alkyl group as in $R_{31}$, $R_{32}$ and $R_{33}$ is preferred.

The cycloalkyl group includes a monocyclic or polycyclic cycloalkyl group which may have a substituent. The cycloalkyl group is preferably a monocyclic cycloalkyl group having a carbon number of 3 to 8, which may have a substituent, such as cyclopropyl group, cyclopentyl group and cyclohexyl group.

The halogen atom includes a fluorine atom, a chlorine atom, a bromine atom and an iodine atom, with a fluorine atom being preferred.

Preferred examples of the substituent which may be substituted on each of the groups above include a hydroxyl group, a halogen atom (e.g., fluorine, chlorine, bromine, iodine), a nitro group, a cyano group, an amido group, a sulfonamido group, the alkyl group described above for $R_{21}$ to $R_{23}$, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group, with a hydroxyl group and a halogen atom being more preferred.

In formula (III), each of $R_{31}$, $R_{32}$ and $R_{33}$ is preferably a hydrogen atom, an alkyl group or a halogen atom, more preferably a hydrogen atom, a methyl group, an ethyl group, a trifluoromethyl group (—$CF_3$), a hydroxymethyl group (—$CH_2$—OH), a chloromethyl group (—$CH_2$—Cl) or a fluorine atom (—F).

Each of $X_{31}$ and $X_{32}$ independently represents a single bond, —O—, —S—, —CO—, —$SO_2$—, —NR— (R is a hydrogen atom or an alkyl group), a divalent nitrogen-containing non-aromatic heterocyclic group, or a group formed by combining two or more thereof.

The alkyl group represented by R in —NR— is a linear or branched alkyl group which may have a substituent, and specific examples thereof are the same as those of the alkyl group in $R_{31}$, $R_{32}$ and $R_{33}$. In particular, R is preferably a hydrogen atom, a methyl group or an ethyl group.

The divalent nitrogen-containing non-aromatic heterocyclic group means preferably a 3- to 8-membered non-aromatic heterocyclic group having at least one nitrogen atom. Specific examples thereof include the structures illustrated above for $X_{11}$ to $X_{13}$ in formula (I).

$X_{31}$ is preferably a single bond, —O—, —CO—, —NR— (R is a hydrogen atom or an alkyl group), or a group formed by combining two or more thereof, more preferably —COO— or —CONR— (R is a hydrogen atom or an alkyl group).

$X_{32}$ is preferably a single bond, —O—, —CO—, —$SO_2$—, a divalent nitrogen-containing non-aromatic heterocyclic group, or a group formed by combining two or more thereof, more preferably a single bond, —OCO—, —$OSO_2$—, or a group formed by combining a divalent nitrogen-containing non-aromatic heterocyclic group and —$SO_2$—.

$L_{31}$ represents a single bond, an alkylene group, an alkenylene group, a cycloalkylene group, or a group formed by combining two or more thereof. In the group formed by combination, two or more groups combined may be the same as or different from each other. Also, these groups may be connected through, as a linking group, —O—, —S—, —CO—, —$SO_2$—, —NR— (R is a hydrogen atom or an alkyl group), a divalent nitrogen-containing non-aromatic heterocyclic group, or a group formed by combining two or more thereof.

The alkylene group of $L_{31}$ may be linear or branched, and preferred examples thereof include an alkylene group having a carbon number of 1 to 8, such as methylene group, ethylene group, propylene group, butylene group, hexylene group and octylene group. An alkylene group having a carbon number of 1 to 6 is more preferred, and an alkylene group having a carbon number of 1 to 4 is still more preferred.

The alkenylene group includes a group having a double bond at an arbitrary position of the alkylene group described above for $L_{31}$.

The cycloalkylene group may be either monocyclic or polycyclic, and preferred examples thereof include a cycloalkylene group having a carbon number of 3 to 17, such as cyclobutylene group, cyclopentylene group, cyclohexylene group, norbornanylene group, adamantylene group and diamantanylene group. A cycloalkylene group having a carbon number of 5 to 12 is more preferred, and a cycloalkylene group having a carbon number of 6 to 10 is still more preferred.

Specific examples of —NR— and divalent nitrogen-containing non-aromatic heterocyclic group are the same as those of respective groups in $X_{31}$ above, and preferred examples are also the same.

$L_{31}$ is preferably a single bond, an alkylene group, a cycloalkylene group, or a group formed by combining an alkylene group and a cycloalkylene group through —OCO—, —O— or —CONH— (for example, -alkylene group-O-alkylene group-, -alkylene group-OCO-alkylene group-, -cycloalkylene group-O-alkylene group-, or -alkylene group-CONH-alkylene group-).

$L_{32}$ represents an alkylene group, an alkenylene group, a cycloalkylene group, or a group formed by combining two or more thereof, and in these groups, a part or all of hydrogen atoms are substituted for by a substituent selected from a fluorine atom, an alkyl fluoride group, a nitro group and a cyano group. In the group formed by combination, two or more groups combined may be the same as or different from each other. Also, these groups may be connected through, as a linking group, —O—, —S—, —CO—, —SO$_2$—, —NR— (R is a hydrogen atom or an alkyl group), a divalent nitrogen-containing non-aromatic heterocyclic group, or a group formed by combining two or more thereof.

$L_{32}$ is preferably an alkylene group where a part or all of hydrogen atoms are substituted for by a fluorine atom or an alkyl fluoride group (more preferably a perfluoroalkyl group), more preferably an alkylene group where a part or all of hydrogen atoms are substituted for by a fluorine atom. $L_{32}$ is most preferably an alkylene group where from 30 to 100% by number of hydrogen atoms are substituted for by a fluorine atom.

The alkylene group in $L_{32}$ may be linear or branched, and preferred examples thereof include an alkylene group having a carbon number of 1 to 8, such as methylene group, ethylene group, propylene group, butylene group, hexylene group and octylene group. An alkylene group having a carbon number of 1 to 6 is more preferred, and an alkylene group having a carbon number of 1 to 4 is still more preferred.

The alkenylene group includes a group having a double bond at an arbitrary position of the above-described alkylene group.

The cycloalkylene group may be either monocyclic or polycyclic, and preferred examples thereof include a cycloalkylene group having a carbon number of 3 to 17, such as cyclobutylene group, cyclopentylene group, cyclohexylene group, norbornanylene group, adamantylene group and diamantanylene group.

Specific examples of —NR— and divalent nitrogen-containing non-aromatic heterocyclic group, as a linking group in $L_{32}$, are the same as those of respective groups in $X_{31}$ above, and preferred examples are also the same. Specific preferred examples of $L_{32}$ include the structures illustrated above for $L_{12}$ in formula (I).

$Z_3$ represents a moiety capable of becoming a sulfonic acid group, an imide acid group or a methide acid group upon irradiation with an actinic ray or radiation. $Z_3$ has the same meaning as $Z_1$ in formula (I), and the description about $Z_1$ also applies to $Z_3$.

Specific examples of the structure for the cation constituting an onium salt preferred as $Z_3$ in formula (III) are illustrated later.

With respect to the polymerizable monomer unit corresponding to the repeating unit of formula (III), examples of the sulfonic acid, imide acid or methide acid unit produced resulting from leaving of the cation upon irradiation with an actinic ray or irradiation are illustrated below.

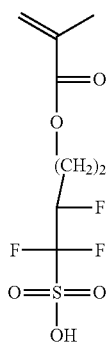

(III-1)

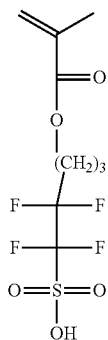

(III-2)

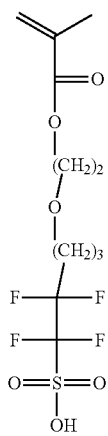

(III-3)

(III-4)
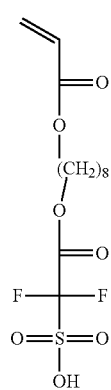
(III-5)
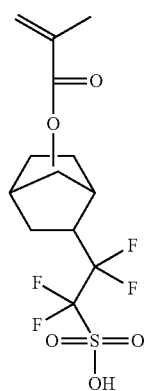
(III-6)
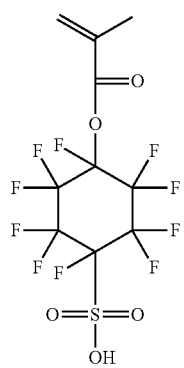
(III-7)
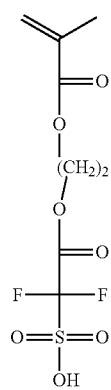
(III-8)
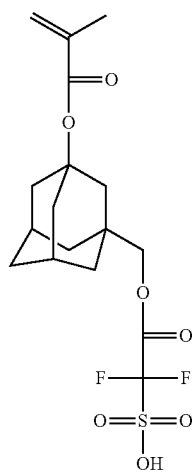
(III-9)
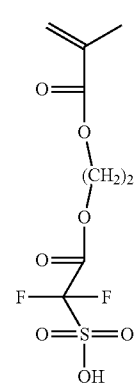
(III-10)
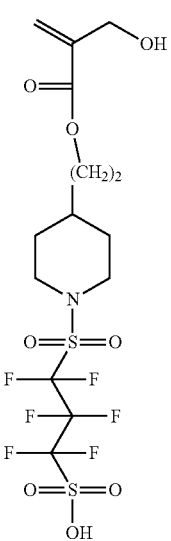

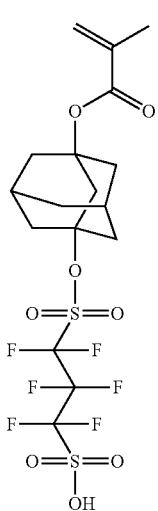
(III-11)
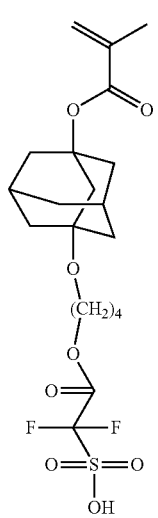
(III-12)
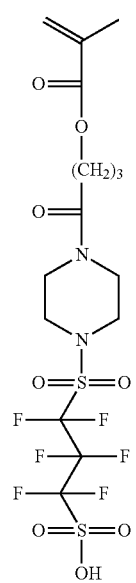
(III-13)
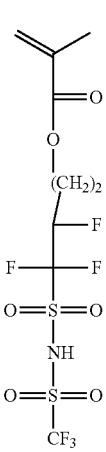
(III-14)
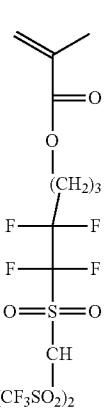
(III-15)
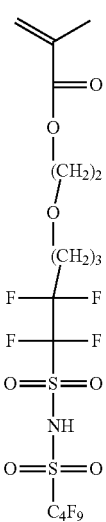
(III-16)

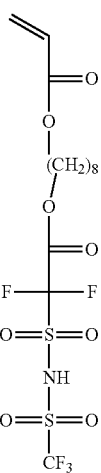 (III-17)
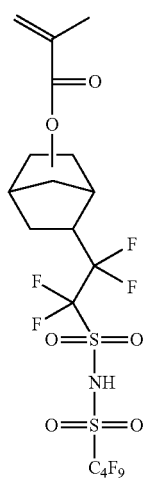 (III-18)
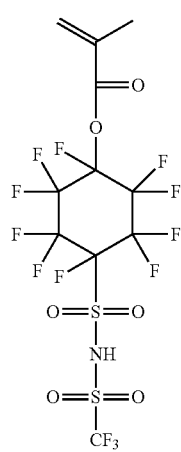 (III-19)
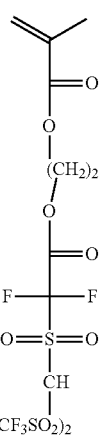 (III-20)
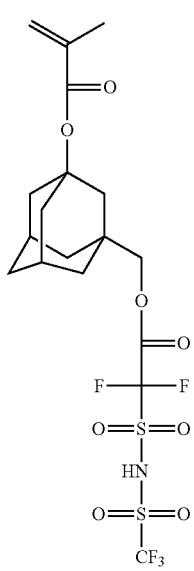 (III-21)
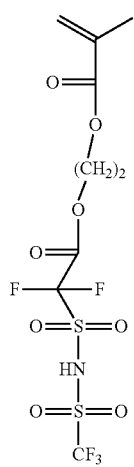 (III-22)

(III-23)
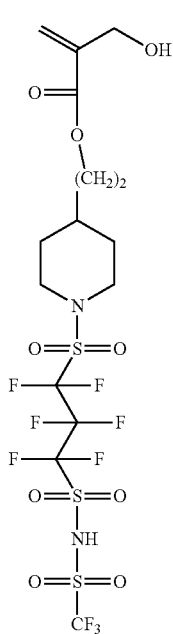
(III-24)
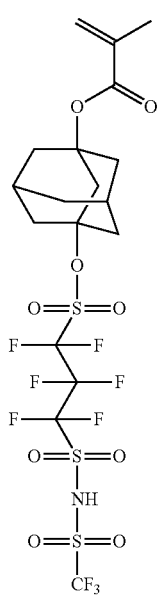
(III-25)
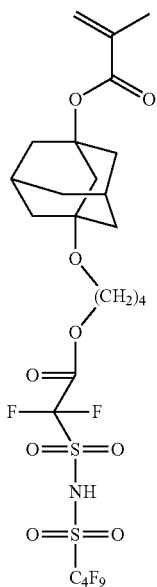
(III-26)
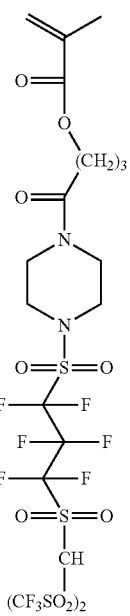
(III-27)
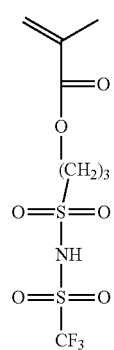

(III-28) 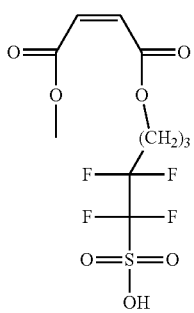
(III-29) 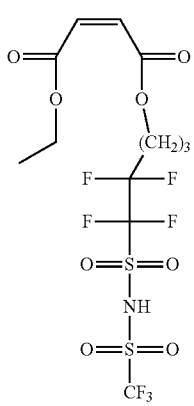
(III-30) 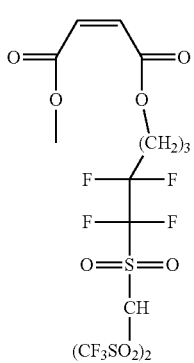
(III-31) 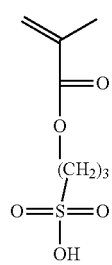
(III-32) 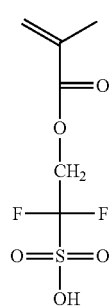
(III-33) 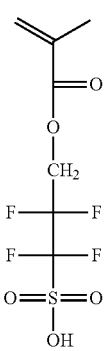
(III-34) 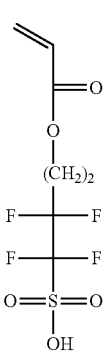
(III-35) 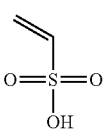
(III-36) 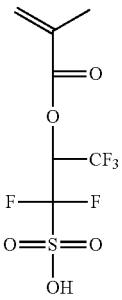
(III-37) 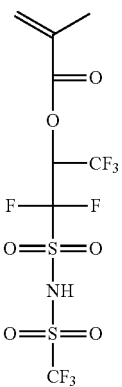

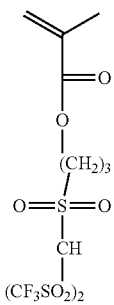
(III-38)

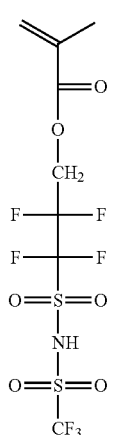
(III-39)

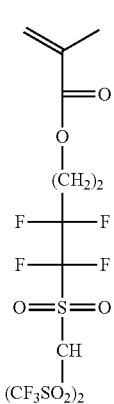
(III-40)

The polymerizable compound corresponding to the repeating unit (B2) can be synthesized using a general sulfonic acid esterification reaction or a sulfonamidation reaction. For example, the compound may be obtained by a method of selectively reacting one sulfonyl halide moiety of a bis-sulfonyl halide compound with an amine, an alcohol or the like to form a sulfonamide bond or a sulfonic acid ester bond and then hydrolyzing the other sulfonyl halide moiety, or a method of ring-opening a cyclic sulfonic anhydride by an amine or an alcohol. The compound may also be easily synthesized using the methods described in U.S. Pat. No. 5,554,664, *J. Fluorine Chem.*, 105, 129-136 (2000), and *J. Fluorine Chem.*, 116, 45-48 (2002).

The compound corresponding to the repeating unit (B2) can be easily synthesized from a lithium, sodium or potassium salt of the organic acid synthesized above and a hydroxide, bromide, chloride or the like of iodonium or sulfonium, by utilizing the salt exchange method described in JP-T-11-501909 (the term "JP-T" as used herein means a "published Japanese translation of a PCT patent application") or JP-A-2003-246786 or the salt exchange method described in JP-A-10-232490 and Japanese Patent 4,025,039.

As for the repeating unit (B2), specific examples of the cation for the acid anion generated in the side chain of the resin resulting from decomposition upon irradiation with an actinic ray or radiation are illustrated below.

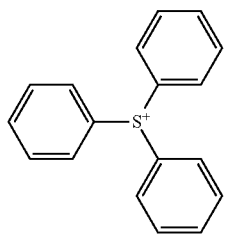
(Z-1)

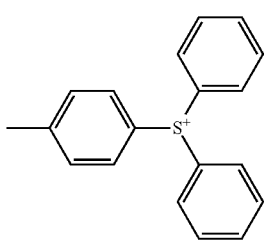
(Z-2)

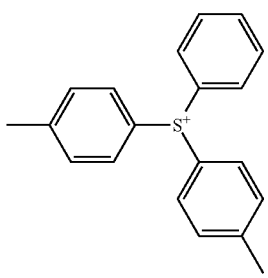
(Z-3)

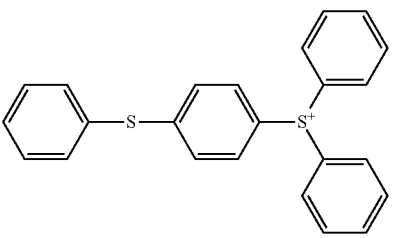
(Z-4)

(Z-5)

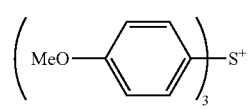
(Z-6)

-continued
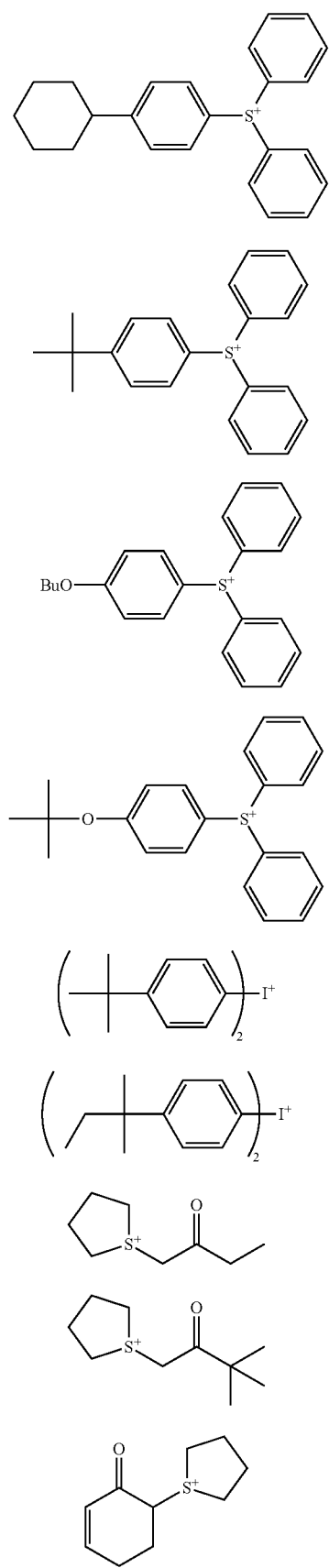
(Z-7)
(Z-8)
(Z-9)
(Z-10)
(Z-11)
(Z-12)
(Z-13)
(Z-14)
(Z-15)
-continued
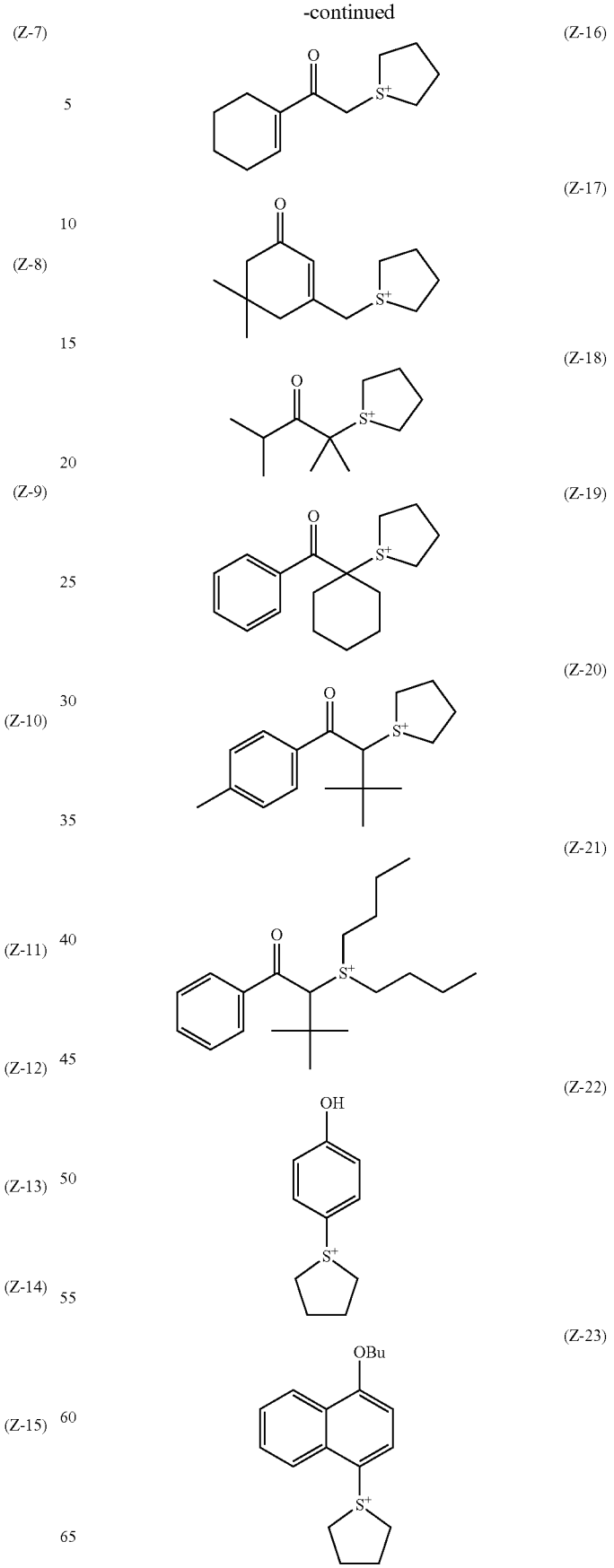
(Z-16)
(Z-17)
(Z-18)
(Z-19)
(Z-20)
(Z-21)
(Z-22)
(Z-23)

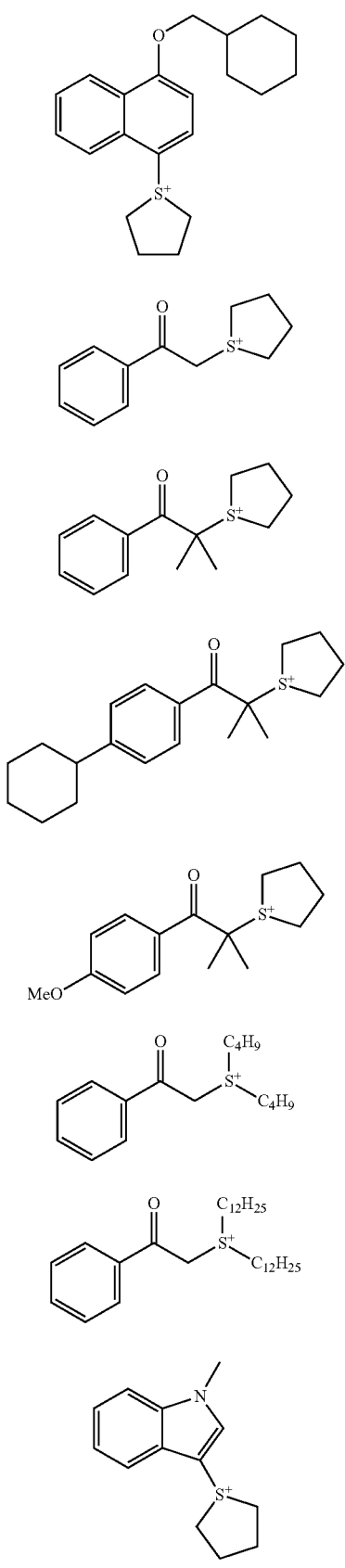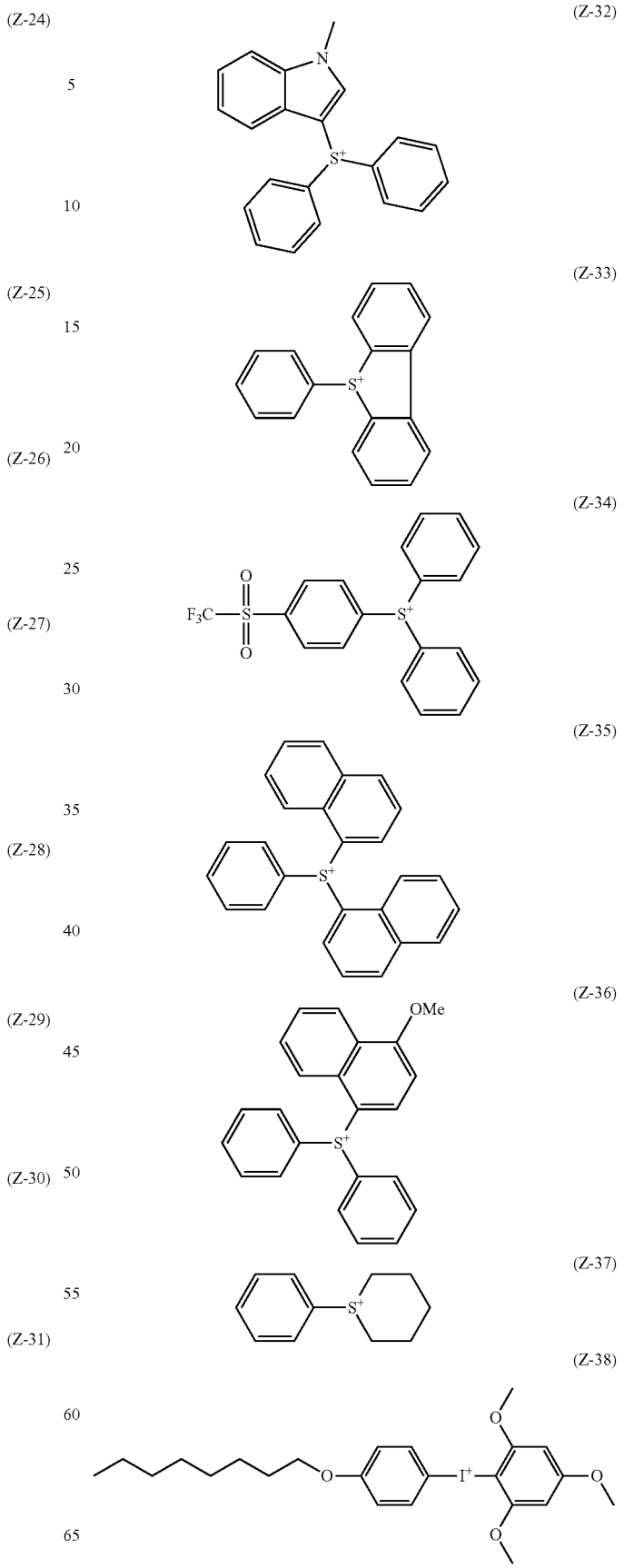

(Z-39) 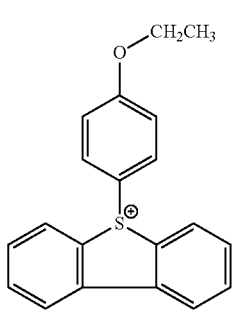
(Z-40) 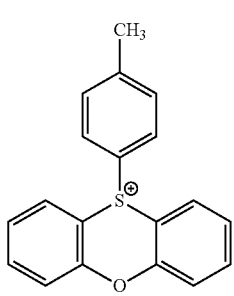
(Z-41) 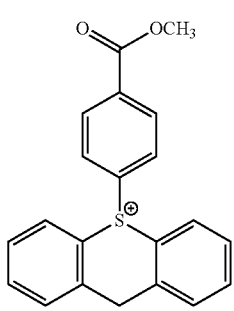
(Z-42) 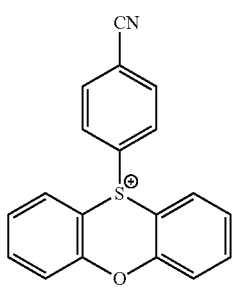
(Z-43) 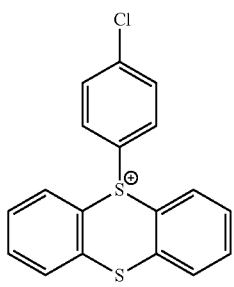
(Z-44) 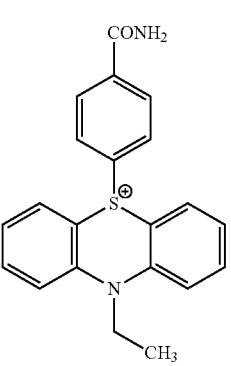
(Z-45) 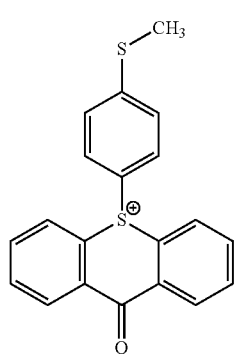
(Z-46) 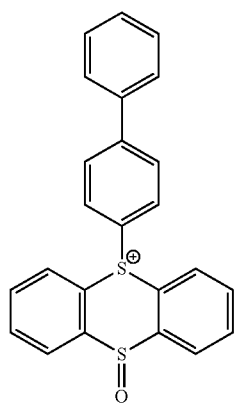
(Z-47) 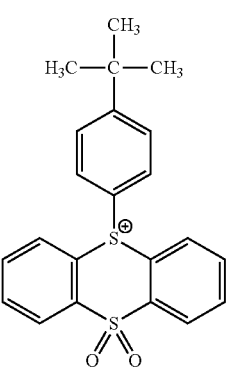

(Z-48) 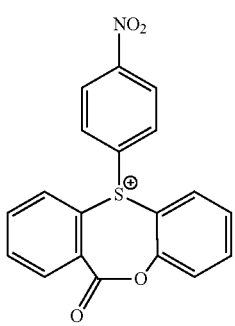
(Z-49) 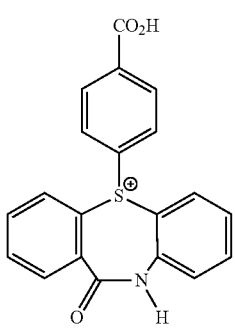
(Z-50) 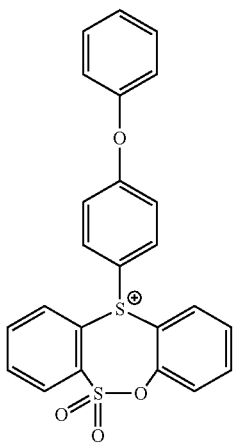
(Z-51) 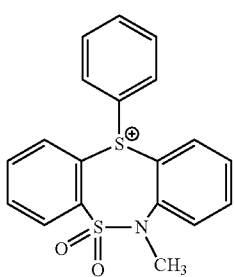
(Z-52) 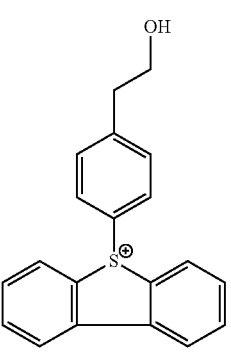
(Z-53) 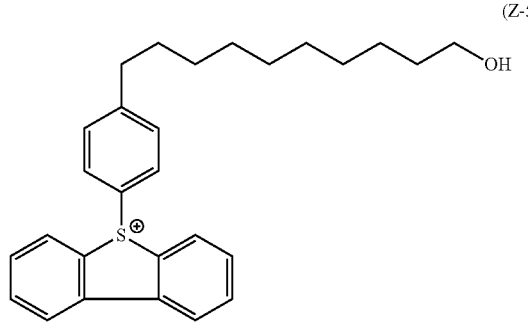
(Z-54) 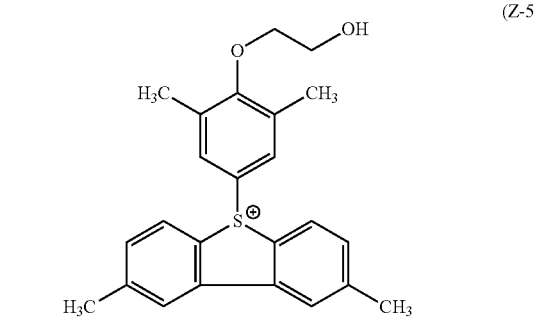
(Z-55) 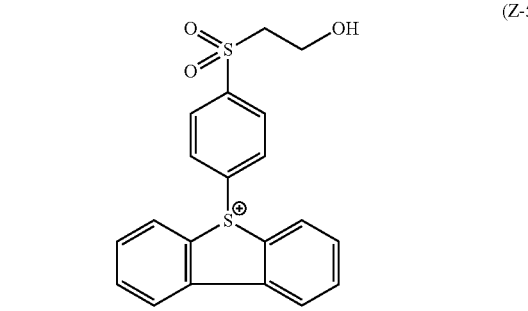
(Z-56) 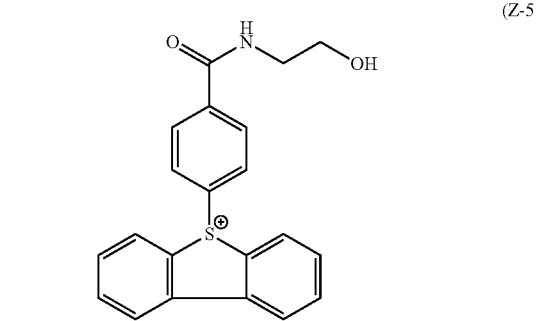

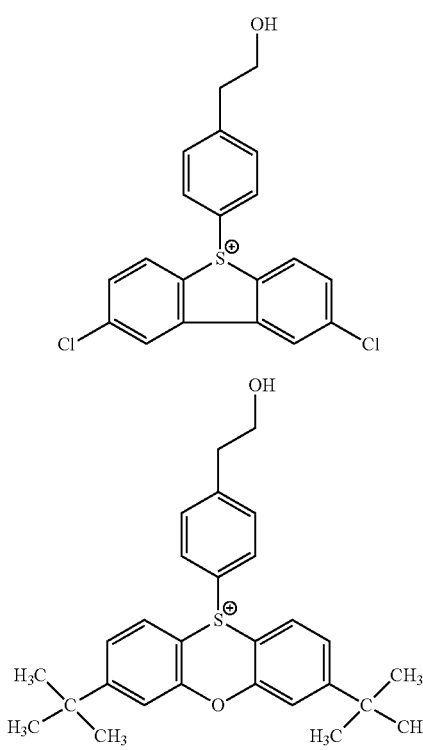

(Z-57)

(Z-58)

In the Tables below specific examples of the polymerizable compound (M) corresponding to the repeating unit (A) are shown as the combination of a cation structure ((Z-1) to (Z-58) exemplified above) and an anion structure (anion wherein hydrogen atom of an organic acid in (I-1) to (I-65), (II-1) to (II-27), (III-1) to (III-40) exemplified above is excluded).

| Polymerizable Compound (M) | Cation Structure | Anion Structure |
| --- | --- | --- |
| M-I-1 | Z-1 | I-1 |
| M-I-2 | Z-2 | I-2 |
| M-I-3 | Z-1 | I-3 |
| M-I-4 | Z-1 | I-4 |
| M-I-5 | Z-3 | I-5 |
| M-I-6 | Z-1 | I-6 |
| M-I-7 | Z-4 | I-7 |
| M-I-8 | Z-1 | I-8 |
| M-I-9 | Z-5 | I-9 |
| M-I-10 | Z-1 | I-10 |
| M-I-11 | Z-6 | I-11 |
| M-I-12 | Z-1 | I-12 |
| M-I-13 | Z-7 | I-13 |
| M-I-14 | Z-1 | I-14 |
| M-I-15 | Z-8 | I-15 |
| M-I-16 | Z-1 | I-16 |
| M-I-17 | Z-9 | I-17 |
| M-I-18 | Z-1 | I-18 |
| M-I-19 | Z-10 | I-19 |
| M-I-20 | Z-1 | I-20 |
| M-I-21 | Z-1 | I-21 |
| M-I-22 | Z-11 | I-22 |
| M-I-23 | Z-1 | I-23 |
| M-I-24 | Z-1 | I-24 |
| M-I-25 | Z-12 | I-25 |
| M-I-26 | Z-1 | I-26 |
| M-I-27 | Z-1 | I-27 |
| M-I-28 | Z-13 | I-28 |
| M-I-29 | Z-1 | I-29 |
| M-I-30 | Z-14 | I-30 |
| M-I-31 | Z-1 | I-31 |
| M-I-32 | Z-15 | I-32 |
| M-I-33 | Z-1 | I-33 |
| M-I-34 | Z-1 | I-34 |
| M-I-35 | Z-1 | I-35 |
| M-I-36 | Z-17 | I-36 |
| M-I-37 | Z-1 | I-37 |
| M-I-38 | Z-18 | I-38 |
| M-I-39 | Z-1 | I-39 |
| M-I-40 | Z-19 | I-40 |
| M-I-41 | Z-1 | I-41 |
| M-I-42 | Z-1 | I-42 |
| M-I-43 | Z-1 | I-43 |
| M-I-44 | Z-1 | I-44 |
| M-I-45 | Z-1 | I-45 |
| M-I-46 | Z-20 | I-46 |
| M-I-47 | Z-1 | I-47 |
| M-I-48 | Z-21 | I-48 |
| M-I-49 | Z-22 | I-49 |
| M-I-50 | Z-1 | I-50 |
| M-I-51 | Z-23 | I-50 |
| M-I-52 | Z-1 | I-51 |
| M-I-53 | Z-1 | I-52 |
| M-I-54 | Z-24 | I-53 |
| M-I-55 | Z-1 | I-54 |
| M-I-56 | Z-25 | I-55 |
| M-I-57 | Z-1 | I-56 |
| M-I-58 | Z-1 | I-57 |
| M-I-59 | Z-26 | I-58 |
| M-I-60 | Z-1 | I-59 |
| M-I-61 | Z-27 | I-60 |
| M-I-62 | Z-1 | I-61 |
| M-I-63 | Z-28 | I-62 |
| M-I-64 | Z-1 | I-63 |
| M-I-65 | Z-29 | I-64 |
| M-I-66 | Z-1 | I-65 |
| M-I-67 | Z-30 | I-2 |
| M-I-68 | Z-31 | I-4 |
| M-I-69 | Z-32 | I-5 |
| M-I-70 | Z-33 | I-6 |
| M-I-71 | Z-34 | I-7 |
| M-I-72 | Z-35 | I-8 |
| M-I-73 | Z-36 | I-9 |
| M-I-74 | Z-37 | I-10 |
| M-I-75 | Z-38 | I-11 |
| M-I-76 | Z-39 | I-12 |
| M-I-77 | Z-40 | I-13 |
| M-I-78 | Z-41 | I-14 |
| M-I-79 | Z-42 | I-15 |
| M-I-80 | Z-43 | I-16 |
| M-I-81 | Z-44 | I-17 |
| M-I-82 | Z-45 | I-18 |
| M-I-83 | Z-46 | I-19 |
| M-I-84 | Z-47 | I-20 |
| M-I-85 | Z-48 | I-21 |
| M-I-86 | Z-49 | I-22 |
| M-I-87 | Z-50 | I-23 |
| M-I-88 | Z-51 | I-24 |
| M-I-89 | Z-52 | I-1 |
| M-I-90 | Z-52 | I-3 |
| M-I-91 | Z-52 | I-41 |
| M-I-92 | Z-52 | I-43 |
| M-I-93 | Z-52 | I-44 |
| M-I-94 | Z-53 | I-25 |
| M-I-95 | Z-54 | I-26 |
| M-I-96 | Z-55 | I-27 |
| M-I-97 | Z-56 | I-28 |
| M-I-98 | Z-57 | I-29 |
| M-I-99 | Z-57 | I-30 |
| M-I-100 | Z-58 | I-31 |

| Polymerizable Compound (M) | Cation Structure | Anion Structure |
| --- | --- | --- |
| M-II-1 | Z-1 | II-1 |
| M-II-2 | Z-1 | II-2 |
| M-II-3 | Z-1 | II-3 |
| M-II-4 | Z-1 | II-4 |
| M-II-5 | Z-1 | II-5 |
| M-II-6 | Z-1 | II-6 |
| M-II-7 | Z-1 | II-7 |
| M-II-8 | Z-1 | II-8 |
| M-II-9 | Z-1 | II-9 |
| M-II-10 | Z-1 | II-10 |
| M-II-11 | Z-1 | II-11 |
| M-II-12 | Z-1 | II-12 |
| M-II-13 | Z-1 | II-13 |
| M-II-14 | Z-1 | II-14 |
| M-II-15 | Z-1 | II-15 |
| M-II-16 | Z-1 | II-16 |
| M-II-17 | Z-1 | II-17 |
| M-II-18 | Z-1 | II-18 |
| M-II-19 | Z-1 | II-19 |
| M-II-20 | Z-1 | II-20 |
| M-II-21 | Z-1 | II-21 |
| M-II-22 | Z-1 | II-22 |
| M-II-23 | Z-1 | II-23 |
| M-II-24 | Z-1 | II-24 |
| M-II-25 | Z-1 | II-25 |
| M-II-26 | Z-1 | II-26 |
| M-II-27 | Z-1 | II-27 |
| M-II-28 | Z-2 | II-1 |
| M-II-29 | Z-3 | II-2 |
| M-II-30 | Z-4 | II-3 |
| M-II-31 | Z-5 | II-4 |
| M-II-32 | Z-6 | II-5 |
| M-II-33 | Z-7 | II-6 |
| M-II-34 | Z-8 | II-7 |
| M-II-35 | Z-9 | II-8 |
| M-II-36 | Z-10 | II-9 |
| M-II-37 | Z-11 | II-I0 |
| M-II-38 | Z-12 | II-11 |
| M-II-39 | Z-13 | II-12 |
| M-II-40 | Z-14 | II-13 |
| M-II-41 | Z-15 | II-14 |
| M-II-42 | Z-16 | II-15 |
| M-II-43 | Z-17 | II-16 |
| M-II-44 | Z-18 | II-17 |
| M-II-45 | Z-19 | II-18 |
| M-II-46 | Z-20 | II-19 |
| M-II-47 | Z-21 | II-20 |
| M-II-48 | Z-22 | II-21 |
| M-II-49 | Z-23 | II-22 |
| M-II-50 | Z-24 | II-23 |
| M-II-51 | Z-25 | II-24 |
| M-II-52 | Z-26 | II-25 |
| M-II-53 | Z-27 | II-26 |
| M-II-54 | Z-28 | II-27 |
| M-II-55 | Z-29 | II-1 |
| M-II-56 | Z-30 | II-2 |
| M-II-57 | Z-31 | II-3 |
| M-II-58 | Z-32 | II-4 |
| M-II-59 | Z-33 | II-5 |
| M-II-60 | Z-34 | II-6 |
| M-II-61 | Z-35 | II-7 |
| M-II-62 | Z-36 | II-8 |
| M-II-63 | Z-37 | II-9 |
| M-II-64 | Z-38 | II-10 |
| M-II-65 | Z-39 | II-11 |
| M-II-66 | Z-40 | II-12 |
| M-II-67 | Z-41 | II-13 |
| M-II-68 | Z-42 | II-14 |
| M-II-69 | Z-43 | II-15 |
| M-II-70 | Z-44 | II-16 |
| M-II-71 | Z-45 | II-17 |
| M-II-72 | Z-46 | II-18 |
| M-II-73 | Z-47 | II-19 |
| M-II-74 | Z-48 | II-20 |
| M-II-75 | Z-49 | II-21 |
| M-II-76 | Z-50 | II-22 |
| M-II-77 | Z-51 | II-23 |
| M-II-78 | Z-52 | II-24 |
| M-II-79 | Z-52 | II-25 |
| M-II-80 | Z-52 | II-26 |
| M-II-81 | Z-52 | II-27 |
| M-II-82 | Z-52 | II-1 |
| M-II-83 | Z-52 | II-2 |
| M-II-84 | Z-52 | II-3 |
| M-II-85 | Z-52 | II-4 |
| M-II-86 | Z-52 | II-5 |
| M-II-87 | Z-52 | II-6 |
| M-II-88 | Z-52 | II-7 |
| M-II-89 | Z-52 | II-8 |
| M-II-90 | Z-52 | II-9 |
| M-II-91 | Z-52 | II-10 |
| M-II-92 | Z-52 | II-11 |
| M-II-93 | Z-52 | II-12 |
| M-II-94 | Z-52 | II-13 |
| M-II-95 | Z-53 | II-14 |
| M-II-96 | Z-54 | II-15 |
| M-II-97 | Z-55 | II-16 |
| M-II-98 | Z-56 | II-17 |
| M-II-99 | Z-57 | II-18 |
| M-II-100 | Z-58 | II-19 |

| Polymerizable Compound (M) | Cation Structure | Anion Structure |
| --- | --- | --- |
| M-III-1 | Z-1 | III-1 |
| M-III-2 | Z-1 | III-2 |
| M-III-3 | Z-1 | III-3 |
| M-III-4 | Z-1 | III-4 |
| M-III-5 | Z-1 | III-5 |
| M-III-6 | Z-1 | III-6 |
| M-III-7 | Z-1 | III-7 |
| M-III-8 | Z-1 | III-8 |
| M-III-9 | Z-1 | III-9 |
| M-III-10 | Z-1 | III-10 |
| M-III-11 | Z-1 | III-11 |
| M-III-12 | Z-1 | III-12 |
| M-III-13 | Z-1 | III-13 |
| M-III-14 | Z-1 | III-14 |
| M-III-15 | Z-1 | III-15 |
| M-III-16 | Z-1 | III-16 |
| M-III-17 | Z-1 | III-17 |
| M-III-18 | Z-1 | III-18 |
| M-III-19 | Z-1 | III-19 |
| M-III-20 | Z-1 | III-20 |
| M-III-21 | Z-1 | III-21 |
| M-III-22 | Z-1 | III-22 |
| M-III-23 | Z-1 | III-23 |
| M-III-24 | Z-1 | III-24 |
| M-III-25 | Z-1 | III-25 |
| M-III-26 | Z-1 | III-26 |
| M-III-27 | Z-1 | III-27 |
| M-III-28 | Z-1 | III-28 |
| M-III-29 | Z-52 | III-37 |
| M-III-30 | Z-1 | III-40 |
| M-III-31 | Z-1 | III-31 |
| M-III-32 | Z-1 | III-32 |
| M-III-33 | Z-1 | III-33 |
| M-III-34 | Z-1 | III-34 |
| M-III-35 | Z-1 | III-35 |
| M-III-36 | Z-1 | III-36 |
| M-III-37 | Z-1 | III-37 |
| M-III-38 | Z-1 | III-38 |
| M-III-39 | Z-1 | III-39 |
| M-III-40 | Z-2 | III-1 |
| M-III-41 | Z-3 | III-2 |
| M-III-42 | Z-4 | III-3 |
| M-III-43 | Z-5 | III-4 |
| M-III-44 | Z-6 | III-5 |
| M-III-45 | Z-7 | III-6 |

-continued

| Polymerizable Compound (M) | Cation Structure | Anion Structure |
|---|---|---|
| M-III-46 | Z-8 | III-7 |
| M-III-47 | Z-9 | III-8 |
| M-III-48 | Z-10 | III-9 |
| M-III-49 | Z-11 | III-10 |
| M-III-50 | Z-12 | III-11 |
| M-III-51 | Z-13 | III-12 |
| M-III-52 | Z-14 | III-13 |
| M-III-53 | Z-15 | III-14 |
| M-III-54 | Z-16 | III-15 |
| M-III-55 | Z-17 | III-16 |
| M-III-56 | Z-18 | III-17 |
| M-III-57 | Z-19 | III-18 |
| M-III-58 | Z-20 | III-19 |
| M-III-59 | Z-21 | III-20 |
| M-III-60 | Z-22 | III-21 |
| M-III-61 | Z-23 | III-22 |
| M-III-62 | Z-24 | III-23 |
| M-III-63 | Z-25 | III-24 |
| M-III-64 | Z-26 | III-25 |
| M-III-65 | Z-27 | III-26 |
| M-III-66 | Z-28 | III-27 |
| M-III-67 | Z-29 | III-28 |
| M-III-68 | Z-30 | III-29 |
| M-III-69 | Z-31 | III-30 |
| M-III-70 | Z-32 | III-31 |
| M-III-71 | Z-33 | III-32 |
| M-III-72 | Z-34 | III-33 |
| M-III-73 | Z-35 | III-34 |
| M-III-74 | Z-36 | III-35 |
| M-III-75 | Z-37 | III-36 |
| M-III-76 | Z-38 | III-37 |
| M-III-77 | Z-39 | III-38 |
| M-III-78 | Z-40 | III-39 |
| M-III-79 | Z-41 | III-1 |
| M-III-80 | Z-42 | III-2 |
| M-III-81 | Z-43 | III-3 |
| M-III-82 | Z-44 | III-4 |
| M-III-83 | Z-45 | III-5 |
| M-III-84 | Z-46 | III-6 |
| M-III-85 | Z-47 | III-7 |
| M-III-86 | Z-48 | III-8 |
| M-III-87 | Z-49 | III-9 |
| M-III-88 | Z-50 | III-10 |
| M-III-89 | Z-51 | III-11 |
| M-III-90 | Z-52 | III-12 |
| M-III-91 | Z-53 | III-13 |
| M-III-92 | Z-54 | III-14 |
| M-III-93 | Z-55 | III-15 |
| M-III-94 | Z-56 | III-16 |
| M-III-95 | Z-57 | III-17 |
| M-III-96 | Z-58 | III-18 |
| M-III-97 | Z-23 | III-27 |
| M-III-98 | Z-27 | III-27 |
| M-III-99 | Z-38 | III-27 |
| M-III-100 | Z-52 | III-27 |

In the case where the repeating unit (B2) is contained in the acid-decomposable resin for use in the present invention, the content of the repeating unit (B2) is preferably 0.5 to 80 mol %, more preferably from 1 to 60 mol %, still more preferably from 3 to 40 mol %.

The resin suitable for KrF, EB, EUV and the like may contain repeating units other than the repeating units described above. Such a repeating unit includes, for example, a repeating unit stable to the action of an acid.

Examples of the repeating unit stable to the action of an acid include a repeating unit having a non-acid-decomposable aryl structure or cycloalkyl structure in the side chain of an acryl structure, such as repeating unit represented by formula (IV). Incidentally, in the repeating unit represented by formula (IV), $R_5$ is preferably a hydrocarbon group and at the same time, has a cyclic structure therein. Specific examples of the hydrocarbon group having a cyclic structure include a monocyclic or polycyclic cycloalkyl group (preferably having a carbon number of 3 to 12, more preferably a carbon number of 3 to 7, still more preferably a cyclohexyl group), a monocyclic or polycyclic cycloalkenyl group (preferably having a carbon number of 3 to 12), an aryl group (preferably having a carbon number of 6 to 20, more preferably a carbon number of 6 to 12, still more preferably a phenyl group or a naphthyl group), and an aralkyl group (preferably having a carbon number of 7 to 20, more preferably a carbon number of 7 to 12, still more preferably a benzyl group). By virtue of having such a structure, the adjustment of contrast and the enhancement of etching resistance can be expected.

The content of the repeating unit stable to the action of an acid is preferably from 0 to 40 mol %, more preferably from 1 to 20 mol %, based on all repeating units in the acid-decomposable resin.

Specific examples of the repeating unit stable to the action of an acid include the followings, in addition to specific examples of the repeating unit represented by formula (IV). In the formulae, Ra represents H, $CH_3$, $CH_2OH$ or $CF_3$.

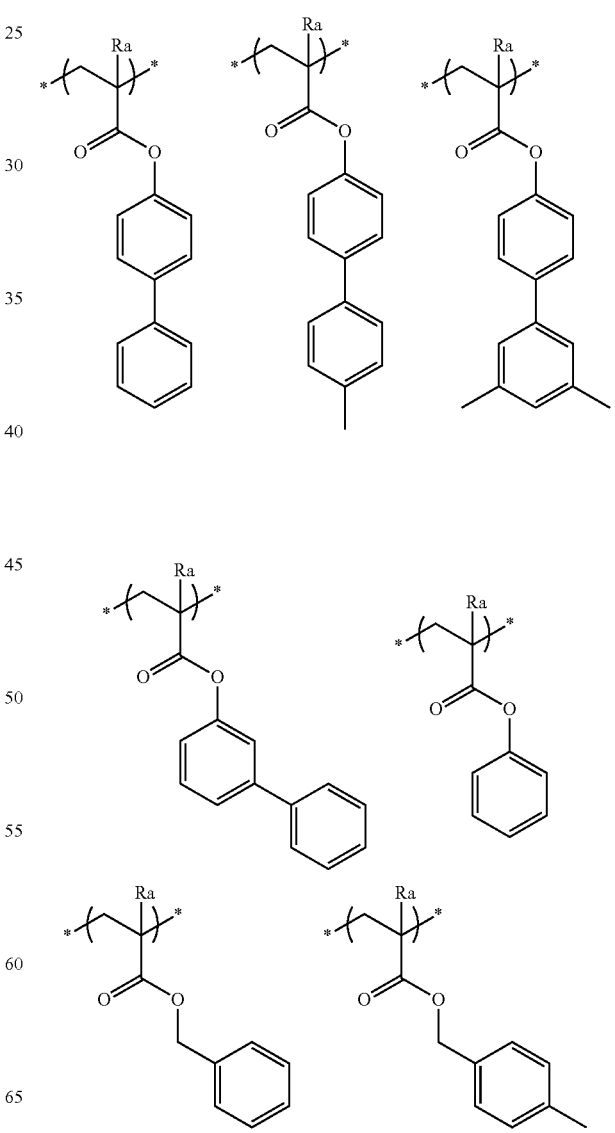

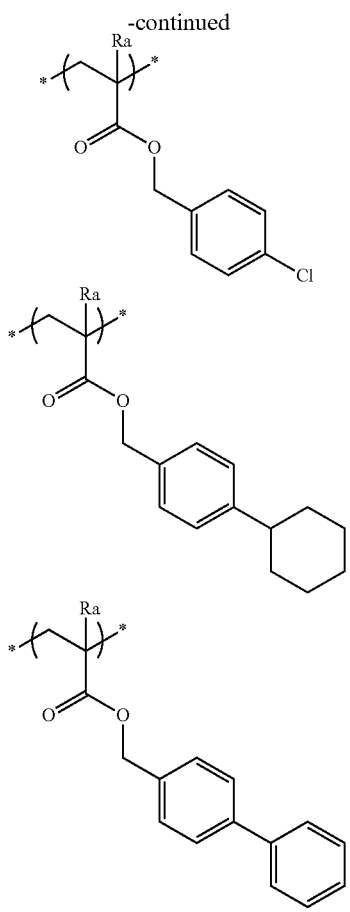

In addition to those described above, specific examples of the repeating unit stable to the action of an acid include a repeating unit derived from a compound having at least one addition-polymerizable unsaturated bond selected from (meth)acrylamides, allyl compounds, vinyl ethers, vinyl esters, styrenes and crotonic acid esters. Other examples include maleic anhydride, maleimide, acrylonitrile, methacrylonitrile and maleylonitrile.

Specific preferred examples of the repeating unit derived from these other polymerizable monomers are illustrated below, but the present invention is not limited thereto.

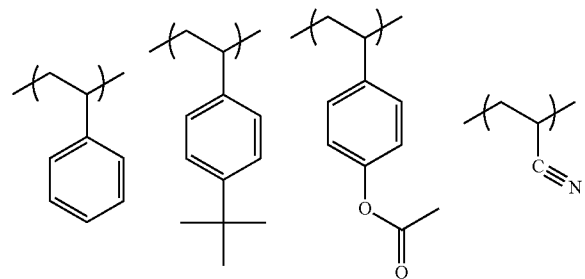

The weight average molecular weight of the acid-decomposable resin is preferably from 2,000 to 200,000 in terms of polystyrene determined by the GPC method. When the weight average molecular weight is 2,000 or more, heat resistance and dry etching resistance can be particularly improved.

Also, when the weight average molecular weight is 200,000 or less, developability can be particularly increased and at the same time, thanks to reduction in the viscosity of the composition, the film-forming property of the composition can be enhanced.

The molecular weight is more preferably from 2,500 to 50,000, still more preferably from 3,000 to 30,000. In the fine pattern formation using an electron beam an X-ray or a high-energy ray at a wavelength of 50 nm or less (e.g., EUV), the weight average molecular weight is most preferably from 3,000 to 15,000. By adjusting the molecular weight, enhancement of the heat resistance and resolution of the composition and reduction and the like in the development defect can be achieved at the same time.

The polydispersity (Mw/Mn) of the resin capable of decomposing by the action of an acid to increase the solubility in an alkali developer is preferably from 1.0 to 3.0, more preferably from 1.0 to 2.5, still more preferably from 1.1 to 2.3. By adjusting the polydispersity, for example, the performance in terms of line edge roughness can be enhanced.

The content of the acid-decomposable resin occupying in the composition of the present invention is preferably from 0 to 99.9 mass %, more preferably from 50 to 95 mass %, still more preferably from 60 to 93 mass %, based on the entire solid content.

[4] Alkali-Soluble Resin

The alkali dissolution rate of the alkali-soluble resin is preferably 2 nm/sec or more as measured (at 23° C.) by using an aqueous 2.38 mass % tetramethylammonium hydroxide (TMAH) solution. This rate is more preferably 20 nm/sec or more.

Examples of the alkali-soluble resin include, but are not limited to, a novolak resin, a hydrogenated novolak resin, an acetone-pyrogallol resin, an o-polyhydroxystyrene, an m-polyhydroxystyrene, a p-polyhydroxystyrene, a hydrogenated polyhydroxystyrene, a halogen- or alkyl-substituted polyhydroxystyrene, a hydroxystyrene-N-substituted maleimide copolymer, an o/p- or m/p-hydroxystyrene copolymer, a polyhydroxystyrene with the hydroxyl group being partially O-alkylated (for example, from 5 to 30 mol % O-methylated, O-(1-methoxy)ethylated, O-(1-ethoxy)ethylated, O-2-tetrahydropyranylated or O-(tert-butoxycarbonyl)methylated) or O-acylated (for example, from 5 to 30 mol % O-acylated or O-(tert-butoxy)carbonylated), a styrene-maleic anhydride copolymer, a styrene-hydroxystyrene copolymer, an α-methylstyrene-hydroxystyrene copolymer, a carboxy group-containing methacrylic resin or a derivative thereof, and a polyvinyl alcohol derivative.

Among these alkali-soluble resins, for example, a novolak resin, an o-polyhydroxystyrene, an m-polyhydroxystyrene, a p-polyhydroxystyrene, a copolymer thereof, an alkyl-substituted polyhydroxystyrene, a partially O-alkylated or O-acylated polyhydroxystyrene, a styrene-hydroxystyrene copolymer and an α-methylstyrene-hydroxystyrene copolymer are preferred.

Above all, a resin having a hydroxystyrene structure is preferred. Among hydroxystyrene structures, an m-hydroxystyrene structure is preferred.

The novolak resin can be obtained, for example, by subjecting a predetermined monomer as the main component to addition condensation with aldehydes in the presence of an acidic catalyst.

The weight average molecular weight of the alkali-soluble resin is 2,000 or more, preferably from 5,000 to 200,000, more preferably from 5,000 to 100,000. The weight average molecular weight as used herein is defined by a value in terms of polystyrene measured by GPC (gel permeation chromatography).

As for the alkali-soluble resin, one kind of a resin may be used alone, or two or more kinds of resins may be used in combination.

The content of the alkali-soluble resin is, for example, from 40 to 97 mass %, preferably from 60 to 90 mass %, based on the entire solid content of the composition.

From the standpoint of improving the resolution or pattern profile by preventing an acid generated upon exposure from diffusing into the unexposed area, it is also preferred that the alkali-soluble resin contains (B2) a repeating unit capable of decomposing upon irradiation with an actinic ray or radiation to generate an acid, which is described in the paragraph of [3] Acid-Decomposable Resin.

In the case of containing the repeating unit (B2) in the alkali-soluble resin for use in the present invention, the content of the repeating unit (B2) is preferably from 0.5 to 80 mol %, more preferably from 1 to 60 mol %, still more preferably from 3 to 40 mol %, based on all repeating units.

[5] Acid Crosslinking Agent

As for the acid crosslinking agent, any compound may be used as long as it can crosslink the resin soluble in an alkali developer by the action of an acid, but the following compounds (1) to (3) are preferred:

(1) a hydroxymethyl, alkoxymethyl or acyloxymethyl form of a phenol derivative, (2) a compound having an N-hydroxymethyl group, an N-alkoxymethyl group or an N-acyloxymethyl group, and (3) a compound having an epoxy group.

The alkoxymethyl group is preferably an alkoxymethyl group having a carbon number of 6 or less, and the acyloxymethyl group is preferably an acyloxymethyl group having a carbon number of 6 or less.

Among these acid crosslinking agents, particularly preferred are illustrated below.

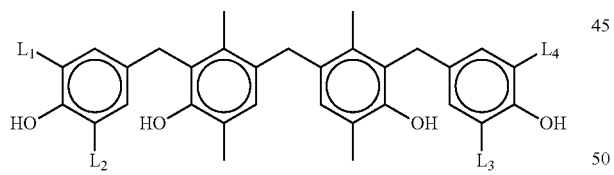

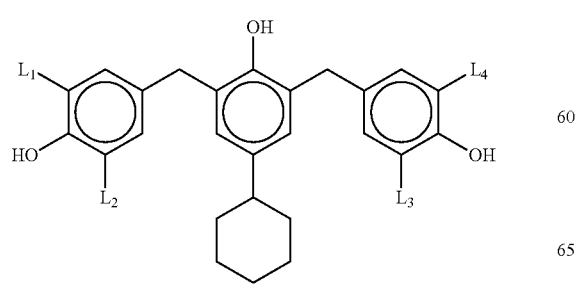

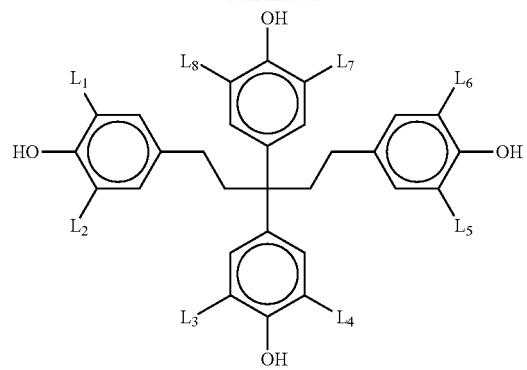

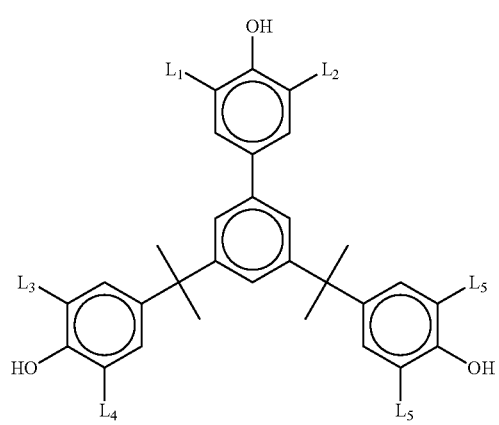

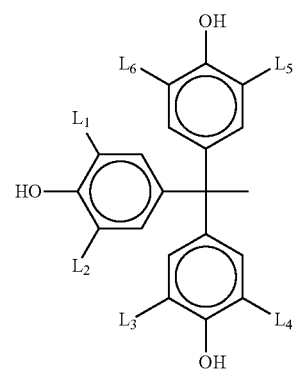

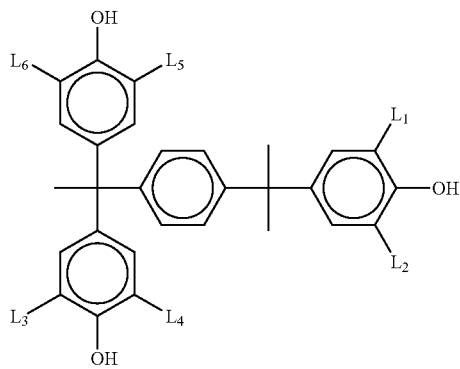

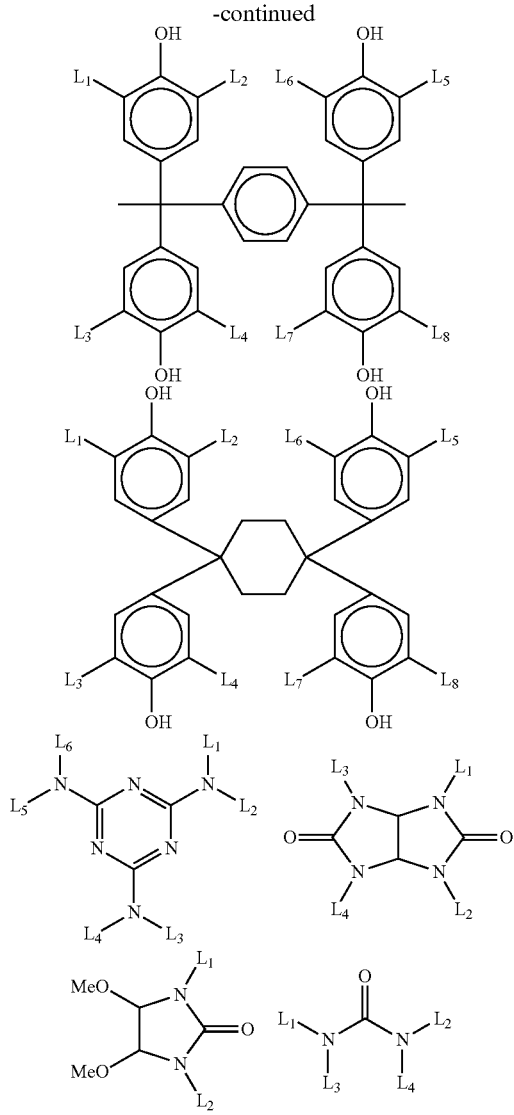

In these formulae, each of $L_1$ to $L_8$ independently represents a hydrogen atom, a hydroxymethyl group, a methoxymethyl group, an ethoxymethyl group or an alkyl group having a carbon number of 1 to 6.

The amount added of the acid crosslinking agent is, for example, from 3 to 70 mass %, preferably from 5 to 50 mass %, based on the entire solid content of the composition.

[6] Dissolution Inhibiting Compound

In order to prevent reduction in the transparency to light at 220 nm or less, the dissolution inhibiting compound is preferably an alicyclic or aliphatic compound having an acid-decomposable group. Examples of such a compound include acid-decomposable group-containing cholic acid derivatives described in *Proceeding of SPIE*, 2724, 355 (1996). Incidentally, examples of the alicyclic structure and acid-decomposable group are the same as those described above for the alicyclic hydrocarbon-based acid-decomposable resin.

In the case where the composition of the present invention is exposed to a KrF excimer laser or irradiated with an electron beam, the dissolution inhibiting compound preferably contains a structure where a phenolic hydroxyl group of a phenol compound is substituted with an acid-decomposable group. The phenol compound preferably contains from 1 to 9 phenol frameworks, more preferably from 2 to 6 phenol frameworks.

The molecular weight of the dissolution inhibiting compound is 3,000 or less, preferably from 300 to 3,000, more preferably from 500 to 2,500.

The amount added of the dissolution inhibiting compound is preferably from 3 to 50 mass %, more preferably from 5 to 40 mass %, based on the entire solid content of the composition.

Specific examples of the dissolution inhibiting compound are illustrated below, but the present invention is not limited thereto.

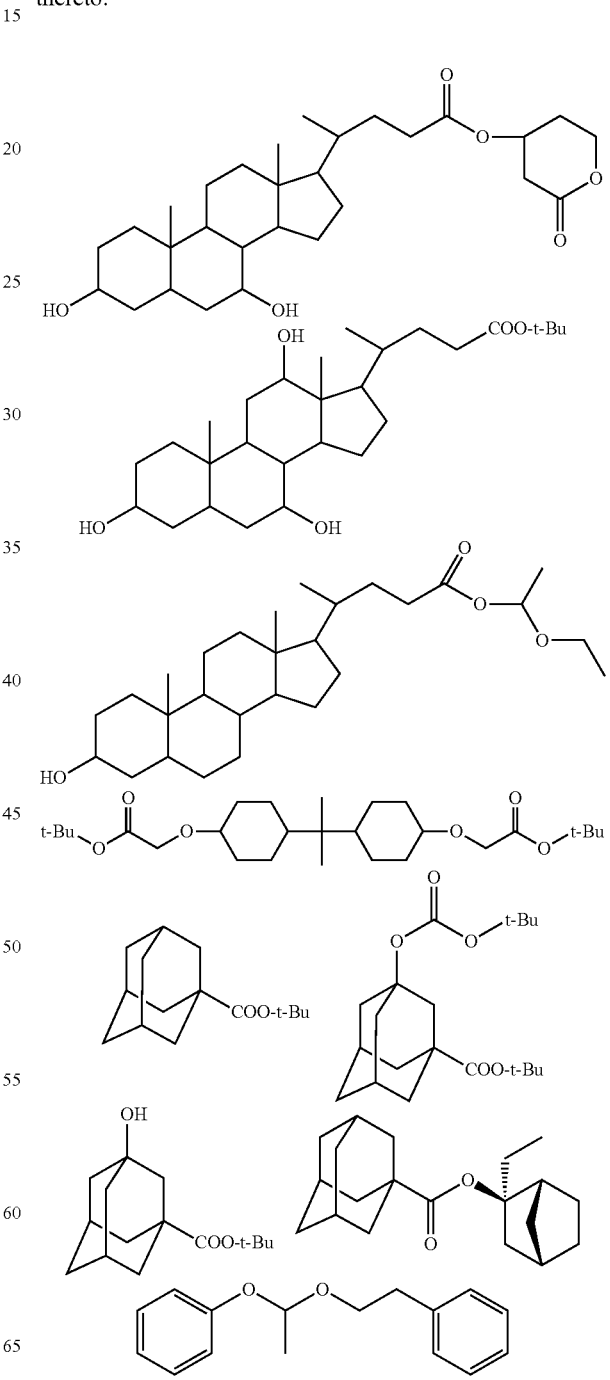

-continued

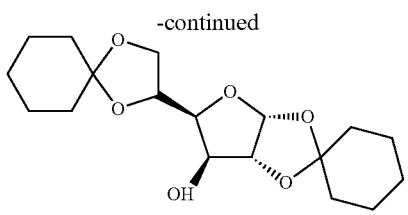

The composition of the present invention may further contain [7] a basic compound, [8] a surfactant, [9] a hydrophobic resin, [10] an organic solvent, and/or [11] other additives.

[7] Basic Compound

The composition of the present invention may contain a basic compound other than the above-described guanidine compound (A) so as to reduce the change of performance with aging from exposure to heating. The basic compound fulfills a role in quenching a deprotection reaction by an acid generated upon exposure, and the diffusibility, basicity or the like of the compound can affect the effective diffusibility of the acid.

Preferred basic compounds include an ammonium salt represented by the following formula (A) and basic compounds having a structure represented by the following formulae (B) to (E):

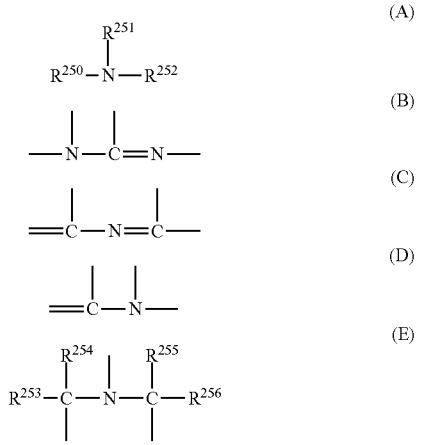

In formula (A), each of $R^{250}$, $R^{251}$ and $R^{252}$ independently represents a hydrogen atom, an alkyl group (preferably having a carbon number of 1 to 20), a cycloalkyl group (preferably having a carbon number of 3 to 20) or an aryl group (having a carbon number of 6 to 20). $R^{250}$ and $R^{251}$ may combine together to form a ring structure. Also, these groups may have a substituent.

The alkyl group and cycloalkyl group having a substituent are preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

These groups may contain an oxygen atom, a sulfur atom or a nitrogen atom in the alkyl chain.

In formula (E), each of $R^{253}$ to $R^{256}$ independently represents an alkyl group (preferably having a carbon number of 1 to 6) or a cycloalkyl group (preferably having a carbon number of 3 to 6).

Preferred compounds include guanidine, aminopyrrolidine, pyrazole, pyrazoline, piperazine, aminomorpholine, aminoalkylmorpholine and piperidine. These compounds may have a substituent.

More preferred compounds include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole.

Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene.

Examples of the compound having an onium hydroxide structure include a triarylsulfonium hydroxide, a phenacylsulfonium hydroxide, and a 2-oxoalkyl group-containing sulfonium hydroxide. Specific examples thereof include triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide.

The compound having an onium carboxylate structure is a compound where the anion moiety of the compound having an onium hydroxide structure is replaced by a carboxylate, and examples thereof include an acetate, an adamantane-1-carboxylate and a perfluoroalkyl carboxylate.

Examples of the compound having a trialkylamine structure include tri(n-butyl)amine and tri(n-octyl)amine.

Examples of the aniline compound include 2,6-diisopropylaniline and N,N-dimethylaniline.

Examples of the alkylamine derivative having a hydroxy group and/or an ether bond include ethanolamine, diethanolamine, triethanolamine and tris(methoxyethoxyethyl)amine.

Examples of the aniline derivative having a hydroxy group and/or an ether bond include N,N-bis(hydroxyethyl)aniline.

Other basic compounds include at least one kind of a nitrogen-containing compound selected from a phenoxy group-containing amine compound and a phenoxy group-containing ammonium salt compound.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom, in addition to the alkyl group.

The amine compound preferably contains an oxygen atom in the alkyl chain to have one or more oxyalkylene groups. The number of oxyalkylene groups preferably from 3 to 9, more preferably from 4 to 6. The oxyalkylene group is preferably an oxyethylene group (—$CH_2CH_2O$—) or an oxypropylene group (—$CH(CH_3)CH_2O$— or —$CH_2CH_2CH_2O$—), more preferably an oxyethylene group.

In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom, in addition to the alkyl group.

The ammonium salt compound may contain an oxygen atom in the alkyl chain to have one or more oxyalkylene groups. The number of oxyalkylene groups is preferably from 3 to 9, more preferably from 4 to 6. The oxyalkylene group is preferably an oxyethylene group (—$CH_2CH_2O$—) or an oxypropylene group (—CH(CH$_3$)CH$_2$O— or —CH$_2$CH$_2$CH$_2$O—), more preferably an oxyethylene group.

Examples of the anion of the ammonium salt compound include a halide, a sulfonate, a borate, a phosphate and a hydroxide, with a hydroxide being preferred.

The halide is preferably chloride, bromide or iodide.

The phenoxy group-containing amine compound is obtained, for example, by reacting a primary or secondary amine having a phenoxy group with a haloalkyl ether under heating and after adding an aqueous solution of a strong base such as sodium hydroxide, potassium hydroxide and tetraalkylammonium, extracting the reaction product with an organic solvent such as ethyl acetate and chloroform. The phenoxy group-containing amine compound may be also obtained by reacting a primary or secondary amine with a haloalkyl ether having a phenoxy group at the terminal under heating and after adding an aqueous solution of a strong base such as sodium hydroxide, potassium hydroxide and tetraalkylammonium, extracting the reaction product with an organic solvent such as ethyl acetate and chloroform.

An ammonium salt is preferably used as the basic compound, and it is most preferred to use a hydroxide of a quaternary ammonium salt compound.

One of these basic compounds may be used alone, or two or more thereof may be used in combination.

The molecular weight of the basic compound is preferably from 250 to 1,000, more preferably from 250 to 800, still more preferably from 400 to 800.

The content of the basic compound is preferably from 0.001 to 8.0 mass %, more preferably from 0.01 to 5.0 mass %, still more preferably from 0.1 to 4.0 mass %, based on the entire solid content of the composition.

[8] Surfactant

The composition of the present invention may or may not contain a surfactant, but in the case of containing a surfactant, the surfactant is preferably a fluorine-containing and/or silicon-containing surfactant. The fluorine-containing and/or silicon-containing surfactant includes, for example, a fluorine-containing surfactant, a silicon-containing surfactant, a surfactant containing both a fluorine atom and a silicon atom, and a mixture thereof.

By virtue of containing a fluorine-containing and/or silicon-containing surfactant, the composition of the present invention can give a pattern with good sensitivity, resolution and adherence as well as little development defect when used for exposure to a light source of 250 nm or less, particularly 220 nm or less.

Examples of the commercially available surfactant which can be used include a fluorine-containing or silicon-containing surfactant such as EFtop EF301 and EF303 (produced by Shin-Akita Kasei K.K.); Florad FC430 and 431 (produced by Sumitomo 3M Inc.); Megaface F171, F173, F176, F189 and R08 (produced by Dainippon Ink & Chemicals, Inc.); Surflon S-382, SC101, 102, 103, 104, 105 and 106 (produced by Asahi Glass Co., Ltd.); and Troysol S-366 (produced by Troy Chemical). In addition, Polysiloxane Polymer KP-341 (produced by Shin-Etsu Chemical Co., Ltd.) may be also used as the silicon-containing surfactant.

Other than these known surfactants, a surfactant containing a polymer having a fluoroaliphatic group which is derived from a fluoroaliphatic compound produced by a telomerization process (also called telomer process) or an oligomerization process (also called oligomer process) may be also used. The fluoroaliphatic compound can be synthesized by the method described, for example, in JP-A-2002-90991.

The polymer having a fluoroaliphatic group is preferably a copolymer of a fluoroaliphatic group-containing monomer with a (poly(oxyalkylene)) acrylate or methacrylate and/or a (poly(oxyalkylene)) methacrylate, and the polymer may have an irregular distribution or may be a block copolymer.

Examples of the poly(oxyalkylene) group include a poly (oxyethylene) group, a poly(oxypropylene) group and a poly (oxybutylene) group. This group may be also a unit having alkylenes differing in the chain length within the same chain, such as block-linked poly(oxyethylene, oxypropylene and oxyethylene) and block-linked poly(oxyethylene and oxypropylene).

Furthermore, the copolymer of a fluoroaliphatic group-containing monomer with a (poly(oxyalkylene)) acrylate or methacrylate may be also a ternary or higher copolymer obtained by simultaneously copolymerizing two or more different fluoroaliphatic group-containing monomers or two or more different (poly(oxyalkylene)) acrylates or methacrylates.

Examples thereof include commercially available surfactants such as Megaface F-178, F-470, F-473, F-475, F-476 and F-472 (produced by Dainippon Ink & Chemicals, Inc.); a copolymer of a $C_6F_{13}$ group-containing acrylate or methacrylate with a (poly(oxyalkylene)) acrylate or methacrylate; a copolymer of a $C_6F_{13}$ group-containing acrylate or methacrylate with a (poly(oxyethylene)) acrylate or methacrylate and a (poly(oxypropylene)) acrylate or methacrylate; a copolymer of a $C_8F_{17}$ group-containing acrylate or methacrylate with a (poly(oxyalkylene)) acrylate or methacrylate; and a copolymer of a $C_8F_{17}$ group-containing acrylate or methacrylate with a (poly(oxyethylene)) acrylate or methacrylate and a (poly(oxypropylene)) acrylate or methacrylate.

In the case where the composition of the present invention contains a surfactant, the content of the surfactant is preferably from 0.0001 to 2 mass %, more preferably from 0.001 to 1 mass %, based on the entire solid content of the composition.

On the other hand, by setting the amount added of the surfactant to 10 ppm or less, the hydrophobic resin described below is more unevenly distributed to the surface, so that the resist film surface can be made more hydrophobic and the followability of water at the immersion exposure can be enhanced.

[9] Hydrophobic Resin

In the case where the film formed of the composition of the present invention is exposed through an immersion medium, a hydrophobic resin may be further added to the actinic ray-sensitive or radiation-sensitive resin composition, if desired. The hydrophobic resin is unevenly distributed to the surface layer of the film and when the immersion medium is water, the receding contact angle on the resist film surface for water as well as the followability of immersion liquid can be enhanced. The hydrophobic resin may be any resin as long as it can enhance the receding contact angle on the surface by the addition, but a resin having at least either a fluorine atom or a silicon atom is preferred. The receding contact angle of the film is preferably from 60 to 90°, more preferably 70° or more. The hydrophobic resin is, as described above, unevenly distributed to the interface but unlike a surfactant, need not have necessarily a hydrophilic group in the molecule and may not contribute to uniform mixing of polar/nonpolar substances.

The receding contact angle is a contact angle measured when a contact line recedes on the liquid droplet-substrate interface, and this is generally known to be useful in simulating the mobility of a liquid droplet in the dynamic state. In a simple manner, the receding contact angle can be defined as a contact angle at the time of the liquid droplet interface receding when a liquid droplet ejected from a needle tip is landed on a substrate and then the liquid droplet is again suctioned into the needle. In general, the receding contact angle can be measured by a contact angle measuring method called an expansion/contraction method.

In the immersion exposure step, the immersion liquid must move on a wafer following the movement of an exposure head that is scanning the wafer at a high speed and forming an exposure pattern. Therefore, the contact angle of the immersion liquid for the resist film in a dynamic state is important, and the resist is required to have a performance of allowing a liquid droplet to follow the high-speed scanning of an exposure head with no remaining The fluorine atom or silicon atom in the hydrophobic resin may be contained in the main chain of the resin or substituted on the side chain.

The hydrophobic resin is preferably a resin containing, as a fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably from 1 to 4) is a linear or branched alkyl group with at least one hydrogen atom being substituted for by a fluorine atom and may further have a substituent other than the fluorine atom.

The fluorine atom-containing cycloalkyl group is a monocyclic or polycyclic cycloalkyl group with at least one hydrogen atom being substituted for by a fluorine atom and may further have a substituent other than the fluorine atom.

The fluorine atom-containing aryl group includes an aryl group (e.g., phenyl, naphthyl) with at least one hydrogen atom being substituted for by a fluorine atom and may further have a substituent other than the fluorine atom.

Preferred fluorine atom-containing alkyl group, fluorine atom-containing cycloalkyl group and fluorine atom-containing aryl group include groups represented by the following formulae (F2) to (F4), but the present invention is not limited thereto.

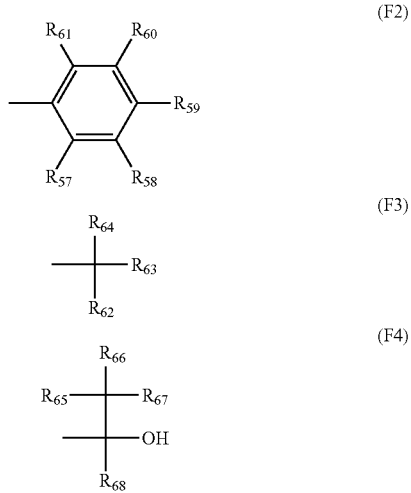

In formulae (F2) to (F4), each of $R_{57}$ to $R_{68}$ independently represents a hydrogen atom, a fluorine atom or an alkyl group (linear or branched). However, at least one of $R_{57}$ to $R_{61}$, at least one of $R_{62}$ to $R_{64}$, and at least one of $R_{65}$ to $R_{68}$ each independently represents a fluorine atom or an alkyl group (preferably having a carbon number of 1 to 4) with at least one hydrogen atom being substituted for by a fluorine atom. It is preferred that all of $R_{57}$ to $R_{61}$ and $R_{65}$ to $R_{67}$ are a fluorine atom. Each of $R_{62}$, $R_{63}$ and $R_{68}$ is preferably an alkyl group (preferably having a carbon number of 1 to 4) with at least one hydrogen atom being substituted for by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

The hydrophobic resin may further contain at least one group selected from the group consisting of the following (x) to (z):

(x) an alkali-soluble group, (y) a group capable of decomposing by the action of an alkali developer to increase the solubility in an alkali developer, and (z) a group capable of decomposing by the action of an acid.

Examples of the (x) alkali-soluble group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group. Preferred alkali-soluble groups include a fluorinated alcohol group (preferably hexafluoroisopropanol), a sulfonimide group and a bis(carbonyl)methylene group.

Examples of the repeating unit having (x) an alkali-soluble group include a repeating unit where an alkali-soluble group is directly bonded to the main chain of the resin, such as repeating unit by an acrylic acid or a methacrylic acid, and a repeating unit where an alkali-soluble group is bonded to the main chain of the resin through a linking group. Furthermore, an alkali-soluble group may be introduced into the polymer chain terminal by using an alkali-soluble group-containing polymerization initiator or chain transfer agent at the polymerization. All of these cases are preferred.

The content of the repeating unit having (x) an alkali-soluble group is preferably from 1 to 50 mol %, more preferably from 3 to 35 mol %, still more preferably from 5 to 20 mol %, based on all repeating units in the hydrophobic resin.

Examples of the group (y) capable of decomposing by the action of an alkali developer to increase the solubility in an alkali developer include a lactone structure-containing group, an acid anhydride group and an acid imide group, with a lactone structure-containing group being preferred.

As for the repeating unit having (y) a group capable of decomposing by the action of an alkali developer to increase the solubility in an alkali developer, both a repeating unit where (y) a group capable of decomposing by the action of an alkali developer to increase the solubility in an alkali developer is bonded to the main chain of the resin, such as repeating unit by an acrylic acid ester or a methacrylic acid ester; and a repeating unit where (y) a group capable of increasing the solubility in an alkali developer is introduced into the polymer chain terminal by using a polymerization initiator or chain transfer agent containing the group at the polymerization, are preferred.

The content of the repeating unit having (y) a group capable of increasing the solubility in an alkali developer is preferably from 1 to 40 mol %, more preferably from 3 to 30 mol %, still more preferably from 5 to 15 mol %, based on all repeating units in the hydrophobic resin (HR).

Specific examples of the repeating unit having (y) a group capable of increasing the solubility in an alkali developer are the same as those of the repeating unit having a lactone structure described above in the paragraph of [3] Acid-Decomposable Resin.

Examples of the repeating unit having (z) a group capable of decomposing by the action of an acid, contained in the hydrophobic resin, are the same as those of the repeating unit having an acid-decomposable group described above in the paragraph of [3] Acid-Decomposable Resin. The content of the repeating unit having (z) a group capable of decomposing by the action of an acid is preferably from 1 to 80 mol %, more preferably from 10 to 80 mol %, still more preferably from 20 to 60 mol %, based on all repeating units in the hydrophobic resin.

The hydrophobic resin may further contain a repeating unit represented by the following formula (III):

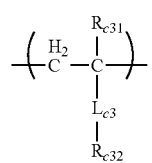

(III)

In formula (III), $R_{c31}$ represents a hydrogen atom, an alkyl group, an alkyl group which may be substituted with a fluorine atom, a cyano group or a —$CH_2$—O-$Rac_2$ group, wherein $Rac_c$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group, a cycloalkenyl group or an aryl group. These groups may be substituted with a silicon atom-containing group or a fluorine atom.

$L_{c3}$ represents a single bond or a divalent linking group.

In formula (III), the alkyl group of $R_{c32}$ is preferably a linear or branched alkyl group having a carbon number of 3 to 20.

The cycloalkyl group of $R_{c32}$ is preferably a cycloalkyl group having a carbon number of 3 to 20.

The alkenyl group of $R_{c32}$ is preferably an alkenyl group having a carbon number of 3 to 20.

The cycloalkenyl group of $R_{c32}$ is preferably a cycloalkenyl group having a carbon number of 3 to 20.

The aryl group of $R_{c32}$ is preferably an aryl group having a carbon number of 6 to 20, more preferably a phenyl group.

$R_{c32}$ is preferably an unsubstituted alkyl group or an alkyl group substituted with a fluorine atom.

The divalent linking group of $L_{c3}$ is preferably an ester bond, an alkylene group (preferably having a carbon number of 1 to 5), an ether bond, a phenylene group or a divalent linking group formed by combining two or more thereof.

It is also preferred that the hydrophobic resin further contains a repeating unit represented by the following formula (CII-AB):

(CII-AB)

In formula (CII-AB), each of $R_{c11}{'}$ and $R_{c12}{'}$ independently represents a hydrogen atom, a cyano group, a halogen atom or an alkyl group.

Zc' represents an atomic group for forming an alicyclic structure containing two carbon atoms (C—C) to which bonded.

In the case where the hydrophobic resin contains a fluorine atom, the fluorine atom content is preferably from 5 to 80 mass %, more preferably from 10 to 80 mass %, based on the weight average molecular weight of the hydrophobic resin. Also, the fluorine atom-containing repeating unit preferably accounts for 10 to 100 mol %, more preferably from 30 to 100 mol %, based on all repeating units in the hydrophobic resin.

The weight average molecular weight of the hydrophobic resin is preferably from 1,000 to 100,000, more preferably from 1,000 to 50,000, still more preferably from 2,000 to 15,000, in terms of standard polystyrene.

One kind of a hydrophobic resin may be used, or two or more kinds of hydrophobic resins may be used in combination.

The content of the hydrophobic resin in the composition is preferably from 0.01 to 10 mass %, more preferably from 0.05 to 8 mass %, still more preferably from 0.1 to 5 mass %, based on the entire solid content in the composition of the present invention.

In the hydrophobic resin, similarly to the above-described acid-decomposable resin, it is of course preferred that the content of impurities such as metal is small, but also, the content of residual monomers or oligomer components is preferably as close to 0 as possible, specifically, preferably from 0 to 10 mass %, more preferably from 0 to 5 mass %, still more preferably from 0 to 1 mass %. When these conditions are satisfied, a resist composition free from extraneous substances in liquid or change with aging of sensitivity or the like can be obtained. Furthermore, in view of resolution, resist profile, side wall of resist pattern, roughness and the like, the molecular weight distribution (Mw/Mn, sometimes referred to as "polydispersity") is preferably from 1 to 5, more preferably from 1 to 3, still more preferably from 1 to 2.

As for the hydrophobic resin, various commercially available products may be also used, or the resin may be synthesized and purified by a conventional method (for example, radical polymerization). For details of the synthesis method and purification method, please refer to description, for example, in "Kobunshi Gosei (Polymer Synthesis)" of *Dai*

5-Han Jikken Kagaku Koza 26, Kobunshi Kagaku (Experimental Chemistry Course 26, Polymer Chemistry, 5th Edition), Chapter 2, Maruzen.
Specific examples of the hydrophobic resin include resins having a silicon atom described in paragraphs 0172 to 0253 of U.S. Patent Application Publication No. 2008/0305432A1 and resins having a fluorine atom illustrated below.
(HR-1)
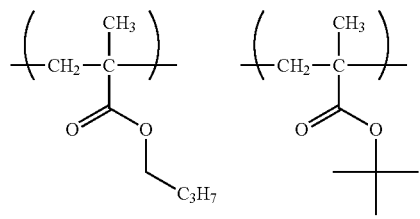
(HR-2)
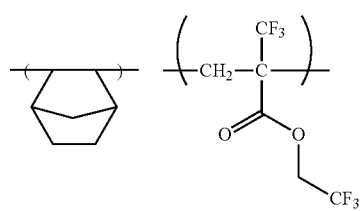
(HR-3)
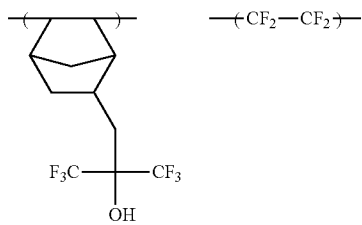
(HR-4)
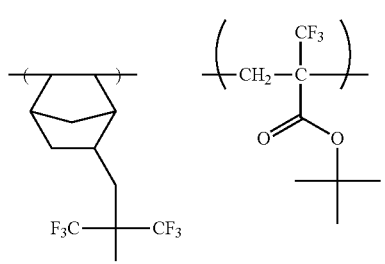
(HR-5)
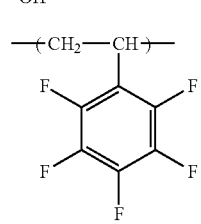
(HR-6)
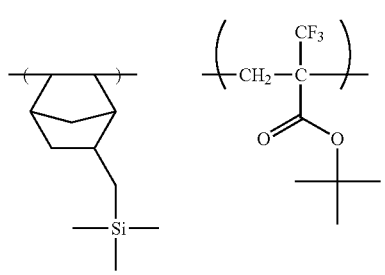
(HR-7)
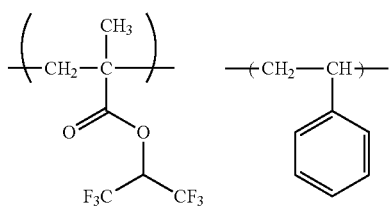
(HR-8)
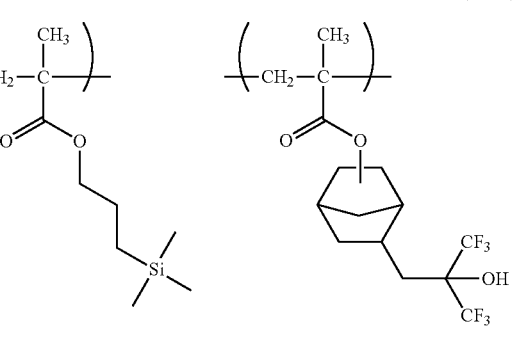
(HR-9)
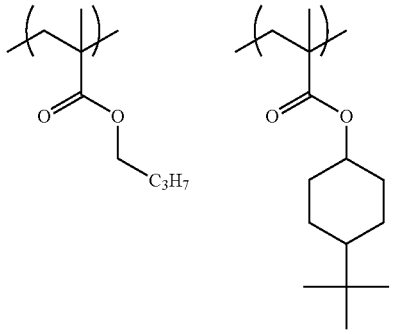
(HR-10)
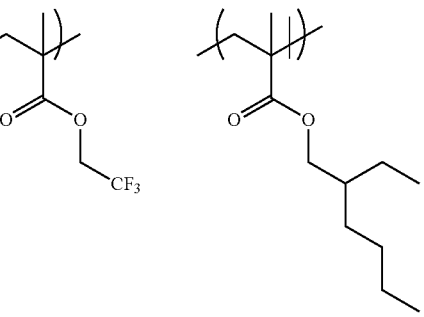
(HR-11)
(HR-12)
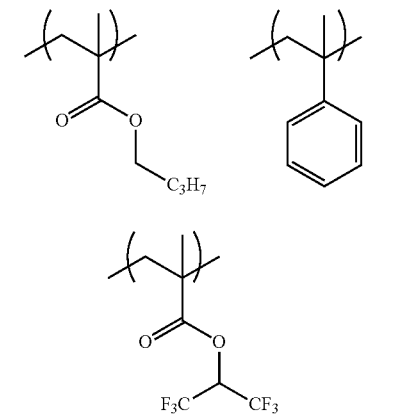

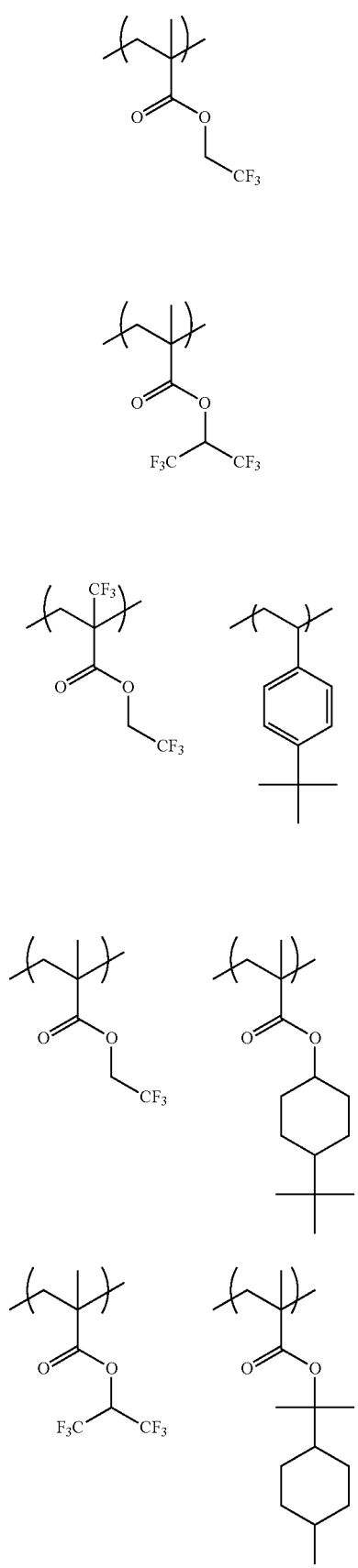
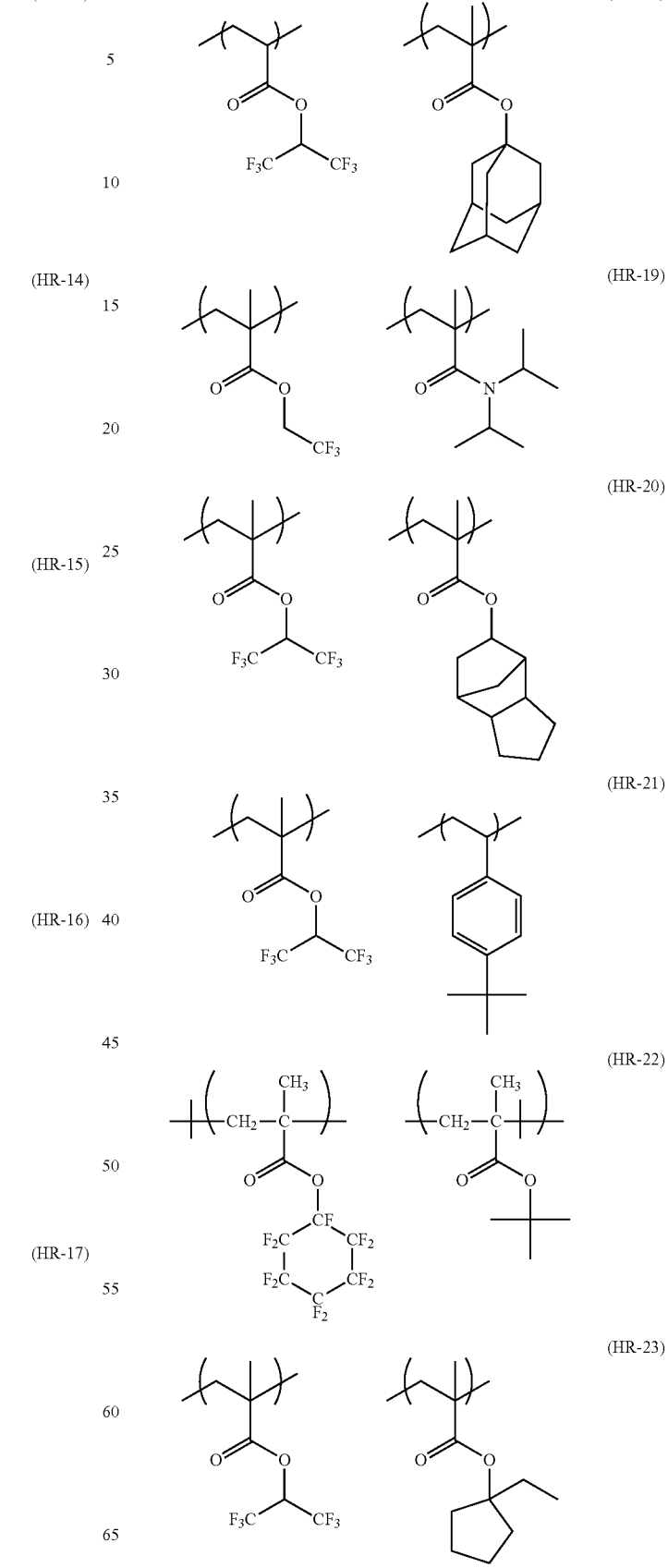

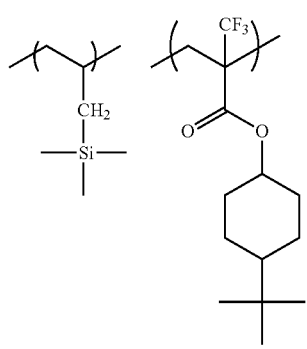
(HR-24)
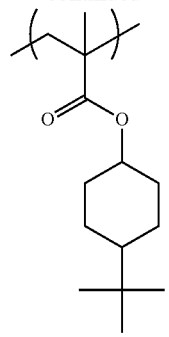
(HR-30)
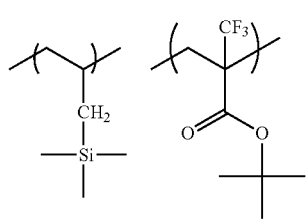
(HR-25)
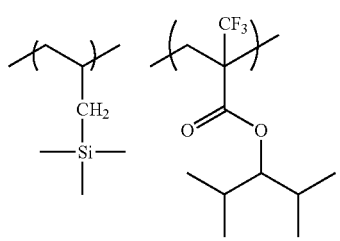
(HR-26)
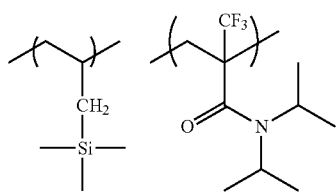
(HR-27)
(HR-28)
(HR-29)
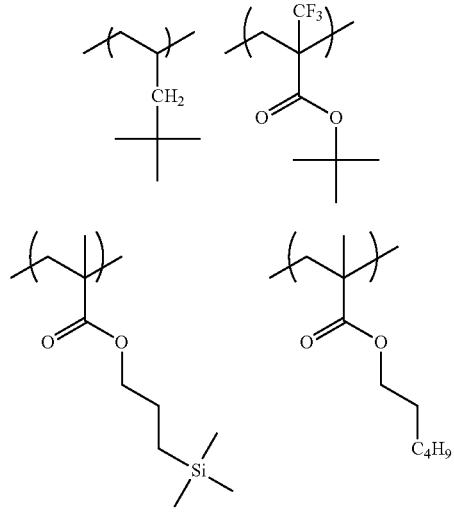
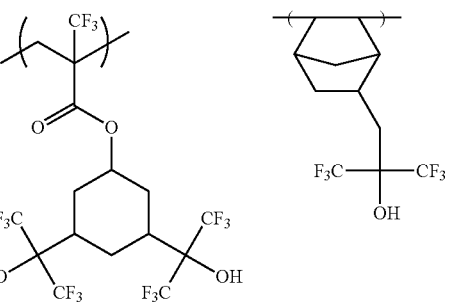
(HR-31)
(HR-32)
(HR-33)

(HR-34) 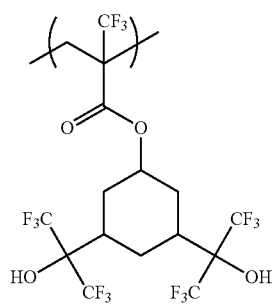 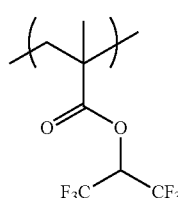
(HR-35) 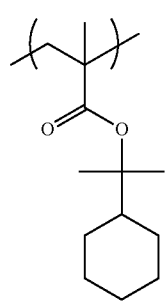 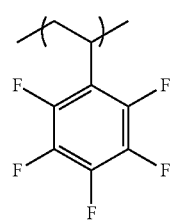
(HR-36) 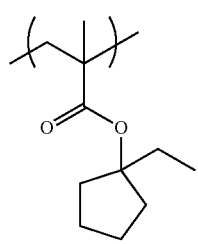 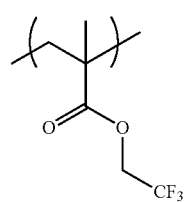
(HR-37) 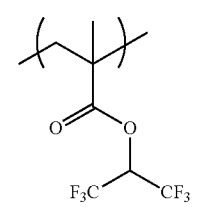 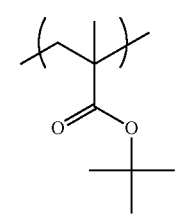
(HR-38) 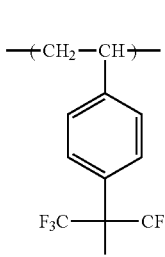 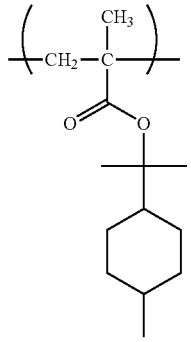
(HR-39) 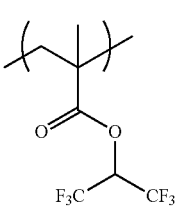 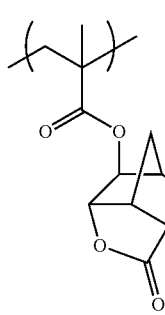
(HR-40) 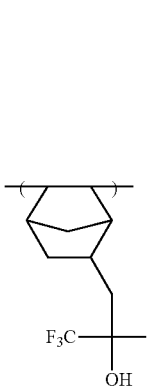 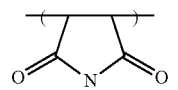 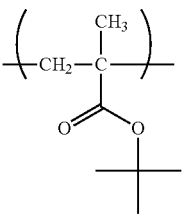
(HR-41) 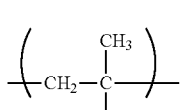 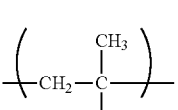 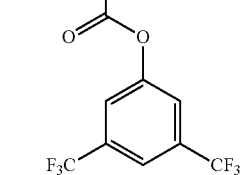 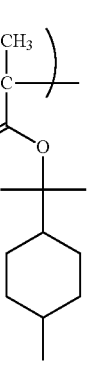
(HR-42) 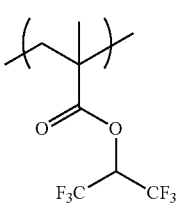 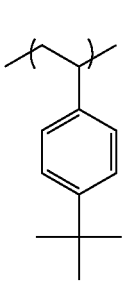 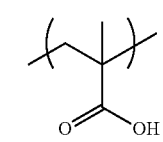
(HR-43) 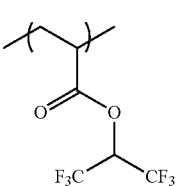 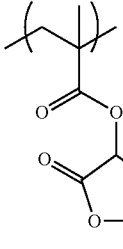

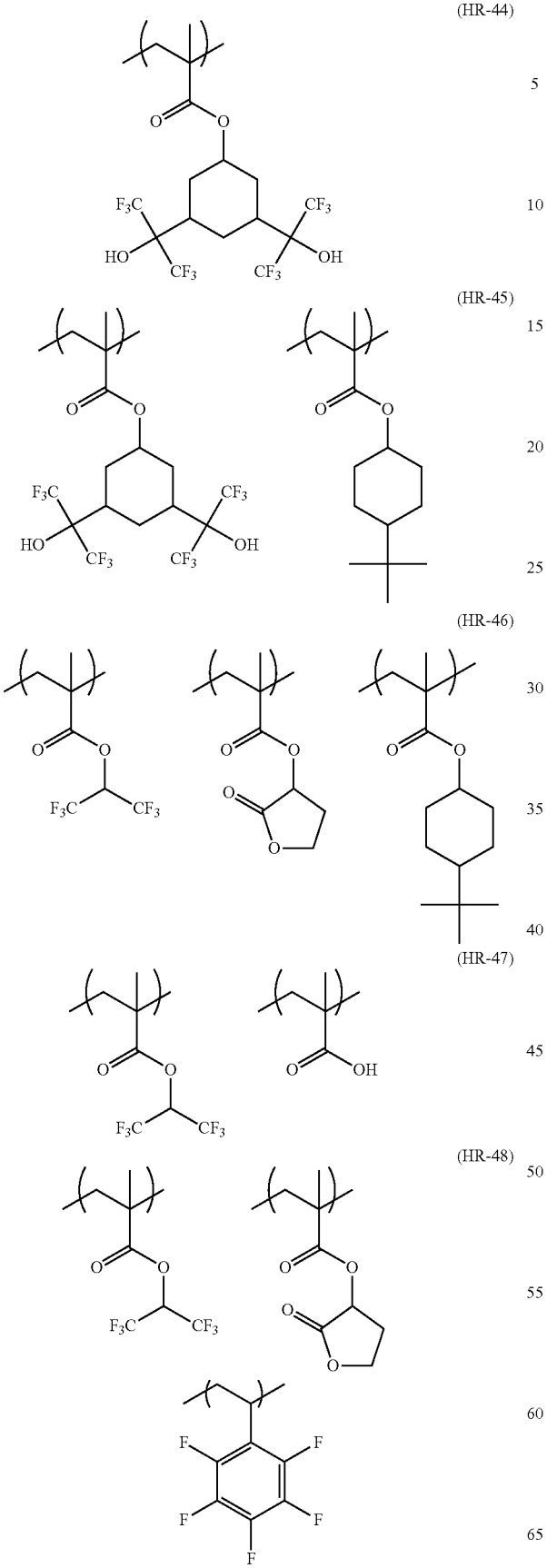
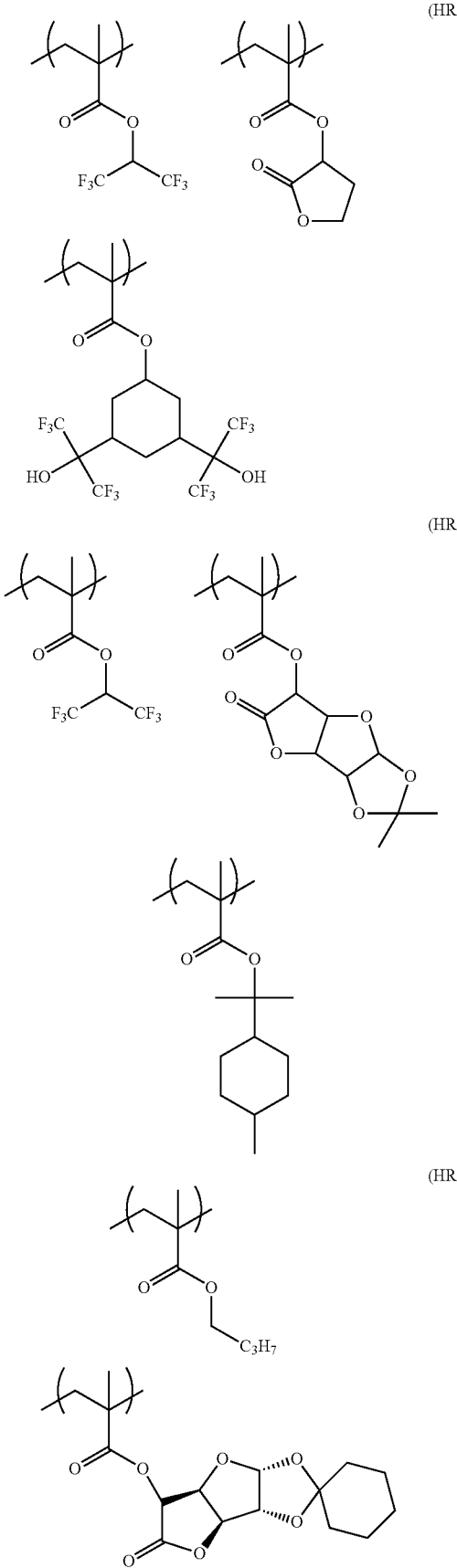

(HR-52)
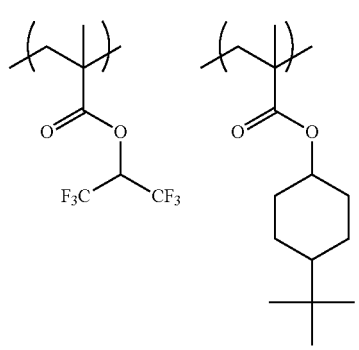

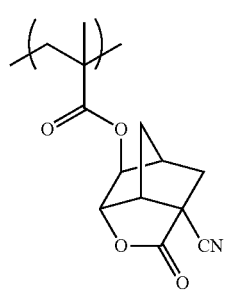

(HR-53)
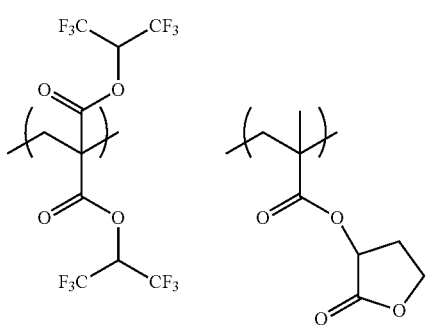

(HR-54)
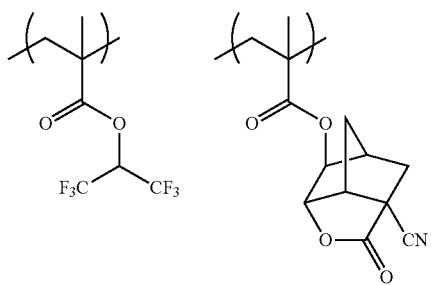

(HR-55)
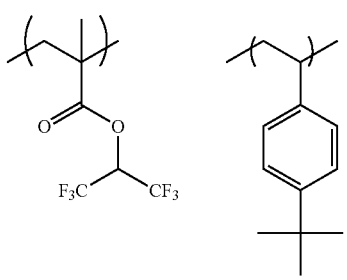

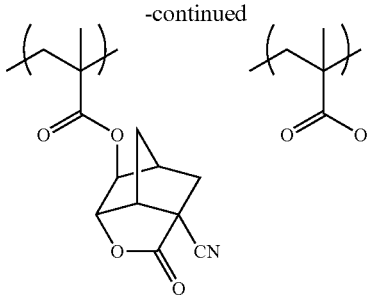

(HR-56)
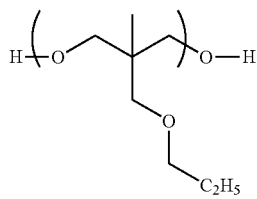

(HR-57)
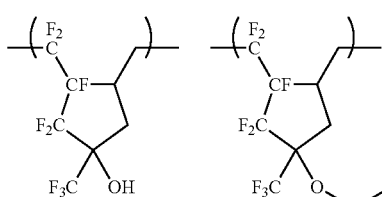

(HR-58)
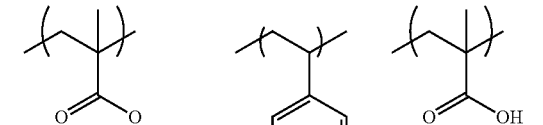
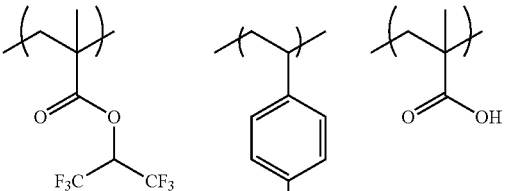

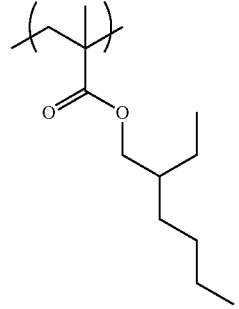

[10] Organic Solvent

The composition of the present invention typically further contains a predetermined organic solvent capable of dissolving the components described above.

Examples of the organic solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

The solvent having a ketone structure includes, for example, a chain ketone solvent and a cyclic ketone solvent. In view of coatability, a compound having a total carbon number of 5 to 8 is preferred.

Examples of the chain ketone solvent include 2-heptanone, methyl ethyl ketone and methyl isobutyl ketone, with 2-heptanone being preferred.

Examples of the cyclic ketone solvent include cyclopentanone, 3-methyl-2-cyclopentanone, cyclohexanone, 2-methylcyclohexanone, 2,6-dimethylcyclohexanone, cycloheptanone, cyclooctanone and isophorone, with cyclohexanone and cycloheptanone being preferred.

As for the organic solvent, it is preferred to use a ketone structure-containing solvent alone or a mixed solvent of a ketone structure-containing solvent and another solvent.

Examples of the solvent mixed with a ketone structure-containing solvent include a propylene glycol monoalkyl ether carboxylate, an alkyl lactate, a propylene glycol monoalkyl ether, an alkyl alkoxypropionate and a lactone compound.

Examples of the propylene glycol monoalkyl ether carboxylate include propylene glycol monomethyl ether acetate, propylene glycol monomethyl ether propionate and propylene glycol monoethyl ether acetate.

Examples of the alkyl lactate include methyl lactate and ethyl lactate.

Examples of the propylene glycol monoalkyl ether include propylene glycol monomethyl ether and propylene glycol monoethyl ether.

Examples of the alkyl alkoxypropionate include methyl methoxypropionate, ethyl methoxypropionate, methyl ethoxypropionate and ethyl ethoxypropionate.

Examples of the lactone compound include γ-butyrolactone.

The solvent used in combination is preferably a propylene glycol monoalkyl ether carboxylate, an alkyl lactate or a propylene glycol monoalkyl ether. The solvent used in combination is more preferably propylene glycol monomethyl ether acetate.

In view of film thickness uniformity and performance in terms of development defect, a high boiling-point solvent having a boiling point of 200° C. or more, such as ethylene carbonate and propylene carbonate, may be mixed.

The amount of the high boiling-point solvent added is usually from 0.1 to 15 mass %, preferably from 0.5 to 10 mass %, more preferably from 1 to 5 mass %, based on the entire solvent.

In the present invention, typically, the actinic ray-sensitive or radiation-sensitive resin composition is prepared by using an organic solvent, preferably a mixed solvent of two or more kinds of solvents.

The solid content concentration of the composition is usually from 1 to 25 mass %, preferably from 2 to 20 mass %, more preferably from 2.5 to 10 mass %. Particularly, in the case of performing pattern formation by using an electron beam, EUV light of ArF light, the solid content concentration is preferably from 2.5 to 20 mass %.

[11] Other Additives

The composition of the present invention may further contain, if desired, additives such as dye, plasticizer, surfactant other than the above-described fluorine-containing and/or silicon-containing surfactant, photosensitizer and compound capable of accelerating the solubility in a developer.

The compound capable of accelerating the dissolution in a developer (dissolution accelerating compound) is a low molecular compound containing two or more phenolic OH groups or one or more carboxy groups and having a molecular weight of 1,000 or less. In the case of containing a carboxyl group, an alicyclic or aliphatic compound is preferred.

The amount of the dissolution accelerating compound added is preferably from 2 to 50 mass %, more preferably from 5 to 30 mass %, based on the resin of the resin above. From the standpoint of suppressing the development scum or preventing the deformation of pattern at the development, the amount added is preferably 50 mass % or less.

The phenol compound having a molecular weight of 1,000 or less can be easily synthesized by referring to the method described, for example, in JP-A-4-122938, JP-A-2-28531, U.S. Pat. No. 4,916,210 and European Patent 219294.

Specific examples of the alicyclic or aliphatic compound having a carboxy group include, but are not limited to, a carboxylic acid derivative having a steroid structure, such as cholic acid, deoxycholic acid and lithocholic acid, an adamantane carboxylic acid derivative, an adamantane dicarboxylic acid, a cyclohexanecarboxylic acid and a cyclohexanedicarboxylic acid.

Specific examples of the surfactant other than the fluorine-containing and/or silicon-containing surfactant include a nonionic surfactant such as polyoxyethylene alkyl ethers, polyoxyethylene alkylallyl ethers, polyoxyethylene•polyoxypropylene block copolymers, sorbitan aliphatic esters and polyoxyethylene sorbitan aliphatic esters. One of these surfactants may be added alone, or two or more thereof may be added in combination.

[Pattern Forming Method]

The pattern forming method using the composition of the present invention is described below.

The composition of the present invention is typically used by dissolving the components in a predetermined organic solvent, preferably the above-described mixed solvent, and coating the solution on a predetermined support. For example, the composition is applied to a substrate (e.g., silicon, silicon/silicon dioxide coat, silicon nitride, quartz having a Cr layer) for use in the production of a precision integrated circuit device, an imprint mold structure or the like by an appropriate coating method such as spinner or coater. Thereafter, the coating is dried to obtain an actinic ray-sensitive or radiation-sensitive resist film (hereinafter, sometimes referred to as a "photosensitive film"). The drying temperature is preferably from 60 to 150° C., more preferably from 80 to 130° C. Incidentally, a known antireflection film may be also provided by coating.

Subsequently, the photosensitive film is irradiated with an actinic ray or radiation, then preferably baked (heated) and developed. The baking temperature in the post-exposure baking (PEB) step after the exposure step but before the development step is preferably from 80 to 150° C., more preferably from 90 to 130° C., in view of sensitivity and stability and by this baking, a good pattern can be obtained.

Examples of the actinic ray or radiation include infrared light, visible light, ultraviolet light, far ultraviolet light, X-ray and electron beam. An actinic ray or radiation having, for example, a wavelength of 250 nm or less, particularly 220 nm or less, is preferred. Such an actinic ray or radiation includes, for example, KrF excimer laser (248 nm), ArF excimer laser (193 nm), $F_2$ excimer laser (157 nm), X-ray, EUV (13 nm) and electron beam. The actinic ray or radiation is preferably ArF excimer laser, $F_2$ excimer laser, X-ray, EUV (13 nm) or electron beam, more preferably X-ray, EUV (13 nm) or electron beam.

The exposure may be also performed by filling a liquid (e.g., pure water) having a refractive index higher than that of air between the photosensitive film and the lens. That is, immersion exposure may be also performed. By this exposure, the resolution can be more enhanced. In this case, for preventing the resist film from contacting with the immersion liquid, a film (sometimes referred to as a "topcoat") sparingly soluble in the immersion liquid may be provided on the resist film to intervene between the resist film and the immersion liquid. As another means to avoid contact of the resist film with the immersion liquid, the above-described hydrophobic resin may be previously added to the composition.

In the development step, an alkali developer is usually used.

Examples of the alkali developer include an alkaline aqueous solution containing inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

In the alkali developer, alcohols and/or a surfactant may be added each in an appropriate amount.

The alkali concentration of the alkali developer is usually from 0.1 to 20 mass %. The pH of the alkali developer is usually from 10.0 to 15.0.

For details of fabricating an imprint mold by using the composition of the present invention, please refer to, for example, Japanese Patent 4,109,085, JP-A-2008-162101, and "Yoshihiko Hirai (compiler), *Nanoimprint no Kiso to Gijutsu Kaihatsu•Oyo Tenkai-Nanoimprint no Kiban Gijutsu to Saishin no Gijutsu Tenkai (Basic and Technology Expansion•Application Development of Nanoimprint-Substrate Technology of Nanoimprint and Latest Technology Expansion)*, Frontier Shuppan".

EXAMPLES

The present invention is described in greater detail below, but the contents of the present invention are not limited thereto.

<(A) Guanidine Compound Having a logP Value of 1.2 or More>

As the guanidine compound (A) having a logP value of 1.2 or more and comparative compounds, compound shown in the Table below were used.

| Compound | Compound Structure |
|---|---|
| 1 | 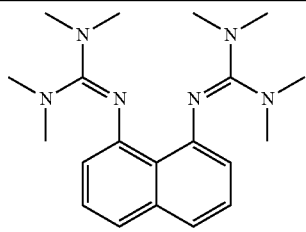<br>Log P: 4.29<br>pKa of conjugate acid: 12.1<br>produced by Fluka |
| 2 | Log P: 3.32<br>pKa of conjugate acid: 11.55<br>produced by Tokyo Chemical Industry |
| 3 | Log P: 5.66<br>pKa of conjugate acid: 14.56<br>produced by Tokyo Chemical Industry |
| 4 | Log P: 5.24<br>pKa of conjugate acid: 9.1<br>produced by Tokyo Chemical Industry |
| 5 | 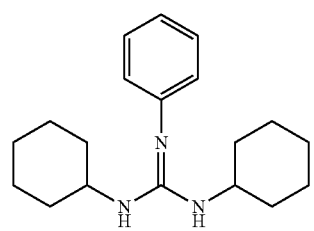<br>Log P: 5<br>pKa of conjugate acid: 11.26<br>produced by FCHC |

-continued

| Compound | Compound Structure |
|---|---|
| 6 | 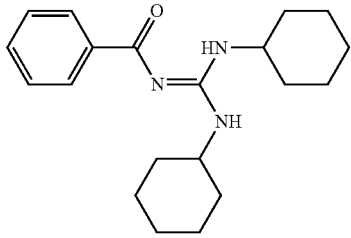<br>Log P: 4.95<br>pKa of conjugate acid: 6.72 |
| 7 | 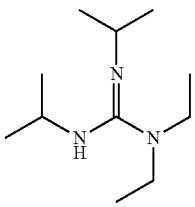<br>Log P: 2.61<br>pKa of conjugate acid: 14.01 |
| 8 | 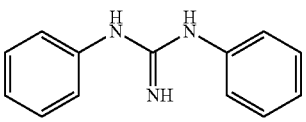<br>Log P: 3.34<br>pKa of conjugate acid: 10.12<br>produced by Tokyo Chemical Industry |
| 9 | 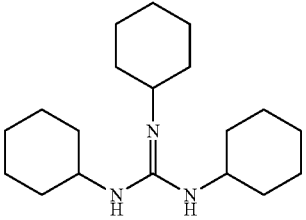<br>Log P: 4.89<br>pKa of conjugate acid: 13.81<br>produced by Rare Chemicals |
| 10 | 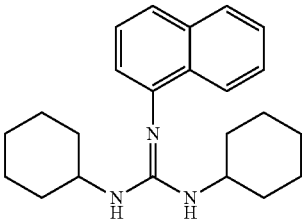<br>Log P: 6<br>pKa of conjugate acid: 11.26 |

-continued

| Compound | Compound Structure |
|---|---|
| Comparative Compound 1 | 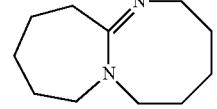<br>Log P: 2.13<br>pKa of conjugate acid: 13.26<br>produced by Tokyo Chemical Industry |
| Comparative Compound 2 | 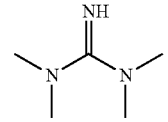<br>Log P: 0.76<br>pKa of conjugate acid: 15.20<br>produced by Aldrich |
| Comparative Compound 3 | 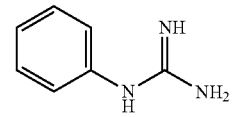<br>Log P: 1.15<br>pKa of conjugate acid: 11.06 |
| Comparative Compound 4 | 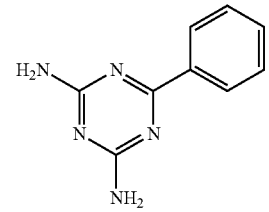<br>Log P: 2.22<br>pKa of conjugate acid: 3.97<br>produced by Tokyo Chemical Industry |
| Comparative Compound 5 | 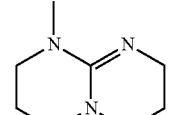<br>Log P: 0.72<br>pKa of conjugate acid: 14.37 |

<Synthesis of Compound 6>

Compound 6 was synthesized by the method described in *Tetrahedron Letters*, 2002, Vol. 43, #1, pp. 49-52. That is, Compound 6 was synthesized by aminating a thiourea compound.

$^1$H NMR (CDCl$_3$): δ 1.19-1.48 (8H, m); 1.52-1.70 (4H, m); 1.78-1.80 (4H, m); 1.95-2.15 (4H, m); 3.50 (1H, s1); 4.20 (1H, m); 7.37-7.48 (3H, m); 8.21 (2H, d, J=7.2 Hz); 10.35 (1H, s1).

<Synthesis of Compound 7>

Compound 7 was synthesized by the method described in *Journal of Organic Chemistry*, 2007, Vol. 72, #18, pp. 6763-6767. That is, Compound 7 was synthesized by reacting carbodiimide and amine.

$^1$H NMR (CDCl$_3$): δ 3.38 (br, 1H), 3.25 (br, 1H), 3.04 (q, J=6.9 Hz, 4H), 0.99 (m, 18H).

<Synthesis of Compound 10>

Compound 10 was synthesized by the method described in *Journal of Organic Chemistry*, 2007, Vol. 72, #18, pp. 6763-6767. That is, Compound 10 was synthesized by reacting carbodiimide and amine.

$^1$H NMR (CDCl$_3$): δ 7.99 (d, J=7.3 Hz, 1H), 7.73 (d, J=7.1 Hz, 1H), 7.36 (m, 4H), 6.88 (d, J=6.2 Hz, 1H), 3.69 (br, 2H), 3.43 (br, 2H), 1.99-0.82 (m, 20H).]

<Photoacid Generator>

At least one of (z1) to (z98) was used as the photoacid generator.

<Basic Compound>

The following Compounds C-1 to C-3 were used as the basic compound.

C-1: 2,4,5-Triphenylimidazole
C-2: Tetrabutylammonium hydroxide
C-3: 1,5-Diazabicyclo[4.3.0]non-5-ene <Surfactant>

The following W-1 to W-4 were used as the surfactant.

W-1: Megaface F176 (produced by Dainippon Ink & Chemicals, Inc.; fluorine-containing)
W-2: Megaface R08 (produced by Dainippon Ink & Chemicals, Inc.; fluorine- and silicon-containing)
W-3: Polysiloxane Polymer KP-341 (produced by Shin-Etsu Chemical Co., Ltd.; silicon-containing)
W-4: Troysol S-366 (produced by Troy Chemical; fluorine-containing)

<Solvent>

The following A1 to A4, B1 and B2 were used as the solvent. These solvents were appropriately mixed and used.

A1: Propylene glycol monomethyl ether acetate
A2: 2-Heptanone
A3: Cyclohexanone
A4: γ-Butyrolactone
B1: Propylene glycol monomethyl ether
B2: Ethyl lactate Example A Examples 1A to 13A and Comparative Examples 1A to 5A Preparation of Resist The components shown in Table 1 below were dissolved in a solvent to prepare a solution having a solid content concentration of 4.0 mass %, and the obtained solution was filtered through a polytetrafluoroethylene filter having a pore size of 0.1 μm to obtain a positive resist solution.

(Evaluation of Resist)

An antireflection film, DUV-42, produced by Brewer Science Co., Ltd. was uniformly coated on a hexamethyldisilazane-treated silicon substrate by a spin coater to a thickness of 60 nm, dried on a hot plate at 100° C. for 90 seconds and then dried by heating at 190° C. for 240 seconds. Thereafter, each positive resist composition was coated thereon by a spin coater and dried at 120° C. for 90 seconds to form a resist film having a thickness of 0.12 μm.

This resist film was exposed through a 6% halftone mask having a 1:1 line-and-space pattern with a line width of 150 nm by using an ArF excimer laser stepper (manufactured by ISI, NA=0.6) and immediately after the exposure, heated on a hot plate at 120° C. for 90 seconds. Furthermore, the resist film was developed with an aqueous 2.38 mass % tetramethylammonium hydroxide solution at 23° C. for 60 seconds, rinsed with pure water for 30 seconds and then dried to obtain a line pattern.

[Sensitivity]

Surface exposure was performed by changing the exposure dose in steps of 0.5 mJ/cm$^2$ in the range of 10 to 40 mJ/cm$^2$, and the exposed film was further baked at 110° C. for 90 seconds. Thereafter, the dissolution rate at each exposure dose was measured by using an aqueous 2.38 mass % tetramethylammonium hydroxide (TMAH) solution to obtain a dissolution rate curve.

In the dissolution rate curve, the exposure dose when the dissolution rate of the resist is saturated, was taken as the sensitivity.

[Line Edge Roughness (LER)]

A line pattern (L/S=1/1) of 150 nm was formed with the irradiation dose giving the sensitivity above. At arbitrary 30 points in a longitudinal 50 μm region, the distance from the reference line where the edge should be present was measured by means of a scanning electron microscope (S-9220, manufactured by Hitachi, Ltd.). The standard deviation of measured distances was determined, and 3σ was computed.

[Pattern Profile]

The exposure dose for reproducing a line-and-space (L/S=1/1) mask pattern with a line width of 150 nm was taken as an optimal exposure dose, and the profile at the optimal exposure dose was observed by a scanning microscope (SEM).

[PEB Temperature Dependency]

The exposure dose for reproducing a line-and-space 1/1 with a mask size of 150 nm when post-exposure baking (PEB) was performed at 120° C. for 90 seconds, was taken as an optimal exposure dose and after performing exposure with the optimal exposure dose, post-baking was performed at two temperatures of +2° C. and −2° C. with respect to the post-baking temperature (that is, 122° C. and 118° C.). Each line-and-space obtained was measured for the length, and the line widths L1 and L2 were determined. The PEB temperature dependency (PEBS) was defined as the fluctuation of line width per PEB temperature change of 1° C. and calculated according to the following formula.

$$\text{PEB Temperature dependency (nm/° C.)} = |L1-L2|/4$$

A smaller value indicates less change in performance based on the temperature change and is better.

[Evaluation of Scum]

A line pattern was formed by the same method as in [Pattern Profile] above. Thereafter, its cross-sectional SEM was obtained using S4800 (manufactured by Hitachi High-Technologies Corporation), and the scum in the space portion was observed and evaluated as follows.

D: A lot of scum is observed and patterns are partially connected.

C: A lot of scum is observed but patterns are not connected.

B: Scum is observed but patterns are not connected.

A: Scum is not observed.

These evaluation results are shown in Table 1 below.

TABLE 1

(ArF; positive)

| Example | Photoacid Generator | Compound (A) | Acid-Decomposable Resin (9.6 g) | Surfactant (0.1 mass %)* | Solvent (mass ratio) | Sensitivity (mJ/cm$^2$) | PEB Temperature Dependency | LER (nm) | Pattern Profile | Scum |
|---|---|---|---|---|---|---|---|---|---|---|
| Example 1A | z63 (0.8 g) 244 Å$^3$ | 3 (0.02 g) | RA-20 | W-1 | A1/B1 (6/4) | 24.0 | 2.5 | 4.1 | rectangular | A |
| Example 2A | z85 (0.8 g) 271 Å$^3$ | 2 (0.02 g) | RA-20 | W-1 | A2/B2 (6/4) | 24.1 | 2.0 | 4.1 | rectangular | A |
| Example 3A | z57 (0.8 g) 136 Å$^3$ | 1 (0.02 g) | RA-20 | W-1 | A3/B1 (6/4) | 26.0 | 3.5 | 4.5 | rectangular | A |
| Example 4A | z63 (0.8 g) 244 Å$^3$ | 4 (0.02 g) | RA-20 | W-1 | A4/B1 (6/4) | 24.0 | 2.6 | 5.0 | rectangular | A |
| Example 5A | z44 (0.8 g) 113 Å$^3$ | 7 (0.02 g) | RA-20 | W-1 | A1/B1 (6/4) | 24.0 | 3.0 | 4.5 | rectangular | B |
| Example 6A | z63 (0.8 g) 244 Å$^3$ | 6 (0.02 g) | RA-20 | W-1 | A1/B1 (6/4) | 24.2 | 2.5 | 5.1 | rectangular | A |
| Example 7A | z89 (0.8 g) 244 Å$^3$ | 5 (0.01 g) | RA-1 | W-1 | A1/B2 (6/4) | 24.2 | 2.0 | 4.1 | rectangular | A |
| Example 8A | z87 (0.8 g) 291 Å$^3$ | 9 (0.01 g) | RA-23 | W-2 | A3/B1 (6/4) | 24.0 | 2.0 | 4.3 | rectangular | A |
| Example 9A | z63 (0.5 g) 244 Å$^3$ + z17 (0.2 g) 113 Å$^3$ | 8 (0.1 g) | RA-25 | W-3 | A1/B1 (6/4) | 24.0 | 3.0 | 5.0 | rectangular | A |
| Example 10A | z63 (0.5 g) 244 Å$^3$ + z87 (0.2 g) 291 Å$^3$ | 10 (0.1 g) | RA-25 | W-3 | A2/B1 (6/4) | 24.0 | 2.5 | 4.5 | rectangular | A |
| Example 11A | z63 (0.8 g) 244 Å$^3$ | 2 (0.05 g) + 4 (0.05 g) | RA-25 | W-3 | A2/B1 (6/4) | 24.0 | 2.5 | 4.1 | rectangular | A |
| Example 12A | z63 (0.8 g) 244 Å$^3$ | 2 (0.1 g) | RA-20 (4.6 g) + RA-25 (5.0 g) | W-3 | A2/B1 (6/4) | 24.2 | 2.5 | 4.2 | rectangular | A |
| Example 13A | z63 (0.8 g) 244 Å$^3$ | 10 (0.1 g) | RA-25 | none | A2/B1 (6/4) | 24.0 | 2.5 | 4.1 | rectangular | A |
| Comparative Example 1A | z2 (0.8 g) 113 Å$^3$ | Comparative Compound 1 (0.02 g) | RA-20 | W-1 | A1/B1 (6/4) | 28.0 | 4.3 | 5.7 | tapered | D |
| Comparative Example 2A | z2 (0.8 g) 113 Å$^3$ | Comparative Compound 2 (0.02 g) | RA-20 | W-1 | A1/B1 (6/4) | 27.0 | 4.2 | 5.5 | tapered | D |
| Comparative Example 3A | z2 (0.8 g) 113 Å$^3$ | Comparative Compound 3 (0.02 g) | RA-20 | W-1 | A1/B1 (6/4) | 27.0 | 4.2 | 5.5 | tapered | D |
| Comparative Example 4A | z2 (0.8 g) 113 Å$^3$ | Comparative Compound 4 (0.02 g) | RA-20 | W-1 | A1/B1 (6/4) | 27.2 | 4.2 | 6.0 | tapered | C |
| Comparative Example 5A | z2 (0.8 g) 113 Å$^3$ | Comparative Compound 5 (0.02 g) | RA-20 | W-1 | A1/B1 (6/4) | 27.1 | 4.1 | 5.5 | tapered | D |

*Mass % based on the entire solid content. The same applies to the Tables later.

The photoacid generator, compound (A), basic compound, surfactant and solvent were appropriately selected from those described above and used.

Any of the following (RA-1), (RA-20), (RA-23) and (RA-25) was used as the acid-decomposable resin. In the formulae below, the numeral on the right side of the repeating units indicates the molar ratio. Also, Mw indicates the weight average molecular weight, and Mw/Mn indicates the polydispersity.

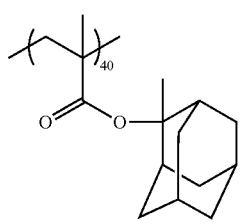

(RA-1)

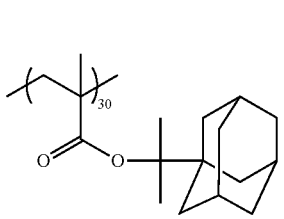

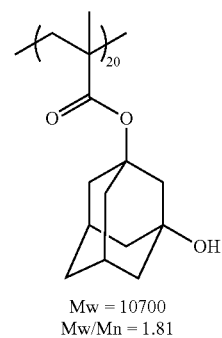

Mw = 10700
Mw/Mn = 1.81

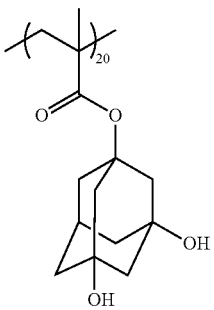

(RA-20)

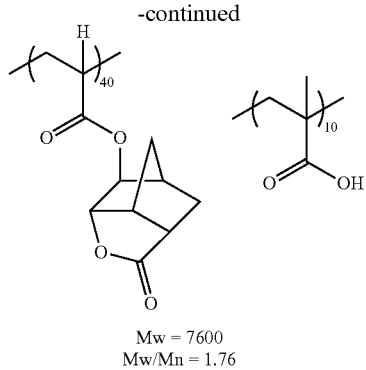

Mw = 7600
Mw/Mn = 1.76

(RA-23)

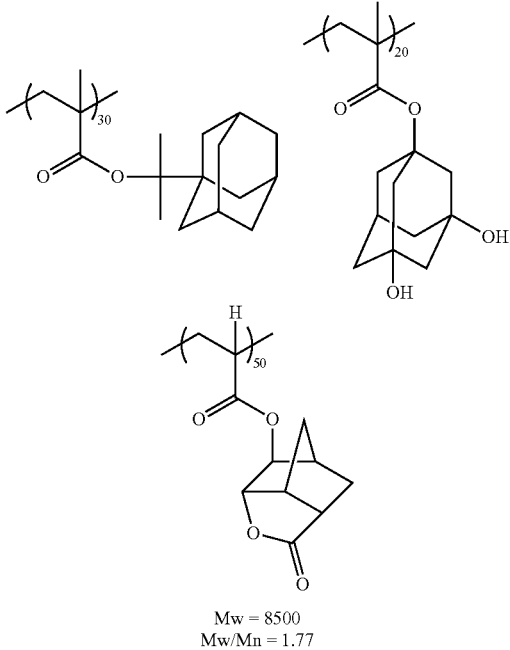

Mw = 8500
Mw/Mn = 1.77

(RA-25)

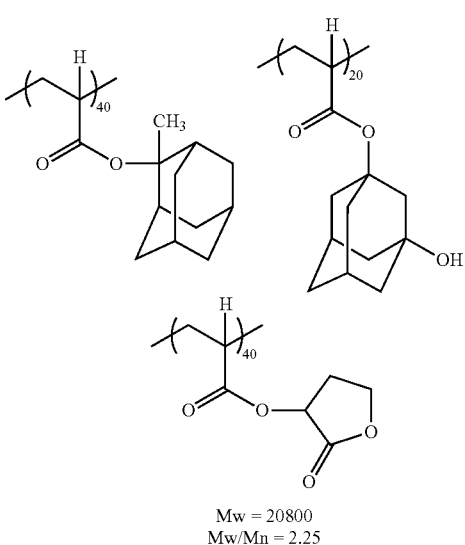

Mw = 20800
Mw/Mn = 2.25

The results shown in Table 1 reveal the followings. The composition according to the present invention brings about excellent pattern profile in ArF exposure and good scum performance as well as small PEB temperature dependency. The performance in terms of sensitivity and LER is also excellent. That is, the composition of the present invention has an excellent performance as a positive resist composition for ArF excimer laser exposure.

In Examples using an acid generator capable of generating an acid having a size of 130 Å or more, LER tends to be more improved.

In Examples using (A) a guanidine compound having a larger logP value and higher hydrophobicity, the scum performance tends to be more excellent.

In Examples using (A) a guanidine compound having higher basicity, LER tends to be more improved.

Example B1

A resist solution was prepared in the same manner as in Example A except for adding 0.06 g of the polymer shown below to the composition of Example 1A, and the solution was coated to obtain a resist film. The obtained resist film was subjected to pattern exposure through an immersion liquid (pure water) by using an ArF excimer laser immersion scanner (XT1250i, manufactured by ASML, NA: 0.85), and a pattern was formed in the same manner as in Example A. With respect to the pattern obtained, it was confirmed that the same evaluation results are obtained in all of scum, pattern profile, PEB temperature dependency, sensitivity and LER.

Weight average molecular weight: 4,500, polydispersity: 1.4

Example B2

A resist solution was prepared in the same manner as in Example A except for adding 0.06 g of the polymer shown below to the composition of Example 1A, and the solution was coated to obtain a resist film. The obtained resist film was subjected to pattern exposure through an immersion liquid (pure water) by using an ArF excimer laser immersion scanner (XT1250i, manufactured by ASML, NA: 0.85), and a pattern was formed in the same manner as in Example A. With respect to the pattern obtained, it was confirmed that the same evaluation results are obtained in all of scum, sensitivity, PEB temperature dependency, LER and pattern profile.

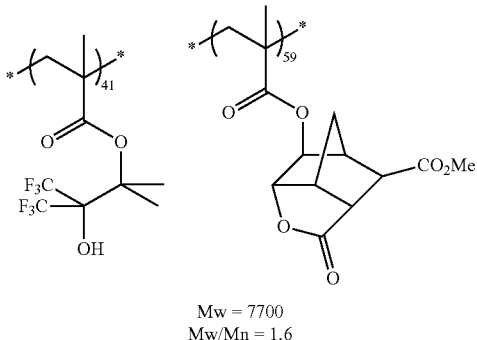

Mw = 7700
Mw/Mn = 1.6

Example B3

A resist solution was prepared in the same manner as in Example A except for adding 0.06 g of the polymer shown below to the composition of Example 1A, and the solution was coated to obtain a resist film. The obtained resist film was subjected to pattern exposure through an immersion liquid (pure water) by using an ArF excimer laser immersion scanner (XT1250i, manufactured by ASML, NA: 0.85), and a pattern was formed in the same manner as in Example A. With respect to the pattern obtained, it was confirmed that the same evaluation results are obtained in all of scum, sensitivity, PEB temperature dependency, LER and pattern profile.

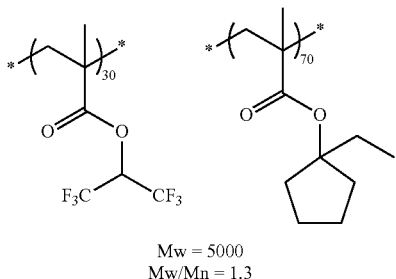

Mw = 5000
Mw/Mn = 1.3

Example C

Examples 1C to 13C and Comparative Examples 1C to 5C

Preparation of Resist

The components shown in Table 2 below were dissolved in a solvent, and the obtained solution was filtered through a polytetrafluoroethylene filter having a pore size of 0.1 μm to obtain a positive resist solution having a solid content concentration of 4.5 mass %.

(Evaluation of Resist)

The positive resist solution prepared was uniformly coated on a hexamethyldisilazane-treated silicon substrate by a spin coater and dried by heating on a hot plate at 100° C. for 90 seconds to form a resist film of 0.4 μm.

This resist film was subjected to pattern exposure through a 6% halftone mask having a 1:1 line-and-space pattern with a line width of 180 nm by using a KrF excimer laser stepper NA=0.63) and immediately after the exposure, heated on a hot plate at 110° C. for 90 seconds. Thereafter, the resist film was developed with an aqueous 2.38 mass % tetramethylammonium hydroxide solution at 23° C. for 60 seconds, rinsed with pure water for 30 seconds and then dried to form a line pattern.

[Sensitivity]

The sensitivity was determined in the same manner as described in Example A.

[Line Edge Roughness (LER)]

A line pattern (L/S=1/1) of 180 nm was formed with the irradiation dose giving the sensitivity above. At arbitrary 30 points in a longitudinal 50 μm region, the distance from the reference line where the edge should be present was measured by means of a scanning electron microscope (S-9220, manufactured by Hitachi, Ltd.). The standard deviation of measured distances was determined, and 3σ was computed.

[Pattern Profile]

The exposure dose for reproducing a line-and-space (L/S=1/1) mask pattern with a line width of 180 nm was taken as an optimal exposure dose, and the profile at the optimal exposure dose was observed by a scanning microscope (SEM).

[PEB Temperature Dependency]

The exposure dose for reproducing a line-and-space 1/1 with a mask size of 180 nm when post-baking was performed at 120° C. for 90 seconds, was taken as an optimal exposure dose and after performing exposure with the optimal exposure dose, post-baking was performed at two temperatures of +2° C. and −2° C. with respect to the post-baking temperature (that is, 122° C. and 118° C.). Each line-and-space obtained was measured for the length, and the line widths L1 and L2 were determined. The PEB temperature dependency (PEBS) was defined as the fluctuation of line width per PEB temperature change of 1° C. and calculated according to the following formula.

PEB Temperature dependency (nm/° C.)=$|L1-L2|/4$

A smaller value indicates less change in performance based on the temperature change and is better.

[Evaluation of Scum]

The scum performance was evaluated in the same manner as described in Example A.

These evaluation results are shown in Table 2 below.

TABLE 2

(KrF; positive)

| Example | Photoacid Generator | Compound (A) | Acid-Decomposable Resin (9.7 g) | Basic Compound (0.02 g) | Surfactant (0.1 mass %) | Solvent (mass ratio) | Sensitivity (mJ/cm$^2$) | PEB Temperature Dependency | LER (nm) | Pattern Profile | Scum |
|---|---|---|---|---|---|---|---|---|---|---|---|
| Example 1C | z2 (0.6 g) 113 Å$^3$ | 1 (0.02 g) | R-18(L) | none | W-1 | A1/B1 (6/4) | 18.0 | 4.0 | 4.5 | rectangular | A |
| Example 2C | z7 (0.6 g) 303 Å$^3$ | 2 (0.02 g) | R-18(L) | none | W-1 | A2/B2 (6/4) | 18.0 | 2.8 | 4.1 | rectangular | A |
| Example 3C | z21 (0.6 g) 127 Å$^3$ | 3 (0.02 g) | R-18(L) | none | W-2 | A3/B1 (6/4) | 20.0 | 3.0 | 4.5 | rectangular | A |
| Example 4C | z2 (0.3 g) 113 Å$^3$ + z37 (0.3 g) 113 Å$^3$ | 7 (0.02 g) | R-23 | none | W-3 | A4/B1 (6/4) | 21.0 | 4.5 | 4.5 | rectangular | B |
| Example 5C | z12 (0.6 g) 216 Å$^3$ | 5 (0.02 g) | R-18(L) | none | W-1 | A1/B2 (6/4) | 21.0 | 3.1 | 4.2 | rectangular | A |
| Example 6C | z84 (0.6 g) 186 Å$^3$ | 6 (0.02 g) | R-27 | none | W-1 | A1/B1 (6/4) | 20.0 | 3.2 | 4.7 | rectangular | A |
| Example 7C | z67 (0.6 g) 113 Å$^3$ | 7 (0.02 g) | R-18(L) | none | W-4 | A1/B1 (6/4) | 20.0 | 4.5 | 4.5 | rectangular | A |
| Example 8C | z21 (0.6 g) 127 Å$^3$ | 8 (0.02 g) | R-18 | none | W-4 | A1/B1 (6/4) | 21.3 | 4.0 | 4.9 | rectangular | A |
| Example 9C | z59 (0.6 g) 173 Å$^3$ | 4 (0.02 g) | R-22 | C-1 (0.02 g) | W-1 | A2/B1 (6/4) | 20.0 | 3.5 | 5.0 | rectangular | A |
| Example 10C | z79 (0.5 g) 136 Å$^3$ | 2 (0.1 g) | R-18 | none | W-1 | A1/B1 (6/4) | 18.0 | 3.9 | 4.5 | rectangular | A |
| Example 11C | z12 (0.6 g) 216 Å$^3$ | 2 (0.05 g) + 4 (0.05 g) | R-18 | none | W-1 | A1/B1 (6/4) | 15.0 | 3.1 | 4.2 | rectangular | A |
| Example 12C | z12 (0.6 g) 216 Å$^3$ | 2 (0.1 g) | R-18 (4.7 g) + R-2 (5.0 g) | none | W-1 | A1/B1 (6/4) | 15.4 | 3.2 | 4.3 | rectangular | A |
| Example 13C | z12 (0.6 g) 216 Å$^3$ | 2 (0.1 g) | R-18 | none | none | A1/B1 (6/4) | 15.0 | 3.1 | 4.2 | rectangular | A |
| Comparative Example 1C | z2 (0.6 g) 113 Å$^3$ | Comparative Compound 1 (0.02 g) | R-2 | none | W-1 | A1/B1 (6/4) | 25.5 | 5.5 | 6.5 | tapered | D |
| Comparative Example 2C | z2 (0.6 g) 113 Å$^3$ | Comparative Compound 2 (0.02 g) | R-2 | none | W-1 | A1/B1 (6/4) | 23.0 | 5.5 | 7.5 | tapered | D |
| Comparative Example 3C | z2 (0.6 g) 113 Å$^3$ | Comparative Compound 3 (0.02 g) | R-2 | C-1 (0.02 g) | W-1 | A1/B1 (6/4) | 25.0 | 5.2 | 7.2 | tapered | D |
| Comparative Example 4C | z2 (0.6 g) 113 Å$^3$ | Comparative Compound 4 (0.02 g) | R-2 | C-1 (0.02 g) | W-1 | A1/B1 (6/4) | 25.3 | 5.2 | 8.2 | tapered | C |
| Comparative Example 5C | z2 (0.6 g) 113 Å$^3$ | Comparative Compound 5 (0.02 g) | R-2 | C-1 (0.02 g) | W-1 | A1/B1 (6/4) | 25.2 | 5.2 | 7.2 | tapered | D |

The photoacid generator, compound (A), basic compound, surfactant and solvent were appropriately selected from those described above and used.

The acid-decomposable resin was appropriately selected from (R-1) to (R-31) and used. The molar ratio, weight average molecular weight and polydispersity of each of (R-2), (R-10), (R-14), (R-17), (R-18), (R-18(H)), (R-18(L)), (R-22), (R-23) and (R-27) shown in Table 2 and the Table below are shown in the Table below.

| Resin | Molar Ratio of Repeating Units (corresponding to repeating units from the left) | Weight Average Molecular Weight (Mw) | Polydispersity |
|---|---|---|---|
| R-2 | 60/20/20 | 12000 | 1.7 |
| R-10 | 70/30 | 11000 | 1.6 |
| R-14 | 15/60/25 | 12000 | 1.5 |
| R-17 | 80/20 | 15000 | 1.8 |
| R-18 | 65/35 | 9000 | 1.7 |
| R-18(H) | 60/40 | 10000 | 1.9 |
| R-18(L) | 60/40 | 4000 | 1.2 |
| R-22 | 70/30 | 10000 | 1.9 |
| R-23 | 65/35 | 11000 | 1.6 |
| R-27 | 50/40/10 | 12000 | 1.8 |

The results shown in Table 2 reveal the followings. The composition according to the present invention brings about excellent pattern profile in KrF exposure and good scum performance as well as small PEB temperature dependency. The performance in terms of sensitivity and LER is also excellent. That is, the photosensitive composition of the present invention has an excellent performance as a positive resist composition for KrF excimer laser exposure.

In Examples using an acid generator capable of generating an acid having a size of 130 Å or more, LER tends to be more improved.

In Examples using (A) a guanidine compound having a larger logP value and higher hydrophobicity, the scum performance tends to be more excellent.

In Examples using (A) a guanidine compound having higher basicity, LER tends to be more improved.

Example D

Examples 1D to 23D and Comparative Examples 1D to 5D

Preparation of Resist

The components shown in Table 3 below were dissolved in a solvent, and the obtained solution was filtered through a polytetrafluoroethylene filter having a pore size of 0.1 μm to obtain a positive resist solution having a solid content concentration of 4.0 mass %.

(Evaluation of Resist)

The positive resist solution prepared was uniformly coated on a hexamethyldisilazane-treated silicon substrate by a spin coater and dried by heating on a hot plate at 100° C. for 60 seconds to form a resist film having a thickness of 0.12 μm.

This resist film was irradiated using an electron beam projection lithography apparatus (accelerating voltage: 100 keV) manufactured by Nikon Corp. and immediately after the irradiation, heated on a hot plate at 110° C. for 90 seconds. Thereafter, the resist film was developed with an aqueous tetramethylammonium hydroxide solution with a concentration of 2.38 mass % at 23° C. for 60 seconds, rinsed with pure water for 30 seconds and then dried to form a line-and-space pattern.

[Sensitivity]

The obtained pattern was observed using a scanning electron microscope (S-9220, manufactured by Hitachi, Ltd.). The irradiation dose of electron beam for resolving a line-and-space (L/S=1/1) with a line width of 0.10 μm was taken as the sensitivity (Eo).

[Line Edge Roughness (LER)]

LER was determined in the same manner as in Example A.

[Pattern Profile]

The irradiation dose for reproducing a line-and-space (L/S=1/1) pattern with a line width of 50 nm was taken as an optimal irradiation dose, and the profile at the optimal irradiation dose was observed by a scanning microscope (SEM).

[PEB Temperature Dependency]

The exposure dose for reproducing a line-and-space 1/1 with a line width of 50 nm when post-baking was performed at 120° C. for 90 seconds, was taken as an optimal exposure dose and after performing exposure with the optimal exposure dose, post-baking was performed at two temperatures of +2° C. and −2° C. with respect to the post-baking temperature (that is, 122° C. and 118° C.). Each line-and-space obtained was measured for the length, and the line widths L1 and L2 were determined. The PEB temperature dependency (PEBS) was defined as the fluctuation of line width per PEB temperature change of 1° C. and calculated according to the following formula.

PEB Temperature dependency (nm/° C.)=|L1−L2|/4

A smaller value indicates less change in performance based on the temperature change and is better.

[Evaluation of Scum]

The scum performance was evaluated in the same manner as described in Example A.

These evaluation results are shown in Table 3 below.

TABLE 3

(Electron Beam Irradiation; positive)

| Example | Photoacid Generator | Compound (A) | Acid-Decomposable Resin (9.7 g) | Basic Compound | Surfactant (0.1 mass %) | Solvent (mass ratio) | Sensitivity (μC./cm$^2$) | Pattern Profile | LER (nm) | PEB Temperature Dependency | Scum |
|---|---|---|---|---|---|---|---|---|---|---|---|
| Example 1D | z7 (0.6 g) 303 Å$^3$ | 7 (0.02 g) | R-18(H) | none | W-1 | A1/B1 (6/4) | 10.3 | rectangular | 4.3 | 2.0 | B |
| Example 2D | z12 (0.6 g) 216 Å$^3$ | 2 (0.02 g) | R-18(L) | none | W-1 | A2/B1 (6/4) | 10.5 | rectangular | 4.5 | 2.0 | A |
| Example 3D | z91 (0.6 g) 303 Å$^3$ | 3 (0.02 g) | R-22 | none | W-2 | A4/B1 (6/4) | 10.5 | rectangular | 4.2 | 1.5 | A |
| Example 4D | z90 (0.6 g) 437 Å$^3$ | 4 (0.02 g) | R-10 | none | W-3 | A1/B2 (6/4) | 10.0 | rectangular | 4.9 | 1.5 | A |
| Example 5D | z93 (0.6 g) 437 Å$^3$ | 5 (0.02 g) | R-2 | none | W-1 | A3/B2 (6/4) | 10.1 | rectangular | 4.3 | 1.5 | A |
| Example 6D | z63 (0.6 g) 244 Å$^3$ | 6 (0.02 g) | R-23 | none | W-1 | A1/B1 (6/4) | 10.2 | rectangular | 5.0 | 2.0 | A |
| Example 7D | z2 (0.6 g) 113 Å$^3$ | 1 (0.02 g) | R-27 | none | W-1 | A1/B1 (6/4) | 10.1 | rectangular | 5.0 | 3.2 | A |
| Example 8D | z21 (0.6 g) 127 Å$^3$ | 8 (0.02 g) | R-14 | none | W-1 | A1/B2 (6/4) | 10.3 | rectangular | 5.0 | 3.0 | A |
| Example 9D | z87 (0.6 g) 291 Å$^3$ | 9 (0.02 g) | R-17 | none | W-2 | A2/B1 (6/4) | 10.2 | rectangular | 4.3 | 2.5 | A |
| Example 10D | z93 (0.6 g) 437 Å$^3$ | 10 (0.02 g) | R-23 | none | W-1 | A1/B1 (6/4) | 12.3 | rectangular | 4.5 | 1.4 | A |
| Example 11D | z85 (0.6 g) 271 Å$^3$ | 2 (0.02 g) | R-18(L) | none | W-1 | A1/B1 (6/4) | 12.5 | rectangular | 4.5 | 1.4 | A |
| Example 12D | z93 (0.5 g) 437 Å$^3$ | 2 (0.1 g) | R-18(L) | none | W-1 | A1/B2 (6/4) | 15.2 | rectangular | 4.0 | 1.4 | A |
| Example 13D | z93 (0.5 g) 437 Å$^3$ | 2 (0.1 g) | R-18(L) | C-2 (0.02 g) | W-1 | A1/B1 (6/4) | 15.5 | rectangular | 4.0 | 1.4 | A |
| Example 14D | z90 (0.5 g) 437 Å$^3$ | 5 (0.1 g) | R-18(L) | C-2 (0.02 g) | W-1 | A2/B1 (6/4) | 16.2 | rectangular | 4.1 | 1.5 | A |

TABLE 3-continued (Electron Beam Irradiation; positive)

| Example | Photoacid Generator | Compound (A) | Acid-Decomposable Resin (9.7 g) | Basic Compound | Surfactant (0.1 mass %) | Solvent (mass ratio) | Sensitivity ($\mu C./cm^2$) | Pattern Profile | LER (nm) | PEB Temperature Dependency | Scum |
|---|---|---|---|---|---|---|---|---|---|---|---|
| Example 15D | z90 (0.4 g) 437 Å$^3$ + z89 (0.1 g) 244 Å$^3$ | 5 (0.1 g) | R-18(L) | C-1 (0.02 g) | W-1 | A3/B1 (6/4) | 16.5 | rectangular | 4.0 | 1.4 | A |
| Example 16D | none | 5 (0.1 g) | PP-1 (10.3 g) | none | W-1 | A1/B1 (6/4) | 15.2 | rectangular | 3.8 | 1.4 | A |
| Example 17D | none | 5 (0.1 g) | PP-2 (10.3 g) | none | W-1 | A1/B1 (6/4) | 15.2 | rectangular | 3.8 | 1.4 | A |
| Example 18D | none | 5 (0.1 g) | PP-3 (10.3 g) | none | W-2 | A2/B1 (6/4) | 15.2 | rectangular | 3.9 | 1.4 | A |
| Example 19D | none | 5 (0.1 g) | PP-4 (10.3 g) | none | W-1 | A3/B1 (6/4) | 15.2 | rectangular | 3.7 | 1.4 | A |
| Example 20D | none | 5 (0.1 g) | PP-5 (10.3 g) | none | W-1 | A1/B1 (6/4) | 15.2 | rectangular | 3.9 | 1.4 | A |
| Example 21D | none | 2 (0.05 g) + 4 (0.05 g) | PP-5 (10.3 g) | none | W-1 | A1/B1 (6/4) | 15.2 | rectangular | 3.9 | 1.4 | A |
| Example 22D | none | 5 (0.1 g) | PP-5 (5.3 g) + PP-4 (4.0 g) | none | W-1 | A1/B1 (6/4) | 15.3 | rectangular | 3.8 | 1.4 | A |
| Example 23D | None | 5 (0.1 g) | PP-5 (10.3 g) | none | none | A1/B1 (6/4) | 15.2 | rectangular | 3.9 | 1.4 | A |
| Comparative Example 1D | z2 (0.6 g) 113 Å$^3$ | Comparative Compound 1 (0.02 g) | R-2 | none | W-1 | A1/B1 (6/4) | 19.8 | tapered | 6.0 | 4.0 | D |
| Comparative Example 2D | z2 (0.6 g) 113 Å$^3$ | Comparative Compound 2 (0.02 g) | R-2 | none | W-1 | A1/B1 (6/4) | 19.9 | tapered | 6.0 | 4.0 | D |
| Comparative Example 3D | z2 (0.6 g) 113 Å$^3$ | Comparative Compound 3 (0.02 g) | R-2 | C-2 (0.02 g) | W-1 | A1/B1 (6/4) | 19.1 | tapered | 6.2 | 4.0 | D |
| Comparative Example 4D | z2 (0.6 g) 113 Å$^3$ | Comparative Compound 4 (0.02 g) | R-2 | C-2 (0.02 g) | W-1 | A1/B1 (6/4) | 19.3 | tapered | 8.2 | 4.0 | C |
| Comparative Example 5D | z2 (0.6 g) 113 Å$^3$ | Comparative Compound 5 (0.02 g) | R-2 | C-2 (0.02 g) | W-1 | A1/B1 (6/4) | 19.4 | tapered | 6.2 | 4.0 | D |

The structure, molecular weight and molecular weight distribution of the acid-decomposable resin used, containing a repeating unit capable of decomposing upon irradiation with an actinic ray or radiation to generate an acid, are shown below. The same applies to the Tables below.

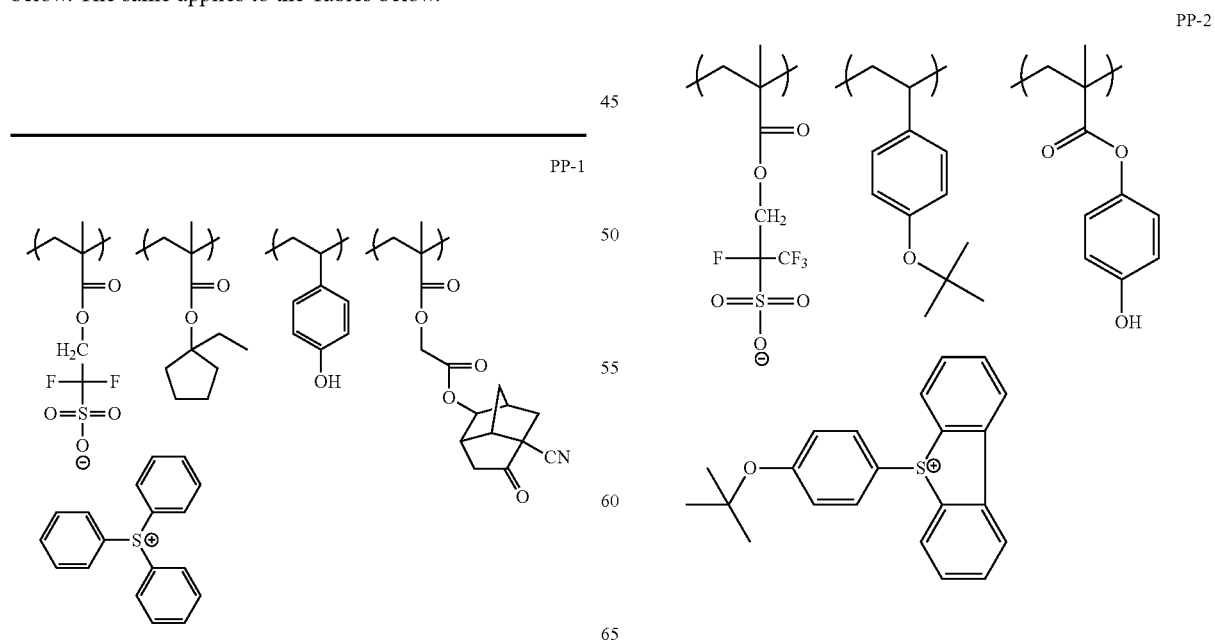

-continued

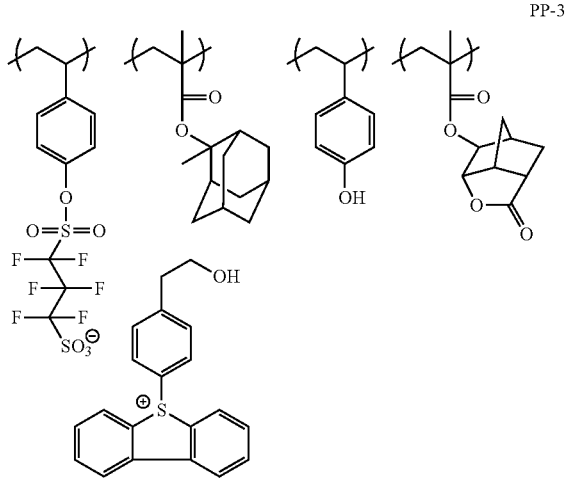

PP-3

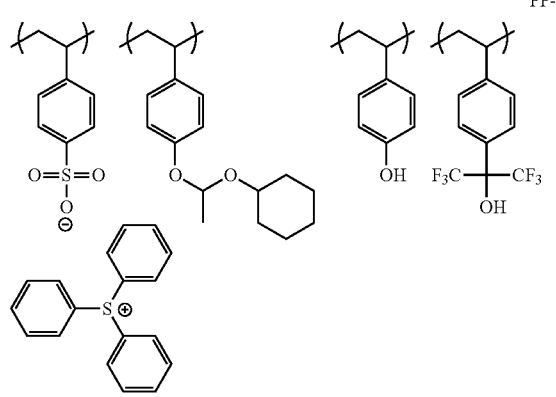

PP-4

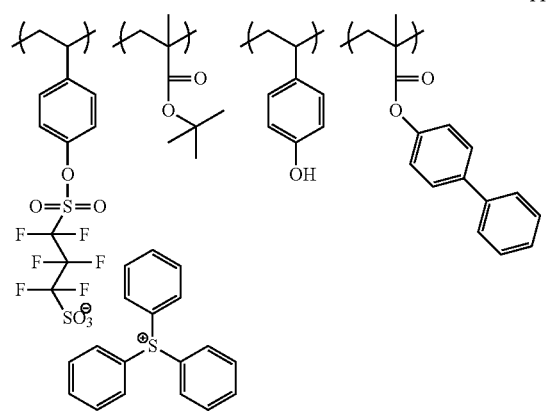

PP-5

| Resin | Molar Ratio of Repeating Units (corresponding to repeating units from the left) | Weight Average Molecular Weight (Mw) | Polydispersity |
|---|---|---|---|
| PP-1 | 7/30/43/20 | 12000 | 1.3 |
| PP-2 | 10/40/50 | 8000 | 1.2 |
| PP-3 | 7/30/43/20 | 8000 | 1.2 |
| PP-4 | 15/35/45/5 | 4000 | 1.1 |
| PP-5 | 7/38/50/5 | 10000 | 1.4 |

The results shown in Table 3 reveal the followings. The composition according to the present invention brings about excellent pattern profile in electron beam irradiation and good scum performance as well as small PEB temperature dependency. The performance in terms of sensitivity and LER is also excellent. That is, the composition of the present invention has an excellent performance as a positive resist composition for exposure by electron beam irradiation.

In Examples using (A) a guanidine compound having a larger logP value and higher hydrophobicity, the scum performance tends to be more excellent.

In Examples using an acid-decomposable resin containing a repeating unit capable of decomposing upon irradiation with an actinic ray or radiation to generate an acid, the LER performance tends to be excellent.

Example E

Examples 1E to 10E and Comparative Examples 1E to 5E

Preparation of Resist

The components shown in Table 4 below were dissolved in a solvent, and the obtained solution was filtered through a polytetrafluoroethylene filter having a pore size of 0.1 μm to obtain a negative resist solution having a solid content concentration of 12 mass %.

(Evaluation of Resist)

The negative resist solution prepared was uniformly coated on a hexamethyldisilazane-treated silicon substrate by a spin coater and dried by heating on a hot plate at 120° C. for 60 seconds to form a resist film having a thickness of 0.3 μm.

This resist film was irradiated using an electron beam projection lithography apparatus (accelerating voltage: 100 keV) manufactured by Nikon Corp. and immediately after the irradiation, heated on a hot plate at 110° C. for 90 seconds. Thereafter, the resist film was developed with an aqueous tetramethylammonium hydroxide solution with a concentration of 2.38 mass % at 23° C. for 60 seconds, rinsed with pure water for 30 seconds and then dried to form a line-and-space pattern.

The evaluations were performed in the same manner as described in Example D. The results thereof are shown in Table 4.

TABLE 4

(Electron Beam Irradiation; negative)

| Example | Photoacid Generator | Compound (A) | Alkali-Soluble Resin (9.7 g) | Crosslinking Agent (3.0 g) | Surfactant (0.1 mass %) | Solvent (mass ratio) | Sensitivity ($\mu C/cm^2$) | Pattern Profile | LER (nm) | PEB Temperature Deppendency | Scum |
|---|---|---|---|---|---|---|---|---|---|---|---|
| Example 1E | z7 (0.6 g) 303 Å$^3$ | 2 (0.02 g) | P-3 | CL-1 | W-1 | A1/B1 (6/4) | 13.8 | rectangular | 4.5 | 1.8 | A |
| Example 2E | z63 (0.6 g) 244 Å$^3$ | 3 (0.02 g) | P-3 | CL-1 | W-2 | A2/B2 (6/4) | 13.8 | rectangular | 4.6 | 1.8 | A |
| Example 3E | z55 (0.6 g) 136 Å$^3$ | 7 (0.02 g) | P-3 | CL-1 | W-3 | A3/B1 (6/4) | 13.7 | rectangular | 5.0 | 3.0 | B |
| Example 4E | z59 (0.6 g) 173 Å$^3$ | 5 (0.02 g) | P-2 | CL-1 | W-1 | A4/B1 (6/4) | 13.8 | rectangular | 4.6 | 1.5 | A |
| Example 5E | z70 (0.6 g) 189 Å$^3$ | 6 (0.02 g) | P-3 | CL-1 | W-3 | A1/B2 (6/4) | 13.9 | rectangular | 5.5 | 2.5 | A |
| Example 6E | z14 (0.6 g) 127 Å$^3$ | 1 (0.02 g) | P-3 | CL-2 | W-2 | A4/B1 (6/4) | 13.8 | rectangular | 5.1 | 3.0 | A |
| Example 7E | z7 (0.5 g) 303 Å$^3$ | 8 (0.1 g) | P-3 | CL-3 | W-4 | A1/B1 (6/4) | 17.8 | rectangular | 4.8 | 2.5 | A |
| Example 8E | z63 (0.6 g) 244 Å$^3$ | 2 (0.01 g) + 4 (0.01 g) | P-3 | CL-1 | W-1 | A1/B1 (6/4) | 13.8 | rectangular | 4.5 | 1.8 | A |
| Example 9E | z63 (0.6 g) 244 Å$^3$ | 2 (0.02 g) | P-3 (4.7g) + P-1 (5.0 g) | CL-1 | W-1 | A1/B1 (6/4) | 13.9 | rectangular | 4.6 | 1.9 | A |
| Example 10E | z63 (0.6 g) 244 Å$^3$ | 2 (0.02 g) | P-3 | CL-1 | none | A1/B1 (6/4) | 13.8 | rectangular | 4.5 | 1.8 | A |
| Comparative Example 1E | z2 (0.6 g) 113 Å$^3$ | Comparative Compound 1 (0.02 g) | P-1 | none | W-1 | A1/B1 (6/4) | 20.8 | tapered | 7.8 | 4.5 | D |
| Comparative Example 2E | z2 (0.6 g) 113 Å$^3$ | Comparative Compound 2 (0.02 g) | P-1 | CL-1 | W-1 | A1/B1 (6/4) | 22.8 | tapered | 7.9 | 43.4 | D |
| Comparative Example 3E | z2 (0.6 g) 113 Å$^3$ | Comparative Compound 3 (0.02 g) | P-1 | CL-1 | W-1 | A1/B1 (6/4) | 19.8 | tapered | 7.1 | 4.6 | D |
| Comparative Example 4E | z2 (0.6 g) 113 Å$^3$ | Comparative Compound 4 (0.02 g) | P-1 | CL-1 | W-1 | A1/B1 (6/4) | 19.9 | tapered | 8.3 | 4.6 | C |
| Comparative Example 5E | z2 (0.6 g) 113 Å$^3$ | Comparative Compound 5 (0.02 g) | P-1 | CL-1 | W-1 | A1/B1 (6/4) | 19.6 | tapered | 7.1 | 4.6 | D |

The structure, molecular weight and molecular weight distribution of the alkali-soluble resin and the structure of the acid crosslinking agent are shown below.

| | | Mw | Mw/Mn |
|---|---|---|---|
| P-1 | | 16000 | 2.30 |
| P-2 | | 12000 | 1.2 |
| P-3 | | 6000 | 1.2 |

VP-5000 produced by Nippon Soda Co., Ltd.

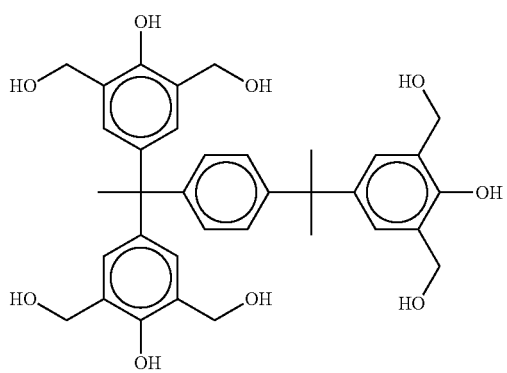

CL-1

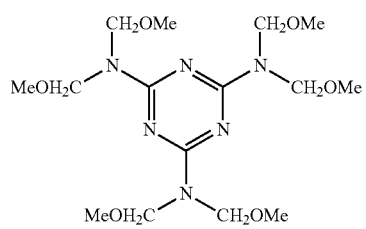

CL-2

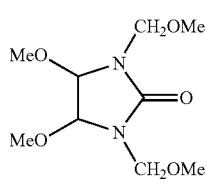

CL-3

The results shown in Table 4 reveal the followings. The composition according to the present invention brings about excellent pattern profile in electron beam exposure and good scum performance as well as small PEB temperature dependency. The performance in terms of sensitivity and LER is also excellent. That is, the composition of the present invention has an excellent performance as a negative resist composition for exposure by electron beam irradiation.

In Examples using an acid generator capable of generating an acid having a size of 130 Å or more, LER tends to be more improved.

In Examples using (A) a guanidine compound having a larger logP value and higher hydrophobicity, the scum performance tends to be more excellent.

In Examples using (A) a guanidine compound having higher basicity, LER tends to be more improved.

Example F

Examples 1F to 15F and Comparative Examples 1F to 5F

Preparation of Resist

The components shown in Table 5 below were dissolved in a solvent, and the obtained solution was filtered through a polytetrafluoroethylene filter having a pore size of 0.1 μm to obtain a positive resist solution having a solid content concentration of 8 mass %.

(Evaluation of Resist)

The positive resist solution prepared was uniformly coated on a hexamethyldisilazane-treated silicon substrate by a spin coater and dried by heating on a hot plate at 100° C. for 60 seconds to form a resist film having a thickness of 0.12 μm.

[Sensitivity]

The obtained resist was subjected to surface exposure to EUV light (wavelength: 13 nm) by changing the exposure dose in steps of 0.5 mJ/cm$^2$ in the range of 0 to 10.0 mJ/cm$^2$ and baked at 110° C. for 90 seconds. Thereafter, the dissolution rate at each exposure dose was measured by using an aqueous 2.38 mass % tetramethylammonium hydroxide (TMAH) solution to obtain a dissolution rate curve.

In the dissolution rate curve, the exposure dose when the dissolution rate of the resist is saturated, was taken as the sensitivity.

[Pattern Profile]

The exposure dose for reproducing a line-and-space (L/S=1/1) mask pattern with a line width of 50 nm by using a 6% halftone mask having a 1:1 line-and-space pattern with a line width of 50 nm was taken as an optimal exposure dose, and the profile at the optimal exposure dose was observed by a scanning microscope (SEM).

[Line Edge Roughness (LER)]

A line pattern (L/S=1/1) having a line width of 50 nm was formed with the irradiation dose giving the sensitivity above. At arbitrary 30 points in a longitudinal 50 μm region, the distance from the reference line where the edge should be present was measured by means of a scanning electron microscope (S-9220, manufactured by Hitachi, Ltd.). The standard deviation of measured distances was determined, and 36 was computed.

[PEB Temperature Dependency]

The exposure dose for reproducing a line-and-space 1/1 with a mask size of 50 nm when post-baking was performed at 120° C. for 90 seconds, was taken as an optimal exposure dose and after performing exposure with the optimal exposure dose, post-baking was performed at two temperatures of +2° C. and −2° C. with respect to the post-baking temperature (that is, 122° C. and 118° C.). Each line-and-space obtained was measured for the length, and the line widths L1 and L2 were determined. The PEB temperature dependency (PEBS; Post Exposure Bake Sensitivity) was defined as the fluctuation of line width per PEB temperature change of 1° C. and calculated according to the following formula.

PEB Temperature dependency (nm/° C.)=|L1−L2|/4

A smaller value indicates less change in performance based on the temperature change and is better.

[Evaluation of Scum]

The scum performance was evaluated in the same manner as described in Example A.

These evaluation results are shown in Table 5 below.

TABLE 5

| | | | | | | | | | PEB | |
|---|---|---|---|---|---|---|---|---|---|---|
| | | | Acid- | Surfactant | | | | | | |
| | Photoacid | | Decomposable | (0.1 | Solvent | Sensitivity | Pattern | LER | Temperature | |
| Example | Generator | Compound (A) | Resin (9.7 g) | mass %) | (mass ratio) | (mJ/cm$^2$) | Profile | (nm) | Deppendency | Scum |
| Example 1F | z7 (0.6 g) 303 Å$^3$ | 1 (0.02 g) | R-18(H) | W-1 | A1/B1 (6/4) | 12.3 | rectangular | 5.5 | 3.0 | A |
| Example 2F | z12 (0.6 g) 216 Å$^3$ | 2 (0.02 g) | R-18(L) | W-1 | A1/B1 (6/4) | 12.5 | rectangular | 5.0 | 2.0 | A |
| Example 3F | z91 (0.6 g) 303 Å$^3$ | 3 (0.02 g) | R-22 | W-2 | A1/B1 (6/4) | 12.5 | rectangular | 5.0 | 1.5 | A |
| Example 4F | z90 (0.6 g) 437 Å$^3$ | 4 (0.02 g) | R-10 | W-3 | A2/B1 (6/4) | 12.0 | rectangular | 5.5 | 1.3 | A |
| Example 5F | z93 (0.6 g) 437 Å$^3$ | 5 (0.02 g) | R-2 | W-1 | A4/B1 (6/4) | 13.1 | rectangular | 5.1 | 1.5 | A |
| Example 6F | z63 (0.6 g) 244 Å$^3$ | 6 (0.02 g) | R-23 | W-1 | A1/B1 (6/4) | 12.2 | rectangular | 6.2 | 2.0 | A |
| Example 7F | z2 (0.6 g) 113 Å$^3$ | 7 (0.02 g) | R-27 | W-2 | A3/B2 (6/4) | 12.1 | rectangular | 6.0 | 3.2 | B |
| Example 8F | z21 (0.6 g) 127 Å$^3$ | 8 (0.02 g) | R-14 | W-1 | A1/B2 (6/4) | 12.3 | rectangular | 6.0 | 3.0 | A |
| Example 9F | z87 (0.6 g) 291 Å$^3$ | 9 (0.02 g) | R-17 | W-1 | A1/B1 (6/4) | 12.2 | rectangular | 5.6 | 2.0 | A |
| Example 10F | z93 (0.6 g) 437 Å$^3$ | 10 (0.02 g) | R-23 | W-3 | A1/B1 (6/4) | 15.3 | rectangular | 5.1 | 1.4 | A |
| Example 11F | none | 4 (0.1 g) | PP-1 (10.3 g) | W-1 | A1/B1 (6/4) | 12.3 | rectangular | 4.2 | 1.4 | A |
| Example 12F | none | 5 (0.1 g) | PP-2 (10.3 g) | W-1 | A1/B1 (6/4) | 13.3 | rectangular | 4.3 | 1.4 | A |
| Example 13F | none | 2 (0.1 g) | PP-3 (10.3 g) | W-1 | A1/B1 (6/4) | 12.3 | rectangular | 4.5 | 1.4 | A |
| Example 14F | none | 4 (0.1 g) | PP-4 (10.3 g) | W-1 | A3/B1 (6/4) | 13.5 | rectangular | 4.3 | 1.4 | A |
| Example 15F | none | 2 (0.1 g) | PP-5 (10.3 g) | W-1 | A1/B2 (6/4) | 13.3 | rectangular | 4.5 | 1.4 | A |
| Comparative Example 1F | z2 (0.6 g) 113 Å$^3$ | Comparative Compound 1 (0.02 g) | R-2 | W-1 | A1/B1 (6/4) | 19.0 | tapered | 7.0 | 4.3 | D |
| Comparative Example 2F | z2 (0.6 g) 113 Å$^3$ | Comparative Compound 2 (0.02 g) | R-2 | W-1 | A1/B1 (6/4) | 18.0 | tapered | 7.0 | 4.5 | D |
| Comparative Example 3F | z2 (0.6 g) 113 Å$^3$ | Comparative Compound 3 (0.02 g) | R-2 | W-1 | A1/B1 (6/4) | 19.0 | tapered | 6.8 | 4.8 | D |
| Comparative Example 4F | z2 (0.6 g) 113 Å$^3$ | Comparative Compound 4 (0.02 g) | R-2 | W-1 | A1/B1 (6/4) | 19.1 | tapered | 8.3 | 4.5 | C |
| Comparative Example 5F | z2 (0.6 g) 113 Å$^3$ | Comparative compound 5 (0.02 g) | R-2 | W-1 | A1/B1 (6/4) | 19.2 | tapered | 6.5 | 4.6 | D |

The results shown in Table 5 reveal the followings. The composition according to the present invention brings about excellent pattern profile in EUV exposure and good scum performance as well as small PEB temperature dependency. The performance in terms of sensitivity and LER is also excellent. That is, the photosensitive composition of the present invention has an excellent performance as a positive resist composition for exposure by EUV irradiation.

In Examples using (A) a guanidine compound having a larger logP value and higher hydrophobicity, the scum performance tends to be more excellent.

In Examples using an acid generator capable of generating an acid having a size of 130 Å or more, LER tends to be more improved.

In Examples using an acid-decomposable resin containing a repeating unit capable of decomposing upon irradiation with an actinic ray or radiation to generate an acid, the LER performance tends to be excellent.

In Examples using (A) a guanidine compound having higher basicity, LER tends to be more improved.

Example G

Examples 1G to 7G and Comparative Examples 1G to 5G

Preparation of Resist

The components shown in Table 6 below were dissolved in a solvent, and the obtained solution was filtered through a polytetrafluoroethylene filter having a pore size of 0.1 μm to obtain a negative resist solution having a solid content concentration of 8 mass %, which was evaluated as follows.
(Evaluation of Resist)

The negative resist solution prepared was uniformly coated on a hexamethyldisilazane-treated silicon substrate by a spin coater and dried by heating on a hot plate at 120° C. for 60 seconds to form a resist film having a thickness of 0.15 μm.

This resist film was subjected to the same evaluations as described in Example F. The results thereof are shown in Table 6.

TABLE 6

(EUV Exposure; negative)

| Example | Photoacid Generator | Compound (A) | Alkali-Soluble Resin (10 g) | Cross-linking Agent (3.0 g) | Basic Compund (0.2 g) | Surfactant (0.1 mass %) | Solvent (mass ratio) | Sensitivity (mJ/cm$^2$) | Pattern Profile | LER (nm) | PEB Temperature Deppendency | Scum |
|---|---|---|---|---|---|---|---|---|---|---|---|---|
| Example 1G | z7 (0.6 g) 303 Å$^3$ | 1 (0.02 g) | P-3 | CL-1 | none | W-1 | A1/B1 (6/4) | 10.3 | rectangular | 6.5 | 3.0 | A |
| Example 2G | z85 (0.5 g) 271 Å$^3$ | 2 (0.02 g) | P-3 | CL-1 | none | W-2 | A1/B1 (6/4) | 10.8 | rectangular | 6.0 | 2.0 | A |
| Example 3G | z56 (0.6 g) 136 Å$^3$ | 3 (0.02 g) | P-3 | CL-1 | none | W-3 | A2/B1 (6/4) | 10.0 | rectangular | 6.0 | 2.0 | A |
| Example 4G | z59 (0.6 g) 173 Å$^3$ | 4 (0.02 g) | P-3 | CL-1 | none | W-2 | A3/B1 (6/4) | 12.3 | rectangular | 6.5 | 2.0 | A |
| Example 5G | z70 (0.6 g) 189 Å$^3$ | 5 (0.02 g) | P-3 | CL-1 | none | W-1 | A4/B2 (6/4) | 10.3 | rectangular | 6.2 | 2.0 | A |
| Example 6G | z63 (0.6 g) 244 Å$^3$ | 6 (0.02 g) | P-3 | CL-1 | none | W-1 | A1/B1 (6/4) | 10.3 | rectangular | 7.1 | 2.0 | A |
| Example 7G | z14 (0.6 g) 127 Å$^3$ | 7 (0.1 g) | P-3 | CL-1 | none | W-2 | A1/B1 (6/4) | 15.5 | rectangular | 6.5 | 3.0 | B |
| Comparative Example 1G | z2 (0.6 g) 113 Å$^3$ | Comparative Compound 1 (0.02 g) | P-1 | none | none | W-1 | A1/B1 (6/4) | 18.0 | tapered | 8.1 | 4.0 | D |
| Comparative Example 2G | z2 (0.6 g) 113 Å$^3$ | Comparative Compound 2 (0.02 g) | P-1 | CL-1 | none | W-1 | A1/B1 (6/4) | 19.5 | tapered | 8.3 | 4.2 | D |
| Comparative Example 3G | z2 (0.6 g) 113 Å$^3$ | Comparative Compound 3 (0.02 g) | P-1 | CL-1 | C-1 (0.02 g) | W-1 | A1/B1 (6/4) | 19.0 | tapered | 8.1 | 4.1 | D |
| Comparative Example 4G | z2 (0.6 g) 113 Å$^3$ | Comparative Compound 4 (0.02 g) | P-1 | CL-1 | C-1 (0.02 g) | W-1 | A1/B1 (6/4) | 19.2 | tapered | 8.9 | 4.3 | C |
| Comparative Example 5G | z2 (0.6 g) 113 Å$^3$ | Comparative Compound 5 (0.02 g) | P-1 | CL-1 | C-1 (0.02 g) | W-1 | A1/B1 (6/4) | 19.1 | tapered | 8.1 | 4.4 | D |

The results shown in Table 6 reveal the followings. The composition according to the present invention brings about excellent pattern profile in EUV exposure and good scum performance as well as small PEB temperature dependency. The performance in terms of sensitivity and LER is also excellent. That is, the composition of the present invention has an excellent performance as a negative resist composition for exposure by EUV irradiation.

In Examples using an acid generator capable of generating an acid having a size of 130 Å or more, LER tends to be more improved.

In Examples using (A) a guanidine compound having a larger logP value and higher hydrophobicity, the scum performance tends to be more excellent.

In Examples using (A) a guanidine compound having higher basicity, LER tends to be more improved.

The entire disclosure of each and every foreign patent application from which the benefit of foreign priority has been claimed in the present application is incorporated herein by reference, as if fully set forth.

What is claimed is:

1. An actinic ray-sensitive or radiation-sensitive resin composition comprising:
   (A) a guanidine compound having a logP value of 1.2 or more, and
   (B) a compound capable of generating an acid upon irradiation with an actinic ray or radiation which is a sulfonium salt or an iodonium salt which has a sulfonate anion, a bis(alkylsulfonyl)amide anion, or a tris(alkylsulfonyl)methide anion,
   said con on being a positive resist composition containing an acid-decomposable resin.

2. The actinic ray-sensitive or radiation-sensitive resin composition as claimed in claim 1, wherein the guanidine compound (A) is a compound represented by the following formula (A1):

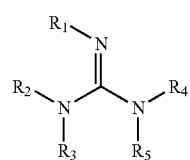

(A1)

wherein each of $R_1$ to $R_5$ represents a hydrogen atom or an organic group, $R_2$ and $R_3$ are not hydrogen at the same time, $R_4$ and $R_5$ are not hydrogen at the same time, and respective members of $R_1$ to $R_5$ may combine with each other to form a non-aromatic ring, and
any of $R_1$ to $R_5$ of a structure represented by formula (A1) may be bonded with any of $R_1$ to $R_5$ of another structure represented by formula (A1) to form a structure having a plurality of structures represented by formula (A1).

3. The actinic ray-sensitive or radiation-sensitive resin composition as claimed in claim 2, wherein each of $R_1$ to $R_5$ in formula (A1) is a hydrogen atom, an alkyl group, a cycloalkyl group or an aryl group.

4. The actinic ray-sensitive or radiation-sensitive resin composition as claimed in claim 1, wherein the compound (B) capable of generating an acid is a compound capable of generating an acid having a size of 130 Å$^3$ or more in volume or a resin containing a repeating unit capable of decomposing upon irradiation with an actinic ray or radiation to generate an acid.

5. The actinic ray-sensitive or radiation-sensitive resin composition as claimed in claim 1, wherein the acid-decomposable resin contains a repeating unit represented by the following formula (VI):

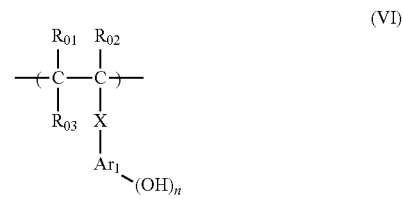

(VI)

wherein each of $R_{01}$, $R_{02}$ and $R_{03}$ independently represents a hydrogen atom, an alkyl group, a cycloalkyl group, a halogen atom, a cyano group or an alkoxycarbonyl group, $R_{03}$ may represent an alkylene group and combine with $Ar_1$ to form a 5- or 6-membered ring,
$Ar_1$ represents an aromatic ring group,
n represents an integer of 1 to 4, and
X represents a single bond or a divalent linking group.

6. The actinic ray-sensitive or radiation-sensitive resin composition as claimed in claim 1, which is exposed to electron beam, X-ray or EUV light.

7. A resist film formed using the actinic ray-sensitive or radiation-sensitive resin composition claimed in claim 1.

8. A pattern forming method comprising a step of exposing the resist film claimed in claim 7 and a step of developing the exposed film.

9. The actinic ray-sensitive or radiation-sensitive resin composition as claimed in claim 1, wherein the logP value of the guanidine compound (A) is from 2 to 10.

10. The actinic ray-sensitive or radiation-sensitive resin composition as claimed in claim 2, wherein at least one of $R_1$ to $R_5$ in formula (A1) has a cycloalkyl group or an aryl group.

11. The actinic ray-sensitive or radiation-sensitive resin composition as claimed in claim 2, wherein two or more of $R_1$ to $R_5$ in formula (A1) have a cycloalkyl group or an aryl group.

12. The actinic ray-sensitive or radiation-sensitive resin composition as claimed in claim 1, wherein (B) the compound capable of generating an acid upon irradiation with an actinic ray or radiation is a compound capable of generating a sulfonic acid having a size of 270 Å$^3$ or more.

13. The actinic ray-sensitive or radiation-sensitive resin composition as claimed in claim 5, wherein the acid-decomposable resin contains a repeating unit represented by the following formula (AO) or formula (X):

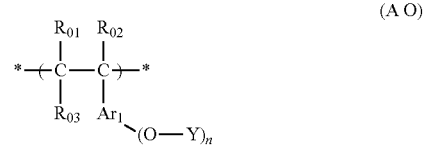

(AO)

wherein each of $R_{01}$, $R_{02}$ and $R_{03}$ independently represents a hydrogen atom, an alkyl group, a cycloalkyl group, a halogen atom, a cyano group or an alkoxycarbonyl group; $R_{03}$ may represent an alkylene group and combine with $Ar_1$ to form a 5- or 6-membered ring;

$Ar_1$ represents an aromatic ring group;

each of n Y's independently represents a hydrogen atom or a group capable of leaving by the action of an acid, and at least one Y represents a group capable of leaving by the action of an acid, and n represents an integer of 1 to 4;

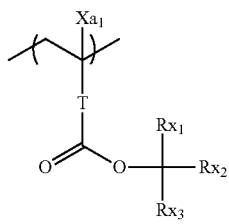
(X)

wherein $Xa_1$ represents a hydrogen atom, a methyl group, a trifluoromethyl group or a hydroxymethyl group;

T represents a single bond or a divalent linking group;

each of $Rx_1$ to $Rx_3$ independently represents a linear or branched alkyl group or a monocyclic or polycyclic cycloalkyl group, and at least two members out of $Rx_1$ to $Rx_3$ may combine with each other to form a monocyclic or polycyclic cycloalkyl group.

14. An actinic ray-sensitive or radiation-sensitive resin composition comprising:

(A) a guanidine compound having a logP value of 1.2 or more, and (B) a compound capable of generating an acid upon irradiation with an actinic ray or radiation which is a sulfonium salt or an iodonium salt which has a sulfonate anion, a bis(alkylsulfonyl)amide anion, or a tris(alkylsulfonyl)methide anion, wherein (B) the compound capable of generating an acid upon irradiation with an actinic ray or radiation is a compound capable of generating a sulfonic acid having a size of 270 $Å^3$ or more.

* * * * *